(12) United States Patent
Kurokawa

(10) Patent No.: US 11,509,918 B2
(45) Date of Patent: Nov. 22, 2022

(54) SEMICONDUCTOR DEVICE, AND ELECTRONIC DEVICE

(71) Applicant: SEMICONDUCTOR ENERGY LABORATORY CO., LTD., Atsugi (JP)

(72) Inventor: Yoshiyuki Kurokawa, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 253 days.

(21) Appl. No.: 16/466,693

(22) PCT Filed: Jan. 16, 2018

(86) PCT No.: PCT/IB2018/050246
§ 371 (c)(1),
(2) Date: Jun. 5, 2019

(87) PCT Pub. No.: WO2018/138597
PCT Pub. Date: Aug. 2, 2018

(65) Prior Publication Data
US 2019/0342564 A1    Nov. 7, 2019

(30) Foreign Application Priority Data

Jan. 26, 2017   (JP) .............................. JP2017-011938
Feb. 23, 2017   (JP) .............................. JP2017-031711

(51) Int. Cl.
*H04N 19/42*     (2014.01)
*G06T 9/00*      (2006.01)
*G09G 3/36*      (2006.01)

(52) U.S. Cl.
CPC ............. *H04N 19/42* (2014.11); *G06T 9/002* (2013.01); *G09G 3/3648* (2013.01); *G06T 2207/20084* (2013.01)

(58) Field of Classification Search
CPC ................... H04N 19/42; G06T 9/002; G06T 2207/20084; G09G 3/3648; H03K 3/3562
See application file for complete search history.

(56) References Cited

U.S. PATENT DOCUMENTS 5,841,904 A * 11/1998 Sugiura .................... H04N 1/64
                                                    382/233
6,320,590 B1   11/2001 Go
(Continued)

FOREIGN PATENT DOCUMENTS

CN      102682688 A     9/2012
JP      03-226884 A    10/1991
(Continued)

OTHER PUBLICATIONS

FPGA, Wikipedia, 2016 (Year: 2016).*
(Continued)

*Primary Examiner* — Jianxun Yang
(74) *Attorney, Agent, or Firm* — Nixon Peabody LLP; Jeffrey L. Costellia

(57) ABSTRACT

A semiconductor device and electronic device with reduced power consumption are provided. The semiconductor device includes an encoder, a decoder, and a source driver circuit. An output terminal of the encoder is electrically connected to an input terminal of the source driver circuit, and an output terminal of the source driver circuit is electrically connected to an input terminal of the decoder. The encoder converts input image data into feature-extracted image data, and the decoder restores the feature-extracted image data to the original image data. In addition, provision of a circuit that performs convolution processing using a weight filter for the encoder enables calculation using a convolutional neural network.

6 Claims, 51 Drawing Sheets

(56) References Cited

U.S. PATENT DOCUMENTS

| | | |
|---|---|---|
| 7,091,981 B2 | 8/2006 | Go |
| 9,558,687 B2 | 1/2017 | Hiroki |
| 10,218,967 B2 | 2/2019 | Hiroki |
| 2002/0024514 A1 | 2/2002 | Go |
| 2007/0286287 A1 | 12/2007 | Kim et al. |
| 2009/0189881 A1 | 7/2009 | Ooishi et al. |
| 2012/0062529 A1 | 3/2012 | Koyama |
| 2012/0229431 A1 | 9/2012 | Hiroki |
| 2013/0311412 A1 | 11/2013 | Lazar et al. |
| 2016/0343452 A1 | 11/2016 | Ikeda et al. |
| 2017/0230675 A1* | 8/2017 | Wierstra .......... G06N 3/08 |
| 2018/0189981 A1* | 7/2018 | Singh .......... G06N 3/08 |
| 2018/0211620 A1 | 7/2018 | Kurokawa et al. |

FOREIGN PATENT DOCUMENTS

| | | |
|---|---|---|
| JP | 03-254223 A | 11/1991 |
| JP | 07-134279 A | 5/1995 |
| JP | 11-065535 A | 3/1999 |
| JP | 11-259193 A | 9/1999 |
| JP | 2001-306034 A | 11/2001 |
| JP | 2013-137486 A | 7/2013 |
| JP | 2016-004549 A | 1/2016 |
| KR | 10-0293523 | 4/2001 |
| WO | WO-2012/109407 | 8/2012 |

OTHER PUBLICATIONS

Arima.Y et al., "A Self-Learning Neural Network Chip with 125 Neurons and 10K Self-Organization Synapses", IEEE Journal of Solid-State Circuits, Apr. 1, 1991, vol. 26, No. 4, pp. 607-611.

Kawashima.S et al., "13.3-in. 8K × 4K 664-ppi OLED Display Using CAAC-OS FETs", SID Digest '14 : SID International Symposium Digest of Technical Papers, Jun. 3, 2014, pp. 627-630.

Hamasaki.K et al., "A proposal of a stream image compression architecture using neural networks", IEICE Technical Report, Jan. 22, 2015, vol. 114, No. 428, pp. 129-132, IEICE(The Institute of Electronics,Information and Communication Engineers).

International Search Report (Application No. PCT/IB2018/050246) dated Mar. 27, 2018.

Written Opinion (Application No. PCT/IB2018/050246) dated Mar. 27, 2018.

* cited by examiner

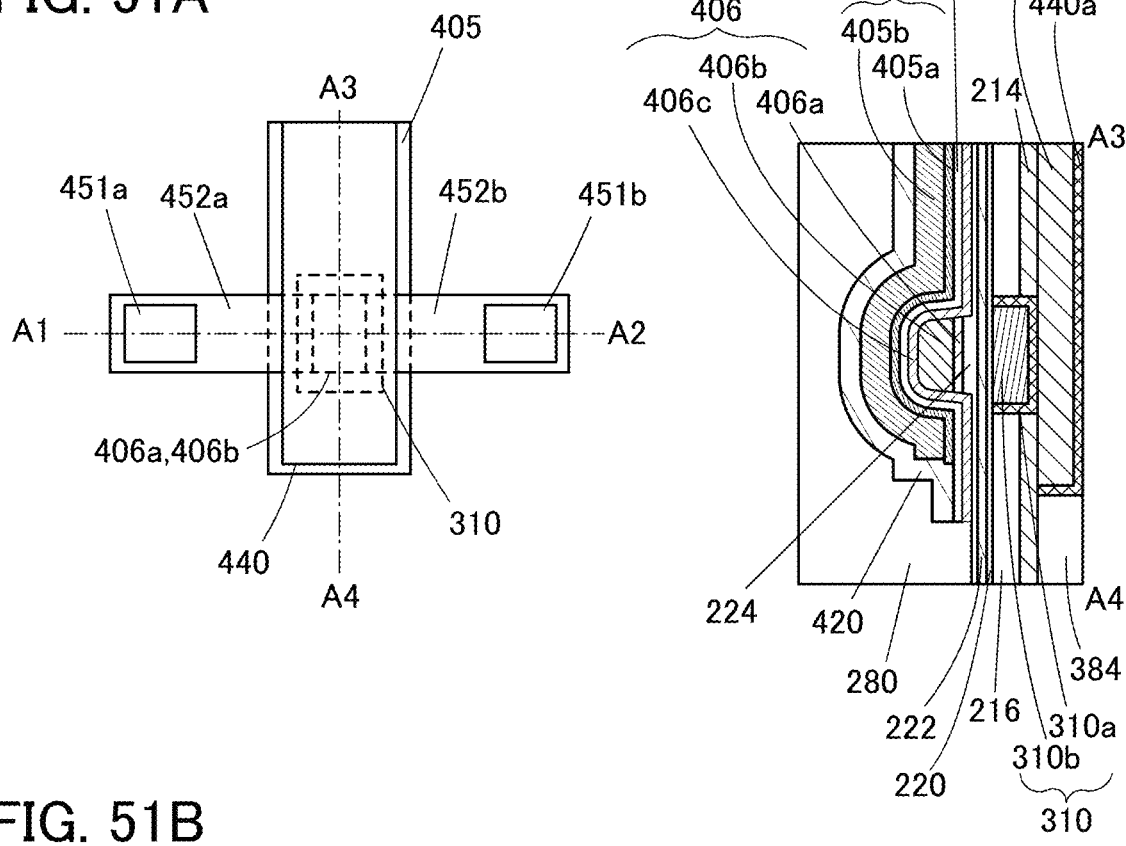
FIG. 51A
FIG. 51C
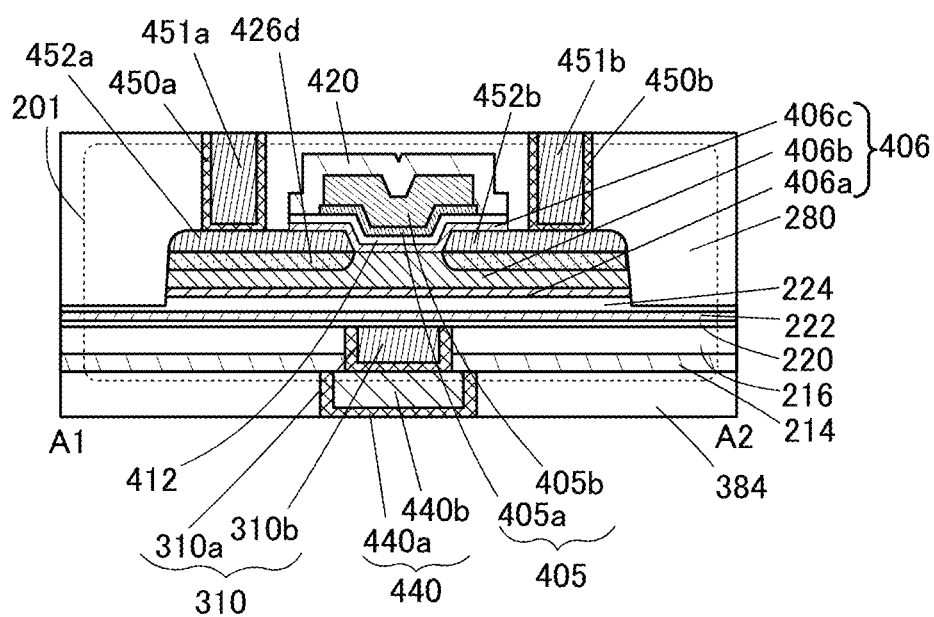
FIG. 51B

SEMICONDUCTOR DEVICE, AND ELECTRONIC DEVICE

TECHNICAL FIELD

One embodiment of the present invention relates to a semiconductor device and an electronic device.

Note that one embodiment of the present invention is not limited to the above technical field. The technical field of the invention disclosed in this specification and the like relates to an object, a method, or a manufacturing method. Alternatively, one embodiment of the present invention relates to a process, a machine, manufacture, or a composition of matter. Therefore, more specifically, examples of the technical field of one embodiment of the present invention disclosed in this specification include a semiconductor device, a display device, a liquid crystal display device, a light-emitting device, a power storage device, an imaging device, a memory device, a processor, an electronic device, a system, a method for driving them, a method for manufacturing them, and a method for inspecting them.

BACKGROUND ART

A television (TV) has been desired to be able to display high-definition images along with an increase in the size of a screen. For this reason, ultra-high definition TV (UHDTV) broadcasting has been increasingly put into practical use. In Japan, where UHDTV broadcasting has been promoted, 4K broadcast services by a communication satellite (CS) and an optical line started in 2015. The practical broadcasting of UHDTV (4K and 8K) by a broadcast satellite (BS) is planned to start in the future. Therefore, a variety of electronic devices compatible with 8K broadcasting have been developed (Non-Patent Document 1).

Furthermore, development of not only televisions but also a variety of electronic devices to which artificial intelligence utilizing artificial neural networks or the like is added has been proceeding. It is expected that computers with higher performance than conventional Neumann computers can be provided by utilizing artificial neural networks, and in recent years, a variety of researches on formation of artificial neural networks on electronic circuits have been carried out. Non-Patent Document 2 discloses a technique relating to a chip having a self-learning function with artificial neural networks.

Furthermore, Patent Document 1 discloses an invention in which weight data necessary for calculation with an artificial neural network is retained by a memory device including a transistor that includes an oxide semiconductor in a channel formation region.

REFERENCE

Patent Document

[Patent Document 1] United States Patent Application Publication No. 2016/0343452

Non-Patent Documents

[Non-Patent Document 1] S. Kawashima, et al., "13.3-In. 8K X 4K 664-ppi OLED Display Using CAAC-OS FETs," SID 2014 DIGEST, pp. 627-630.
[Non-Patent Document 2] Yutaka Arima et al., "A Self-Learning Neural Network Chip with 125 Neurons and 10K Self-Organization Synapses", IEEE JOURNAL OF SOLID-STATE CIRCUITS, VOL. 26, NO. 4, APRIL 1991, pp. 607-611.

SUMMARY OF THE INVENTION

Problems to be Solved by the Invention

As a video encoding method for 8K broadcasting, a new standard of H.265|MPEG-H HEVC (High Efficiency Video Coding) is employed. The resolution (the number of pixels in the horizontal and perpendicular directions) of an image in 8K broadcasting is 7680×4320, which is 4 times as high as that in 4K (3840×2160) and is 16 times as high as that in 2K (1920×1080). Thus, it is necessary to use a large volume of image data in 8K broadcasting.

In a television that has received a signal for 8K broadcasting, for example, the received broadcast signal is decompressed (decoded) to obtain the amount of data corresponding to an 8K image. In the case of transmitting such an enormous amount of image data to a display device, the number of wirings transmitting the image data is increased as the resolution of the display device becomes higher. Thus, the cost for components such as the wirings is increased, and power consumed for transmitting image data is also increased.

An object of one embodiment of the present invention is to provide a novel semiconductor device. Alternatively, an object of one embodiment of the present invention is to provide an electronic device including a novel semiconductor device. Alternatively, an object of one embodiment of the present invention is to provide a semiconductor device with a small circuit area. Alternatively, an object of one embodiment of the present invention is to provide a semiconductor device with reduced power consumption.

Note that the objects of one embodiment of the present invention are not limited to the objects listed above. The objects listed above do not disturb the existence of other objects. Note that the other objects are the objects that are not described in this section and will be described in the following description. The objects that are not described in this section will be derived from the description of the specification, the drawings, or the like and can be extracted from the description as appropriate by those skilled in the art. Note that one embodiment of the present invention solves at least one of the objects listed above and the other objects. Note that one embodiment of the present invention does not necessarily solve all the objects listed above and the other objects.

Means for Solving the Problems (1)
One embodiment of the present invention is a semiconductor device characterized by including an encoder, a decoder, a source driver circuit, and a display portion, and in that an output terminal of the encoder is electrically connected to an input terminal of the source driver circuit, an output terminal of the source driver circuit is electrically connected to an input terminal of the decoder, the encoder has a function of converting, when a first analog signal corresponding to first image data is input to the encoder, the first image data into feature-extracted second image data, and a function of outputting the second image data as a second analog signal from the output terminal of the encoder, and the decoder has a function of restoring, when the second analog signal is input to the input terminal of the decoder, the second image data into the first image data, and a function of outputting the restored first image data as a third analog signal from an output terminal of the decoder.

(2)

Alternatively, one embodiment of the present invention is, in the above structure of (1), the semiconductor device characterized in that the encoder includes a neural network having a function of performing convolution processing using a weight filter, the encoder includes a memory cell array and a shift register, the memory cell array has a function of storing a filter value of the weight filter, the shift register has a function of sequentially outputting the first image data for every pixel region of the display portion to the memory cell array, and the convolution processing includes product-sum operation using the first image data and the filter value.

(3)

Alternatively, one embodiment of the present invention is, in the above structure of (2), the semiconductor device characterized in that the first image data includes n rows and m columns (here, n and m are each an integer greater than or equal to 1) of pixel data, the pixel region has t rows and s columns (here, t is an integer greater than or equal to 1 and less than or equal to n, and s is an integer greater than or equal to 1 and less than or equal to m), the shift register includes t×m stages of retention circuits, and the shift register has a function of outputting t×s of the pixel data from the first image data to the memory cell array at a time.

(4)

Alternatively, one embodiment of the present invention is, in the above structure of (2) or (3), the semiconductor device characterized in that the memory cell array includes a first transistor and the first transistor includes a metal oxide in a channel formation region.

(5)

Alternatively, one embodiment of the present invention is, in the above structure of any one of (1) to (4), the semiconductor device characterized by including an autoencoder and in that the encoder and the decoder are included in the autoencoder.

(6)

Alternatively, one embodiment of the present invention is, in the above structure of any one of (1) to (5), the semiconductor device characterized by including an analog buffer circuit and in that an input terminal of the analog buffer circuit is electrically connected to the output terminal of the decoder.

(7)

Alternatively, one embodiment of the present invention is, in the above structure of any one of (1) to (6), the semiconductor device characterized in that the source driver circuit includes a latch circuit and the latch circuit has a function of storing the second image data output from the encoder and a function of outputting the second image data to the decoder.

(8)

Alternatively, one embodiment of the present invention is, in above the structure of (7), the semiconductor device characterized in that the latch circuit includes a second transistor and the second transistor includes a metal oxide in a channel formation region.

(9)

Alternatively, one embodiment of the present invention is an electronic device characterized by including a semiconductor device having the above structure of any one of (1) to (8) and a display portion and in that the display portion displays an image corresponding to the third analog signal output from the decoder.

(10)

Alternatively, one embodiment of the present invention is, in the above structure of (9), the electronic device characterized in that the display portion includes a third transistor in a pixel and the third transistor includes hydrogenated amorphous silicon in a channel formation region.

(11)

Alternatively, one embodiment of the present invention is, in the above structure of (9), the electronic device characterized in that the display portion includes a third transistor in a pixel and the third transistor includes a metal oxide in the channel formation region.

Effect of the Invention

According to one embodiment of the present invention, a novel semiconductor device can be provided. Alternatively, according to one embodiment of the present invention, an electronic device including a novel semiconductor device can be provided.

Alternatively, according to one embodiment of the present invention, a semiconductor device with a small circuit area can be provided. Alternatively, according to one embodiment of the present invention, a semiconductor device with reduced power consumption can be provided.

Note that the effects of one embodiment of the present invention are not limited to the effects listed above. The effects listed above do not disturb the existence of other effects. Note that the other effects are the effects that are not described in this section and will be described in the following description. The effects that are not described in this section will be derived from the description of the specification, the drawings, or the like and can be extracted from the description as appropriate by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF DRAWINGS

FIG. 36 A timing chart showing an operation example of a product-sum operation circuit.

FIG. 47 A top view and cross-sectional views illustrating a structure example of a transistor.

FIG. 51 A top view and cross-sectional views illustrating a structure example of a transistor.

MODE FOR CARRYING OUT THE INVENTION

In this specification and the like, an artificial neural network (ANN, hereinafter referred to as a neural network) generally means a model that imitates a biological neural network. In general, a neural network has a structure in which units that imitate neurons are connected to each other through a unit that imitates a synapse.

The connection strength of the synapse (also referred to as a weight coefficient) can be changed when the neural network is provided with existing information. The processing for determining a connection strength by providing a neural network with existing information in such a manner is called "learning" in some cases.

Furthermore, when a neural network in which "learning" has been performed (a connection strength has been determined) is provided with some type of information, new information can be output on the basis of the connection strength. The processing for outputting new information on the basis of provided information and a connection strength in a neural network in such a manner is called "inference" or "recognition" in some cases.

Examples of models of a neural network include a hopfield type and a hierarchical type. In particular, a multilayer neural network is called a "deep neural network" (DNN) in general, and machine learning using a deep neural network is called "deep learning" in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as OS), and the like. For example, when a metal oxide is used in an active layer of a transistor, the metal oxide is called an oxide semiconductor in some cases. That is, when a metal oxide can form a channel formation region in a transistor that has at least one of an amplifying function, a rectifying function, and a switching function, the metal oxide can be referred to as a metal oxide semiconductor or shortly as an OS. Moreover, when an OS FET (or an OS transistor) is described, it can also be referred to as a transistor including a metal oxide or an oxide semiconductor.

Embodiment 1

In this embodiment, the structure of a semiconductor device of one embodiment of the present invention will be described.

Figure 1:
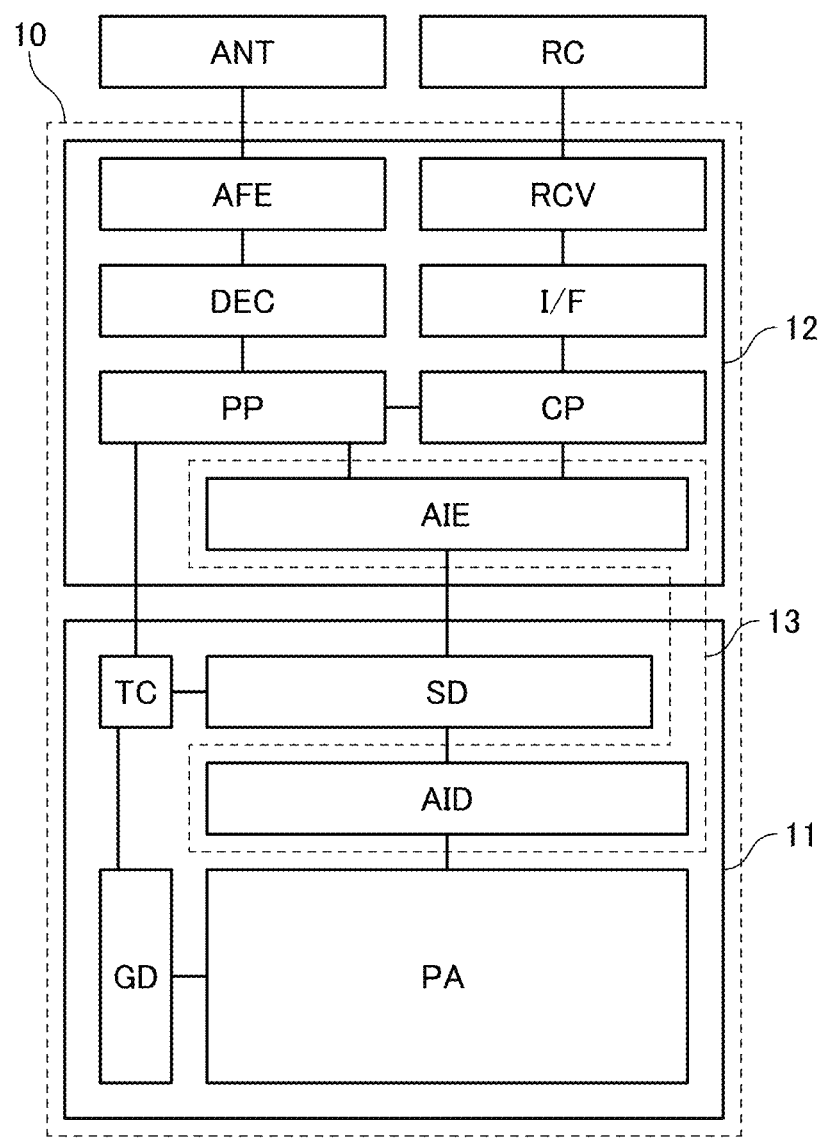
FIG. 1 A block diagram illustrating a structure example of an electronic device.

FIG. 1 is a block diagram illustrating an electronic device including a display device, a receiver, and the like. An electronic device 10 includes a display device 11 and a receiver 12. FIG. 1 also illustrates an antenna ANT that receives a broadcast signal and a remote controller RC for controlling the electronic device 10.

The display device 11 includes a display portion PA, a gate driver circuit GD, a source driver circuit SD, a timing controller TC, and a decoder AID.

The receiver 12 includes a receive portion RCV, an interface I/F, a control portion CP, an analog front end AFE, a decoder DEC, an image processing portion PP, and an encoder AIE.

Note that in the electronic device 10 illustrated in FIG. 1, the decoder AID included in the display device 11 and the encoder AIE included in the receiver 12 compose an autoencoder 13. Alternatively, although FIG. 1 illustrates a structure in which the source driver circuit SD is not included in the autoencoder 13, a structure in which the source driver circuit SD is included in the autoencoder 13 may be used.

The antenna ANT is electrically connected to the analog front end AFE in the receiver 12, and the analog front end AFE is electrically connected to the decoder DEC. The decoder DEC is electrically connected to the image processing portion PP, and the image processing portion PP is electrically connected to the control portion CP, the encoder ALE, and the timing controller TC. The receive portion RCV is electrically connected to the interface I/F, and the interface I/F is electrically connected to the control portion CP. The control portion CP is electrically connected to the encoder AIE, and the encoder AIE is electrically connected to the source driver circuit SD.

The source driver circuit SD is electrically connected to the decoder AID. The timing controller TC is electrically connected to the source driver circuit SD and the gate driver circuit GD. The display portion PA is electrically connected to the decoder AID and the gate driver circuit GD.

The antenna ANT has a function of receiving airwaves from an artificial satellite or a radio tower and converting the airwaves into an electric signal. The antenna ANT also has a function of transmitting the electric signal to the analog front end AFE.

The analog front end AFE has a function of extracting a signal of a channel included in the electric signal and demodulating the signal to give a broadcast signal. The analog front end AFE also has a function of transmitting the broadcast signal to the decoder DEC.

The decoder DEC has a function of decoding and decompressing image data and audio data included in the broadcast signal. The image data, in particular, is transmitted from the decoder DEC to the image processing portion PP. In addition, the audio data is transmitted to an audio control portion, an audio output device, or the like included in the electronic device 10. Note that the audio control portion and the audio output device are not illustrated in FIG. 1.

The image processing portion PP has a function of performing a variety of kinds of image processing on the decompressed image data. The image processing portion PP can include, for example, a gamma correction circuit, a dimming circuit, and a toning circuit.

Moreover, in the case where the display portion PA includes an organic EL (Electro Luminescence) element and the source driver circuit SD includes a current detection circuit that detects a current flowing through the organic EL element, the image processing portion PP can include an EL correction circuit. The corrected image data is transmitted to the encoder AIE.

The autoencoder 13, and the encoder AIE and the decoder AID included in the autoencoder 13 will be described later.

As a means by which a user operates the electronic device 10, a method using the remote controller RC is given. The remote controller RC can transmit a control signal to the electronic device 10 by the operation by the user. Examples of the control signal include a signal for selecting a program of broadcasting stations on the broadcast signal received from the antenna ANT. Examples of the control signal also include a signal for adjusting the tone, brightness, or the like of an image displayed on the display device. Examples of the control signal also include, in the case where the electronic device 10 has a function of recording and reproducing image data, a signal for performing reproduction, rewind, fast-forward, or stop of the image data. The control signal transmitted from the remote controller RC is, for example, an infrared ray or an electric wave.

Furthermore, a means by which the user operates the electronic device 10 is not limited to that in the structure in FIG. 1, and a structure in which the user directly operates the electronic device 10 by an input key or the like provided for the electronic device 10 may also be used, for example.

The receive portion RCV has a function of receiving the control signal from the remote controller RC. The receive portion RCV has a function of transmitting the control signal to the interface I/F after receiving the control signal.

The interface I/F has a function of converting the control signal into an electric signal and transmitting it to the control portion CP.

The control portion CP has a function of decoding the electric signal transmitted from the interface I/F, and a function of generating data necessary for controlling the contents of the image processing, updating a weight coefficient for the autoencoder 13, and changing the structure of a neural network in the autoencoder 13, on the basis of the electric signal. Then, the data is transmitted as a control signal to the image processing portion PP, the autoencoder 13, and the like.

The timing controller TC has a function of generating a timing signal (for example, a clock signal CLK to be described later) that is used in the source driver circuit SD and the gate driver circuit GD. In addition, the timing signal is generated on the basis of a frame rate or the like included in the image data transmitted from the image processing portion PP. Note that the timing signal is not generated limitedly on the basis of a frame rate of the image data transmitted from the image processing portion PP.

The source driver circuit SD has a function of receiving image data output from the encoder AIE included in the autoencoder 13, and a function of transmitting the image data to the decoder AID. Note that the image data may be transmitted to the decoder AID on the basis of the timing signal transmitted from the timing controller TC. Note that the details of the source driver circuit SD will be described later.

The gate driver circuit GD has a function of transmitting a selection signal to pixels included in the display portion PA. Note that the selection signal is transmitted to the pixels on the basis of the timing signal transmitted from the timing controller TC.

At least one of the decoder AID, the timing controller TC, the source driver circuit SD, and the gate driver circuit GD included in the display device 11 can be formed over a substrate over which the display portion PA is formed, in some cases. Alternatively, at least one of the decoder AID, the timing controller TC, the source driver circuit SD, and the gate driver circuit GD included in the display device 11 can be mounted on the substrate over which the display portion PA is formed, as an IC (Integrated Circuit) by a COG (Chip On Glass) method, in some cases. Alternatively, at least one of the decoder AID, the timing controller TC, the source driver circuit SD, and the gate driver circuit GD included in the display device 11 can be mounted on an FPC (Flexible Printed Circuit) that is connected to the substrate over which the display portion PA is formed, as an IC by a COF (Chip On Film) method, in some cases.

The display portion PA includes display elements. Transmissive liquid crystal elements, reflective liquid crystal elements, or organic EL elements can be used as the display elements, for example. The display elements can be arranged in a matrix, for example.

<Autoencoder>

Next, the autoencoder 13 will be described.

Figure 2:
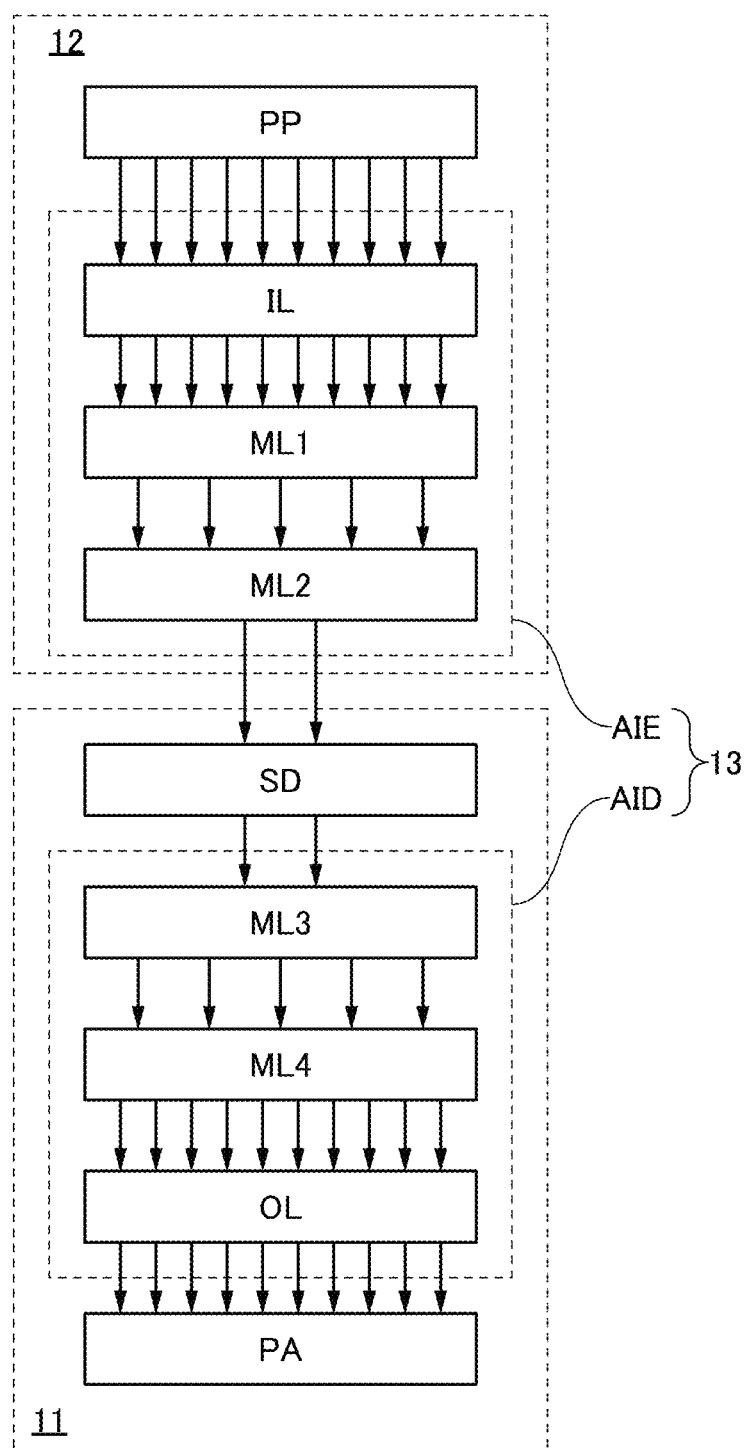
FIG. 2 A block diagram illustrating a structure example of an autoencoder.

The autoencoder 13 is a circuit utilizing a neural network, and FIG. 2 illustrates an example thereof. Note that in addition to the autoencoder 13, the image processing portion PP and the source driver circuit SD are also illustrated in FIG. 2.

The encoder AIE of the autoencoder 13 includes an input layer IL, an intermediate layer ML1, and an intermediate layer ML2, and the decoder AID of the autoencoder 13 includes an intermediate layer ML3, an intermediate layer ML4, and an output layer OL. This means that in the autoencoder 13, a hierarchical neural network is composed of the input layer IL, the intermediate layer ML1 to the intermediate layer ML4, and the output layer OL.

The image data transmitted from the image processing portion PP is input to the input layer IL of the encoder AIE in the autoencoder 13. This means that the image data is handled as input data of the hierarchical neural network. The hierarchical neural network will be described in Embodiment 3.

The hierarchical neural network in the encoder AIE has a structure in which the number of neurons decreases as the depth of the hierarchy becomes deeper. That is, the number of neurons in the intermediate layer ML1 is smaller than the number of neurons in the input layer IL, and the number of neurons in the intermediate layer ML2 is smaller than the number of neurons in the intermediate layer ML1.

The hierarchical neural network in the decoder AID has a structure in which the number of neurons increases as the depth of the hierarchy becomes deeper. That is, the number of neurons in the intermediate layer ML4 is larger than the number of neurons in the intermediate layer ML3, and the number of neurons in the output layer OL is larger than the number of neurons in the intermediate layer ML4.

In the above structure, the number of neurons in the intermediate layer ML2 is smallest in the encoder AIE, and the number of neurons in the intermediate layer ML3 is smallest in the decoder AID. Thus, the number of wirings for connecting the neurons in the intermediate layer ML2 and the neurons in the intermediate layer ML3 through the source driver circuit SD can be small. In other words, the number of wirings for electrically connecting the decoder AID of the display device 11 and the encoder AIE of the receiver 12 can be small.

In the encoder AIE of the autoencoder 13, when an analog signal corresponding to image data is transmitted from the image processing portion PP to the encoder AIE, processing for converting the image data into feature-extracted image data is performed, and in the decoder AID of the autoencoder 13, processing for restoring the feature-extracted image data to the original image data and outputting the original image data as an analog signal from the output layer OL is performed.

The restored image data output from the output layer OL of the decoder AID in the autoencoder 13 is transmitted to the display portion PA.

Note that in the hierarchical neural network composed of the autoencoder 13, the layers can be fully connected or the layers can be partially connected.

Note that although the hierarchical neural network in the autoencoder 13 illustrated in FIG. 2 is composed of the input layer IL, the intermediate layer ML1 to the intermediate layer ML4, and the output layer OL, one embodiment of the present invention is not limited thereto. For example, the structure of the hierarchical neural network may be a structure in which the number of intermediate layers of the autoencoder 13 in FIG. 2 is increased or decreased.

<Source Driver Circuit>

Next, a structure example of the source driver circuit SD will be described.

Figure 3A:
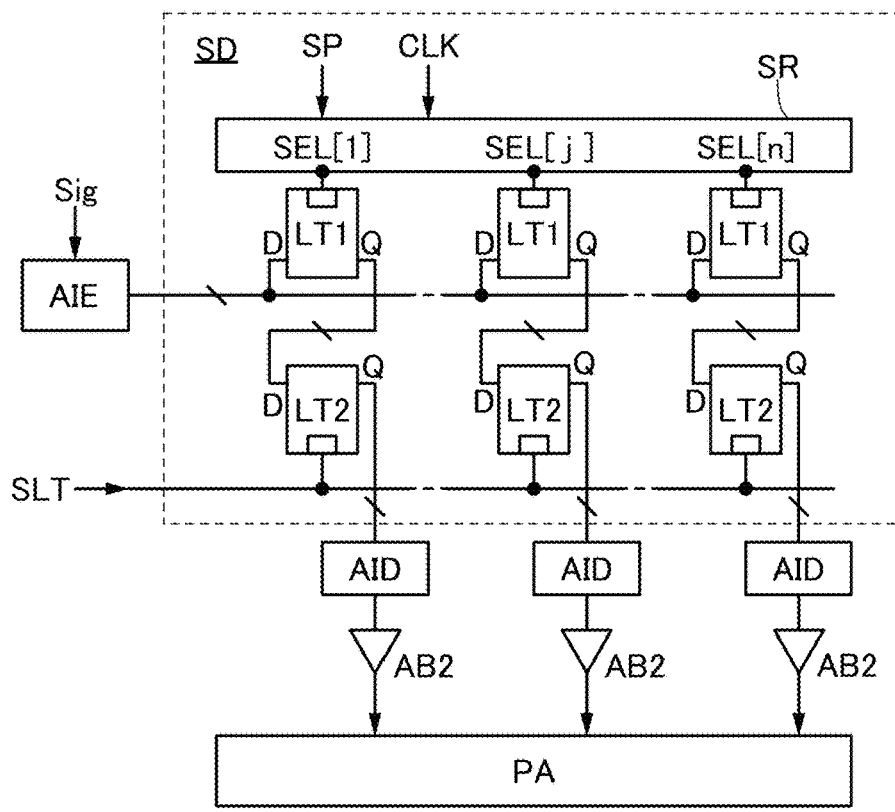
FIG. 3 Block diagrams illustrating structure examples of a semiconductor device.

FIG. 3(A) is a block diagram illustrating the source driver circuit SD, the encoder AIE, the decoder AID, the display portion PA, and an analog buffer circuit AB2. Note that the circuit configuration of the source driver circuit SD is partly illustrated.

The source driver circuit SD includes a shift register SR, latch circuits LT1, and latch circuits LT2. Note that in this embodiment, the pixels (display elements) included in the display portion PA are arranged in a matrix. Accordingly, in the structure example illustrated in FIG. 3(A), the number of the latch circuits LT1 and the number of the latch circuits LT2 included in the source driver circuit SD each correspond to the number of pixels in one row in the display portion PA.

The shift register SR includes a terminal to which a start pulse signal SP is input, a terminal to which the clock signal CLK is input, and an output terminal SEL[1] to an output terminal SEL[n]. Note that n is an integer greater than or equal to 1, and in the case where the pixels (display elements) included in the display portion PA are arranged in a matrix, n is the number of pixels in one row in the display portion PA. The output terminal SEL[1], the output terminal SEL[j], and the output terminal SEL[n] are also illustrated in FIG. 3(A), where j is an integer greater than or equal to 1 and less than or equal to n, in particular.

The latch circuit LT1 and the latch circuit LT2 each include an input terminal D, an output terminal Q, and a clock input terminal.

Next, the connection structure between the source driver circuit SD, the decoder AID, the display portion PA, and the analog buffer circuit AB2, which are illustrated in FIG. 3(A), and the circuit configuration of the source driver circuit SD will be described. Note that the description of the circuit configuration of the source driver circuit SD will be made with a focus on the j-th column.

The intermediate layer ML2 of the encoder AIE is electrically connected to the input terminal D of the latch circuit LT1 of the source driver circuit SD.

The output terminal Q of the latch circuit LT1 is electrically connected to the input terminal D of the latch circuit LT2. The clock input terminal of the latch circuit LT1 is electrically connected to the output terminal SEL[j] of the shift register SR.

The output terminal Q of the latch circuit LT2 is electrically connected to the intermediate layer ML3 of the decoder AID. The output layer OL of the decoder AID is electrically connected to the analog buffer circuit AB2.

An output terminal of the analog buffer circuit AB2 is electrically connected to the display portion PA. Specifically, an electric signal output from the output terminal of the analog buffer circuit AB2 is transmitted to the pixels (display elements) in one column in the display portion PA.

Note that although the source driver circuit SD illustrated in FIG. 3(A) is configured so that one decoder AID corresponds to the pixels in one column in the display portion PA, the structure of the semiconductor device of one embodiment of the present invention is not limited to this structure.

Figure 4A:
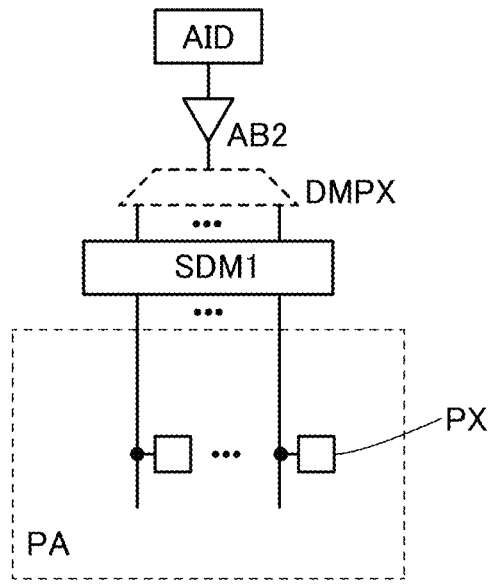
FIG. 4 Block diagrams illustrating configuration examples of a circuit.
Figure 4A:
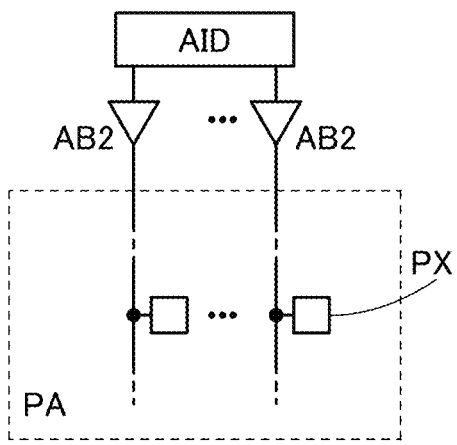
Figure 4A:
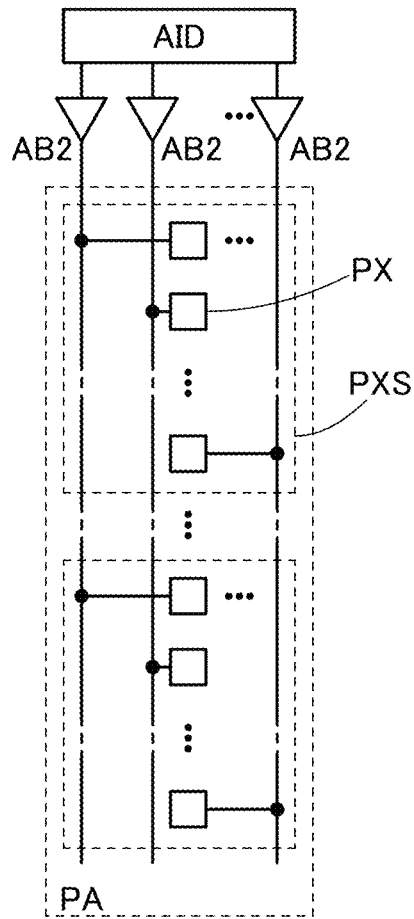
Figure 4A:
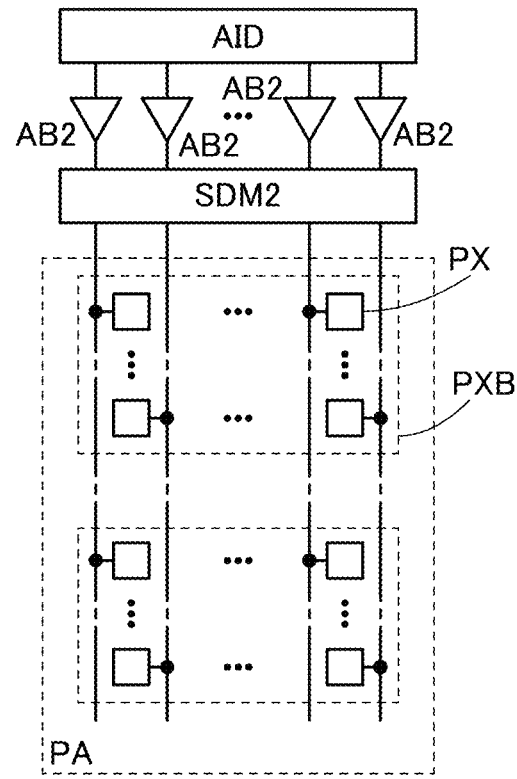

As illustrated in FIG. 4(A), the analog buffer circuit AB2 may be electrically connected to the display portion PA with a demultiplexer DMPX and a driver circuit SDM1 therebetween, for example. The output terminal of the analog buffer circuit AB2 is electrically connected to an input terminal of the demultiplexer DMPX, a plurality of output terminals of the demultiplexer DMPX are electrically connected to a plurality of input terminals of the driver circuit SDMI1, and a plurality of output terminals of the driver circuit SDM1 are electrically connected to pixels PX in a plurality of columns in the display portion PA.

By receiving restored image data from the decoder AID, the demultiplexer DMPX selects a column corresponding to the image data and inputs the image data to the corresponding input terminal of the driver circuit SDM1. The input image data is retained by the driver circuit SDM1. Image data are input to all of the input terminals of the driver circuit SDM1 and the image data are retained, and then the retained image data are transmitted to the pixels PX in the plurality of columns in the display portion PA at a time.

With such a structure, one decoder AID can transmit image data to pixels in a plurality of columns.

Figure 3B:
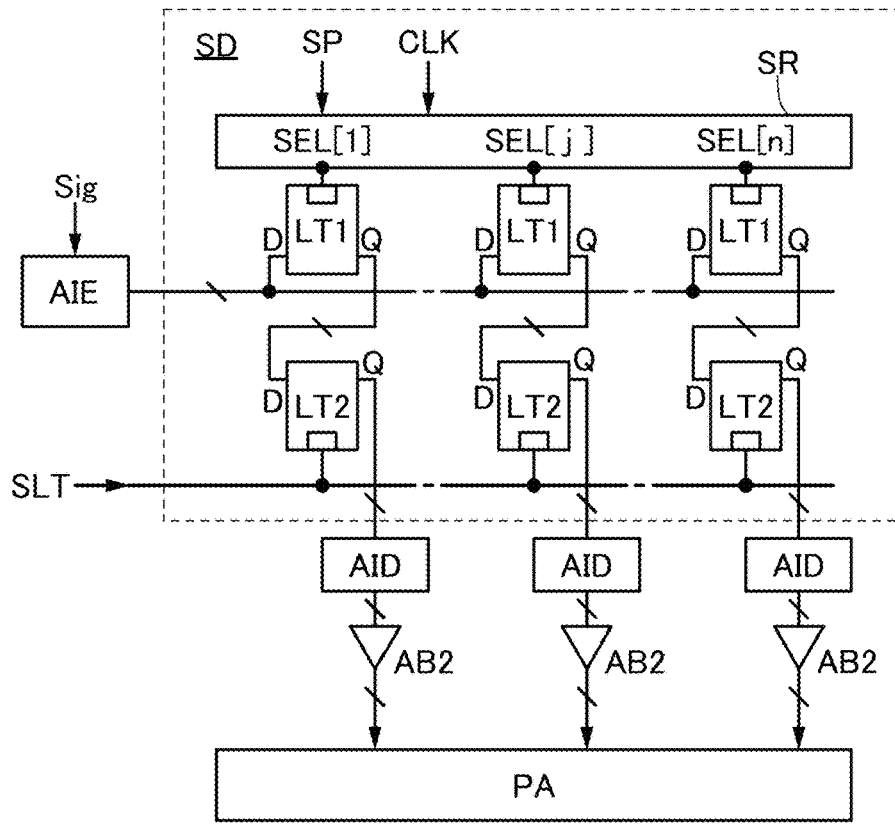

Alternatively, for example, a structure in which the decoder AID includes a plurality of output terminals may be used. A structure example in that case is illustrated in FIG. 3(B). In the structure illustrated in FIG. 3(B), one decoder AID includes a plurality of output terminals, the output terminals are electrically connected to input terminals of a plurality of analog buffer circuits AB2, and the output terminals of the plurality of analog buffer circuits AB2 are electrically connected to the display portion PA.

An example of a connection structure from the decoder AID to the pixel included in the display portion PA in FIG. 3(B) will be described.

FIG. 4(B1) illustrates a structure in which the plurality of output terminals of the decoder AID are electrically connected to the input terminals of the plurality of analog buffer circuits AB2 and the output terminals of the plurality of analog buffer circuits AB2 are electrically connected to the pixels PX in the plurality of columns in the display portion PA.

FIG. 4(B2) illustrates a structure in which the plurality of output terminals of the decoder AID are electrically connected to the input terminals of the plurality of analog buffer circuits AB2 and the output terminals of the plurality of analog buffer circuits AB2 are electrically connected to the pixels PX in one column in the display portion PA. In particular, in FIG. 4(B2), the pixels PX electrically connected to the output terminals of the plurality of analog buffer circuits AB2 are collectively denoted by a pixel column PXS, and a structure in which a plurality of pixel columns PXS are arranged in the column direction is illustrated. Therefore, selection signals are transmitted to all the pixels PX in one pixel column PXS at a time, whereby image data can be transmitted to all the pixels PX in the one pixel column PXS.

Moreover, a structure in which the structure in FIG. 4(B1) and the structure in FIG. 4(B2) are combined is illustrated in FIG. 4(B3). In FIG. 4(B3), the plurality of output terminals of the decoder AID are electrically connected to the input terminals of the plurality of analog buffer circuits AB2, the output terminals of the plurality of analog buffer circuits AB2 are electrically connected to a plurality of input terminals of a driver circuit SDM2, and a plurality of output terminals of the driver circuit SDM2 are electrically connected to the pixels PX in the plurality of columns in the display portion PA. In particular, in FIG. 4(B3), one or a plurality of pixels PX in the row direction and one or a plurality of pixels PX in the column direction, which are electrically connected to the plurality of output terminals of the driver circuit SDM2, are collectively denoted by a pixel portion PXB, and a structure in which a plurality of pixel portions PXB are arranged in the column direction is illustrated. Therefore, selection signals are transmitted to all the pixels PX in one pixel portion PXB at a time, whereby image data can be transmitted to all the pixels PX in the one pixel portion PXB.

Note that the driver circuit SDM2 is described as a driver circuit for retaining image data sequentially and writing the image data to the pixels PX in the pixel portion PXB at a time. However, depending on image data input to the encoder AIE and the decoder AID, the driver circuit SDM2 may be unnecessary.

When the connection structure between the source driver circuit SD and the display portion PA illustrated in FIG. 3(A) is the structure illustrated in FIG. 4(A) or when the connection structure between the source driver circuit SD and the display portion PA illustrated in FIG. 3(B) is changed into any of the structures illustrated in FIGS. 4(B1) to (B3), image data corresponding to a region in the display portion PA (the pixel PX in one row or a plurality of rows, the pixel column PXS, or the pixel portion PXB) and one selection signal are transmitted to the display portion PA, whereby an image corresponding to the image data can be displayed on the region.

Next, the operation of the source driver circuit SD illustrated in FIGS. 3(A) and (B) will be described.

When image data from the image processing portion PP is input to the autoencoder 13, the encoder AIE performs processing for converting the image data into feature-extracted image data and the decoder AID performs processing for restoring the feature-extracted image data to the original image data. In FIGS. 3(A) and (B), image data (in FIGS. 3(A) and (B), the image data transmitted from the image processing portion PP is denoted by a signal Sig) is transmitted from the image processing portion PP to the encoder AIE, and the image data is converted into feature-extracted image data. The feature-extracted image data is input to the source driver circuit SD, and then input to the decoders AID through the latch circuits LT1 and the latch circuits LT2 in the corresponding columns. The decoder AID restores the feature-extracted image data to the original image data.

Specific operation of the semiconductor device of one embodiment of the present invention, including the operation of the latch circuit LT1 and the latch circuit LT2, will be described.

As illustrated in FIGS. 3(A) and (B), image data transmitted from the image processing portion PP is converted into feature-extracted image data by the encoder AIE. The feature-extracted image data is input to the input terminal D of the latch circuit LT1. In this case, the corresponding image data are sequentially stored in the latch circuits LT1 in the columns by the shift register SR. Accordingly, a plurality of latch circuits LT1 retain the image data for one row or a plurality of rows.

The timing at which the plurality of latch circuits LT1 each retain a feature-extracted image is determined by an output signal output from the output terminal SEL[j] of the shift register SR. The shift register SR is a circuit that sequentially outputs output signals from the output terminal SEL[1] to the output terminal SEL[n] in response to the start pulse signal SP, the clock signal CLK, or the like transmitted from the timing controller TC.

Figure 5A:
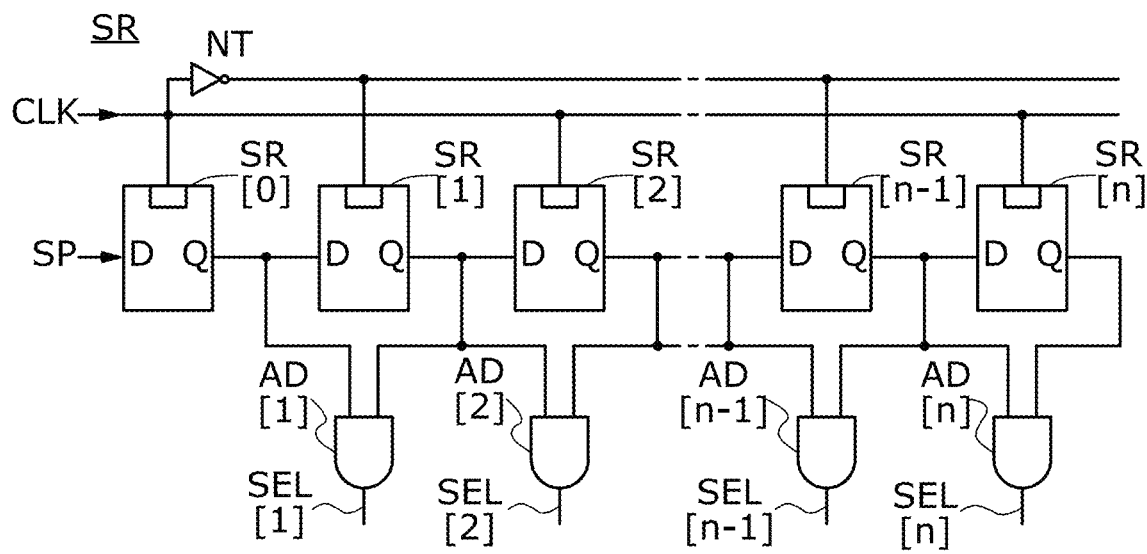
FIG. 5 Circuit diagrams illustrating structure examples of a shift register and a latch circuit.

The shift register SR may have a structure illustrated in FIG. 5(A), for example. The shift register SR illustrated in FIG. 5(A) includes a latch circuit SR[0] to a latch circuit SR[n](here, n is an integer greater than or equal to 1), an AND circuit AD[1] to an AND circuit AD[n], and a NOT circuit NT. Note that in FIG. 5(A), only the latch circuit SR[0], the latch circuit SR[1], the latch circuit SR[2], the latch circuit SR[n−1], the latch circuit SR[n], the AND circuit AD[1], the AND circuit AD[2], the AND circuit AD[n−1], the AND circuit AD[n], and the NOT circuit NT are illustrated, and the illustrations of the other circuits are omitted.

An input terminal D of the latch circuit SR[0] is electrically connected to a wiring that supplies the start pulse signal SP. An output terminal Q of the latch circuit SR[j−1] (here, j is an integer greater than or equal to 1 and less than or equal to n) is electrically connected to an input terminal D of the latch circuit SR[j]. A clock input terminal of the latch circuit SR[$h_{even}$]($h_{even}$ is an even number in integers greater than or equal to 0 and less than or equal to n) is electrically connected to a wiring that supplies the clock signal CLK, and an input terminal of the NOT circuit NT is electrically connected to the wiring. A clock input terminal of the latch circuit SR[$h_{odd}$] ($h_{odd}$ is an odd number in integers greater than or equal to 1 and less than or equal to n) is electrically connected to an output terminal of the NOT circuit NT. Note that in the structure example in FIG. 5(A), n−1 is an odd number and n is an even number.

A first input terminal of the AND circuit AD[j] is electrically connected to the output terminal Q of the latch circuit SR[j−1], and a second input terminal of the AND circuit AD[j] is electrically connected to an output terminal Q of the latch circuit SR[j]. An output terminal of the AND circuit AD[j] is electrically connected to the clock input terminal of the latch circuit LT1 in each column, as the output terminal SEL[j] of the shift register SR. Note that in FIG. 5(A), the output terminal SEL[1], the output terminal SEL[2], the output terminal SEL[n−1], and the output terminal SEL[n] are illustrated, and the illustrations of the other output terminals SEL are omitted.

The start pulse signal SP is input to an input terminal D of the first-stage latch circuit SR[0] in the shift register SR. In the shift register SR, a signal input to an input terminal D of a latch circuit in the previous stage is input from an output terminal Q of the latch circuit in the previous stage to an input terminal D of a latch circuit in the subsequent stage in synchronization with the input clock signal CLK. In other words, an output signal from the output terminal Q of the latch circuit in the previous stage is output from an output terminal Q of the latch circuit in the subsequent stage every time the pulse of the clock signal CLK is transmitted.

Moreover, in the case where a signal output from output terminals Q of the adjacent latch circuits in the shift register SR has a logic value "1" the logic value "1" is output from the output terminals of the AND circuits electrically connected to the output terminals Q of the adjacent latch circuits. In other words, when the logic value "1" is input as the start pulse signal SP and the pulse of the clock signal CLK is input once, the logic value "1" can be sequentially output from the output terminal SEL[1] to the output terminal SEL[n] of the shift register SR.

The clock input terminal of the latch circuit LT1 is connected to one of the output terminal SEL[1] to the output terminal SEL[n] of the shift register SR. Thus, to the shift register SR, the start pulse signal SP is input and the pulse of the clock signal CLK is input a predetermined number of times, whereby the potential of a signal corresponding to the logic value "1" is applied to the clock input terminal of the latch circuit LT1. In this manner, the latch circuit LT1 can retain the image data input to the input terminal D of the latch circuit LT1.

When the signal corresponding to the logic value "1" is input to the clock input terminal of the latch circuit LT1, the signal output from the encoder AIE (feature-extracted image data) is retained by the latch circuit LT1. Note that in the case of transmitting signals (feature-extracted image data) for the corresponding columns, the output terminal of the shift register SR is changed in response to the clock signal CLK; thus, the electronic device 10 is configured so that the signals (feature-extracted image data) are input to the source driver circuit SD in synchronization with the clock signal CLK.

When a signal corresponding to the logic value "0" is input to the clock input terminal of the latch circuit LT1, the potential of the signal (feature-extracted image data) retained by the latch circuit LT1 is output from the output terminal Q. Thus, the signal is input to the input terminal D of the latch circuit LT2.

A plurality of latch circuits LT2 are controlled by a signal SLT. When the signals corresponding to the logic value "1" are input as the signals SLT to the clock input terminals of the plurality of latch circuits LT2, the potential of the signal (feature-extracted image data) input to the input terminal D of the latch circuit LT2 is retained. Then, the signals corresponding to the logic value "0" are input as the signals SLT to the clock input terminals of the plurality of latch circuits LT2, whereby the plurality of latch circuits LT2 can output the potentials of the retained signals (feature-extracted image data) from the output terminals Q at a time.

The signals (feature-extracted image data) output from the plurality of latch circuits LT2 are input to the decoder AID. In this way, the feature-extracted image data are restored to the original image data. The restored image data are output from the decoders AID.

The image data output from the decoder AID is input to an input terminal of the analog buffer circuit AB2. As a result, the image data is amplified by the analog buffer circuit AB2 at an amplification degree of 1 and is output from the output terminal of the analog buffer circuit AB2. Then, the image data output from the output terminal of the analog buffer circuit AB2 is transmitted to the display portion PA. When the image data is written to the corresponding pixel in the display portion PA, an image is displayed on the display device 11.

When the connection structure among the source driver circuit SD, the encoder AIE, and the decoder AID is as illustrated in FIGS. 3(A) and (B), the number of wirings electrically connecting the display device 11 and the receiver 12 illustrated in FIG. 1 can be reduced.

Note that image data retained by the latch circuit LT1 is preferably not data of a digital signal but data of a plurality of analog signals. This is because arithmetic processing is performed utilizing a neural network in the encoder AIE to the decoder AID, and the scale of the circuit configuration of the arithmetic circuit or the like can be smaller in the case where the processing is performed by an analog signal than in the case where the processing is performed by a digital signal. Note that a structure may be used in which image data is input to the encoder AIE as a digital signal, processing of a neural network in the encoder AIE to the decoder AID is performed by a digital signal, and the image data (digital signal) output from the decoder AID is converted into an analog signal by a digital-to-analog converter circuit.

Figure 5B:
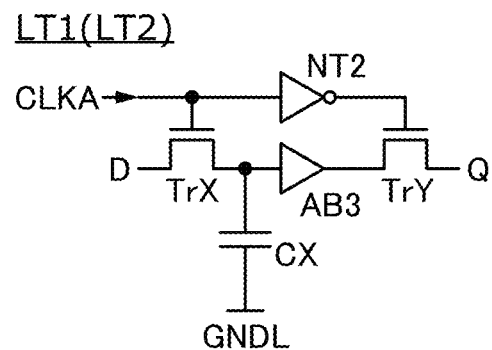

Here, a configuration example of the latch circuit LT1 and the latch circuit LT2 is illustrated in FIG. 5(B). In FIG. 5(B), the latch circuit LT1 (LT2) includes a transistor TrX, a transistor TrY, a NOT circuit NT2, an analog buffer circuit AB3, and a capacitor CX. Note that the configuration example of the latch circuit LT1 and the latch circuit LT2 is not limited to that in FIG. 5(B), and another configuration may be used.

A first terminal of the transistor TrX is electrically connected to the input terminal D, a second terminal of the transistor TrX is electrically connected to an input terminal of the analog buffer circuit AB3, and a gate of the transistor TrX is electrically connected to a wiring that supplies a clock signal CLKA. An output terminal of the analog buffer circuit AB3 is electrically connected to the first terminal of the transistor TrY, an input terminal of the NOT circuit NT2 is electrically connected to the wiring that supplies the clock signal CLKA, and an output terminal of the NOT circuit NT2 is electrically connected to a gate of the transistor TrY. A second terminal of the transistor TrY is electrically connected to the output terminal Q. A first terminal of the capacitor CX is electrically connected to the second terminal of the transistor TrX, and a second terminal of the capacitor CX is electrically connected to a wiring GNDL.

The wiring GNDL is a wiring that supplies a reference potential.

As illustrated in FIG. 5(B), the conduction state and the non-conduction state of each of the transistor TrX and the transistor TrY are switched by the clock signal CLKA. For example, when the signal corresponding to the logic value "1" is input as the clock signal CLKA, the transistor TrX is brought into a conduction state and the transistor TrY is brought into a non-conduction state. Furthermore, for example, when the signal corresponding to the logic value "0" is input as the clock signal CLKA, the transistor TrX is brought into a non-conduction state and the transistor TrY is brought into a conduction state.

When the signal corresponding to the logic value "1" is input as the clock signal CLKA, the potential of the signal input to the input terminal D is retained by the capacitor CX. In addition, the potential of the signal is output from the output terminal of the analog buffer circuit AB3 at an amplification degree of 1. Note that the transistor TrY is in a non-conduction state in this case, so that the potential of the signal output from the output terminal of the analog buffer circuit AB3 is not output from the output terminal Q.

Next, when the signal corresponding to the logic value "0" is input as the clock signal CLKA, the transistor TrX is brought into a non-conduction state and the transistor TrY is brought into a conduction state. Therefore, the potential of the signal output from the output terminal of the analog buffer circuit AB3 is output from the output terminal Q. Moreover, since the transistor TrX is brought into a non-conduction state, the potential of the first terminal of the capacitor CX can be retained.

Note that it is preferable that the transistor TrX of the latch circuit LT1 and the latch circuit LT2 be an OS transistor. It is particularly preferable that an OS transistor use an oxide containing at least one of indium, an element M (the element M is aluminum, gallium, yttrium, or tin), and zinc in a channel formation region. The use of such an OS transistor as the transistor TrX enables the off-state current of the transistor to be extremely low. That is, leakage of the potential retained by the capacitor CX can be prevented.

Note that the source driver circuit SD may have a structure in which the analog buffer circuit AB2 is power gated until image data for one row or a plurality of rows are stored in the latch circuit LT1, and the operation of the analog buffer circuit AB2 is started when the row is selected by the gate driver circuit. Such a structure can reduce power consumed for driving the source driver circuit SD.

Note that image data can be retained for a long time when OS transistors are used in the pixels in the display portion PA. As a result, in the case of displaying a still image, the number of image data rewriting can be reduced, that is, the frame rate can be low. In this specification and the like, a method for lowering the frame rate and driving a display device is called idling stop (IDS) driving. Note that the detail of the idling stop (IDS) driving will be described in Embodiment 6.

No image data is necessary to be supplied to the display portion PA during the idling stop (IDS) driving; thus, each of the circuits can be power gated. Accordingly, the power consumption of the electronic device 10 can be reduced.

Figure 6:
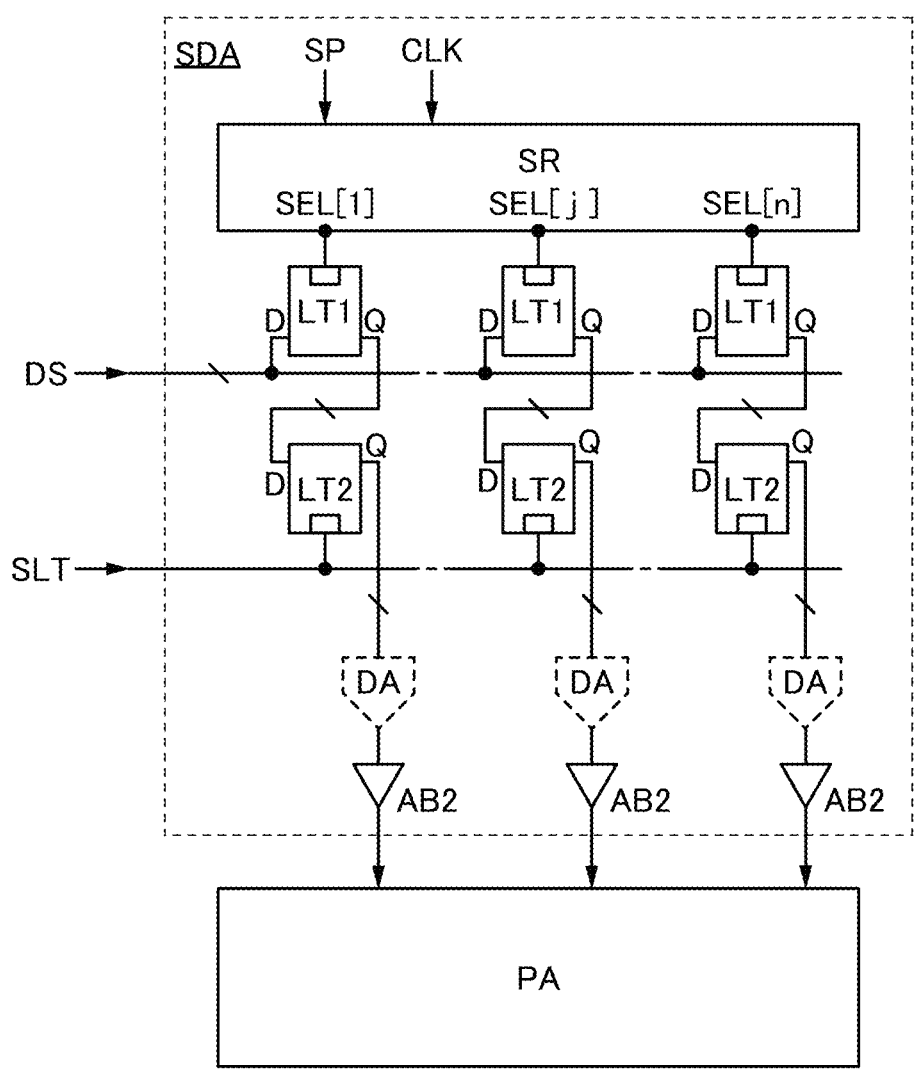
FIG. 6 A block diagram illustrating a structure example of a semiconductor device.

FIG. 6 is a block diagram of a general source driver circuit. A source driver circuit SDA includes the shift register SR, the latch circuits LT1, the latch circuits LT2, digital-to-analog converter circuits DA, and the analog buffer circuits AB2. Note that the number of the analog buffer circuits AB2, that of the latch circuits LT1, and that of the latch circuits LT2 included in the source driver circuit SDA correspond to, in the case where pixels (display elements) in the display portion PA are arranged in a matrix, the number of pixels in one row. That is, the source driver circuit SDA has a structure in which the encoder AIE is removed from the circuit illustrated in FIG. 3(A) and the digital-to-analog converter circuit DA is provided instead of the decoder AID.

Next, the specific circuit configuration of the source driver circuit SDA will be described. Note that the description will be made with a focus on one column in the source driver circuit SDA.

The output terminal of the shift register SR is electrically connected to the clock input terminal of the latch circuit LT1, and the output terminal Q of the latch circuit LT1 is electrically connected to the input terminal D of the latch circuit LT2. The output terminal Q of the latch circuit LT2 is electrically connected to an input terminal of the digital-to-analog converter circuit DA, and an output terminal of the digital-to-analog converter circuit DA is electrically connected to the input terminal of the analog buffer circuit AB2. The output terminal of the analog buffer circuit AB2 is electrically connected to the display portion PA. Specifically, an electric signal output from the output terminal of the analog buffer circuit AB2 is transmitted to the pixels (display elements) in one column in the display portion PA.

As illustrated in FIG. 6, image data DS, which is a digital signal, is input to the input terminal D of the latch circuit LT1. In this case, the corresponding image data DS are sequentially stored in the latch circuits LT1 in the columns by the shift register SR. Accordingly, the plurality of latch circuits LT1 retain the image data DS for one row.

After that, the signals SLT are input to the clock input terminals of the latch circuits LT2, whereby the image data DS for one row retained by the plurality of latch circuits LT1 are stored in the plurality of latch circuits LT2 at a time.

The image data DS stored in the plurality of latch circuits LT2 are converted into analog signals by the digital-to-analog converter circuits DA and transmitted to the display portion PA through the analog buffer circuits AB2. When the image data is written to the corresponding pixel in the display portion PA, an image is displayed on the display device 11.

Here, the source driver circuit SD in FIGS. 3(A) and (B) and the source driver circuit SDA are compared. The source driver circuit SDA handles image data as a digital signal until the image data is input to the digital-to-analog converter circuit DA; thus, due to such a circuit configuration, the image data is required to be retained by the latch circuit LT1 and the latch circuit LT2 row by row and output to the display portion PA. On the contrary, the source driver circuit SD can convert image data for one row or a plurality of rows into a feature-extracted image by the encoder AIE and the decoder AID, and then restore the feature-extracted image to the original image data and output the image data to the display portion PA. In particular, in the case of handling image data for a plurality of rows, the latch circuit LT1 and the latch circuit LT2 of the source driver circuit SD need not capture new image data for a plurality of rows until the image data for a plurality of rows are written to the display portion PA.

In the case of writing an image for one frame to the display portion PA, the number of times of image capturing into the latch circuit LT1 and the latch circuit LT2 can be smaller in the source driver circuit SD than in the source driver circuit SDA. Therefore, if the source driver circuit SD is configured, power consumption at the time of writing an image to the display portion PA can be reduced.

Note that one embodiment of the present invention is not limited to the circuit configuration of the source driver circuit SD illustrated in FIGS. 3(A) and (B). Depending on the case, according to circumstances, or as needed, the circuit configuration of the source driver circuit SD can be changed.

Note that this embodiment can be combined with the other embodiment in this specification as appropriate.

Embodiment 2

In this embodiment, a structure example of the autoencoder described in the above embodiment will be described. Specifically, a structure example in which a convolutional neural network (CNN) is employed for the feature extraction in the encoder included in the autoencoder will be described.
<Convolutional Neural Network>

Figure 7:
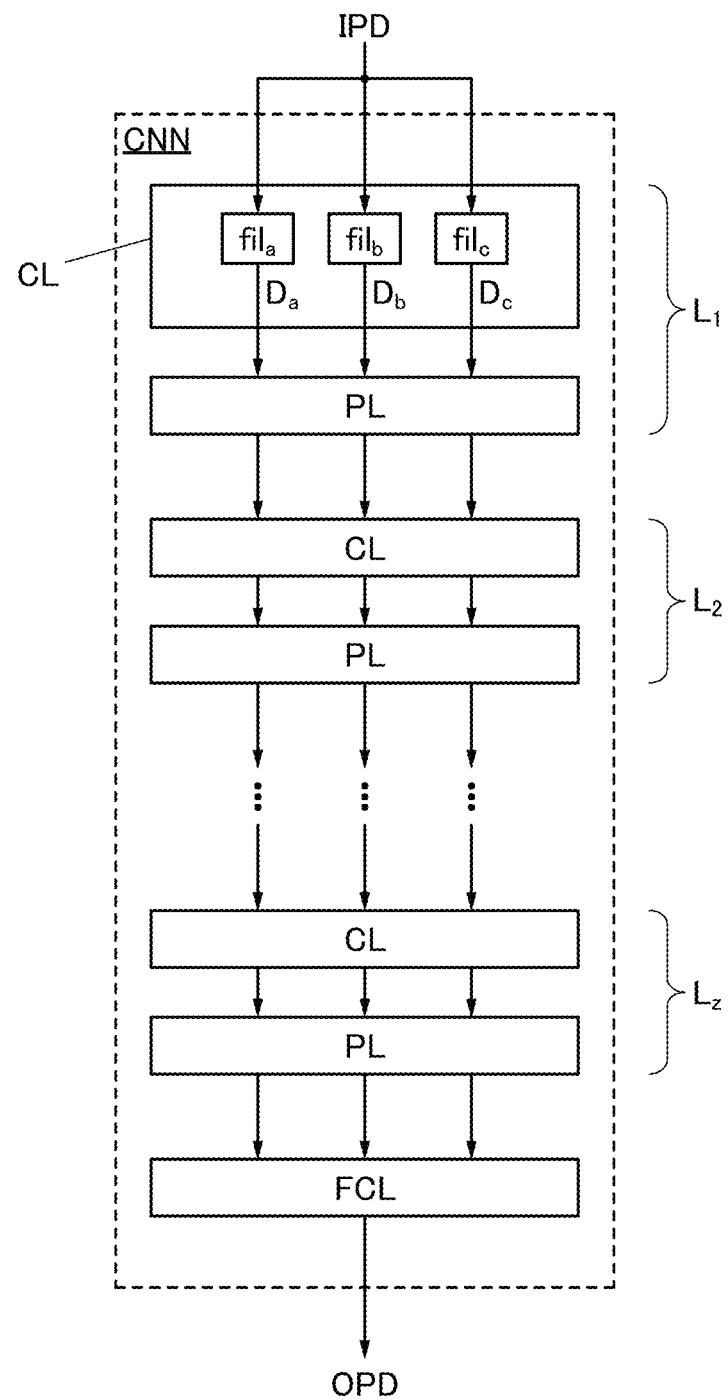
FIG. 7 A diagram illustrating a structure example of a CNN.

FIG. 7 illustrates a configuration example of the CNN. The CNN is composed of a convolution layer CL, a pooling layer PL, and a fully connected layer FCL. In the case of using the CNN in the encoder AIE, image data IPD output from the image processing portion PP is input to the CNN and then the feature extraction is performed.

The convolution layer CL has a function of performing convolution on the image data. The convolution is performed by repeating the product-sum operation using part of the image data and the filter value of a weight filter. As a result of the convolution in the convolution layer CL, a feature of an image is extracted.

For the convolution, one or a plurality of weight filters can be used. In the case of using a plurality of weight filters, a plurality of features of the image data can be extracted. FIG. 7 illustrates an example in which three filters (filters $fil_a$, $fil_b$, and $fil_c$) are used as weight filters. The image data input to the convolution layer CL is subjected to filter processing using the filters $fil_a$, $fil_b$, and $fil_c$, so that image data $D_a$, $D_b$, and $D_c$ are generated.

The image data $D_a$, $D_b$, and $D_c$ subjected to the convolution are converted using an activation function, and then output to the pooling layer PL. As the activation function, a ReLU (Rectified Linear Units) or the like can be used. The ReLU is a function that outputs "0" when an input value is negative and outputs the input value as it is when an input value is greater than or equal to "0." As the activation function, a sigmoid function, a tan h function, or the like can also be used.

The pooling layer PL has a function of performing pooling on the image data input from the convolution layer CL. The pooling is processing in which the image data is partitioned into a plurality of regions, and predetermined data is extracted from each of the regions and the data are arranged in a matrix. By the pooling, the image data is reduced while the feature-extracted in the convolution layer CL remains. Note that as the pooling, max pooling, average pooling, Lp pooling, or the like can be used.

In the CNN, the feature extraction is performed using the above convolution processing and pooling processing. Note that the CNN can be composed of a plurality of convolution layers CL and a plurality of pooling layers PL. FIG. 7 illustrates a configuration in which z layers L ($L_1$ to $L_z$) (here, z is an integer greater than or equal to 1) each of which consists of the convolution layer CL and the pooling layer PL are provided and the convolution processing and the pooling processing are performed z times. In this case, feature extraction can be performed in each layer L, which enables more advanced feature extraction.

The fully connected layer FCL has a function of determining an image using the image data subjected to the convolution and the pooling. All nodes in the fully connected layer FCL are connected to all nodes in the layer prior to the fully connected layer FCL (here, the pooling layer PL). The image data output from the convolution layer CL or the pooling layer PL is a two-dimensional feature map and is unfolded into a one-dimensional feature map when input to the fully connected layer FCL. Then, image data OPD obtained as a result of the inference by the fully connected layer FCL is output.

Note that the configuration of the CNN is not limited to the configuration in FIG. 7. For example, each pooling layer PL may be provided for a plurality of convolution layers CL. Moreover, in the case where the positional information of the extracted feature is desired to be left as much as possible, the pooling layer PL may be omitted.

Furthermore, in the case of classifying images using the output data from the fully connected layer FCL, an output layer electrically connected to the fully connected layer FCL may be provided. The output layer can output a classification class using a softmax function or the like as a likelihood function.

In addition, the CNN can perform supervised learning using image data as training data and teacher data. In the supervised learning, a backpropagation method can be used, for example. Owing to the learning in the CNN, the filter value of the weight filter, the weight coefficient of the fully connected layer, or the like can be optimized.
<Convolution Processing>

Next, a specific example of the convolution processing performed in the convolution layer CL will be described.

Figure 8A:
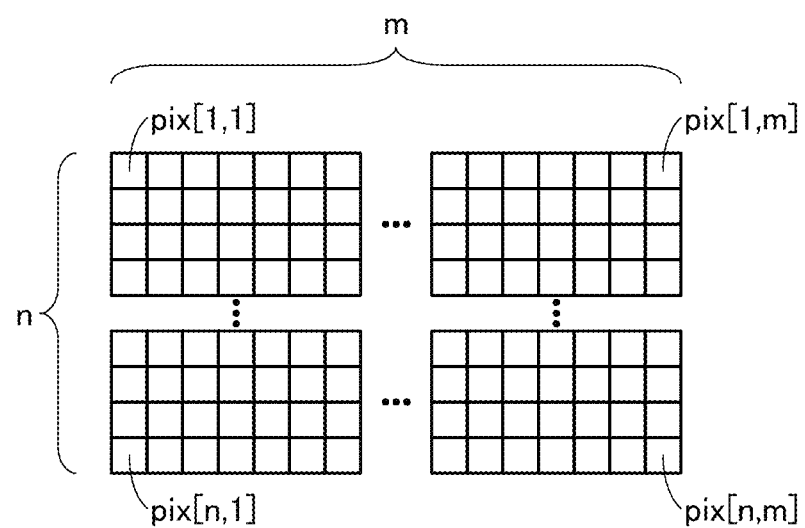
FIG. 8 Diagrams illustrating structure examples of a pixel and a filter.

FIG. 8(A) illustrates a plurality of pixels pix arranged in a matrix of n rows and m columns (here, n and m are each an integer greater than or equal to 1) in the display portion PA. In pixels pix[1, 1] to pix[n, m], g[1, 1] to g[n, m] are stored as image data, respectively.

Figure 8B:
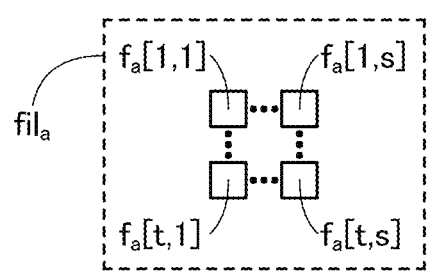

The convolution is performed by the product-sum operation using image data g and the filter value of a weight filter. FIG. 8(B) illustrates the filter $fil_a$ composed of addresses in t rows and s columns (here, t is an integer greater than or equal to 1 and less than or equal to n, and s is an integer greater than or equal to 1 and less than or equal to m). Filter values $f_a[1, 1]$ to $f_a[t, s]$ are assigned to the addresses of the filter $fil_a$.

In the case of performing feature extraction using the convolution, data showing certain features (referred to as feature data) can be stored as the filter values $f_a[1, 1]$ to $f_a[t, s]$. Then, in the feature extraction, the data and image data are compared with each other. In addition, in the case of performing image processing such as edge processing or blurring processing using the convolution, parameters necessary for the image processing can be stored as the filter values $f_a[1, 1]$ to $f_a[s, t]$. As an example, the operation in the case of performing feature extraction will be described in detail below.

Figure 9A:
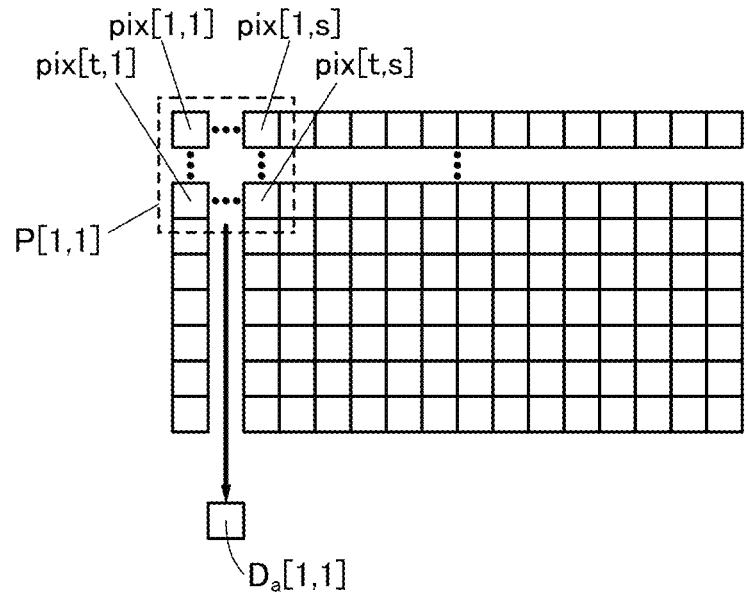
FIG. 9 Diagrams illustrating an example of convolution processing.
Figure 9B:
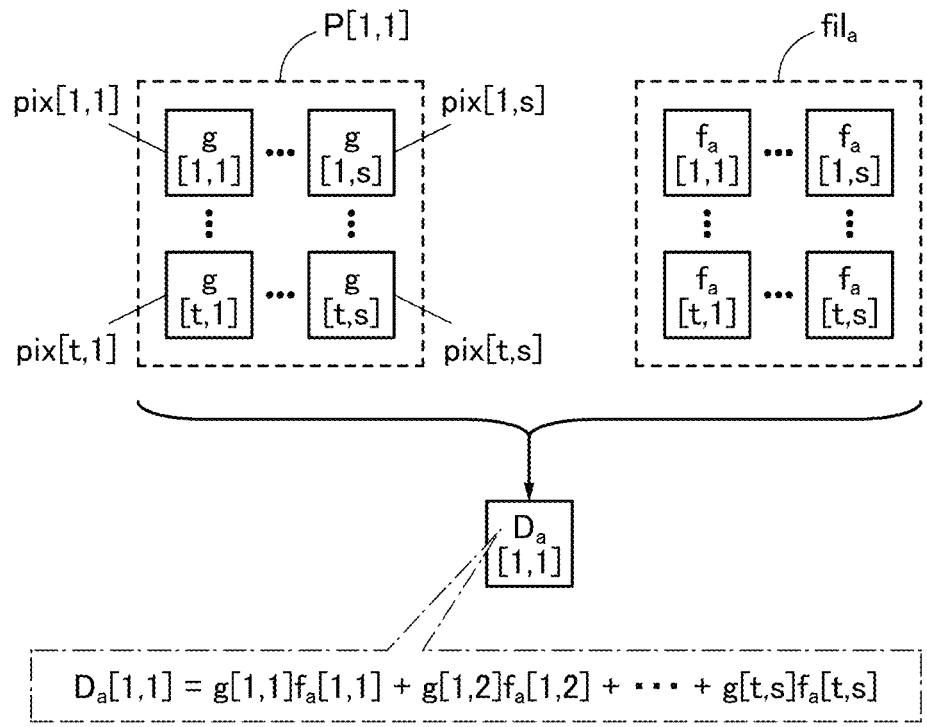

FIG. 9(A) illustrates a state where filter processing using the filter $fil_a$ is performed on a pixel region P[1, 1] whose corners are the pixel pix[1, 1], the pixel pix[1, s], the pixel pix[t, 1], and the pixel pix[t, s] to obtain data $D_a[1, 1]$. This filter processing is, as illustrated in FIG. 9(B), processing in which image data in one pixel pix in the pixel region P[1, 1] is multiplied by the filter value $f_a$ of the filter $fil_a$ that corresponds to the address of the pixel pix, and the multiplication results for the pixels pix are added up together. In other words, the product-sum operation using the image data g[v, w] (here, v is an integer greater than or equal to 1 and less than or equal to t, and w is an integer greater than or equal to 1 and less than or equal to s) and the filter value $f_a[v, w]$ is performed in the pixels pix in the pixel region P[1, 1]. The data $D_a[1, 1]$ can be expressed by the following formula.

$$D_a[1, 1] = \sum_{v=1}^{t} \sum_{w=1}^{s} g[v, w] \cdot f_a[v, w] \quad \text{[Formula 1]}$$

Figure 10:
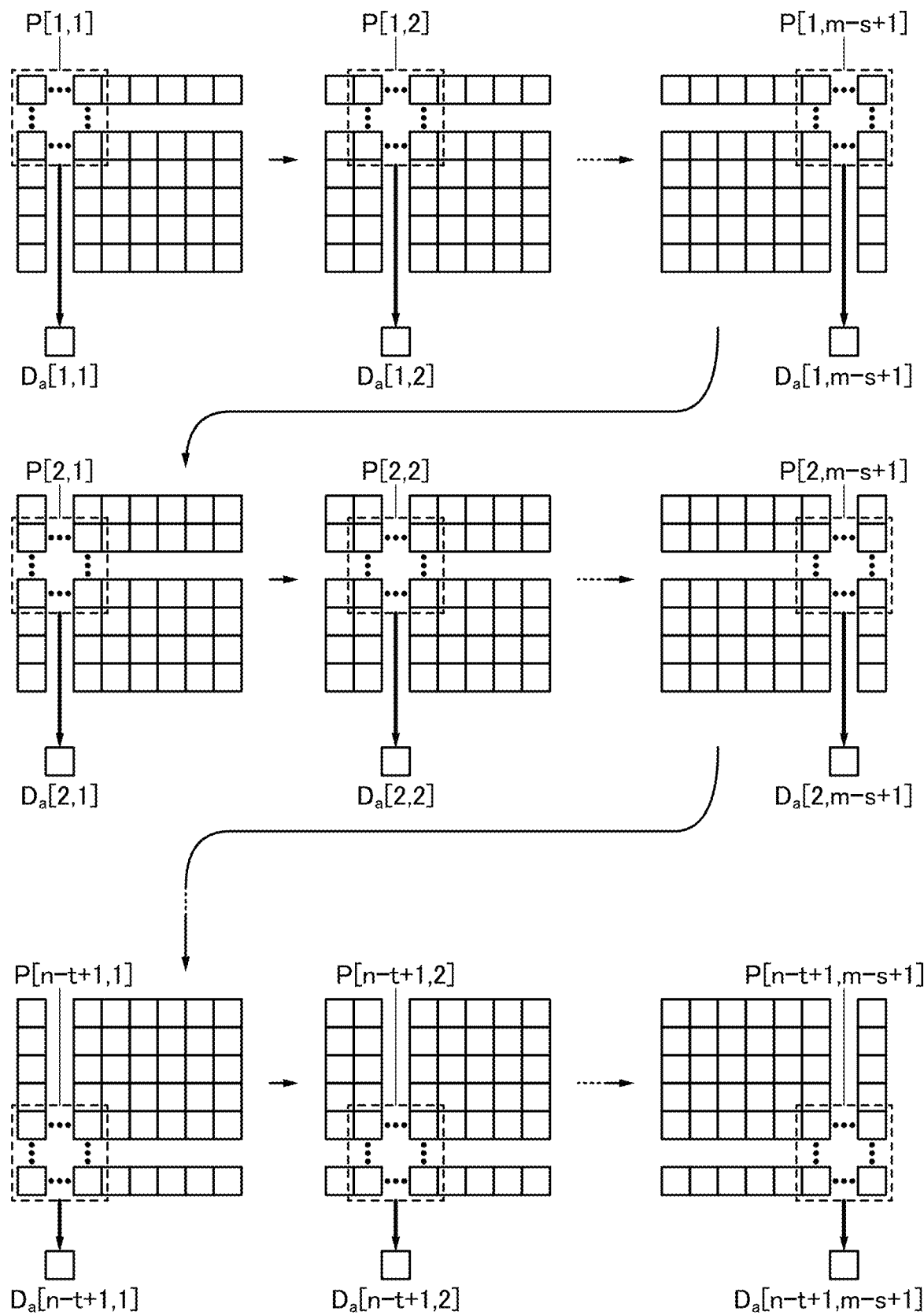
FIG. 10 A diagram illustrating an example of convolution processing.

After that, the above product-sum operation is sequentially performed also in other pixel regions. Specifically, the filter processing is performed on a pixel region P[1, 2] whose corners are the pixel pix[1, 2], the pixel pix[1, s+1], the pixel pix[t, 2], and the pixel pix[t, s+1] to obtain data $D_a[1, 2]$, as illustrated in FIG. 10. Subsequently, the data $D_a$ is obtained in each pixel region P in a similar manner while the pixel region P is moved column by column.

Then, data $D_a[1, m-s+1]$ is obtained from a pixel region P[1, m-s+1] whose corners are the pixel pix[1, m-s+1], the pixel pix[1, m], the pixel pix[t, m-s+1], and the pixel pix[t, m], and after the acquisition of data $D_a$ for one row is completed, the pixel region P is moved by one pixel row and data $D_a$ for one row is sequentially acquired in a similar manner. FIG. 10 illustrates a state where data $D_a[1, l]$ to [2, m-s+1] are obtained from pixel regions P[2, 1] to [2, m-s+1].

When the above operation is repeated and data $D_a[n-t+1, m-s+1]$ is obtained from a pixel region P[n-t+1, m-s+1] whose corners are the pixel pix[n-t+1, m-s+1], the pixel pix[n-t+1, m], the pixel pix[n, m-s+1], and the pixel pix[n, m], the filter processing using the filter $fil_a$ on all pixel regions P is completed.

In such a manner, a pixel region P having pixels arranged in a matrix of t rows and s columns is selected from the pixel pix[1, 1] to the pixel pix[n, m] and the filter processing using the filter $fil_a$ is performed on the pixel region P. The data $D_a[x, y]$ obtained through the filter processing using the filter $fil_a$ and performed on the pixel region P whose corners are the pixel pix[x, y] (here, x is an integer greater than or equal to 1 and less than or equal to n-t+1, and y is an integer greater than or equal to 1 and less than or equal to m-s+1), the pixel pix[x, y+s-1], the pixel pix[x+t-1, y], and the pixel pix[x+t-1, y+s-1] can be expressed by the following formula.

$$D_a[x, y] = \sum_{v=1}^{t} \sum_{w=1}^{s} g[x+v-1, y+w-1] \cdot f_a[v, w] \quad \text{[Formula 2]}$$

Figure 11:
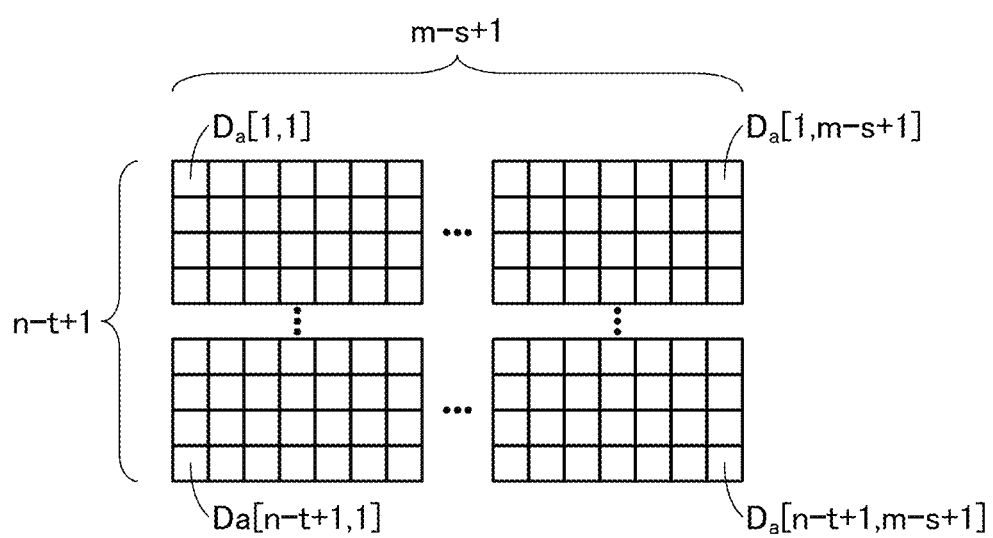
FIG. 11 A diagram illustrating a structure example of a feature map.

As described above, the data $D_a[1, 1]$ to $D_a[n-t+1, m-s+1]$ can be obtained when the filter processing using the filter $fil_a$ is performed on all the pixel regions in t rows and s columns that can be selected from a display region having the pixel pix[1, 1] to the pixel pix[n, m]. Then, the data $D_a[1, 1]$ to the data $D_a[n-t+1, m-s+1]$ are arranged in a matrix in accordance with the addresses, so that a feature map illustrated in FIG. 11 can be obtained.

In the above-described manner, the convolution processing is performed by the product-sum operation using the image data and the filter values to extract the feature of an image.

Note that in the case where a plurality of filters fil are provided in the convolution layer CL as illustrated in FIG. 7, the convolution processing is performed for each filter fil.

Moreover, although described here is an example in which the pixel region P is moved by one pixel column and/or one pixel row, the moving distance of the pixel region P can be set freely.

<Semiconductor Device>

Figure 12:
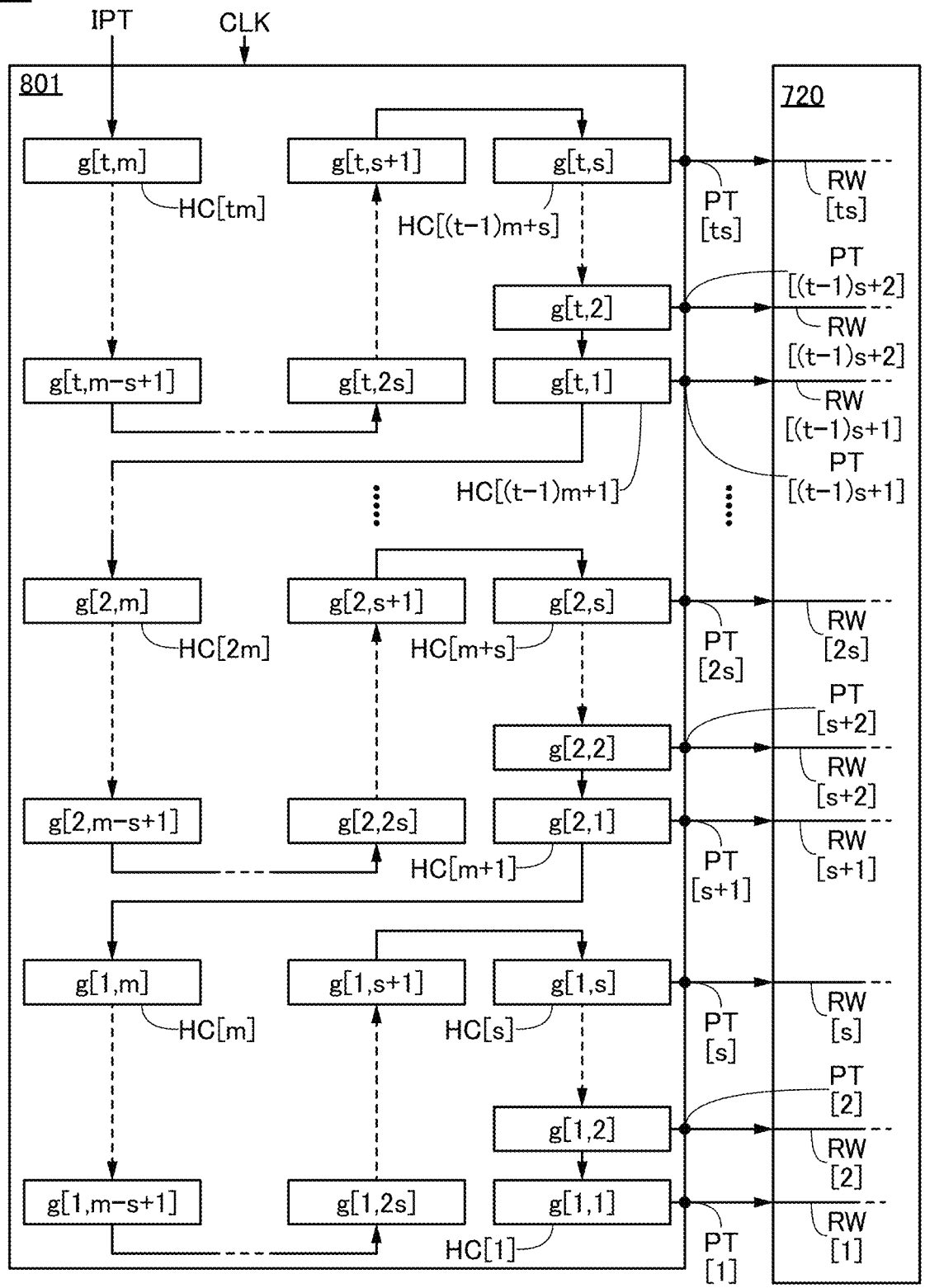
FIG. 12 A diagram illustrating an example of a semiconductor device.

Next, a structure example of a semiconductor device having a function of performing the above convolution processing will be described. FIG. 12 illustrates a structure example of a semiconductor device 800. The semiconductor device 800 includes a memory cell array 720 and a shift register 801.

The semiconductor device 800 will be described by using, as an example, the above-described case where the convolution processing is performed using the filters $fil_a$ in t rows and s columns on the display portion including the pixels pix arranged in a matrix of n rows and m columns as an example.

The shift register 801 includes t×m stages of retention circuits HC, an input terminal IPT, t×s output terminals PT, and a terminal to which the clock signal CLK is input. Note that in this specification and the like, the t×m stages of retention circuits HC are described as a retention circuit HC[1] to a retention circuit HC[tm], and the t×s output terminals PT are described as an output terminal [1] to an output terminal [ts]. In addition, among the retention circuit HC[1] to the retention circuit HC[tm], only the retention circuit HC[1], the retention circuit HC[s], the retention circuit HC[m], the retention circuit HC[m+1], the retention circuit HC[m+s], the retention circuit HC[2m], the retention circuit HC[(t-1)m+1], the retention circuit HC[(t-1)m+s], and the retention circuit HC[tm] are denoted by reference numerals in FIG. 12. Moreover, among the output terminal [1] to the output terminal [ts], only the output terminal PT[1], the output terminal PT[2], the output terminal PT[s], the output terminal PT[s+1], the output terminal PT[s+2], the output terminal PT[2s], the output terminal PT[(t-1)s+1], the output terminal PT[(t-1)s+2], and the output terminal PT[ts] are denoted by reference numerals in FIG. 12.

Among the retention circuit HC[1] to the retention circuit HC[tm], the retention circuit HC[dm+1] to the retention circuit HC[dm+s] (here, d is an integer greater than or equal to 0 and less than or equal to t−1) are electrically connected to the output terminal PT[ds+1] to the output terminal PT[(d+1)s], respectively. That is, in FIG. 12, the retention circuit HC[1] to the retention circuit HC[s] are electrically connected to the output terminal PT[1] to the output terminal PT[s], respectively; the retention circuit HC[m+1] to the retention circuit HC[m+s] are electrically connected to the output terminal PT[s+1] to the output terminal PT[2s], respectively; and the retention circuit HC[(t−1)m+1] to the retention circuit HC[(t−1)m+s] are electrically connected to the output terminal PT[s+1] to the output terminal PT[ts], respectively.

The memory cell array 720 includes a wiring RW[1] to a wiring RW[ts]. The wiring RW[1] to the wiring RW[ts] are electrically connected to the output terminal PT[1] to the output terminal PT[ts], respectively. Note that among the wiring RW[1] to the wiring RW[ts], only the wiring RW[1], the wiring RW[2], the wiring RW[s], the wiring RW[s+1], the wiring RW[s+2], the wiring RW[2s], the wiring RW[(t−1)s+1], the wiring RW[(t−1)s+2], and the wiring RW[ts] are denoted by reference numerals in FIG. 12.

The memory cell array 720 also includes ts rows of memory cells (not illustrated in FIG. 12). In the memory cells, the filter values $f_a[1, 1]$ to $f_a[t, s]$ of the filter $fil_a$ used in the convolution processing are retained. Note that for the specific structure of the memory cell array 720, refer to Embodiment 3.

As will also be described in Embodiment 3, the memory cell array 720 is one of components of a product-sum operation circuit 700, and the product-sum operation circuit 700 can perform the product-sum operation using data retained by the memory cells (filter values, weight coefficients, or the like) and data input to the wirings RW (image data or the like).

The image data g[1, 1] to g[n, m] stored in the pixels pix[1, 1] to pix[n, m] in the display portion PA are sequentially input to the input terminal IPT of the shift register 801. The shift register 801 transmits image data retained by the retention circuits HC to the retention circuits HC in the subsequent stages every time the pulse of the clock signal CLK is input. FIG. 12 is a diagram in which the image data g[1, 1] is transmitted to the retention circuit HC[1] and the image data g[t, m] is transmitted to the retention circuit HC[tm].

In this case, image data retained by the retention circuit HC[dm+1] to the retention circuit HC[dm+s] are output from the output terminal PT[ds+1] to the output terminal PT[(d+1)s], respectively. That is, in FIG. 12, the image data g[1, 1] to the image data g[1, s] are output from the output terminal PT[1] to the output terminal PT[s], respectively, the image data g[2, 1] to the image data g[2, s] are output from the output terminal PT[s+1] to the output terminal PT[2s], respectively, and the image data g[t, 1] to the image data g[t, s] are output from the output terminal PT[(t−1)s+1] to the output terminal PT[ts], respectively.

Accordingly, image data retained by the retention circuit HC[dm+1] to the retention circuit HC[dm+s] are respectively transmitted to the wiring RW[ds+1] to the wiring RW[(d+1)s] of the memory cell array 720. Note that the image data transmitted to the wiring RW[1] to the wiring RW[ts] in this case correspond to the image data in the pixel region P[1, 1] illustrated in FIGS. 9(A) and (B).

The image data in the pixel region P[1, 1] output to the wiring RW[1] to the wiring RW[ts] are supplied to memory cells in one column in the memory cell array 720. In this case, the filter values $f_a[1, 1]$ to $f_a[t, s]$ are retained by the memory cells in one column, and the product-sum operation using the image data and the filter values $f_a$ is performed. For the details of the product-sum operation, refer to Embodiment 3.

Through the product-sum operation using the image data in the pixel region P[1, 1] and the filter $fil_a$, the data $D_a[1, 1]$ illustrated in FIG. 9 can be obtained. In this manner, the shift register 801 has a function of outputting t×s image data to the memory cell array 720 at a time; thus, the convolution processing can be performed at high speed.

Note that in the case of increasing the number of filters used in the convolution processing, the number of columns in the memory cell array 720 is set equal to the number of the filters. In the case of using the filter $fil_a$, the filter $fil_b$, and the filter file which are illustrated in FIG. 7 in the convolution processing, for example, a structure may be used in which the filter values of the filter $fil_a$ are stored in the memory cells in the first column in the memory cell array 720, the filter values of the filter $fil_b$ are stored in the memory cells in the second column in the memory cell array 720, and the filter values of the filter file are stored in the memory cells in the third column in the memory cell array 720. When a plurality of filters are stored in the memory cell array 720 as described above, the product-sum operations for the filters can be performed in parallel by simply outputting the pixel region P from the shift register 801 once. Thus, a plurality of convolution processings can be performed at the same time.

Figure 13:
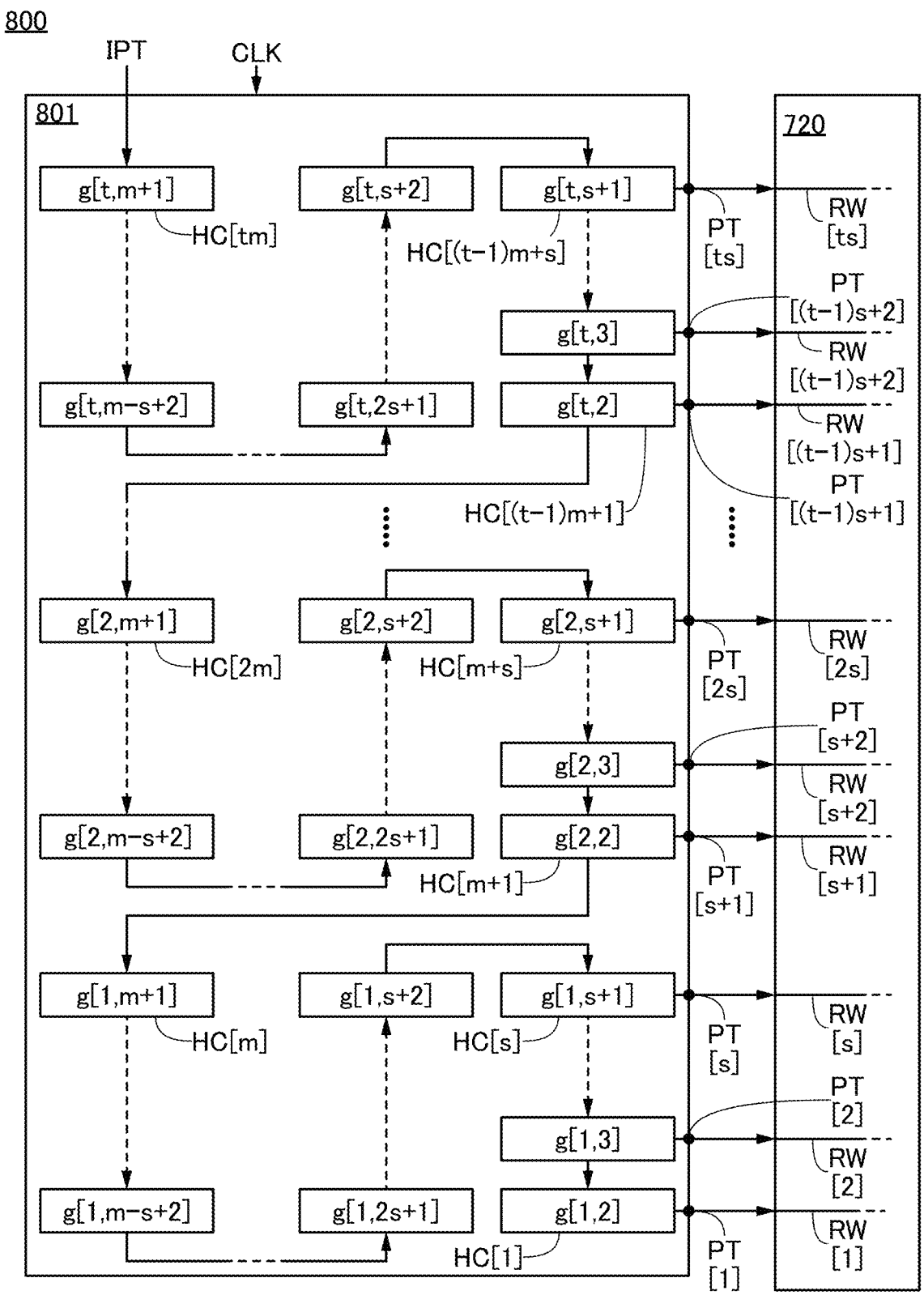
FIG. 13 A diagram illustrating an example of a semiconductor device.

When the pulse of a next clock signal CLK is input to the shift register 801 in the semiconductor device 800 illustrated in FIG. 12, the image data g[1, 2] to the image data g[t, m] respectively stored in the retention circuit HC[1] to the retention circuit HC[tm] of the shift register 801 are transmitted to retention circuits HC in the subsequent stage, as illustrated in FIG. 13. Note that since the shift register 801 does not include a retention circuit in the subsequent stage of the retention circuit HC[1], the image data g[1, 1] is not retained. The retention circuit HC[1] retains the image data g[1, 2] transmitted from the retention circuit HC[2] in the previous stage. Moreover, the retention circuit HC[tm] retains the image data g[t, m+1] transmitted from the input terminal IPT.

In this case, image data retained by the retention circuit HC[dm+1] to the retention circuit HC[dm+s] are output from the output terminal PT[ds+1] to the output terminal PT[(d+1)s], respectively. That is, in FIG. 13, the image data g[1, 2] to the image data g[1, s+1] are output from the output terminal PT[1] to the output terminal PT[s], respectively, the image data g[2, 2] to the image data g[2, s+1] are output from the output terminal PT[s+1] to the output terminal PT[2s], respectively, and the image data g[t, 2] to the image data g[t, s+1] are output from the output terminal PT[(t−1)s+1] to the output terminal PT[ts], respectively.

Accordingly, image data retained by the retention circuit HC[dm+1] to the retention circuit HC[dm+s] are respectively transmitted to the wiring RW[ds+1] to the wiring RW[(d+1)s] of the memory cell array 720. Note that the image data transmitted to the wiring RW[1] to the wiring RW[ts] in this case correspond to the image data in the pixel region P[1, 2] illustrated in FIG. 10.

The image data in the pixel region P[1, 2] transmitted by the wiring RW[1] to the wiring RW[ts] are subjected to the filter processing using the filter $fil_a$ as in the pixel region P[1, 1]. Specifically, the data $D_a[1, 2]$ illustrated in FIG. 10 can be obtained through the product-sum operation using the image data in the pixel region P[1, 2] and the filter values $f_a[1, 1]$ to $f_a[t, s]$ retained by the memory cells in one column.

As described above, to the shift register 801, new image data is input from the input terminal IPT and the pulse of the clock signal CLK is input, whereby image data in the pixel region P that can be selected from the pixel pix[1, 1] to the pixel pix[n, m] can be sequentially input to the memory cell array 720.

Figure 14:
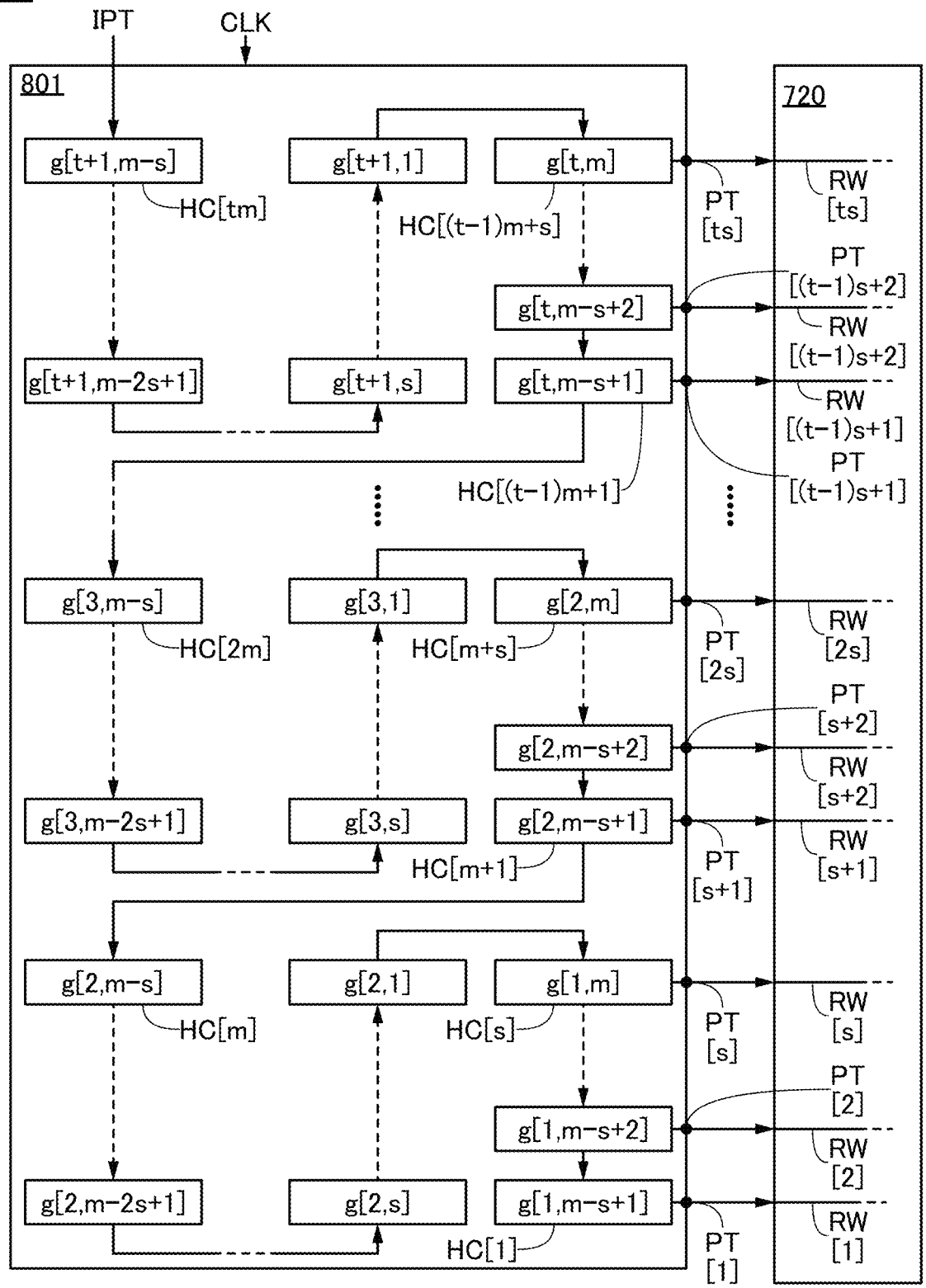
FIG. 14 A diagram illustrating an example of a semiconductor device.

The semiconductor device 800 illustrated in FIG. 14 is in a state where (m−s−1) pulses of the clock signal CLK are input and image data g are sequentially input from the input terminal IPT after the state illustrated in FIG. 13. That is, in FIG. 14, the image data g[1, m−s+1] to the image data g[1, m] are output from the output terminal PT[1] to the output terminal PT[s], respectively, the image data g[2, m−s+1] to the image data g[2, m] are output from the output terminal PT[s+1] to the output terminal PT[2s], respectively, and the image data g[t, m−s+1] to the image data g[t, m] are output from the output terminal PT[(t−1)s+1] to the output terminal PT[ts], respectively.

Accordingly, image data retained by the retention circuit HC[dm+1] to the retention circuit HC[dm+s] are respectively transmitted to the wiring RW[ds+1] to the wiring RW[(d+1)s] of the memory cell array 720. Note that the image data transmitted to the wiring RW [1] to the wiring RW [ts] in this case correspond to the image data in the pixel region P [1, m−s+1] illustrated in FIG. 10.

The image data in the pixel region P[1, m−s+1] transmitted by the wiring RW[1] to the wiring RW[ts] are subjected to the filter processing using the filter $fil_a$ as in the pixel region P[1, 1] and the pixel region P[1, 2]. Specifically, the data $D_a[1, m-s+1]$ illustrated in FIG. 10 can be obtained through the product-sum operation using the image data in the pixel region P[1, m−s+1] and the filter values $f_a[1, 1]$ to $f_a[t, s]$ retained by the memory cells in one column.

As described above, when the image data g and the pulse of the clock signal CLK are sequentially input to perform the convolution processing on each of the pixel region P[1, 1] to the pixel region P[1, m−s+1], the data $D_a$ for one row can be obtained.

Note that in the case of subsequently performing the convolution processing after the state illustrated in FIG. 14, the pixel region subjected to the convolution next is the pixel region P[2, 1]. In this case, the image data in the pixel region P[2, 1] can be input to the memory cell array 720 when s pulses of the clock signal CLK and the image data g are input to the shift register 801 after the state illustrated in FIG. 14.

Figure 15:
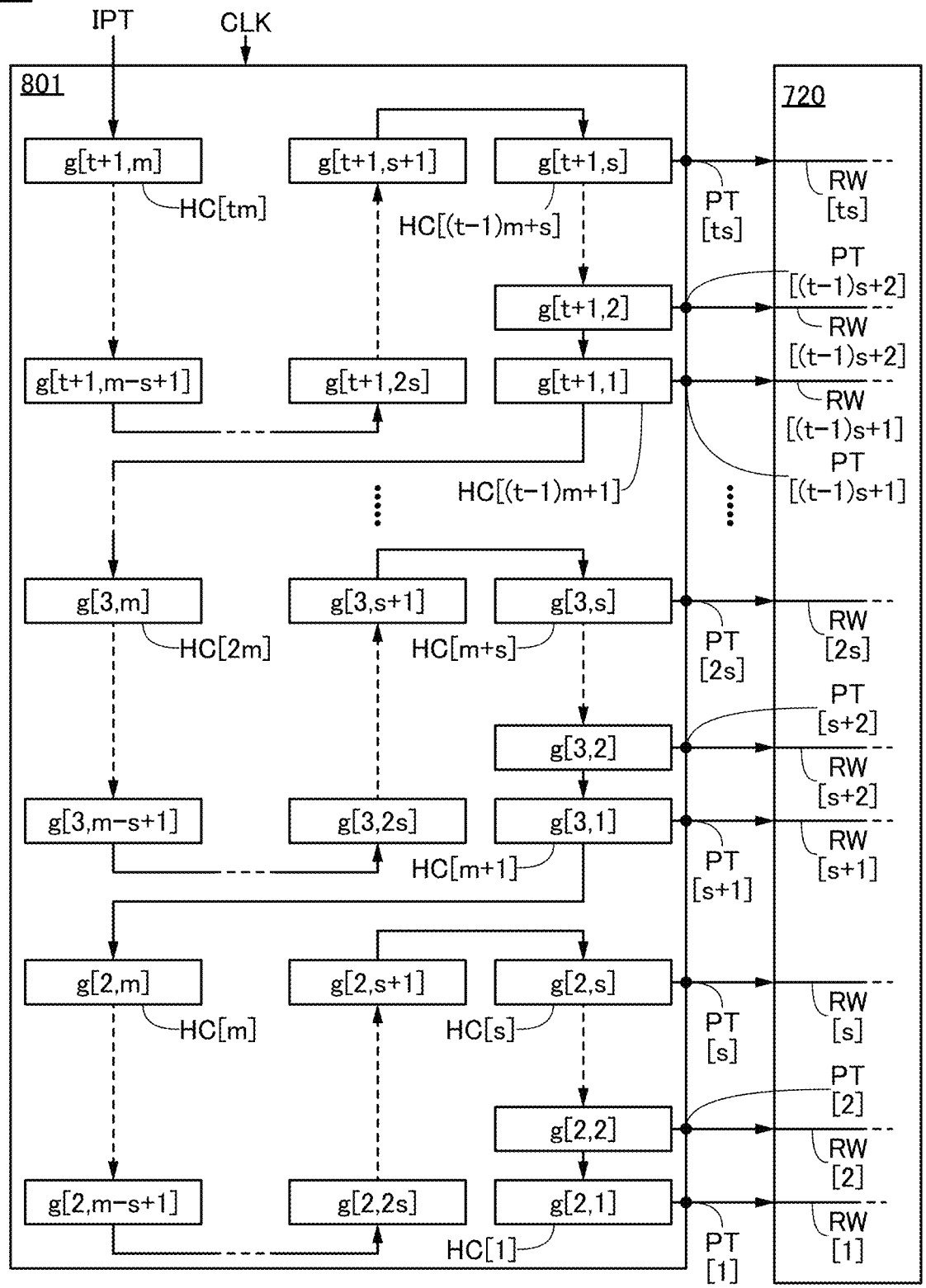
FIG. 15 A diagram illustrating an example of a semiconductor device.

In the case of inputting s, pulses of the clock signal CLK and the image data g are input to the shift register 801, the state illustrated in FIG. 14 becomes the state illustrated in FIG. 15. In FIG. 15, the image data g[2, 1] to the image data g[2, s] are output from the output terminal PT[1] to the output terminal PT[s], respectively, the image data g[3, 1] to the image data g[3, s] are output from the output terminal PT[s+1] to the output terminal PT[2s], respectively, and the image data g[t+1, 1] to the image data g[t+1, s] are output from the output terminal PT[(t−1)s+1] to the output terminal PT[ts], respectively.

Accordingly, image data retained by the retention circuit HC[dm+1] to the retention circuit HC[dm+s] are respectively transmitted to the wiring RW[ds+1] to the wiring RW[(d+1)s] of the memory cell array 720. Note that the image data transmitted to the wiring RW[1] to the wiring RW[ts] in this case correspond to the image data in the pixel region P[2, 1] illustrated in FIG. 10.

The image data in the pixel region P[2, 1] transmitted by the wiring RW[1] to the wiring RW[ts] are subjected to the filter processing using the filter $fil_a$ as in the pixel region P[1, 1] to the pixel region P[1, m−s+1]. Specifically, the data $D_a[2, 1]$ illustrated in FIG. 10 can be obtained through the product-sum operation using the image data in the pixel region P[2, 1] and the filter values $f_a[1, 1]$ to $f_a[t, s]$ retained by the memory cells in one column.

When the above operation is repeated and data $D_a[n-t+1, m-s+1]$ is obtained from the pixel region P[n−t+1, m−s+1], the filter processing using the filter $fil_a$ on all the pixel regions P is completed.

As described above, the shift register 801 included in the semiconductor device 800 has a function of sequentially outputting image data for every pixel region to the memory cell array 720. Thus, the use of the semiconductor device 800 enables a high-speed product-sum operation in the CNN.

Note that one embodiment of the present invention is not limited to the semiconductor device 800 illustrated in FIG. 12 to FIG. 15. Depending on the case or according to circumstances, the circuit configuration of the semiconductor device 800 can be changed as appropriate.

Note that this embodiment can be combined with the other embodiment in this specification as appropriate.

Embodiment 3

In this embodiment, a hierarchical neural network and a configuration example of a product-sum operation circuit that can be applied to the neural network will be described.

<Hierarchical Neural Network>

A hierarchical neural network will be described as one type of neural network that can be used for the semiconductor device of one embodiment of the present invention.

Figure 16:
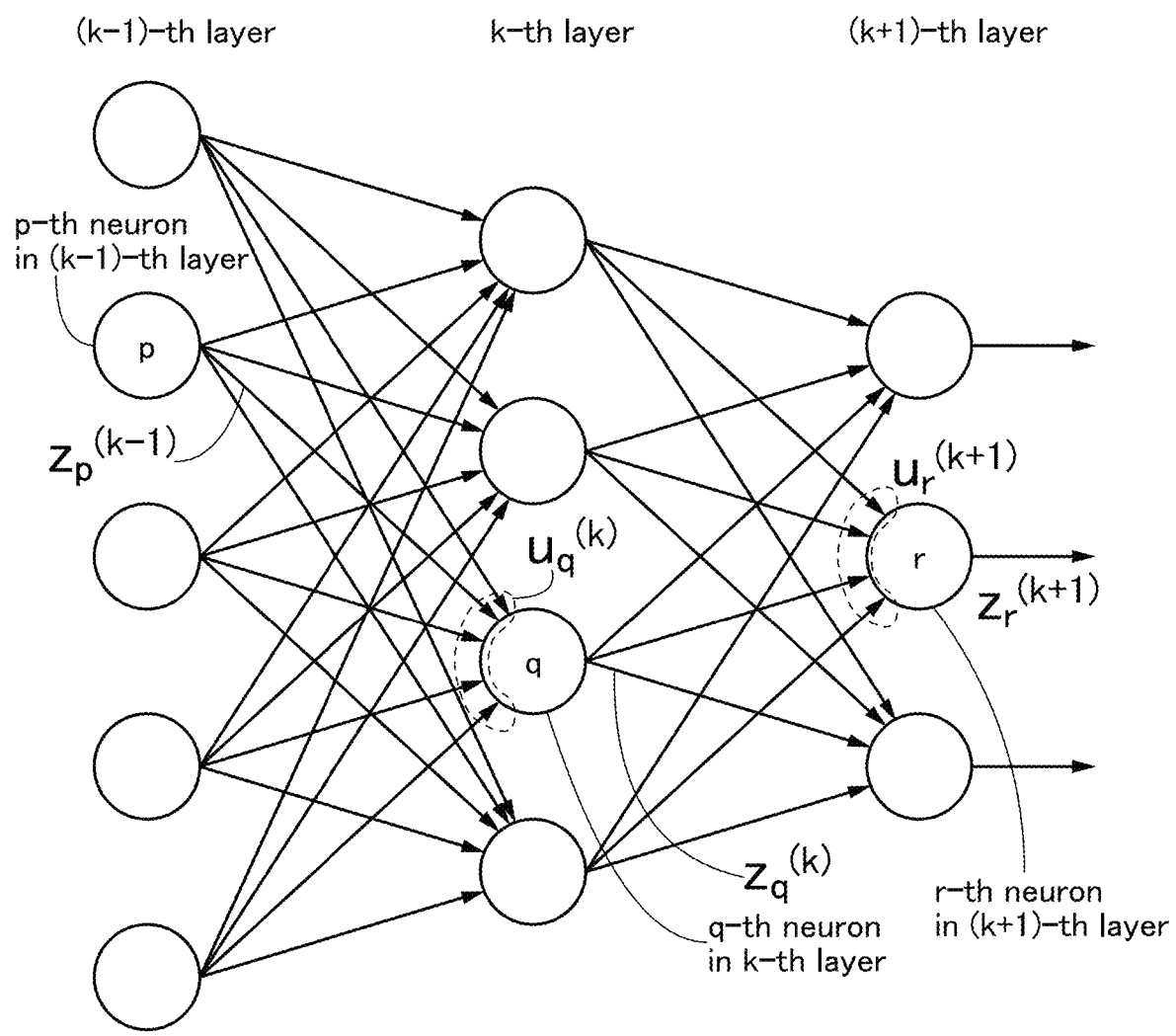
FIG. 16 A diagram illustrating an example of a hierarchical artificial neural network.

FIG. 16 is a diagram illustrating an example of a hierarchical neural network. A (k−1)-th layer (here, k is an integer greater than or equal to 2) includes P neurons (here, P is an integer greater than or equal to 1), a k-th layer includes Q neurons (here, Q is an integer greater than or equal to 1), and a (k+1)-th layer includes R neurons (here, R is an integer greater than or equal to 1).

The product of an output signal $z_p^{(k-1)}$ of the p-th neuron (here, p is an integer greater than or equal to 1 and less than or equal to P) in the (k−1)-th layer and a weight coefficient $w_{qp}^{(k)}$ is input to the q-th neuron (here, q is an integer greater than or equal to 1 and less than or equal to Q) in the k-th layer, the product of an output signal $z_q^{(k)}$ of the q-th neuron in the k-th layer and a weight coefficient $w_{rq}^{(k+1)}$ is input to the r-th neuron (here, r is an integer greater than or equal to 1 and less than or equal to R) in the (k+1)-th layer, and the output signal of the r-th neuron in the (k+1)-th layer is denoted by $z_r^{(k+1)}$.

In this case, the summation $u_q^{(k)}$ of signals input to the q-th neuron in the k-th layer is expressed by the following formula.

[Formula 3]

$$u_q^{(k)} = \sum w_{qp}^{(k)} z_p^{(k-1)} \tag{D1}$$

In addition, the output signal $z_q^{(k)}$ from the q-th neuron in the k-th layer is defined by the following formula.

[Formula 4]

$$z_q^{(k)} = f(u_q^{(k)}) \quad (D2)$$

Figure 19A:
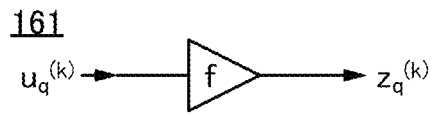
FIG. 19 Diagrams illustrating circuit configuration examples.

A function $f(u_q^{(k)})$ is an activation function, and a step function, a linear ramp function, a sigmoid function, or the like can be used. Note that product-sum operation of Formula (D1) can be calculated with a product-sum operation circuit 700 to be described later. Note that arithmetic operation of Formula (D2) can be calculated with a circuit 161 illustrated in FIG. 19(A), for example.

Note that the activation function may be the same or different among all neurons. Additionally, the activation function in one layer may be the same as or different from that in another layer.

Figure 17:
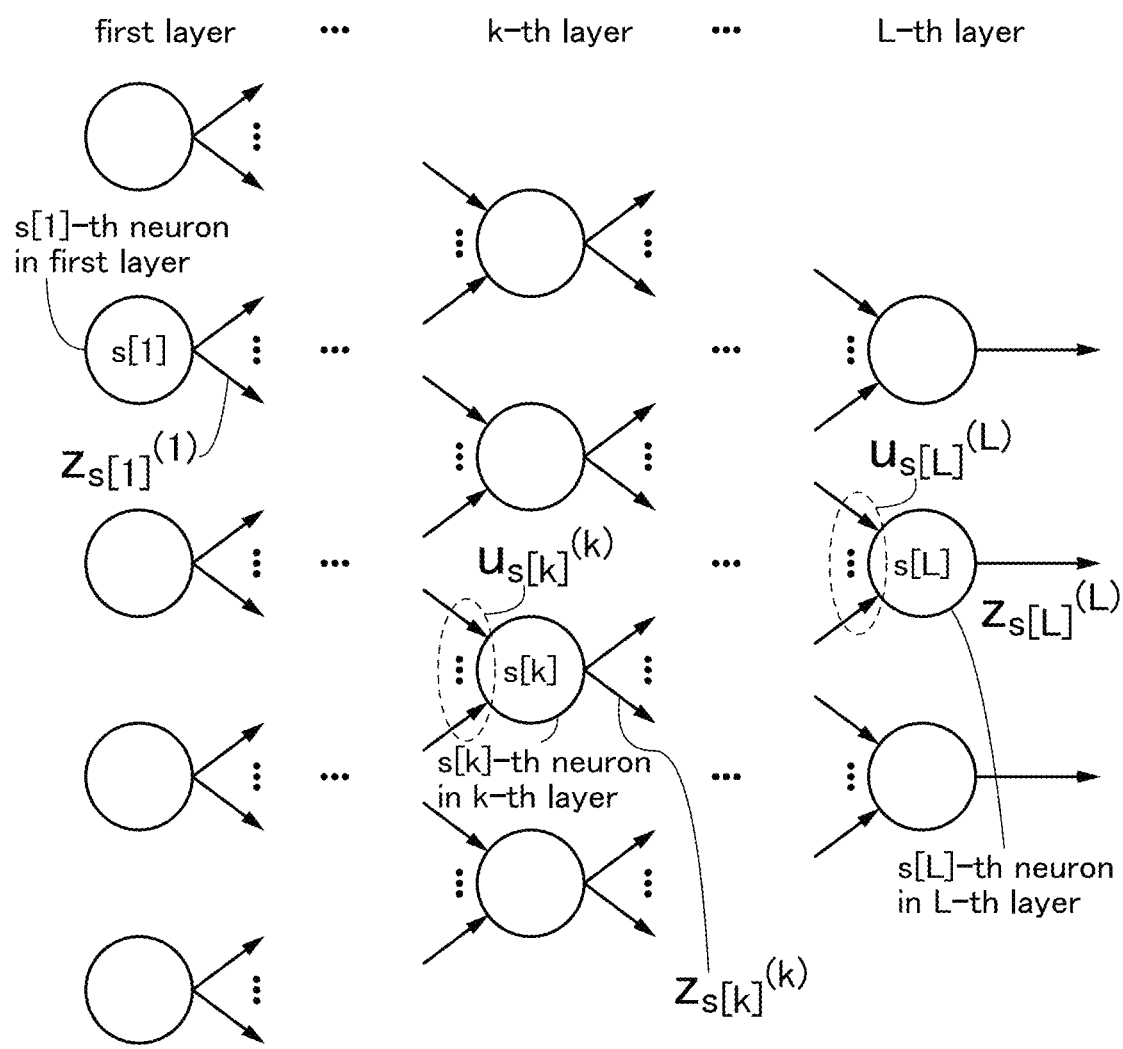
FIG. 17 A diagram illustrating an example of a hierarchical artificial neural network.

Here, a hierarchical neural network including L layers (L is an integer greater than or equal to 3) in total illustrated in FIG. 17 is considered (that is, here, k is an integer greater than or equal to 2 and less than or equal to (L−1)). The first layer is an input layer of the hierarchical neural network, the L-th layer is an output layer of the hierarchical neural network, and the second layer to the (L−1)-th layer are hidden layers.

The first layer (input layer) includes P neurons, the k-th layer (hidden layer) includes Q[k] neurons (Q[k] is an integer greater than or equal to 1), and the L-th layer (output layer) includes R neurons.

An output signal of the s[1]-th neuron (s[1] is an integer greater than or equal to 1 and less than or equal to P) in the first layer is denoted by $z_{s[1]}^{(1)}$, an output signal of the s[k]-th neuron (s[k] is an integer greater than or equal to 1 and less than or equal to Q[k]) in the k-th layer is denoted by $z_{s[k]}^{(k)}$, and an output signal of the s[L]-th neuron (s[L] is an integer greater than or equal to 1 and less than or equal to R) in the L-th layer is denoted by $z_{s[L]}^{(L)}$.

Moreover, the product $u_{s[k]}^{(k)}$ of an output signal $z_{s[k-1]}^{(k-1)}$ of the s[k−1]-th neuron (s[k−1] is an integer greater than or equal to 1 and less than or equal to Q[k−1]) in the (k−1)-th layer and a weight coefficient $w_{s[k]s[k-1]}^{(k)}$ is input to the s[k]-th neuron in the k-th layer, and the product $u_{s[L]}^{(L)}$ of an output signal $z_{s[L-1]}^{(L-1)}$ of the s[L−1]-th neuron (s[L−1] is an integer greater than or equal to 1 and less than or equal to Q[L−1]) in the (L−1)-th layer and a weight coefficient $w_{s[L]s[L-1]}^{(L)}$ is input to the s[L]-th neuron in the L-th layer.

Next, supervised learning will be described. Supervised learning refers to operation of updating all weight coefficients of a hierarchical neural network on the basis of an output result and a desired result (also referred to as teacher data or a teacher signal in some cases) when the output result and the desired result differ from each other, in functions of the above-described hierarchical neural network.

Figure 18:
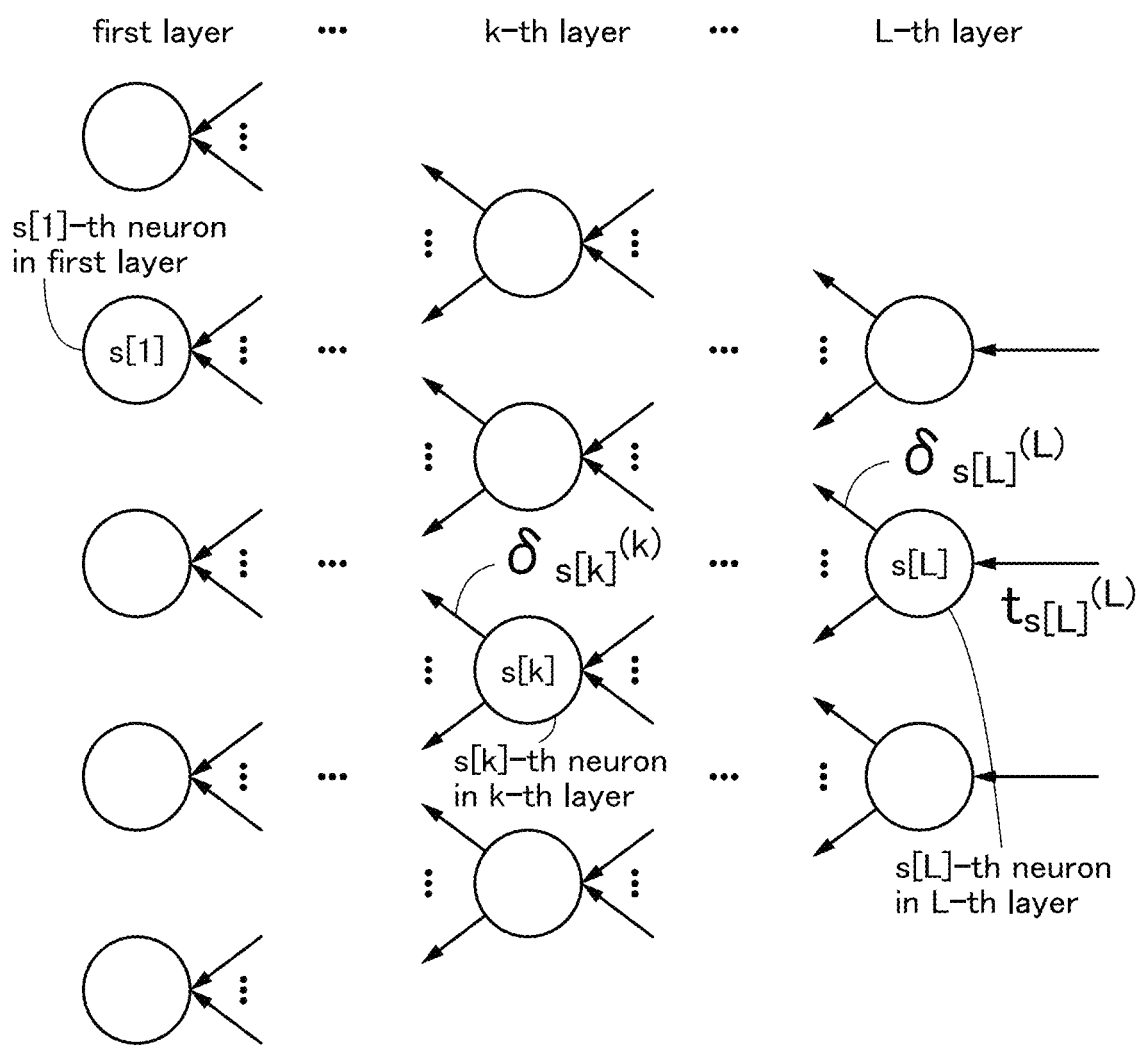
FIG. 18 A diagram illustrating an example of a hierarchical artificial neural network.

A learning method using a backpropagation method will be described as a specific example of supervised learning. FIG. 18 is a diagram illustrating a learning method using a backpropagation method. A backpropagation method is a method for changing a weight coefficient so that an error between an output of a hierarchical neural network and teacher data becomes small.

For example, assume that input data is input to the s[1]-th neuron in the first layer and output data $z_{s[L]}^{(L)}$ is output from the s[L]-th neuron in the L-th layer. Here, when a teacher signal for the output data $z_{s[L]}^{(L)}$ is $t_{s[L]}^{(L)}$, error energy E can be expressed using the output data $z_{s[L]}^{(L)}$ and a teacher signal $t_{s[L]}^{(L)}$.

The update amount of the weight coefficient $w_{s[k]s[k-1]}^{(k)}$ of the s[k]-th neuron in the k-th layer with respect to the error energy E is set to $\partial E/\partial w_{s[k]s[k-1]}^{(k)}$, whereby the weight coefficient can be updated. Here, when an error $\delta_{s[k]}^{(k)}$ of the output value $z_{s[k]}^{(k)}$ of the s[k]-th neuron in the k-th layer is defined as $\partial E/\partial u_{s[k]}^{(k)}$, $\delta_{s[k]}^{(k)}$ and $\partial E/\partial w_{s[k]s[k-1]}^{(k)}$ can be expressed by the following respective formulae.

[Formula 5]

$$\delta_{s[k]}^{(k)} = \sum_{s[k+1]} \delta_{s[k+1]}^{(k+1)} \cdot w_{s[k+1]s[k]}^{(k+1)} \cdot f'(u_{s[k]}^{(k)}) \quad (D3)$$

[Formula 6]

$$\frac{\partial E}{\partial w_{s[k]s[k-1]}^{(k)}} = \delta_{s[k]}^{(k)} \cdot z_{s[k-1]}^{(k-1)} \quad (D4)$$

Figure 19B:
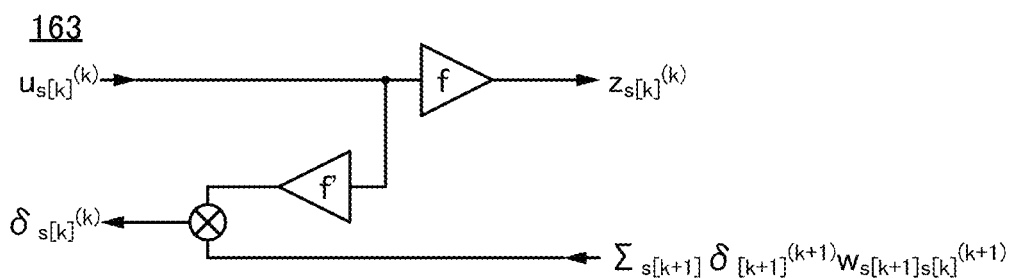
Figure 19C:
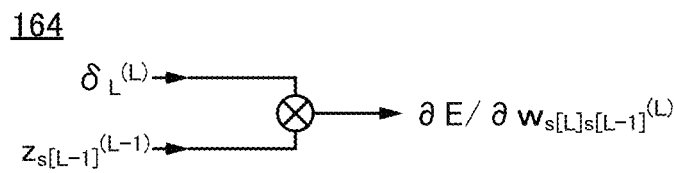

Here, $f(u_{s[k]}^{(k)})$ is the derived function of an activation function. Note that the arithmetic operation of Formula (D3) can be calculated with a circuit 163 illustrated in FIG. 19(B), for example. Moreover, the arithmetic operation of Formula (D4) can be calculated with a circuit 164 illustrated in FIG. 19(C), for example. The derived function of the activation function can be obtained by connecting an arithmetic circuit which corresponds to a desired derived function, to an output terminal of an operational amplifier, for example.

Furthermore, for example, the arithmetic operation of $\Sigma \delta_{s[k+1]}^{(k+1)} \cdot w_{s[k+1] \cdot s[k]}^{(k+1)}$ in Formula (D3) can be calculated with the product-sum operation circuit 700 to be described later.

Here, when the (k+1)-th layer is an output layer, that is, when the (k+1)-th layer is the L-th layer, Ss[L]L) and $\partial E/\partial w_{s[L]s[L-1]}^{(L)}$ can be expressed by the following respective formulae.

[Formula 7]

$$\delta_{s[L]}^{(L)} = (z_{s[L]}^{(L)} - t_{s[L]}) \cdot f'(u_{s[L]}^{(L)}) \quad (D5)$$

[Formula 8]

$$\frac{\partial E}{\partial w_{s[L]s[L-1]}^{(L)}} = \delta_{s[L]}^{(L)} \cdot z_{s[L-1]}^{(L-1)} \quad (D6)$$

Figure 19D:
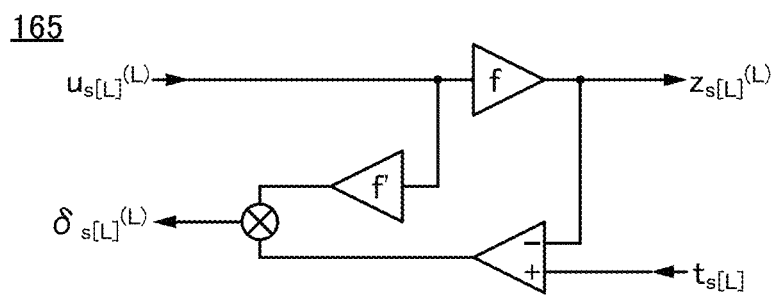

The arithmetic operation of Formula (D5) can be calculated with a circuit 165 illustrated in FIG. 19(D). Moreover, the arithmetic operation of Formula (D6) can be calculated with the circuit 164 illustrated in FIG. 19(C).

That is to say, the errors $\delta_{s[k]}^{(k)}$ and $\delta_{s[L]}^{(L)}$ of all neuron circuits can be calculated by Formula (D1) to Formula (D6). Note that the update amounts of weight coefficients are set on the basis of the errors $\delta_{s[k]}^{(k)}$ and $\delta_{s[L]}^{(L)}$, desired parameters, and the like.

As described above, by using the circuits illustrated in FIG. 19(A) to FIG. 19(D) and the product-sum operation circuit 700 to be described later, calculation of the hierarchical neural network using supervised learning can be performed.

<Circuit Configuration Example of Hierarchical Neural Network>

Figure 20:
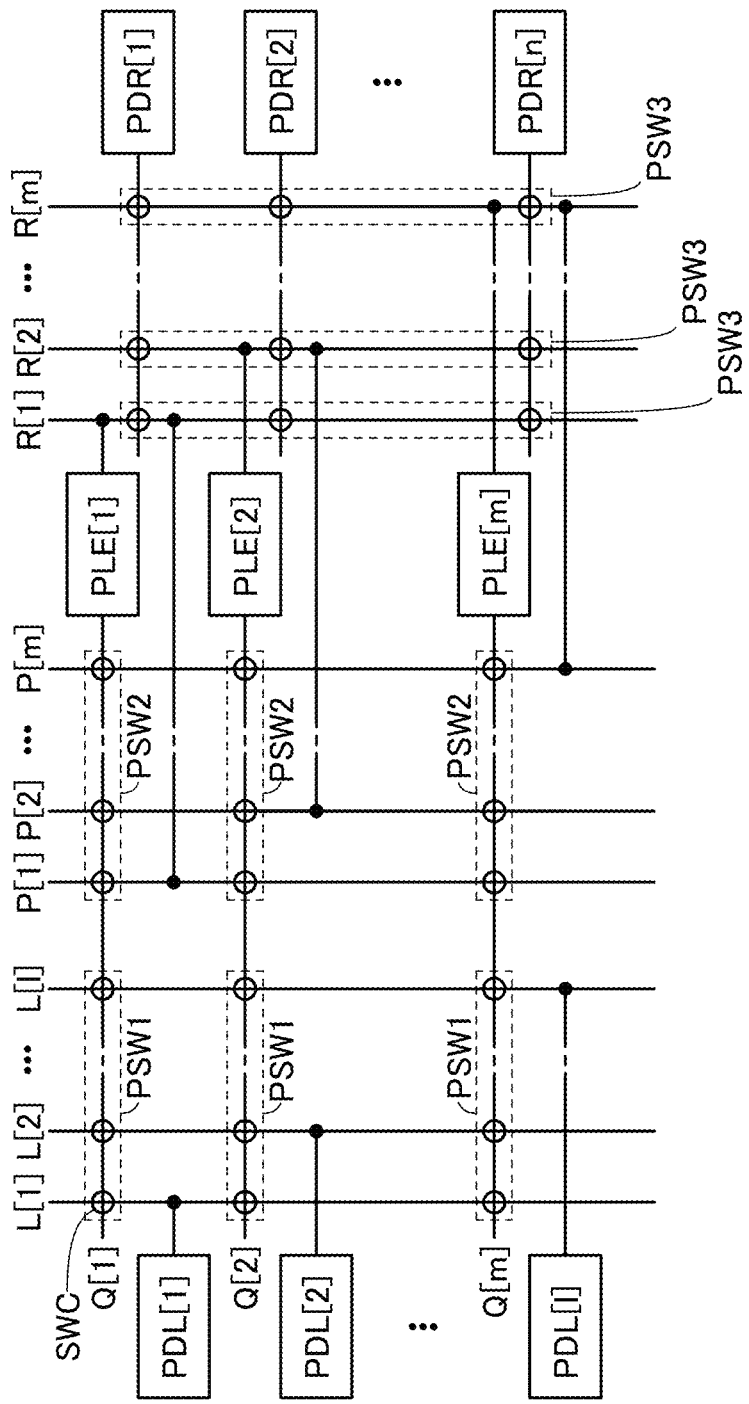
FIG. 20 A block diagram illustrating a circuit configuration example.

FIG. 20 is a block diagram illustrating a circuit configuration example of a hierarchical neural network.

An NN (neural network) circuit 100 includes an input terminal PDL[1] to an input terminal PDL[1] (here, 1 is an integer greater than or equal to 1), an output terminal PDR[1] to an output terminal PDR[n] (here, n is an integer greater than or equal to 1), a programmable logic element PLE[1] to a programmable logic element PLE[m] (here, m is an integer greater than or equal to 1), a wiring L[1] to a wiring L[1], a wiring P[1] to a wiring P[m], a wiring R[1] to a wiring R[m], a wiring Q[1] to a wiring Q[m], a plurality of programmable switches PSW1, a plurality of programmable switches PSW2, and a plurality of programmable switches PSW3.

Note that in the NN circuit 100 illustrated in FIG. 20, only the input terminal PDL[1], the input terminal PDL[2], the input terminal PDL[1], the output terminal PDR[1], the output terminal PDR[2], the output terminal PDR[n], the programmable logic element PLE[1], the programmable logic element PLE[2], the programmable logic element PLE[m], the wiring L[1], the wiring L[2], the wiring L[1], the wiring P[1], the wiring P[2], the wiring P[m], the wiring R[1], the wiring R[2], the wiring R[m], the wiring Q[1], the wiring Q[2], the wiring Q[m], the programmable switches PSW1, the programmable switches PSW2, the programmable switches PSW3, and later-described switch circuits SWC are illustrated, and the other circuits, elements, wirings, and reference numerals are omitted.

The NN circuit 100 is a multi-context programmable arithmetic processing device using the programmable logic element PLE[1] to the programmable logic element PLE[m] and the programmable switch PSW1 to the programmable switch PSW3. As specifically described later, the arithmetic processing device includes a hierarchical artificial neural network in which each network connection state between layers corresponds to a context, and can perform neural network arithmetic processing by sequentially switching contexts.

The input terminal PDL[i] (here, i is an integer greater than or equal to 1 and less than or equal to 1) is electrically connected to the wiring L[i]. The output terminal PDR[k] (here, k is an integer greater than or equal to 1 and less than or equal to n) is electrically connected to the wiring R[1] to the wiring R[m] through the programmable switches PSW3. A first terminal of the programmable logic element PLE[j] (here, j is an integer greater than or equal to 1 and less than or equal to m) is electrically connected to the wiring Q[j], and the wiring Q[j] is electrically connected to the wiring L[1] to the wiring L[1] through the programmable switches PSW1. The wiring Q[j] is also electrically connected to the wiring P[1] to the wiring P[m] through the programmable switches PSW2. A second terminal of the programmable logic element PLE[j] is electrically connected to the wiring R[j]. The wiring P[1] to the wiring P[m] are electrically connected to the wirings R[1] to R[m], respectively.

The programmable switch PSW1 to the programmable switch PSW3 included in the NN circuit 100 are switches whose conduction state and non-conduction state can be switched depending on configuration data stored in a configuration memory CMS to be described later.

Note that each of the programmable switch PSW1 to the programmable switch PSW3 includes the switch circuits SWC. The details of the program switch PSW1 to the program switch PSW3 will be described later.

Figure 21A:
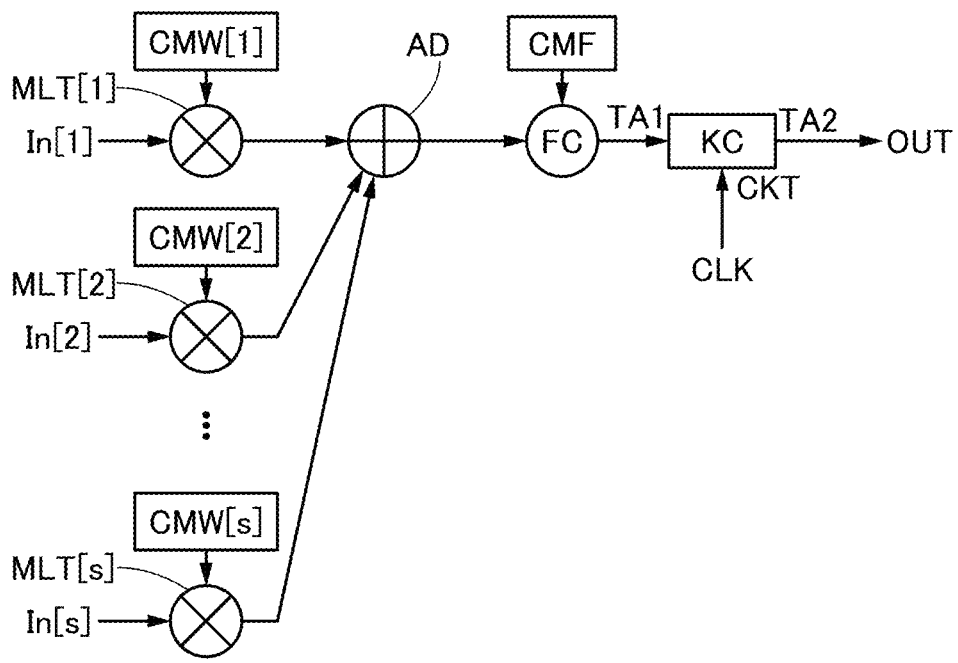
FIG. 21 Block diagrams illustrating configuration examples of an arithmetic processing circuit.

The programmable logic element PLE includes an arithmetic processing circuit 150 illustrated in FIG. 21(A). The arithmetic processing circuit 150 includes an input terminal In[1] to an input terminal In[s] (here, s is an integer greater than or equal to 1), an output terminal OUT, a multiplier circuit MLT[1] to a multiplier circuit MLT[s], an adder circuit AD, an activation function circuit FC, a retention circuit KC, a configuration memory CMW[1] to a configuration memory CMW[s], and a configuration memory CMF. Note that the configuration memory CMW[1] to the configuration memory CMW[s] may be one configuration memory. The configuration memory CMW[1] to the configuration memory CMW[s] and the configuration memory CMF may be one configuration memory.

The input terminal In[h] (here, h is an integer greater than or equal to 1 and less than or equal to s) is electrically connected to an input terminal of the multiplier circuit MLT[h], and an output terminal of the multiplier circuit MLT[h] is electrically connected to an input terminal of the adder circuit AD. An output terminal of the adder circuit AD is electrically connected to an input terminal of the activation function circuit FC. An output terminal of the activation function circuit FC is electrically connected to a terminal TA1 of the retention circuit KC. A terminal TA2 of the retention circuit KC is electrically connected to the output terminal OUT.

The multiplier circuit MLT[h] is a circuit that performs multiplication using data retained by the configuration memory CMW[h] (hereinafter referred to as a weight coefficient) as a multiplier and an input signal input to the input terminal In[h] as a multiplicand. The adder circuit AD calculates the sum of multiplication results output from the multiplier circuit MLT[1] to the multiplier circuit MLT[s]. In other words, the multiplier circuit MLT[1] to the multiplier circuit MLT[s] and the adder circuit AD constitute a product-sum operation circuit.

The activation function circuit FC is a circuit that performs arithmetic operation on a signal input to the input terminal, that is, the result of the product-sum operation, using a function system defined by data retained by the configuration memory CMF. For example, a sigmoid function, a tan h function, a softmax function, a ReLU function, a threshold function, or the like can be used as the function system.

The retention circuit KC has a function of obtaining an operation result output from the activation function circuit FC from the terminal TA1 and temporarily retaining the operation result and a function of outputting the temporarily retained operation result to the terminal TA2. In addition, the retention circuit KC can switch the above-described two functions in response to a clock signal CLK input to a terminal CKT.

For example, the retention circuit KC can retain a potential input from the terminal TA1 when the clock signal CLK has a high-level potential, and the retention circuit KC can output the potential from the terminal TA2 to the output terminal OUT when the clock signal CLK has a low-level potential.

In the case where the arithmetic processing circuit 150 is a circuit that handles digital data, a flip-flop circuit can be used as the retention circuit KC, for example.

Figure 21B:
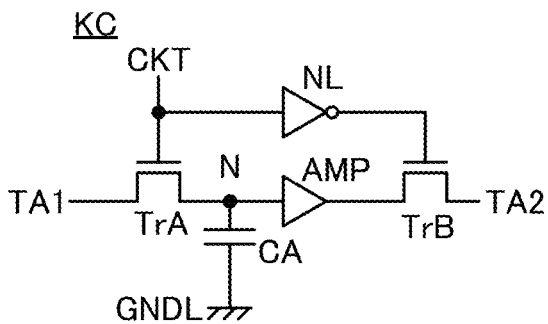

In the case where the arithmetic processing circuit 150 is a circuit that handles analog data, a retention circuit KC illustrated in FIG. 21(B) can be used, for example. The retention circuit KC illustrated in FIG. 21(B) is a sample-and-hold circuit including a transistor TrA, a transistor TrB, a capacitor CA, an amplifier AMP, and a NOT circuit NL.

A first terminal of the transistor TrA is electrically connected to the terminal TA1, a second terminal of the transistor TrA is electrically connected to a first terminal of the capacitor CA, and a gate of the transistor TrA is electrically connected to the terminal CKT. An input terminal of the amplifier AMP is electrically connected to the second terminal of the transistor TrA, and an output terminal of the amplifier AMP is electrically connected to a first terminal of the transistor TrB. A second terminal of the transistor TrB is electrically connected to the terminal TA2. An input terminal of the NOT circuit NL is electrically connected to the terminal CKT, and an output terminal of the NOT circuit NL is electrically connected to a gate of the transistor TrB. A second terminal of the capacitor CA is electrically connected to a wiring GNDL. Note that a connection point of the second terminal of the transistor TrA, the input terminal of the amplifier AMP, and the first terminal of the capacitor CA is referred to as a node N.

The amplifier AMP has a function of amplifying a signal input to the input terminal by a factor of 1 and outputting the amplified signal to the output terminal.

The wiring GNDL is a wiring that supplies a reference potential.

When the clock signal CLK input to the terminal CKT has a high-level potential, the transistor TrA is brought into a conduction state and the transistor TrB is brought into a non-conduction state. In that case, a signal input from the terminal TA1 is input to the amplifier AMP through the transistor TrA. Therefore, the amplifier AMP amplifies the signal and outputs the amplified signal from the output terminal of the amplifier AMP. Note that the amplified signal is not output from the terminal TA2 because the transistor TrB is in a non-conduction state.

In addition, the potential of the node N is retained by the capacitor CA. The potential of the node N in this case becomes the potential of the signal input from the terminal TA1.

When the clock signal CLK input to the terminal CKT has a low-level potential, the transistor TrA is brought into a non-conduction state and the transistor TrB is brought into a conduction state. The potential of the node N does not change because the transistor TrA is in a non-conduction state. The amplifier AMP outputs the potential of the node N to the first terminal of the transistor TrB. Since the transistor TrB is in a conduction state, the potential of the node N, that is, the potential of the signal input from the terminal TA when the clock signal CLK has a high-level potential is output from the terminal TA2.

It is preferable that the transistor TrA and/or the transistor TrB be an OS transistor, which will be described in Embodiment 8. It is particularly preferable that the OS transistor use an oxide containing at least one of indium, an element M (the element M is aluminum, gallium, yttrium, or tin), and zinc in a channel formation region. The use of such an OS transistor as the transistor TrA and/or the transistor TrB enables the off-state current of the transistor(s) to be extremely low. Thus, the influence of electric charge leakage due to the off-state current of the transistor can be reduced.

Note that FIG. 21(A) illustrates only the input terminal In[1], the input terminal In[2], the input terminal In[s], the multiplier circuit MLT[1], the multiplier circuit MLT[2], the multiplier circuit MLT[s], the configuration memory CMW[1], the configuration memory CMW[2], the configuration memory CMW[s], the configuration memory CMF, the adder circuit AD, the activation function circuit FC, the retention circuit KC, the terminal TA1, the terminal TA2, the terminal CKT, the output terminal OUT, and the clock signal CLK, and the other circuits, elements, wirings, and reference numerals are omitted.

Note that the structure of the retention circuit KC of the arithmetic processing circuit 150 included in the semiconductor device of one embodiment of the present invention is not limited to the above-described structure. Depending on the case or according to circumstances, the structure of the retention circuit KC can be changed as appropriate.

Note that a structure in which data writing to the configuration memory CMW[1] to the configuration memory CMW[s] and the configuration memory CMF in the arithmetic processing circuit 150 and data writing to the later-described configuration memory CMS which sets the states of the programmable switch PSW1 to the programmable switch PSW3 are performed by different driver circuits may be used. In other words, it is possible to repeatedly update data in the configuration memory CMW[1] to the configuration memory CMW[s] and the configuration memory CMF in the arithmetic processing circuit 150 without updating data in the configuration memories CMS for the programmable switch PSW1 to the programmable switch PSW3. This enables efficient learning in a neural network.

In addition, in a multi-context system which includes a plurality of sets of configuration memories in the case where a weight coefficient of the product-sum operation in each layer of the neural network corresponds to configuration data of each context, it is possible to sequentially perform the product-sum operation in each layer with a few circuit resources by switching contexts.

Note that although the structure in which one programmable logic element includes the individual arithmetic processing circuit 150 is described in the above description, a plurality of programmable logic elements and a programmable switch connecting the programmable logic elements can constitute one arithmetic processing circuit.

Figure 22A:
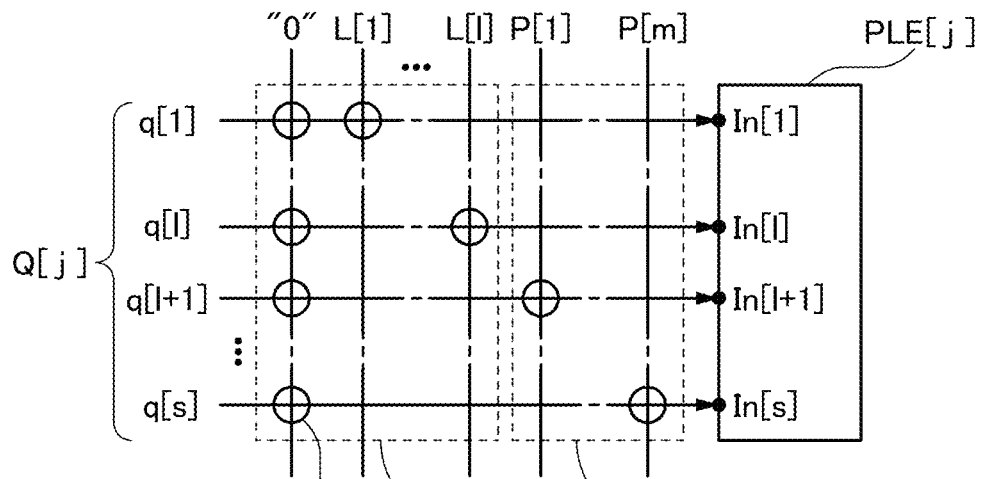
FIG. 22 Block diagrams and a circuit diagram illustrating programmable switches.
Figure 22B:
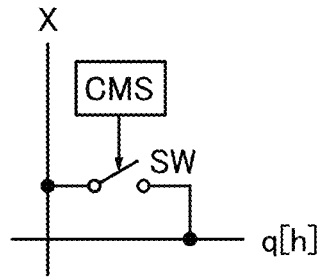

Next, the structures of the programmable switch PSW1 to the programmable switch PSW3 will be described. FIG. 22(A) illustrates an example of connections of the wiring L[1] to the wiring L[1], the wiring P[1] to the wiring P[m], the wiring Q[j], the programmable switch PSW1, the programmable switch PSW2, and the programmable logic element PLE[j] in the NN circuit 100, and FIG. 22(B) illustrates a configuration example of the switch circuit SWC.

Note that the wiring Q[j] in FIG. 22(A) includes a wiring q[1] to a wiring q[s]. In addition, the first terminal of the programmable logic element PLE[j] in FIG. 22(A) corresponds to the input terminal In[1] to the input terminal In[s] of the arithmetic processing circuit 150 described with FIG. 21(A). That is, the wiring q[h] is electrically connected to the input terminal In[h] in FIG. 22(A).

Furthermore, in FIG. 22(A), the wiring q[1] to the wiring q[s] are electrically connected to a wiring "0" through the programmable switch PSW1. The wiring "0" is a wiring that supplies a signal having a value 0 (the potential of the signal is a reference potential).

In the structure example illustrated in FIG. 22(A), the programmable switch PSW1 and the programmable switch PSW2 include the switch circuits SWC. A structure example of the switch circuit SWC is illustrated in FIG. 22(B). A first terminal of a switch SW is electrically connected to the wiring q[h], and a second terminal of the switch SW is electrically connected to a wiring X. Note that the wiring X is any one of the wiring "0," the wiring L[1] to the wiring L[1], and the wiring P[1] to the wiring P[m]. The conduction state or the non-conduction state of the switch SW is determined by data retained by the configuration memory CMS.

In other words, each of the programmable switch PSW1 and the programmable switch PSW2 which are illustrated in FIG. 22(A) is brought into a conduction state or a non-conduction state depending on the data in the configuration memory CMS. That is, whether each of the wiring "0," the wiring L[1] to the wiring L[1], and the wiring P[1] to the wiring P[m] is connected to or disconnected from each of the input terminal In[1] to the input terminal In[s] can be controlled by the data in the configuration memories CMS.

In particular, in the case where no signal is input to at least one of the input terminal In[1] to the input terminal In[s], the switch circuit SWC connecting that terminal and the wiring "0" is brought into a conduction state. In that case, the power consumption of the multiplier circuit corresponding to that terminal can be reduced by power gating.

As the switch SW illustrated in FIG. 22(B), a switch using a MEMS (micro electro mechanical system) technology, such as a transistor, a diode, or a digital micromirror device (DMD), can be used, for example. Alternatively, the switch SW may be a logic circuit in which transistors are combined. In the case where the switch SW is one transistor, an OS transistor having a characteristic of an extremely low off-state current is preferably used.

Figure 22C:
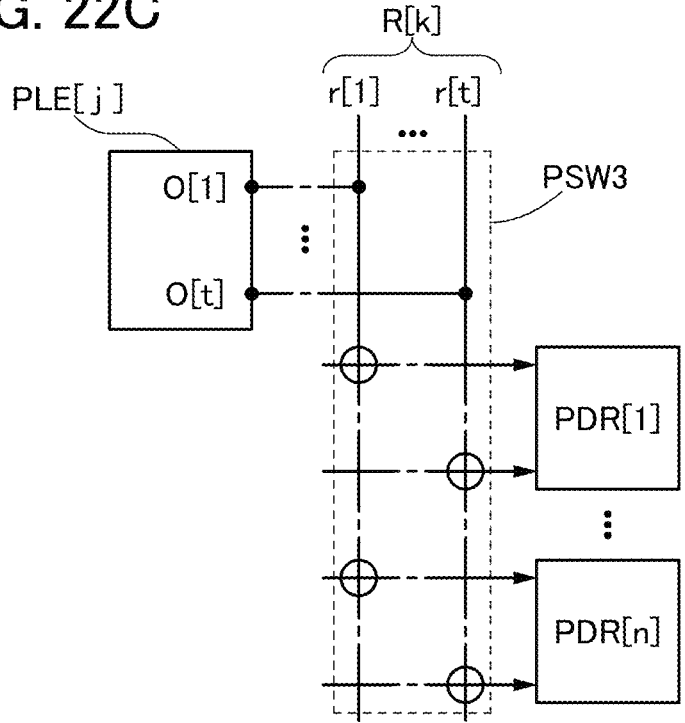

FIG. 22(C) illustrates an example of connections of the wiring R[k], the programmable switch PSW3, the programmable logic element PLE[j], and the output terminal PDR[1] to the output terminal PDR[n] in the NN circuit 100.

Note that the wiring R[k] in FIG. 22(C) includes a wiring r[1] to a wiring r[t] (here, t is an integer greater than or equal to 1). In addition, the second terminal of the programmable logic element PLE[j] is illustrated in FIG. 22(C) as a terminal O[1] to a terminal O[t]. That is, the wiring r[u] is electrically connected to the terminal O[u] (here, u is an integer greater than or equal to 1 and less than or equal to t) in FIG. 22(C). Note that although the plurality of second terminals are illustrated in FIG. 22(C), they may be a single terminal. In that case, the wiring r[1] to the wiring r[t] can be a single wiring.

In the structure example illustrated in FIG. 22(C), the programmable switch PSW3 includes the switch circuits SWC. That is, as in the programmable switch PSW1 and the programmable switch PSW2, the conduction state or the non-conduction state of the switch SW included in the switch circuit SWC can be determined by data retained by the configuration memory CMS. Thus, whether each of the terminal O[1] to the terminal O[t] is connected to or disconnected from each of the output terminal PDR[1] to the output terminal PDR[n] can be controlled by the data in the configuration memories CMS.

Note that an SRAM (Static Random Access Memory) or an MRAM (Magnetic Random Access Memory) can be used as the above-described configuration memory CMS, configuration memory CMW[1] to configuration memory CMW[s], and configuration memory CMF, for example. Alternatively, a memory device using an OS transistor (referred to as an OS memory in this specification) can be used, for example. In particular, when an OS memory is used as the above-described configuration memory, a neural network with low power consumption can be formed with a small number of elements.

When each of the multiplier circuit MLT[1] to the multiplier circuit MLT[s] and the adder circuit AD described above is a product-sum operation circuit that performs arithmetic operation using an analog current, the number of transistors included in the product-sum operation circuit can be reduced. Note that the product-sum operation circuit that performs arithmetic operation using an analog current will be described later in this embodiment.

<Operation Method Example>

Next, an example of an operation method of the NN circuit 100 will be described with reference to FIG. 23 to FIG. 25.

Note that the number of contexts for the NN circuit 100 is N in this operation method example. That is, each of the plurality of configuration memories CMS, the configuration memory CMW[1] to the configuration memory CMW[s], and the configuration memories CMF included in the NN circuit 100 contains N sets of configuration data.

Moreover, the neural network described in this operation method example is a hierarchical neural network including an input layer and a first intermediate layer to an N−1-th intermediate layer. In particular, the N−1-th intermediate layer is an output layer of the hierarchical neural network.

Figure 23:
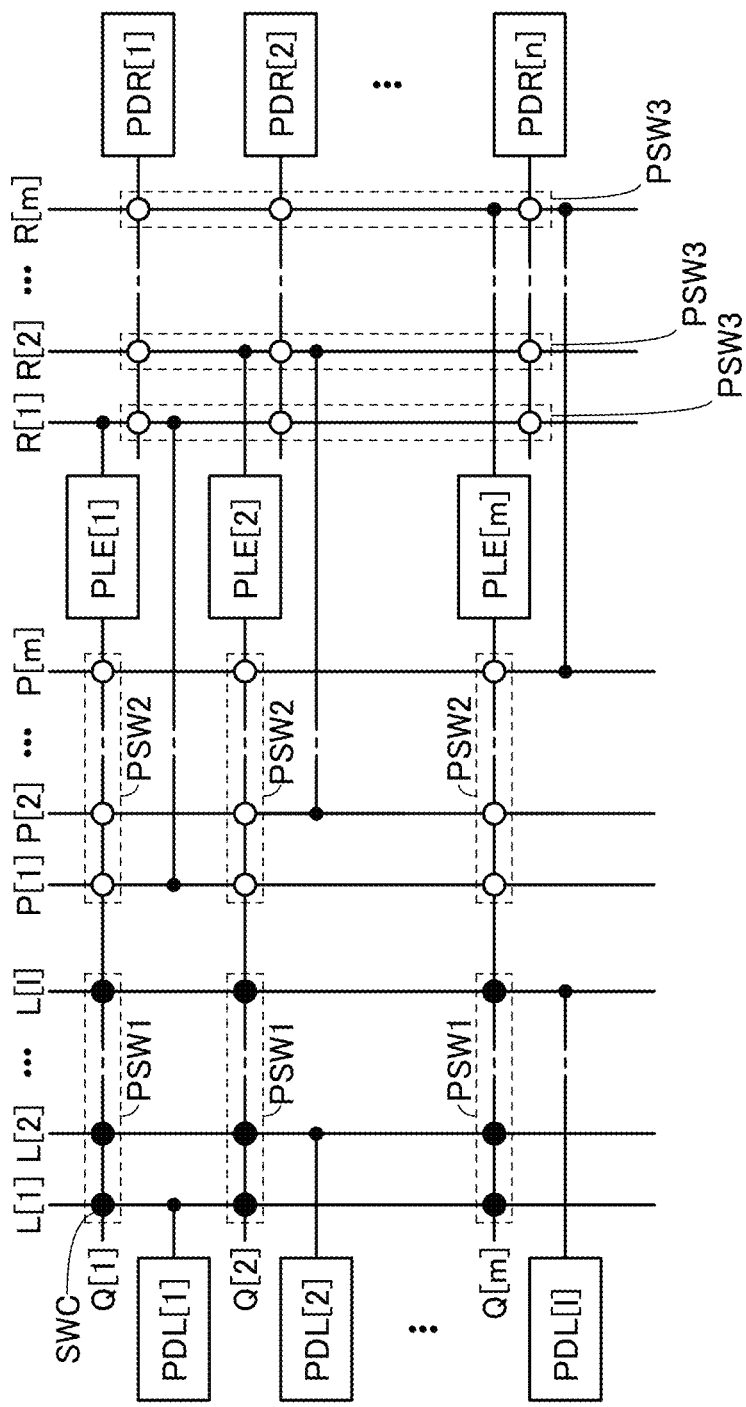
FIG. 23 A block diagram illustrating a circuit configuration example.
Figure 24:
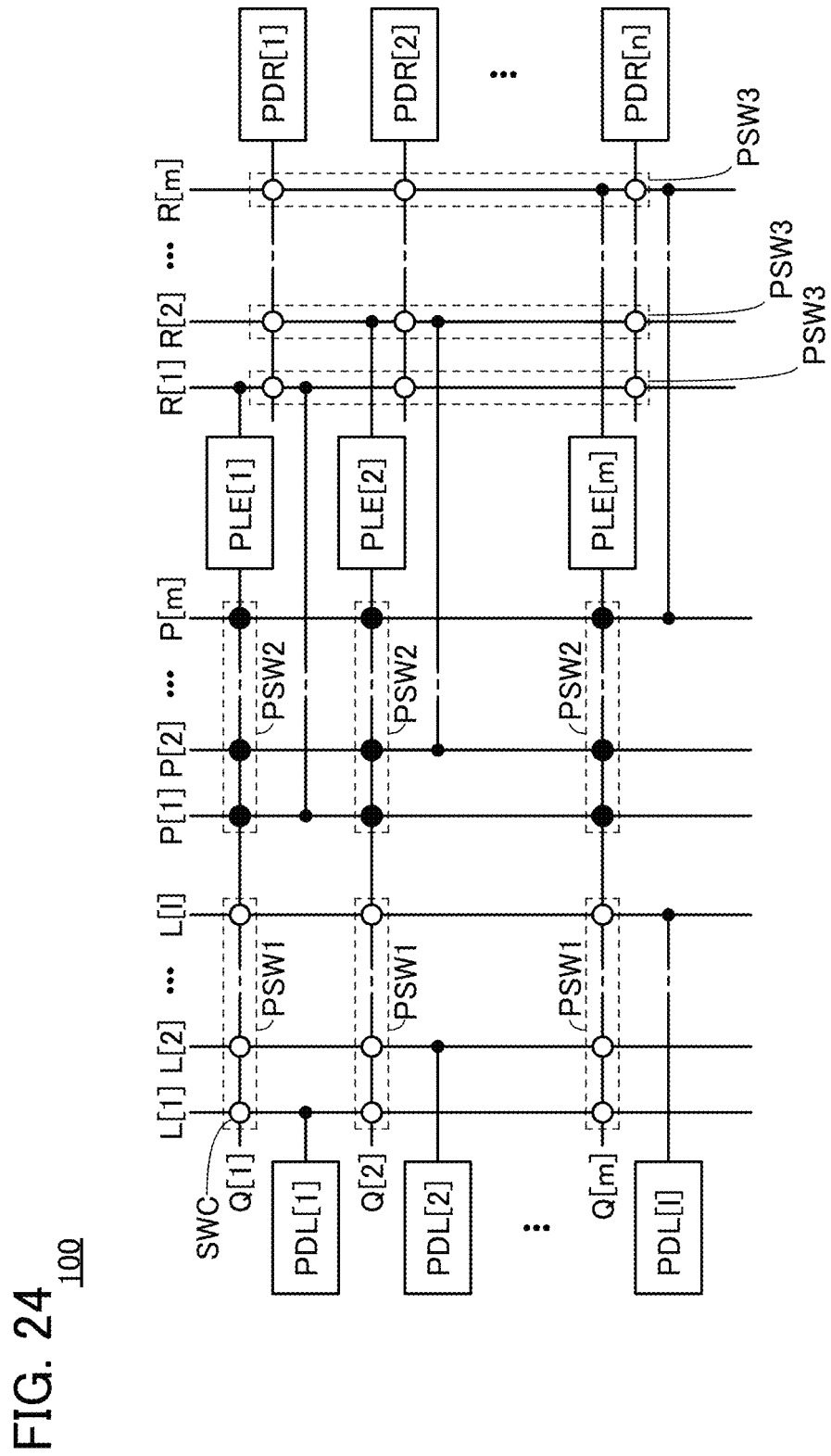
FIG. 24 A block diagram illustrating a circuit configuration example.
Figure 25:
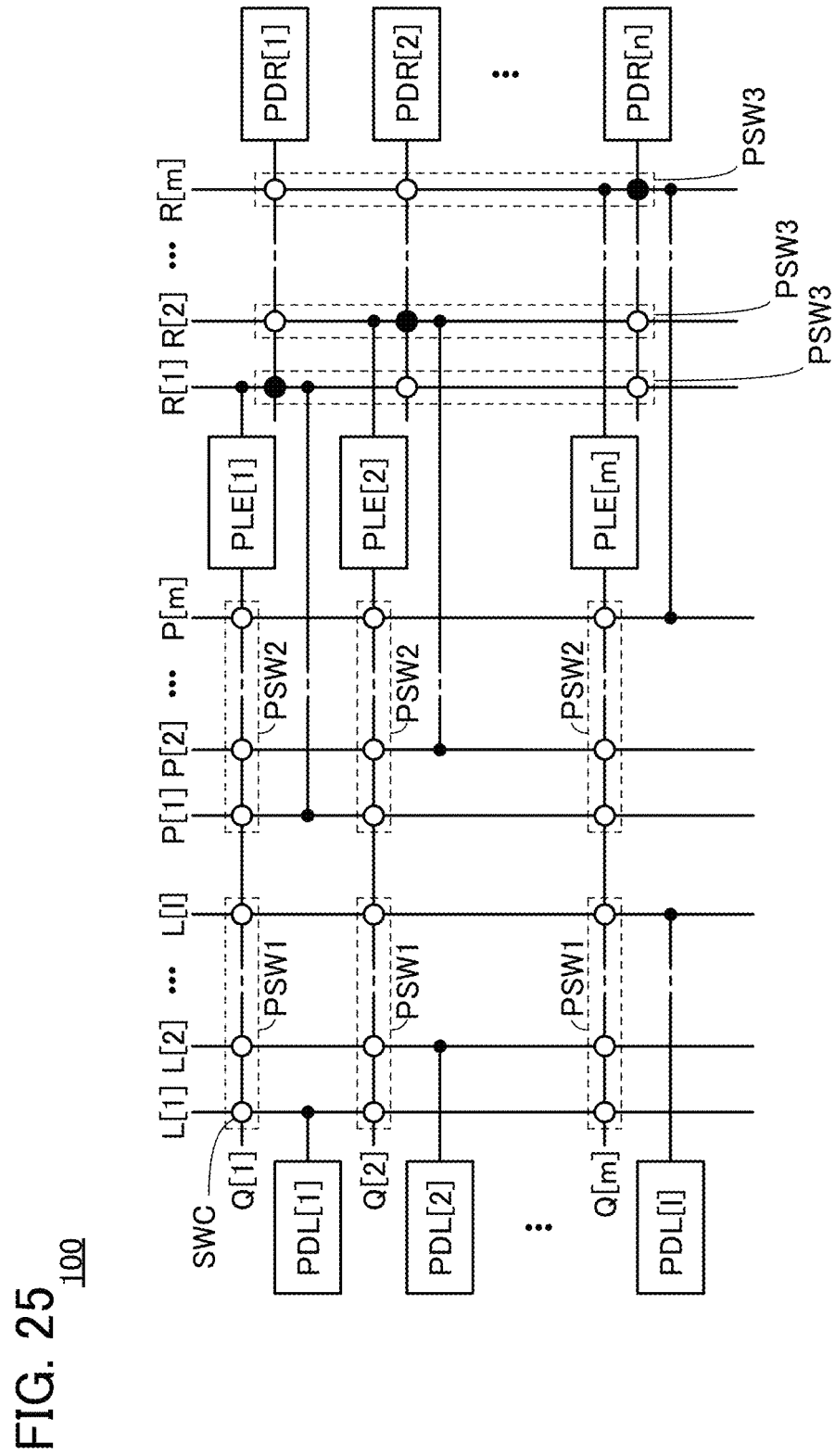
FIG. 25 A block diagram illustrating a circuit configuration example.

Furthermore, in FIG. 23 to FIG. 25, the switch circuit SWC in a conduction state is indicated by a black circle, and the switch circuit SWC in a non-conduction state is indicated by a white circle.

In addition, for the structures of the wiring Q[1] to the wiring Q[m], the wiring R[1] to the wiring R[m], and the programmable switch PSW1 to the programmable switch PSW3, the description of FIGS. 22(A), (B), and (C) can be referred to.

First, a context 1 is selected. The context 1 is a configuration corresponding to a network between the input layer and the first intermediate layer. The NN circuit 100 corresponding to the context 1 is illustrated in FIG. 23.

At that time, configuration data is set for the programmable switch PSW1 to the programmable switch PSW3 so that the programmable logic element PLE[1] to the programmable logic element PLE[m] are electrically connected to the wiring L[1] to the wiring L[1]. In addition, configuration data is set for the programmable logic element PLE[1] to the programmable logic element PLE[1] so that a weight coefficient for each neuron in the first intermediate layer with respect to an output signal of the neurons in the input layer is set in each of the programmable logic element PLE[1] to the programmable logic element PLE[1].

Signals input from the input layer to the first intermediate layer correspond to signals input from the input terminal PDL[1] to the input terminal PDL[1]. A signal input from the input terminal PDL[i] is transmitted to each of the wiring Q[1] to the wiring Q[m] through the wiring L[i]. Then, the signal transmitted to the wiring Q[j] is input to the first terminal of the programmable logic element PLE[1].

The plurality of signals input to the first terminals of the programmable logic element PLE[1] to the programmable logic element PLE[m] are subjected to arithmetic processing by the product-sum operation circuit and the activation function circuit of each programmable logic element. Specifically, product-sum operation using the plurality of signals and respective weight coefficients corresponding to the signals and activation function operation using the result of the product-sum operation as input information are performed. Note that the weight coefficient and the activation function are based on the configuration of the context 1, as described above.

The output result of the activation function operation is retained by the retention circuit KC illustrated in FIG. 21. Note that the data retention by the retention circuit KC is performed when the potential of the clock signal CLK changes from a low-level potential to a high-level potential. Moreover, the data retained by the retention circuit KC is output when the potential of the clock signal CLK changes from the high-level potential to the low-level potential.

Next, a context 2 is selected. The context 2 is a configuration corresponding to a network between the first intermediate layer and the second intermediate layer. The NN circuit 100 corresponding to the context 2 is illustrated in FIG. 24.

At that time, configuration data is set for the programmable switch PSW1 to the programmable switch PSW3 so that the programmable logic element PLE[1] to the programmable logic element PLE[m] are electrically connected to the wiring P[1] to the wiring P[1]. In addition, configuration data is set for the programmable logic element PLE[1] to the programmable logic element PLE[1] so that a weight coefficient for each neuron in the second intermediate layer with respect to an output signal of the neurons in the first intermediate layer is set in each of the programmable logic element PLE[1] to the programmable logic element PLE[1].

In that configuration, data output from the second terminals of the programmable logic element PLE[1] to the programmable logic element PLE[m] are the above-described data stored in the retention circuits KC, that is, the results of the activation function operation based on the context 1. The results are output from the second terminals of the programmable logic element PLE[1] to the programmable logic element PLE[m] when the potential of the clock signal CLK for the retention circuit KC changes from the high-level potential to the low-level potential. The result output from the second terminal of the programmable logic element PLE[j] is transmitted to each of the wiring Q[1] to the wiring Q[m] through the wiring P[j]. Then, the signal transmitted to the wiring Q[j] is input to the first terminal of the programmable logic element PLE[j].

That is, the signals input from the first intermediate layer to the second intermediate layer correspond to the signals output from the second terminals of the programmable logic element PLE[1] to the programmable logic element PLE[m].

The plurality of signals input to the first terminals of the programmable logic element PLE[1] to the programmable logic element PLE[m] are subjected to arithmetic processing by the product-sum operation circuit and the activation function circuit of each programmable logic element. Specifically, product-sum operation using the plurality of signals and respective weight coefficients corresponding to the signals and activation function operation using the result of the product-sum operation as input information are performed. Note that the weight coefficient and the activation function are based on the configuration of the context 2, as described above.

The output result of the activation function operation is retained by the retention circuit KC illustrated in FIG. 21, as in the operation based on the context 1.

The subsequent operation of the NN circuit 100 is performed in a manner similar to that based on the context 2. For example, the case where a context g (here, g is an integer greater than or equal to 3 and less than or equal to N–1) is selected is considered. The context g is a configuration corresponding to a network between the g–1-th intermediate layer and the g-th intermediate layer. Note that the contents of FIG. 24 are referred to for connection states in the NN circuit 100 corresponding to the context g.

At that time, configuration data is set for the programmable switch PSW1 to the programmable switch PSW3 so that the programmable logic element PLE[1] to the programmable logic element PLE[m] are electrically connected to the wiring P[1] to the wiring P[1]. In addition, configuration data is set for the programmable logic element PLE[1] to the programmable logic element PLE[1] so that a weight coefficient for each neuron in the g-th intermediate layer with respect to an output signal of neurons in the g–1-th intermediate layer is set in each of the programmable logic element PLE[1] to the programmable logic element PLE[1].

In that configuration, data output from the second terminals of the programmable logic element PLE[1] to the programmable logic element PLE[m] are the above-described data stored in the retention circuits KC, that is, the results of the activation function operation based on the context g–1. The results are output from the second terminals of the programmable logic element PLE[1] to the programmable logic element PLE[m] when the potential of the clock signal CLK for the retention circuit KC changes from the high-level potential to the low-level potential. The result output from the second terminal of the programmable logic element PLE[j] is transmitted to each of the wiring Q[1] to the wiring Q[m] through the wiring P[j]. Then, the signal transmitted to the wiring Q[j] is input to the first terminal of the programmable logic element PLE[j].

That is, the signals input from the g–1-th intermediate layer to the g-th intermediate layer correspond to the signals output from the second terminals of the programmable logic element PLE[1] to the programmable logic element PLE[m].

The plurality of signals input to the first terminals of the programmable logic element PLE[1] to the programmable logic element PLE[m] are subjected to arithmetic processing by the product-sum operation circuit and the activation function circuit of each programmable logic element. Specifically, product-sum operation using the plurality of signals and respective weight coefficients corresponding to the signals and activation function operation using the result of the product-sum operation as input information are performed. Note that the weight coefficient and the activation function are based on the configuration of the context g, as described above.

The output result of the activation function operation is retained by the retention circuit KC illustrated in FIG. 21, as in the operations based on the context 1 and the context 2.

Lastly, a context N is selected. The context N is a configuration corresponding to connections between the N–1-th intermediate layer (output layer) and the output terminal PDR[1] to the output terminal PDR[n]. The NN circuit 100 corresponding to the context N is illustrated in FIG. 25.

At that time, configuration data are set for the programmable switch PSW1 to the programmable switch PSW3 so that the programmable logic element PLE[1] to the programmable logic element PLE[m] are electrically connected to the wiring R[1] to the wiring R[m].

In that configuration, data output from the second terminals of the programmable logic element PLE[1] to the programmable logic element PLE[m] are the above-described data stored in the retention circuits KC, that is, the results of the activation function operation based on the context N–1. The results are output from the second terminals of the programmable logic element PLE[1] to the programmable logic element PLE[m] when the potential of the clock signal CLK for the retention circuit KC changes from the high-level potential to the low-level potential. The results output from the second terminals of the programmable logic element PLE[1] to the programmable logic element PLE[m] are transmitted to the output terminal PDR[1] to the output terminal PDR[n] through the wiring R[1] to the wiring R[m]. Note that the output terminal PDR[n] refers to the output terminal PDR[m] here.

That is, the output results of the hierarchical neural network which are output from the N–1-th intermediate layer (output layer) correspond to the signals output from the second terminals of the programmable logic element PLE[1] to the programmable logic element PLE[m].

Note that the power consumption of the programmable logic elements that are not used as neurons in the input layer and the first intermediate layer to the N−1-th intermediate layer can be reduced by the above-described power gating.

Furthermore, in the arithmetic processing circuit 150 in FIG. 21, the weight coefficient can be updated by learning. In that case, a stricture in which configuration data corresponding to contexts for a desired neural network structure are generated and only configuration data on weight coefficients for the corresponding contexts are repeatedly changed is preferable. Note that the weight coefficient updating can be performed with a dedicated circuit for executing the corresponding arithmetic processing.

Moreover, the arithmetic processing circuit 150 in FIG. 21 can be configured such that the corresponding arithmetic processing is executed on a server. For example, a neural network structure is possible in which examination and learning of a hierarchical structure of a neural network are performed on a server to generate configuration data for a context corresponding to the optimized hierarchical structure and weight coefficients which are acquired by learning, the configuration data is transmitted to the arithmetic processing circuit 150 included in an electronic device other than the server, and inference (recognition) is executed in the electronic device while the contexts for the arithmetic processing circuit 150 in FIG. 21 are switched.

By forming the above-described NN circuit 100, a neural network arithmetic processing circuit which can be used for learning and inference can be obtained. In addition, a multi-context programmable neural network with a reduced circuit area owing to reduction in the number of elements and the number of wirings can be provided.

Figure 26:
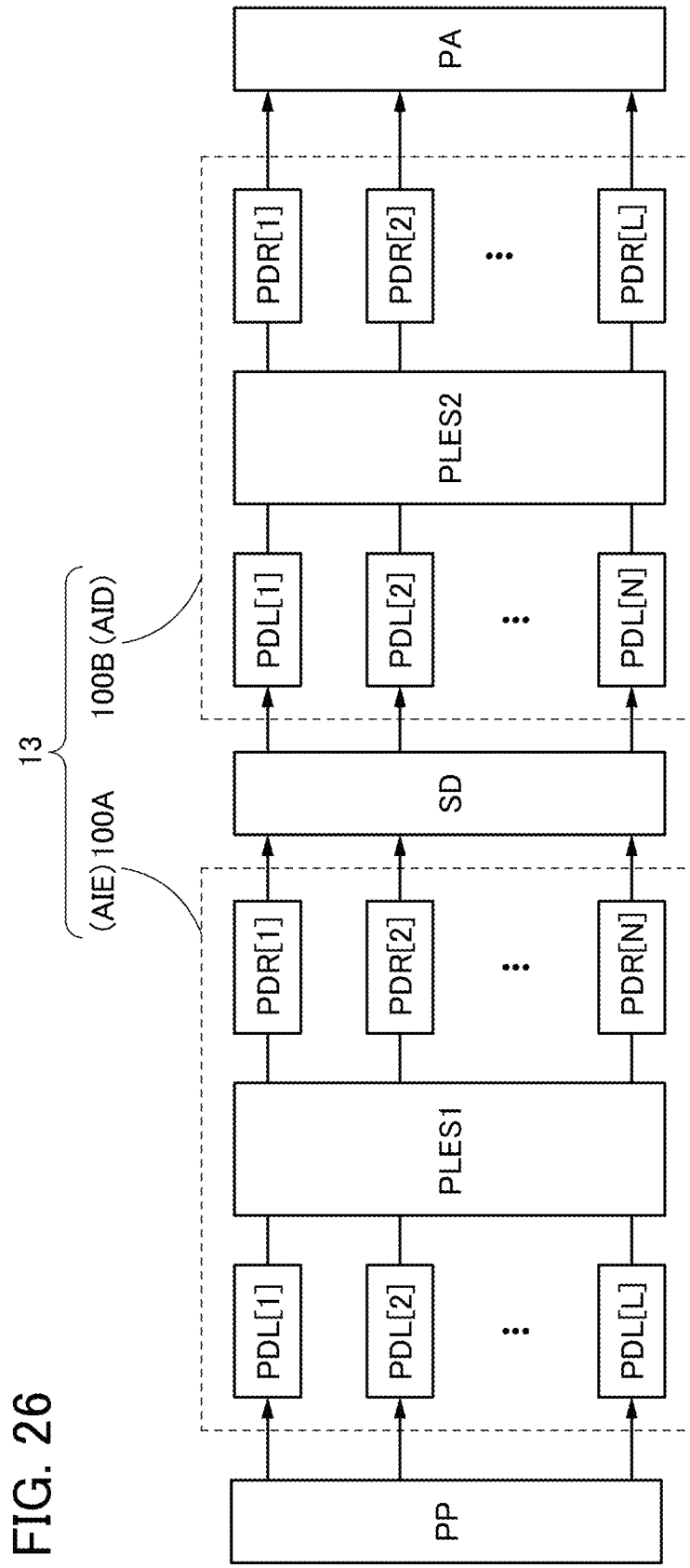
FIG. 26 A block diagram illustrating a structure example of an autoencoder.

Here, the case where the NN circuit 100 is used as each of the encoder AIE and the decoder AID of the autoencoder 13 described in Embodiment 1 will be considered. FIG. 26 illustrates a structure example of the autoencoder 13 in which an NN circuit 100A is used as the NN circuit 100 for the encoder AIE and an NN circuit 100B is used as the NN circuit 100 for the decoder AID. In FIG. 26, the NN circuit 100A and the NN circuit 100B are electrically connected to each other through the source driver circuit SD. Note that FIG. 26 also illustrates the image processing portion PP and the display portion PA, in addition to the source driver circuit SD.

Meanwhile, the autoencoder 13 is configured such that the number of wirings electrically connecting the intermediate layer ML2 of the encoder AIE and the intermediate layer ML3 of the decoder AID is small, as illustrated in FIG. 2. In other words, the encoder AIE is configured such that the number of neurons in the intermediate layer ML2 is small, and the decoder AID is configured such that the number of neurons in the intermediate layer ML3 is small.

In view of this, a structure in which the NN circuit 100A includes an input terminal PDL[1] to an input terminal PDL[L] (here, L is an integer greater than or equal to 1) and an output terminal PDR[1] to an output terminal PDR[N] (here, N is an integer greater than or equal to 1 and less than L), and the NN circuit 100B includes an input terminal PDL[1] to an input terminal PDL[N] and an output terminal PDR[1] to an output terminal PDR[L] is used. In addition, in FIG. 26, a plurality of programmable logic elements PLE included in the NN circuit 100A and those in the NN circuit 100B are denoted by a programmable logic element portion PLES1 and a programmable logic element portion PLES2, respectively.

As illustrated in FIG. 26, the autoencoder 13 can be formed using the NN circuit 100 as each of the encoder AIE and the decoder AID. Accordingly, image data transmitted from the image processing portion PP can be converted into feature-extracted image data by the NN circuit 100A. In addition, the feature-extracted image data can be restored to the original image data by the NN circuit 100B, and the restored image data can be transmitted to the display portion PA.

Note that although the number of the input terminals PDL of the NN circuit 100A is equal to the number of the output terminals PDR of the NN circuit 100B in FIG. 26, the number of the input terminals PDL of the NN circuit 100A may differ from the number of the output terminals PDR of the NN circuit 100B depending on the case, according to circumstances, or as needed.

<Configuration Example of Product-Sum Operation Circuit>

Next, a configuration example of a product-sum operation circuit for achieving the above-described hierarchical neural network will be described.

Figure 27:
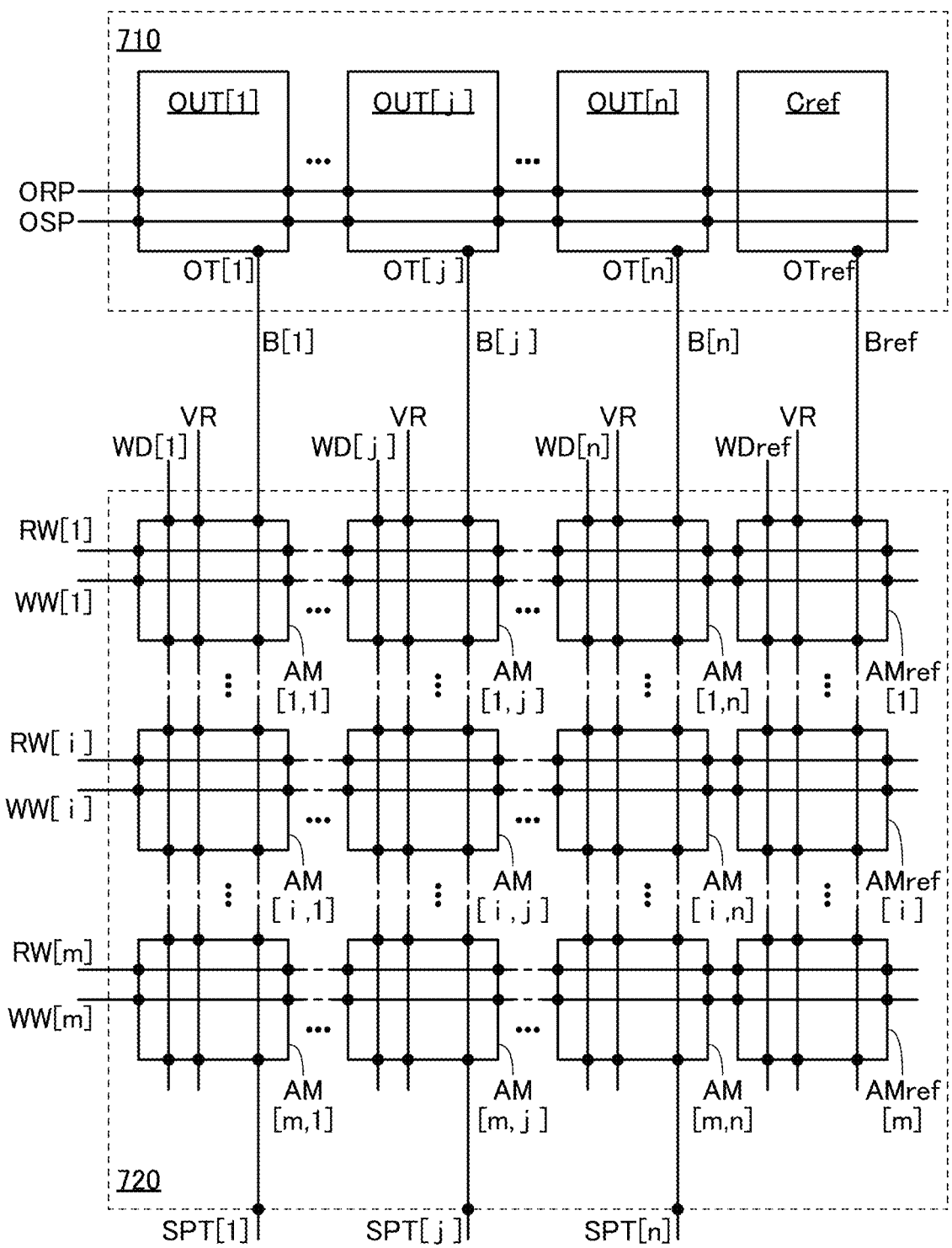
FIG. 27 A block diagram illustrating an example of a product-sum operation circuit.

In FIG. 27, an example of a product-sum operation circuit is illustrated as a block diagram. The product-sum operation circuit 700 illustrated in FIG. 27 includes an offset circuit 710 and a memory cell array 720.

The offset circuit 710 includes a column output circuit OUT[1] to a column output circuit OUT[n] (here, n is an integer greater than or equal to 1) and a reference column output circuit Cref.

The memory cell array 720 includes m (here, m is an integer greater than or equal to 1) memory cells AM in the column direction and n memory cells AM in the row direction, that is, m×n memory cells AM in total, and m memory cells AMref in the column direction. The memory cells AM and the memory cells AMref are arranged in a matrix of m×(n+1) in the memory cell array 720. Specifically, in the memory cell array 720 in FIG. 27, the memory cell AM positioned in an i-th row and a j-th column is denoted by a memory cell AM[i, j] (here, i is an integer greater than or equal to 1 and less than or equal to m, and j is an integer greater than or equal to 1 and less than or equal to n), and the memory cell AMref positioned in the i-th row is denoted by a memory cell AMref[i].

Note that the memory cell AM retains a potential corresponding to first analog data, and the memory cell AMref retains a predetermined potential. Note that the predetermined potential is a potential necessary for the product-sum operation processing, and in this specification, data corresponding to this potential is referred to as reference analog data in some cases.

The memory cell array 720 includes an output terminal SPT[1] to an output terminal SPT[n].

The column output circuit OUT[j] includes an output terminal OT[j], and the reference column output circuit Cref includes an output terminal OTref.

A wiring ORP is electrically connected to the column output circuit OUT[1] to the column output circuit OUT[n], and a wiring OSP is electrically connected to the column output circuit OUT[1] to the column output circuit OUT[n]. The wiring ORP and the wiring OSP are wirings for supplying a control signal to the offset circuit 710.

An output terminal SPT[j] of the memory cell array 720 is electrically connected to a wiring B[j].

The output terminal OT[j] of the column output circuit OUT[j] is electrically connected to the wiring B[j].

The output terminal OTref of the reference column output circuit Cref is electrically connected to a wiring Bref.

The memory cell AM[i, j] is electrically connected to a wiring RW[i], a wiring WW[i], a wiring WD[j], the wiring B[j], and a wiring VR.

The memory cell AMref[i] is electrically connected to the wiring RW[i], the wiring WW[i], a wiring WDref, the wiring Bref, and the wiring VR.

The wiring WW[i] functions as a wiring that supplies a selection signal to a memory cell AM[i, 1] to a memory cell AM[i, n] and the memory cell AMref[i], and the wiring RW[i] functions as a wiring for supplying either a reference potential or a potential corresponding to second analog data to the memory cell AM[i, 1] to the memory cell AM[i, n] and the memory cell AMref[i]. The wiring WD[j] functions as a wiring for supplying data to be written to the memory cells AM in the j-th column, and the wiring VR functions as a wiring for supplying a predetermined potential to the memory cells AM or the memory cells AMref when data is read out from the memory cells AM or the memory cells AMref.

The wiring B[j] functions as a wiring that supplies a signal from the column output circuit OUT[j] to the memory cells AM in the j-th column in the memory cell array 720.

The wiring Bref functions as a wiring that supplies a signal from the reference column output circuit Cref to a memory cell AMref[1] to a memory cell AMref[m].

Note that in the product-sum operation circuit 700 illustrated in FIG. 27, only the offset circuit 710, the memory cell array 720, the column output circuit OUT[1], the column output circuit OUT[j], the column output circuit OUT[n], the reference column output circuit Cref, an output terminal OT[1], the output terminal OT[j], an output terminal OT[n], the output terminal OTref, the output terminal SPT[1], the output terminal SPT[j], the output terminal SPT[n], a memory cell AM[1, 1], the memory cell AM[i, 1], a memory cell AM[m, 1], a memory cell AM[1, j], the memory cell AM[i, j], a memory cell AM[m, j], a memory cell AM[1, n], the memory cell AM[i, n], a memory cell AM[m, n], the memory cell AMref[1], the memory cell AMref[i], the memory cell AMref[m], the wiring OSP, the wiring ORP, a wiring B[1], the wiring B[j], a wiring B[n], the wiring Bref, a wiring WD[1], the wiring WD[j], a wiring WD[n], the wiring WDref, the wiring VR, a wiring RW[1], the wiring RW[i], a wiring RW[m], a wiring WW[1], the wiring WW[i], and a wiring WW[m] are illustrated, and other circuits, wirings, and elements, and reference numerals thereof are omitted.

The configuration of the product-sum operation circuit 700 is not limited to the configuration illustrated in FIG. 27. Depending on the case, according to circumstances, or as needed, the configuration of the product-sum operation circuit 700 can be changed. For example, depending on the circuit configuration of the product-sum operation circuit 700, a configuration in which one wiring is provided to serve as the wiring WD[j] and the wiring VR may be used. Alternatively, depending on the circuit configuration of the product-sum operation circuit 700, a configuration in which one wiring is provided to serve as the wiring ORP and the wiring OSP may be used.

<<Offset Circuit 710>>

Figure 28:
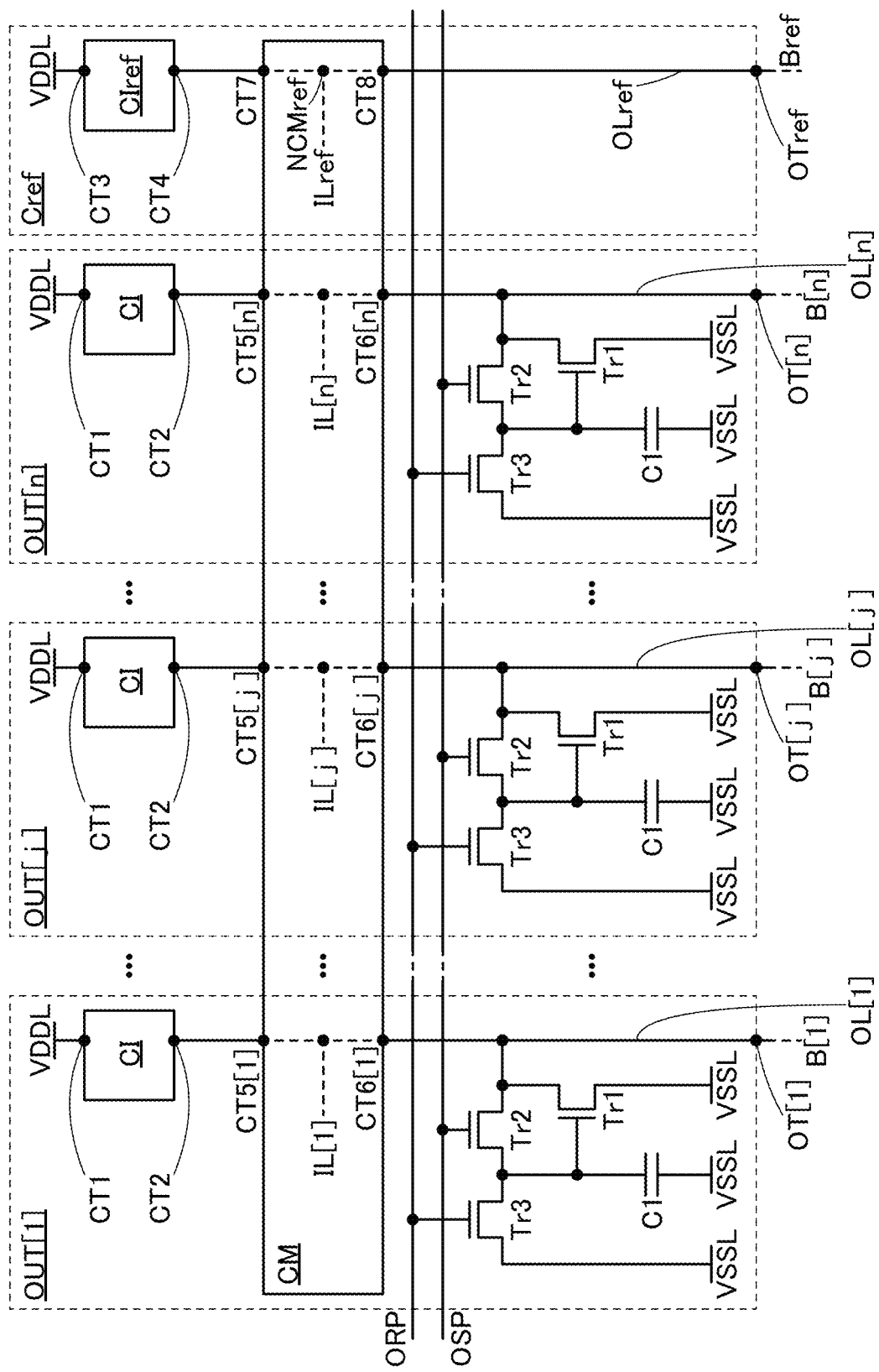
FIG. 28 A circuit diagram illustrating an example of an offset circuit in a product-sum operation circuit.

Next, examples of circuit configurations that can be applied to the offset circuit 710 will be described. In FIG. 28, an offset circuit 711 is illustrated as an example of the offset circuit 710.

The offset circuit 711 is electrically connected to a wiring VDDL and a wiring VSSL so that power supply voltages are supplied. Specifically, each of the column output circuit OUT[1] to the column output circuit OUT[n] is electrically connected to the wiring VDDL and the wiring VSSL, and the reference column output circuit Cref is electrically connected to the wiring VDDL. Note that a current mirror circuit CM to be described later is also electrically connected to the wiring VSSL in some cases. The wiring VDDL is a wiring that supplies the high-level potential, and the wiring VSSL is a wiring that supplies the low-level potential.

The internal circuit configuration of the column output circuit OUT[j] will be described below. The column output circuit OUT[j] includes a constant current circuit CI, a transistor Tr1 to a transistor Tr3, a capacitor C1, and a wiring OL[j]. In addition, the current mirror circuit CM is shared between the column output circuit OUT[1] to the column output circuit OUT[n] and the reference column output circuit Cref.

The constant current circuit C1 includes a terminal CT1 and a terminal CT2. The terminal CT1 functions as an input terminal of the constant current circuit CI, and the terminal CT2 functions as an output terminal of the constant current circuit CI. Moreover, the current mirror circuit CM shared between the column output circuit OUT[1] to the column output circuit OUT[n] and the reference column output circuit Cref includes a terminal CT5[1] to a terminal CT5[n], a terminal CT6[1] to a terminal CT6[n], a terminal CT7, and a terminal CT8.

The constant current circuit CI has a function of keeping a current flowing from the terminal CT1 to the terminal CT2 constant.

In the column output circuit OUT[j], a first terminal of the transistor Tr1 is electrically connected to the wiring OL[j], a second terminal of the transistor Tr1 is electrically connected to the wiring VSSL, and a gate of the transistor Tr1 is electrically connected to a first terminal of the capacitor C1. A first terminal of a transistor Tr2 is electrically connected to the wiring OL[j], a second terminal of the transistor Tr2 is electrically connected to the first terminal of the capacitor C1, and a gate of the transistor Tr2 is electrically connected to the wiring OSP. A first terminal of the transistor Tr3 is electrically connected to the first terminal of the capacitor C1, a second terminal of the transistor Tr3 is electrically connected to the wiring VSSL, and a gate of the transistor Tr3 is electrically connected to the wiring ORP. A second terminal of the capacitor C1 is electrically connected to the wiring VSSL.

Note that each of the transistor Tr1 to the transistor Tr3 is preferably an OS transistor. In addition, it is further preferable that a channel formation region in each of the transistor Tr1 to the transistor Tr3 be an oxide containing at least one of indium, the element M (the element M is aluminum, gallium, yttrium, or tin), and zinc.

An OS transistor has a characteristic of an extremely small off-state current. Thus, when the OS transistor is in a non-conduction state, a leakage current flowing between the source and the drain can be extremely small. In particular, when an OS transistor is used as the transistor Tr2, the electric charge retained by the capacitor C1 can be prevented from flowing between a source and a drain of the transistor Tr2 that is in an off state. Furthermore, when an OS transistor is used as the transistor Tr3, the electric charge retained by the capacitor C1 can be prevented from flowing between a source and a drain of the transistor Tr3 that is in an off state. Accordingly, the potential of the gate of the transistor Tr1 can be retained for a long time; thus, a stable constant current can flow between a source and a drain of the transistor Tr1. As a result, the product-sum operation circuit having high calculation accuracy can be achieved in some cases.

In the column output circuit OUT[j], the terminal CT1 of the constant current circuit CI is electrically connected to the wiring VDDL, and the terminal CT2 of the constant current circuit CI is electrically connected to the terminal CT5[*j*] of the current mirror circuit CM. The terminal CT6[*j*] of the current mirror circuit CM is electrically connected to the output terminal OT[j].

Note that the wiring OL[j] is a wiring that electrically connects the terminal CT2 of the constant current circuit CI to the output terminal OT[j] through the terminal CT5[*j*] and the terminal CT6[*j*] of the current mirror circuit CM.

Next, the reference column output circuit Cref will be described. The reference column output circuit Cref includes a constant current circuit CIref and a wiring OLref. As described above, the reference column output circuit Cref also shares the current mirror circuit CM with the column output circuit OUT[1] to the column output circuit OUT[n].

The constant current circuit CIref includes a terminal CT3 and a terminal CT4. The terminal CT3 functions as an input terminal of the constant current circuit CIref, and the terminal CT4 functions as an output terminal of the constant current circuit CIref.

The constant current circuit CIref has a function of keeping a current flowing from the terminal CT3 to the terminal CT4 constant.

In the reference column output circuit Cref, the terminal CT3 of the constant current circuit CIref is electrically connected to the wiring VDDL, and the terminal CT4 of the constant current circuit CIref is electrically connected to the terminal CT7 of the current mirror circuit CM. The terminal CT8 of the current mirror circuit CM is electrically connected to the output terminal OTref.

Note that the wiring OLref is a wiring that electrically connects the terminal CT4 of the constant current circuit CIref to the output terminal OTref through the terminal CT7 and the terminal CT8 of the current mirror circuit CM.

In the current mirror circuit CM, the terminal CT5[*j*] is electrically connected to the terminal CT6[*j*], and the terminal CT7 is electrically connected to the terminal CT8. In addition, a wiring IL[j] is electrically connected between the terminal CT5[*j*] and the terminal CT6[*j*], and a wiring ILref is electrically connected between the terminal CT7 and the terminal CT8. Furthermore, a connection portion of a wiring between the terminal CT7 and the terminal CT8 and the wiring ILref is a node NCMref. The current mirror circuit CM has a function of equalizing the amount of current flowing through the wiring ILref and the amount of current flowing through each of a wiring IL[1] to a wiring IL[n] with reference to the potential of the node NCMref.

Note that in the offset circuit 711 illustrated in FIG. 28, only the column output circuit OUT[1], the column output circuit OUT[j], the column output circuit OUT[n], the reference column output circuit Cref, the constant current circuit CI, the constant current circuit CIref, the current mirror circuit CM, the output terminal OT[1], the output terminal OT[j], the output terminal OT[n], the output terminal OTref, the terminal CT1, the terminal CT2, the terminal CT3, the terminal CT4, the terminal CT5[1], the terminal CT5[*j*], the terminal CT5[*n*], the terminal CT6[1], the terminal CT6[*j*], the terminal CT6[*n*], the terminal CT7, the terminal CT8, the transistor Tr1, the transistor Tr2, the transistor Tr3, the capacitor C1, a wiring OL[1], the wiring OL[1], a wiring OL[n], the wiring OLref, the wiring ORP, the wiring OSP, the wiring B[1], the wiring B[j], the wiring B[n], the wiring Bref, the wiring IL[1], the wiring IL[j], the wiring IL[n], the wiring ILref, the node NCMref, the wiring VDDL, and the wiring VSSL are illustrated, and other circuits, wirings, and elements, and reference numerals thereof are omitted.

Note that the configuration of the offset circuit 711 is not limited to the configuration illustrated in FIG. 28. Depending on the case, according to circumstances, or as needed, the configuration of the offset circuit 711 can be changed.

[Constant Current Circuits CI and CIref]

Next, an example of an internal configuration of the constant current circuit CI and the constant current circuit CIref will be described.

Figure 29:
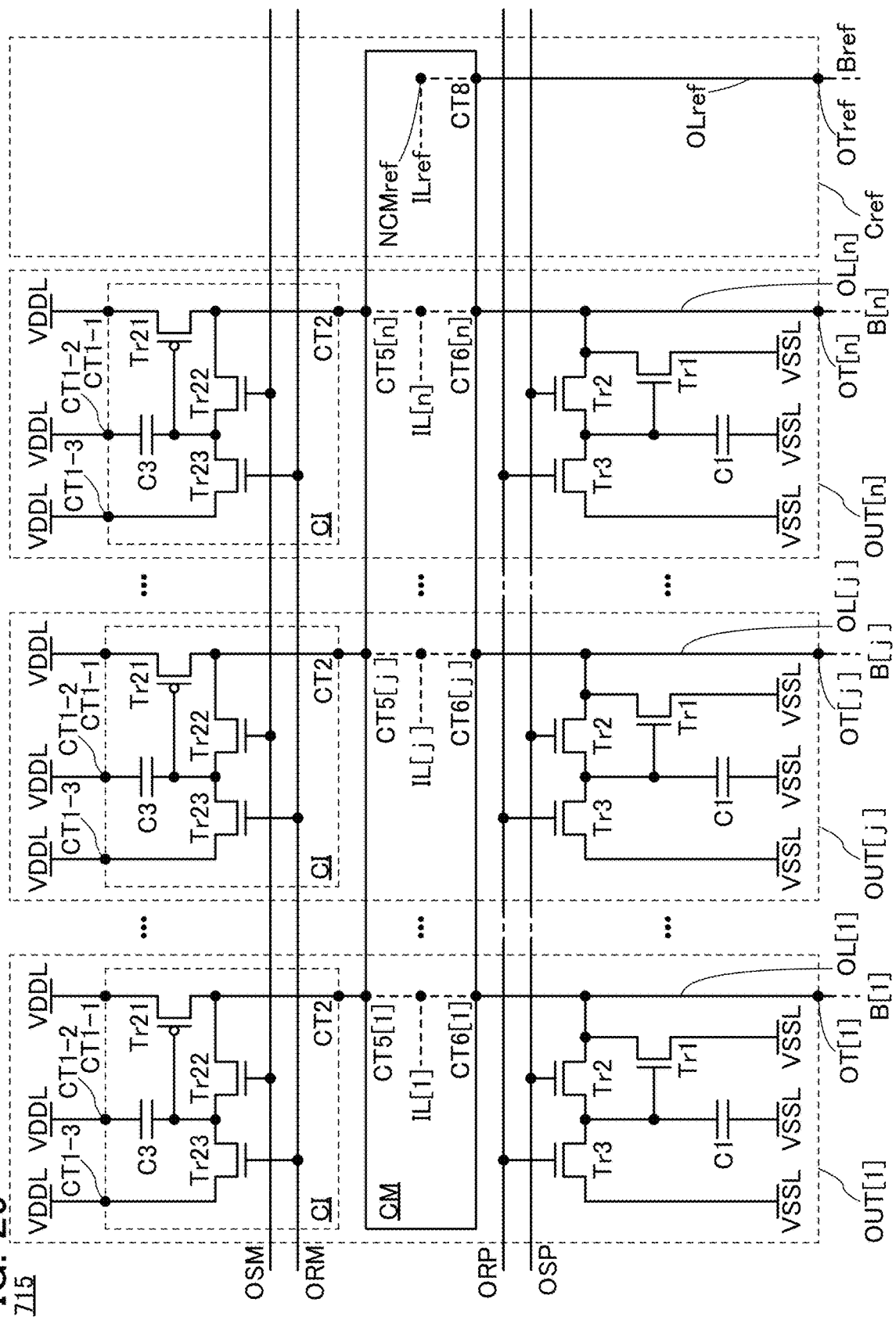
FIG. 29 A circuit diagram illustrating an example of an offset circuit in a product-sum operation circuit.

An offset circuit 715 illustrated in FIG. 29 is a circuit diagram illustrating an internal configuration example of the constant current circuit CI and the constant current circuit CIref included in the offset circuit 711 in FIG. 28.

In the column output circuit OUT[j], the constant current circuit CI includes a transistor Tr21, a transistor Tr22, a transistor Tr23, and a capacitor C3. The constant current circuit CI in the offset circuit 715 also includes a terminal CT1-1, a terminal CT1-2, and a terminal CT1-3 as the terminal CT1 of the constant current circuit CI in the offset circuit 711. Furthermore, the offset circuit 715 is electrically connected to a wiring OSM and a wiring ORM, which are for transmitting a control signal to the constant current circuit CI.

Note that the transistor Tr21 is a p-channel transistor, and the transistor Tr22 and the transistor Tr23 are n-channel transistors. In particular, each of the transistor Tr22 and the transistor Tr23 is preferably an OS transistor. In addition, it is further preferable that the channel formation region in each of the transistor Tr22 and the transistor Tr23 be an oxide containing at least one of indium, the element M, and zinc.

As described above, an OS transistor has a characteristic of an extremely small off-state current. In particular, when an OS transistor is used as the transistor Tr22, the electric charge retained by the capacitor C3 can be prevented from flowing between a source and a drain of the transistor Tr22 that is in an off state. In addition, when an OS transistor is used as the transistor Tr23, the electric charge retained by the capacitor C3 can be prevented from flowing between a source and a drain of the transistor Tr23 that is in an off state. Accordingly, the potential of a gate of the transistor Tr21 can be retained for a long time; thus, a stable constant current can flow between a source and a drain of the transistor Tr21. As a result, the product-sum operation circuit having high calculation accuracy can be achieved in some cases.

The first terminal of the transistor Tr21 is electrically connected to the terminal CT1-1, the second terminal of the transistor Tr21 is electrically connected to the terminal CT2, and the gate of the transistor Tr21 is electrically connected to the first terminal of the capacitor C3. The first terminal of the transistor Tr22 is electrically connected to the terminal CT2, the second terminal of the transistor Tr22 is electrically connected to the first terminal of the capacitor C3, and a gate of the transistor Tr22 is electrically connected to the wiring OSM. The first terminal of the transistor Tr23 is electrically connected to the first terminal of the capacitor C3, the second terminal of the transistor Tr23 is electrically connected to the terminal CT1-3, and a gate of the transistor Tr23 is electrically connected to the wiring ORM. The second terminal of the capacitor C3 is electrically connected to the terminal CT1-2.

The terminal CT1-1 to the terminal CT1-3 are each electrically connected to the wiring VDDL.

The offset circuit 715 illustrated in FIG. 29 has a configuration in which the reference column output circuit Cref does not include the constant current circuit CIref. In a strict sense, in the reference column output circuit Cref, the current mirror circuit CM supplies a current to the wiring OIref, so that the current mirror circuit CM serves as a current source. In other words, the current mirror circuit CM in the reference column output circuit Cref can be regarded as the constant current circuit CIref for the wiring OLref. Note that in terms of a circuit configuration, the offset circuit 715 has a structure in which the constant current circuit CIref is removed from the reference column output circuit Cref in the offset circuit 711 illustrated in FIG. 28.

Note that in the offset circuit 715 illustrated in FIG. 29, only the column output circuit OUT[1], the column output circuit OUT[j], the column output circuit OUT[n], the reference column output circuit Cref, the constant current circuit CI, the current mirror circuit CM, the output terminal OT[1], the output terminal OT[j], the output terminal OT[n], the output terminal OTref, the terminal CT1-1, the terminal CT1-2, the terminal CT1-3, the terminal CT2, the terminal CT5[1], the terminal CT5[j], the terminal CT5[n], the terminal CT6[1], the terminal CT6[j], the terminal CT6[n], the terminal CT8, the transistor Tr1, the transistor Tr2, the transistor Tr3, the transistor Tr21, the transistor Tr22, the transistor Tr23, the capacitor C1, the capacitor C3, the wiring OL[1], the wiring OL[j], the wiring OL[n], the wiring OLref, the wiring ORP, the wiring OSP, the wiring OSM, the wiring ORM, the wiring B[1], the wiring B[j], the wiring B[n], the wiring Bref, the wiring IL[1], the wiring IL[j], the wiring IL[n], the wiring ILref, the node NCMref, the wiring VDDL, and the wiring VSSL are illustrated, and other circuits, wirings, and elements, and reference numerals thereof are omitted.

The operation of the constant current circuit CI in the offset circuit 715 will be described below.

When the high-level potential is input to the wiring ORM and the low-level potential is input to the wiring OSM, the transistor Tr23 is brought into a conduction state and the transistor Tr22 is brought into a non-conduction state. In this case, the first terminal of the capacitor C3 is supplied with the high-level potential from the wiring VDDL through the transistor Tr23. The second terminal of the capacitor C3 is being supplied with the high-level potential from the wiring VDDL; thus, the potential retained by the capacitor C3 becomes 0. That is, by inputting the high-level potential to the wiring ORM and inputting the low-level potential to the wiring OSM, electric charge retained by the capacitor C3 is released, so that the constant current circuit CI can be initialized.

When the low-level potential is input to the wiring ORM and the high-level potential is input to the wiring OSM, the transistor Tr23 is brought into a non-conduction state and the transistor Tr22 is brought into a conduction state. In this case, the second terminal of the transistor Tr21 is electrically connected to the gate of the transistor Tr21 through the transistor Tr22. That is, the transistor Tr21 has a diode-connected structure. Moreover, the potential of the first terminal of the capacitor C3 becomes equal to the potential of the second terminal of the transistor Tr21 over time.

In this state, by inputting the low-level potential to the wiring OSM to bring the transistor Tr22 into a non-conduction state, a potential equal to that of the second terminal of the transistor Tr21 is retained by the capacitor C3. Accordingly, the potential is retained at the gate of the transistor Tr21, and thus a constant current based on the potential flows through the transistor Tr21.

Note that the configurations of the constant current circuit CI and the constant current circuit CIref in the offset circuit of one embodiment of the present invention are not limited to those in the offset circuit 715 illustrated in FIG. 29. Depending on the case, according to circumstances, or as needed, removing the component, such as a circuit, an element, or a wiring, of the offset circuit 715, newly adding another component, such as a circuit, an element, or a wiring, to the offset circuit 715, for example, changing the internal connection structure in the offset circuit 715 can be performed.

[Current Mirror Circuit CM]

Next, an internal configuration example of the current mirror circuit CM will be described.

Figure 30:
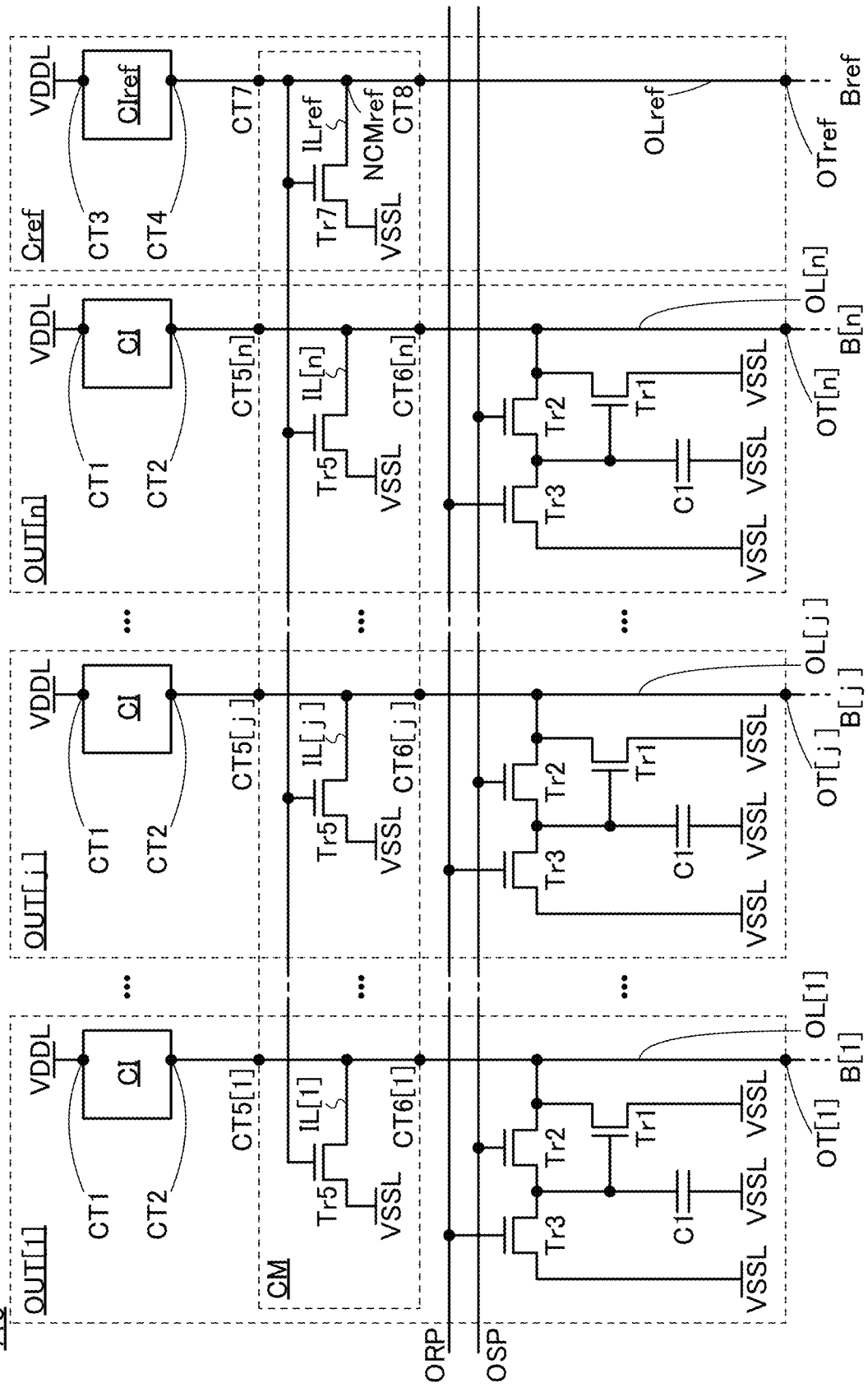
FIG. 30 A circuit diagram illustrating an example of an offset circuit in a product-sum operation circuit.

An offset circuit 713 illustrated in FIG. 30 is a circuit diagram illustrating an internal configuration example of the current mirror circuit CM included in the offset circuit 711 in FIG. 28.

The current mirror circuit CM includes a transistor Tr5 in each of the column output circuit OUT[1] to the column output circuit OUT[n], and includes a transistor Tr7 in the reference column output circuit Cref. Note that the transistor Tr5 and the transistor Tr7 are each an n-channel transistor.

A first terminal of the transistor Tr5 in the column output circuit OUT[j] is electrically connected to the terminal CT5[j] and the terminal CT6[j] of the current mirror circuit CM. A second terminal of the transistor Tr5 in the column output circuit OUT[j] is electrically connected to the wiring VSSL. A gate of the transistor Tr5 in the column output circuit OUT[j] is electrically connected to the terminal CT7 and the terminal CT8 of the current mirror circuit CM.

A first terminal of the transistor Tr7 in the reference column output circuit Cref is electrically connected to the terminal CT7 and the terminal CT8 of the current mirror circuit CM. A second terminal of the transistor Tr7 in the reference column output circuit Cref is electrically connected to the wiring VSSL. A gate of the transistor Tr7 in the reference column output circuit Cref is electrically connected to the terminal CT7 and the terminal CT8 of the current mirror circuit CM.

By using this connection structure, the potential of the node NCMref can be applied to the gate of the transistor Tr5 in each of the column output circuit OUT[1] to the column output circuit OUT[n], and the amount of current flowing between the source and the drain of the transistor Tr7 and the amount of current flowing between the source and the drain of the transistor Tr5 in each of the column output circuit OUT[1] to the column output circuit OUT[n] can be the same. Note that the transistor Tr5 and the transistor Tr7 of the current mirror circuit CM in the offset circuit 713 are n-channel transistors and these transistors are connected to the wiring VSSL to which the low-level potential is applied, and thus the current mirror circuit CM operates as a current sink.

Note that each of the transistor Tr5 and the transistor Tr7 is preferably an OS transistor. In addition, it is further preferable that a channel formation region in each of the transistor Tr5 and the transistor Tr7 be an oxide containing at least one of indium, the element M, and zinc.

Note that in the offset circuit 713 illustrated in FIG. 30, only the column output circuit OUT[1], the column output circuit OUT[j], the column output circuit OUT[n], the reference column output circuit Cref, the constant current circuit CI, the constant current circuit CIref, the current mirror circuit CM, the output terminal OT[1], the output terminal OT[j], the output terminal OT[n], the output terminal OTref, the terminal CT1, the terminal CT2, the terminal CT3, the terminal CT4, the terminal CT5[1], the terminal CT5[j], the terminal CT5[n], the terminal CT6[1], the terminal CT6[j], the terminal CT6[n], the terminal CT7, the terminal CT8, the transistor Tr1, the transistor Tr2, the transistor Tr3, the transistor Tr5, the transistor Tr7, the capacitor C1, the wiring OL[1], the wiring OL[j], the wiring OL[n], the wiring OLref, the wiring ORP, the wiring OSP, the wiring B[1], the wiring B[j], the wiring B[n], the wiring Bref, the wiring IL[1], the wiring IL[j], the wiring IL[n], the wiring ILref, the node NCMref, the wiring VDDL, and the wiring VSSL are illustrated, and other circuits, wirings, and elements, and reference numerals thereof are omitted.

Note that the configuration of the current mirror circuit CM of the offset circuit of one embodiment of the present invention is not limited to that of the offset circuit 713 illustrated in FIG. 30. Depending on the case, according to circumstances, or as needed, removing the component, such as a circuit, an element, or a wiring, of the offset circuit 713, newly adding another component, such as a circuit, an element, or a wiring, to the offset circuit 713, for example, changing the internal connection structure of the offset circuit 713 can be performed. For example, the configuration of the current mirror circuit CM may be changed as in an offset circuit 716 illustrated in FIG. 31.

Figure 31:
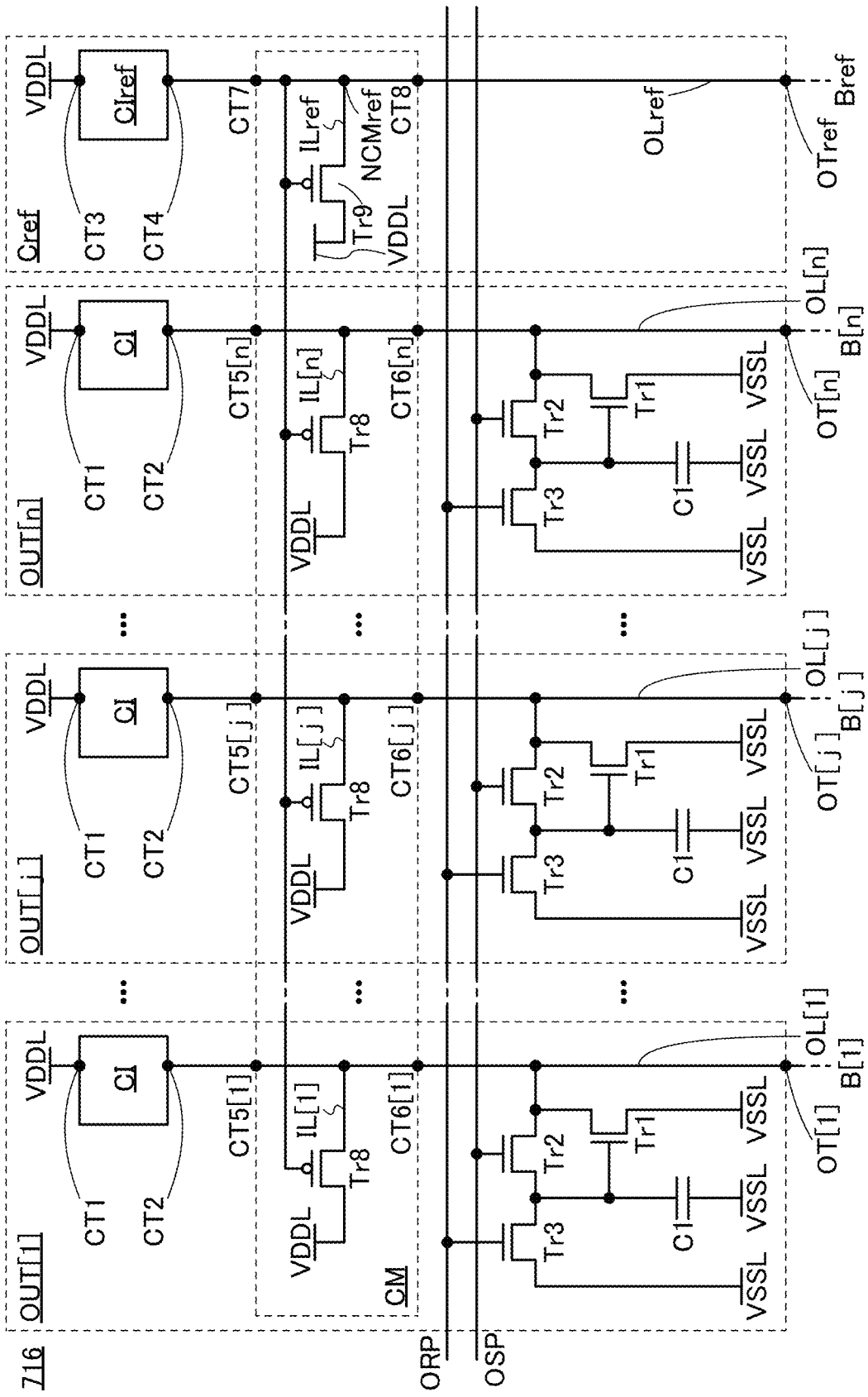
FIG. 31 A circuit diagram illustrating an example of an offset circuit in a product-sum operation circuit.

The current mirror circuit CM of the offset circuit 716 illustrated in FIG. 31 includes a transistor Tr8 in each of the column output circuit OUT[1] to the column output circuit OUT[n], and includes a transistor Tr9 in the reference column output circuit Cref. Note that the transistor Tr8 and the transistor Tr9 are each a p-channel transistor.

A first terminal of the transistor Tr8 in the column output circuit OUT[j] is electrically connected to the terminal CT5[j] and the terminal CT6[j] of the current mirror circuit CM. A second terminal of the transistor Tr8 in the column output circuit OUT[j] is electrically connected to the wiring VDDL. A gate of the transistor Tr8 in the column output circuit OUT[j] is electrically connected to the terminal CT7 and the terminal CT8 of the current mirror circuit CM.

A first terminal of the transistor Tr9 in the reference column output circuit Cref is electrically connected to the terminal CT7 and the terminal CT8 of the current mirror circuit CM. A second terminal of the transistor Tr9 in the reference column output circuit Cref is electrically connected to the wiring VDDL. A gate of the transistor Tr9 in the reference column output circuit Cref is electrically connected to the terminal CT7 and the terminal CT8 of the current mirror circuit CM.

By using this connection structure, the potential of the node NCMref can be applied to the gate of the transistor Tr8 in each of the column output circuit OUT[1] to the column output circuit OUT[n], and the amount of current flowing between the source and the drain of the transistor Tr9 and the amount of current flowing between the source and the drain of the transistor Tr8 in each of the column output circuit OUT[1] to the column output circuit OUT[n] can be the same. Note that the transistor Tr8 and the transistor Tr9 of the current mirror circuit CM in the offset circuit 716 are p-channel transistors and these transistors are connected to the wiring VDDL to which the high-level potential is applied, and thus the current mirror circuit CM operates as a current source.

Note that in the offset circuit 716 illustrated in FIG. 31, only the column output circuit OUT[1], the column output circuit OUT[j], the column output circuit OUT[n], the reference column output circuit Cref, the constant current circuit CI, the constant current circuit CIref, the current mirror circuit CM, the output terminal OT[1], the output terminal OT[j], the output terminal OT[n], the output terminal OTref, the terminal CT1, the terminal CT2, the terminal CT3, the terminal CT4, the terminal CT5[1], the terminal CT5[j], the terminal CT5[n], the terminal CT6[1], the terminal CT6[j], the terminal CT6[n], the terminal CT7, the terminal CT8, the transistor Tr1, the transistor Tr2, the transistor Tr3, the transistor Tr8, the transistor Tr9, the capacitor C1, the wiring OL[1], the wiring OL[j], the wiring OL[n], the wiring OLref, the wiring ORP, the wiring OSP, the wiring B[1], the wiring B[j], the wiring B[n], the wiring Bref, the wiring IL[1], the wiring IL[1], the wiring IL[n], the wiring ILref, the node NCMref, the wiring VDDL, and the wiring VSSL are illustrated, and other circuits, and wirings, elements, and reference numerals thereof are omitted.

<<Memory Cell Array 720>>

Figure 32:
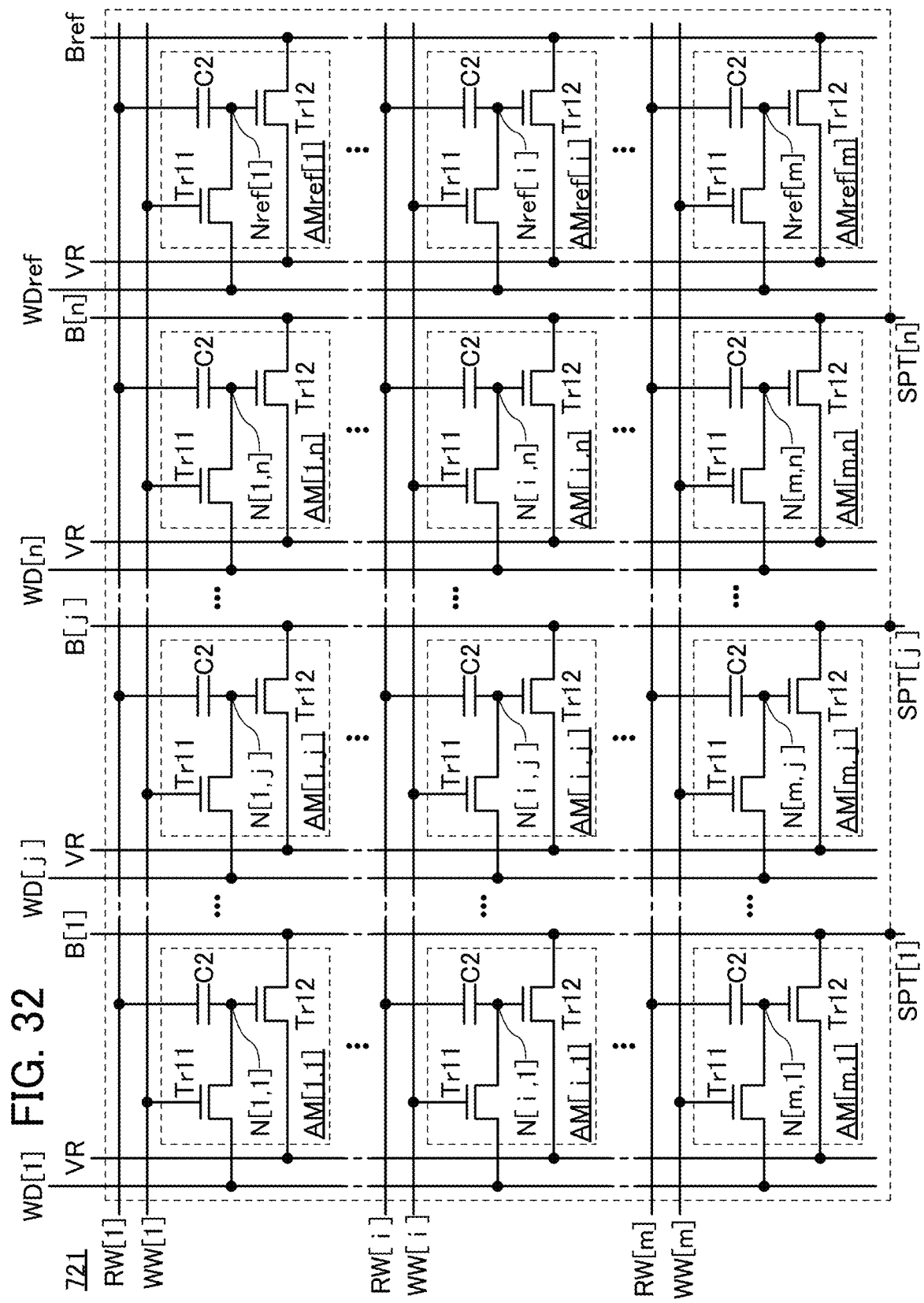
FIG. 32 A circuit diagram illustrating an example of a memory cell array in a product-sum operation circuit.

Next, a circuit configuration example that can be used in the memory cell array 720 will be described. FIG. 32 illustrates a memory cell array 721 as an example of the memory cell array 720.

The memory cell array 721 includes the memory cells AM and the memory cells AMref. Each of all the memory cells AM included in the memory cell array 721 includes a transistor Tr11, a transistor Tr12, and a capacitor C2. The memory cell AMref[1] to the memory cell AMref[m] each include the transistor Tr11, the transistor Tr12, and the capacitor C2.

The description of the connection structure in the memory cell array 721 will be made with a focus on the memory cell AM[i, j]. A first terminal of the transistor Tr1 is electrically connected to a gate of the transistor Tr12 and a first terminal of the capacitor C2, a second terminal of the transistor Tr11 is electrically connected to the wiring WD[j], and a gate of the transistor Tr11 is electrically connected to the wiring WW[i]. A first terminal of the transistor Tr12 is electrically connected to the wiring B[j], and a second terminal of the transistor Tr12 is electrically connected to the wiring VR. A second terminal of the capacitor C2 is electrically connected to the wiring RW[i].

In the memory cell AM[i, j], a connection portion of the first terminal of the transistor Tr11, the gate of the transistor Tr12, and the first terminal of the capacitor C2 is referred to as a node N[i, j]. In this embodiment, a potential corresponding to the first analog data is retained at the node N[i, j].

Next, the description will be made with a focus on the memory cell AMref[i]. A first terminal of the transistor Tr11 is electrically connected to a gate of the transistor Tr12 and a first terminal of the capacitor C2, a second terminal of the transistor Tr11 is electrically connected to the wiring WDref, and a gate of the transistor Tr1 is electrically connected to the wiring WW[i]. A first terminal of the transistor Tr12 is electrically connected to the wiring Bref, and a second terminal of the transistor Tr12 is electrically connected to the wiring VR. A second terminal of the capacitor C2 is electrically connected to the wiring RW[i].

In the memory cell AMref[i], a connection portion of the first terminal of the transistor Tr11, the gate of the transistor Tr12, and the first terminal of the capacitor C2 is referred to as a node Nref[i].

Note that each of the transistor Tr11 and the transistor Tr12 is preferably an OS transistor. In addition, it is further preferable that a channel formation region in each of the transistor Tr11 and the transistor Tr12 be an oxide containing at least one of indium, the element M, and zinc.

With use of the OS transistors as the transistor Tr1 and the transistor Tr12, the leakage current of each of the transistor Tr11 and the transistor Tr12 can be reduced, so that the product-sum operation circuit with high calculation accuracy can be provided in some cases. Furthermore, with use of the OS transistor as the transistor Tr11, the amount of leakage current from the retention node to the writing word line can be extremely small when the transistor Tr11 is in a non-conduction state. In other words, the frequency of refresh operation of the potential at the retention node can be reduced; thus, power consumption of the product-sum operation circuit can be reduced.

Furthermore, when OS transistors are used as all of the transistor Tr1 to transistor Tr3, transistor Tr5, transistor Tr7, transistor Tr11, transistor Tr12, transistor Tr22, and transistor Tr23 described above, a manufacturing process of the product-sum operation circuit can be shortened. In other words, time needed for manufacturing the product-sum operation circuit can be shortened, so that the number of units manufactured in a certain time period can be increased.

Note that the transistor Tr1, the transistor Tr5, the transistor Tr7 to the transistor Tr9, the transistor Tr12, and the transistor Tr21 operate in a saturation region unless otherwise specified. In other words, the gate voltage, source voltage, and drain voltage of each of the transistor Tr1, the transistor Tr5, the transistor Tr7 to the transistor Tr9, the transistor Tr12, and the transistor Tr21 are appropriately biased so that the transistors operate in the saturation region. Note that even when the operations of the transistor Tr1, the transistor Tr5, the transistor Tr7 to the transistor Tr9, the transistor Tr12, and the transistor Tr21 are deviated from the operation in an ideal saturation region, the gate voltage, source voltage, and drain voltage of each of the transistor Tr1, the transistor Tr5, the transistor Tr7 to the transistor Tr9, the transistor Tr12, and the transistor Tr21 are regarded as being appropriately biased as long as the accuracy of output data is obtained within a desired range.

Note that in the memory cell array 721 illustrated in FIG. 32, only the memory cell AM[1, 1], the memory cell AM[i, 1], the memory cell AM[m, 1], the memory cell AM[1, j], the memory cell AM[i, j], the memory cell AM[m, j], the memory cell AM[1, n], the memory cell AM[i, n], the memory cell AM[m, n], the memory cell AMref[1], the memory cell AMref[i], the memory cell AMref[m], the wiring RW[1], the wiring RW[i], the wiring RW[m], the wiring WW[1], the wiring WW[i], the wiring WW[m], the wiring WD[1], the wiring WD[j], the wiring WD[n], the wiring WDref, the wiring B[1], the wiring B[j], the wiring B[n], the wiring Bref, the wiring VR, the output terminal SPT[1], the output terminal SPT[j], the output terminal SPT[n], a node N[1, 1], a node N[i, 1], a node N[m, 1], a node N[1, j], the node N[i, j], a node N[m, j], a node N[1, n], a node N[i, n], a node N[m, n], a node Nref[1], the node Nref[i], a node Nref[m], the transistor Tr11, the transistor Tr12, and the capacitor C2 are illustrated, and other circuits, wirings, and elements, and reference numerals thereof are omitted.

In addition, depending on the case, according to circumstances, or as needed, the product-sum operation circuit of this embodiment may have a combined structure of the above-described configuration examples.

<Operation Example>

Here, an operation example of the product-sum operation circuit 700 will be described. Note that the product-sum operation circuit 700 described in this operation example has a configuration in which an offset circuit 751 illustrated in FIG. 33 is used as the offset circuit 710 and the memory cell array 721 illustrated in FIG. 32 is used as the memory cell array 720 of the product-sum operation circuit 700.

Figure 33:
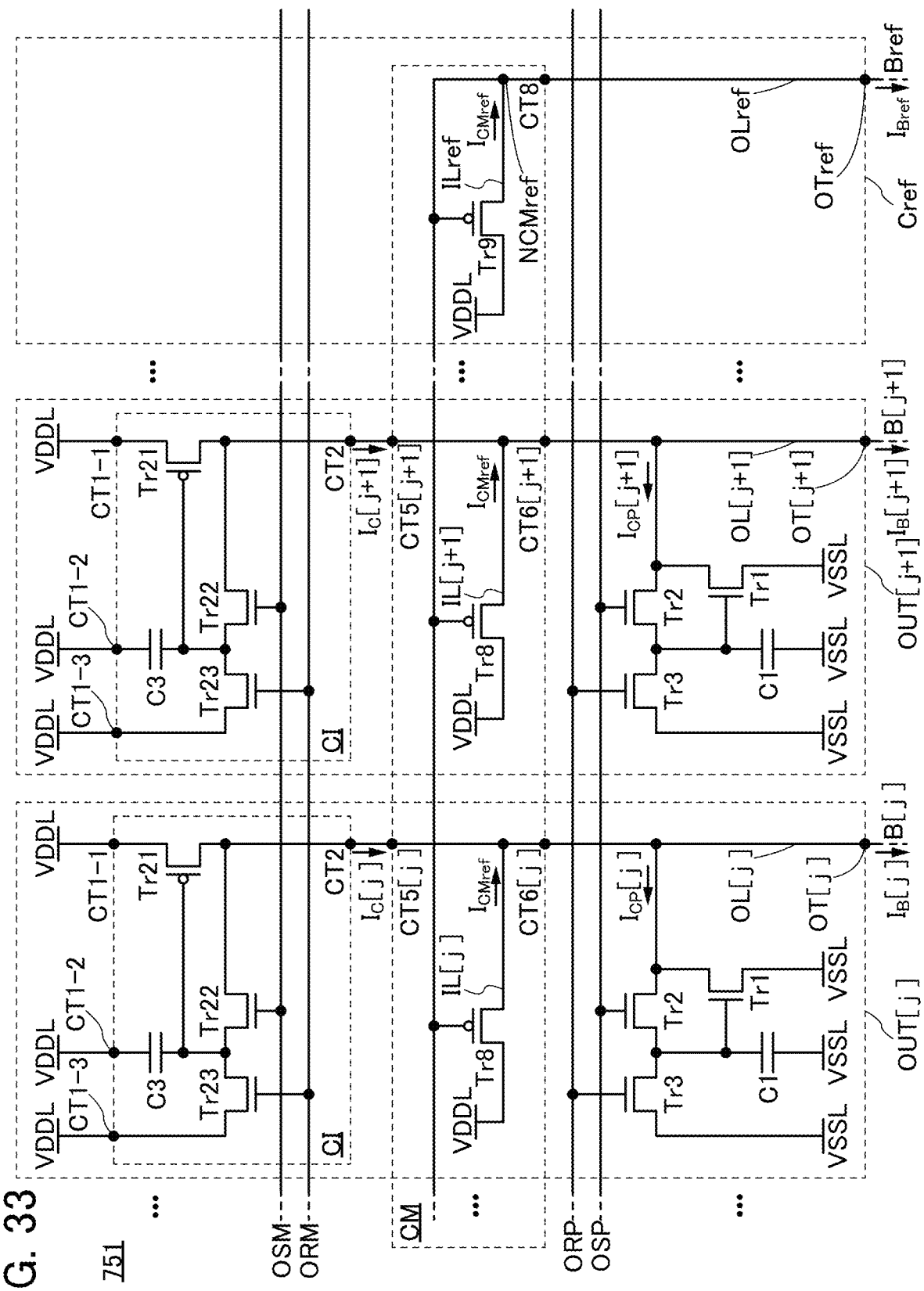
FIG. 33 A circuit diagram illustrating an example of an offset circuit in a product-sum operation circuit.

The offset circuit 751 illustrated in FIG. 33 has a circuit configuration in which the constant current circuit CI of the offset circuit 715 in FIG. 29 and the current mirror circuit CM of the offset circuit 716 in FIG. 31 are used. Note that for the description of this operation example, FIG. 33 illustrates the column output circuit OUT[j], a column output circuit OUT[j+1], and the reference column output circuit Cref.

Note that in FIG. 33, a current flowing from the terminal CT2 of the constant current circuit CI to the terminal CT5[j] of the current mirror circuit CM in the column output circuit OUT[j] is denoted by $I_C[j]$, and a current flowing from the terminal CT2 of the constant current circuit CI to a terminal CT5[j+1] of the current mirror circuit CM in the column output circuit OUT[j+1] is denoted by $I_C[j+1]$. Furthermore, in the current mirror circuit CM, a current flowing from the first terminal of the transistor Tr8 to the wiring IL[j] in the column output circuit OUT[j], a current flowing from the first terminal of the transistor Tr8 to a wiring IL[j+1] in the column output circuit OUT[j+1], and a current flowing from the first terminal of the transistor Tr9 to the wiring ILref in the reference column output circuit Cref are denoted by $I_{CMref}$. That is, a current $I_C[j]+I_{CMref}$ is output to the terminal CT6[j], and a current $I_C[j+1]+I_{CMref}$ is output to the terminal CT6[j+1]. Moreover, a current flowing from the wiring OL[j] to the first terminal of the transistor Tr1 or the first terminal of the transistor Tr2 in the column output circuit OUT[j] is denoted by $I_{CF}[j]$, and a current flowing from a wiring OL[j+1] to the first terminal of the transistor Tr1 or the first terminal of the transistor Tr2 in the column output circuit OUT[j+1] is denoted by $I_C[j+1]$. Furthermore, current output from the output terminal OT[j] to the wiring B[j] in the column output circuit OUT[j] is denoted by $Ia[j]$, current output from an output terminal OT[j+1] to the wiring B[j+1] in the column output circuit OUT[j+1] is denoted by $I_B[j+1]$, and current output from the output terminal OTref to the wiring Bref in the reference column output circuit Cref is denoted by $I_{Bref}$.

Figure 34:
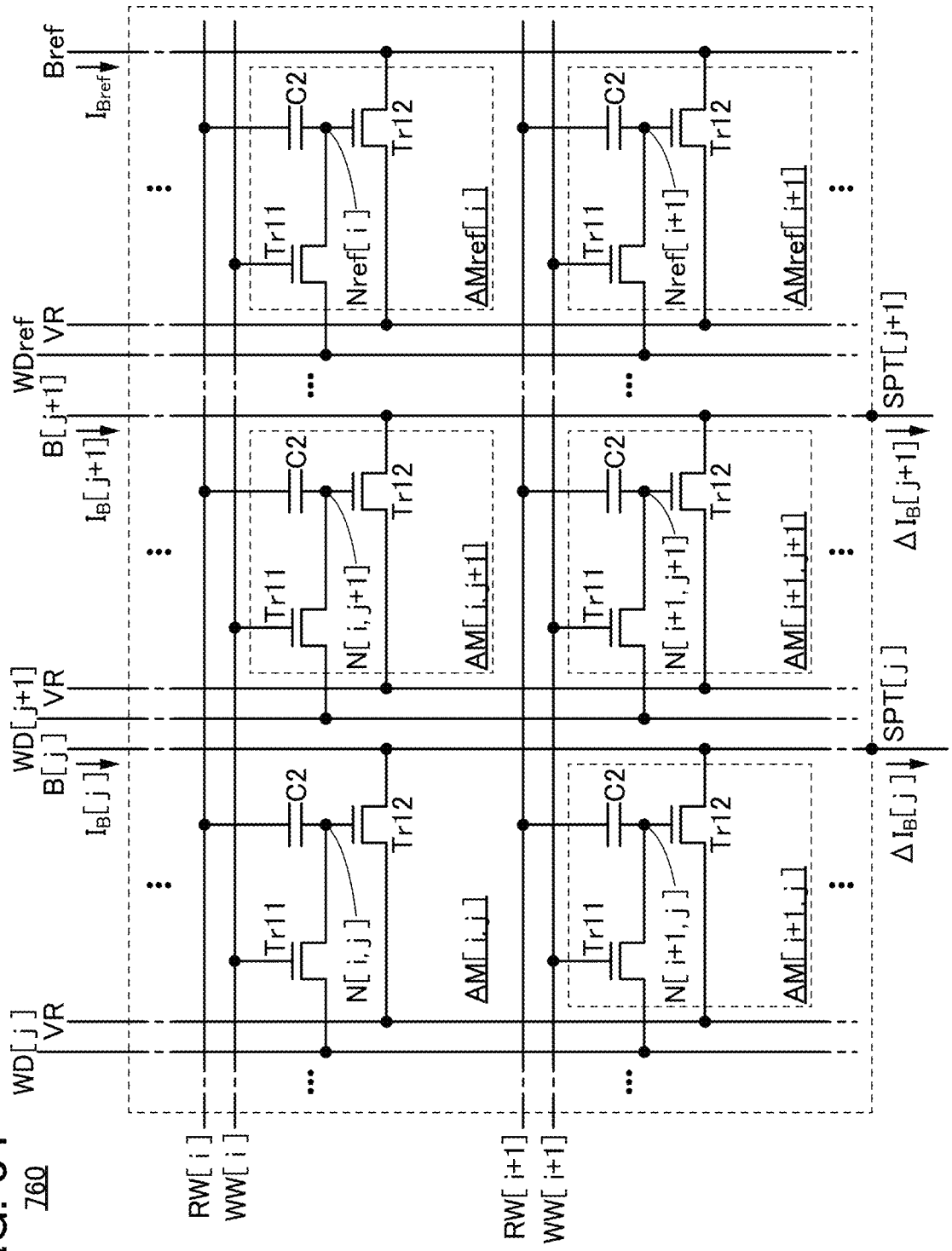
FIG. 34 A circuit diagram illustrating an example of a memory cell array in a product-sum operation circuit.

A memory cell array 760 illustrated in FIG. 34 has a structure similar to that of the memory cell array 721 illustrated in FIG. 32, and for the description of this operation example, FIG. 34 illustrates the memory cell AM[i, j], a memory cell AM[i+1, j], a memory cell AM[i, j+1], a memory cell AM[i+1, j+1], the memory cell AMref[i], and a memory cell AMref[i+1].

Note that in FIG. 34, a current input from the wiring B[j] is denoted by $I_B[j]$, a current input from the wiring B[j+1] is denoted by $In[j+1]$, and a current input from the wiring Bref is denoted by $I_{Bref}$. In addition, a current output from the output terminal SPT[j] electrically connected to the wiring B[j] is denoted by $\Delta I_B[j]$, and a current output from an output terminal SPT[j+1] electrically connected to the wiring B[j+1] is denoted by $\Delta I_b[j+1]$.

Figure 35:
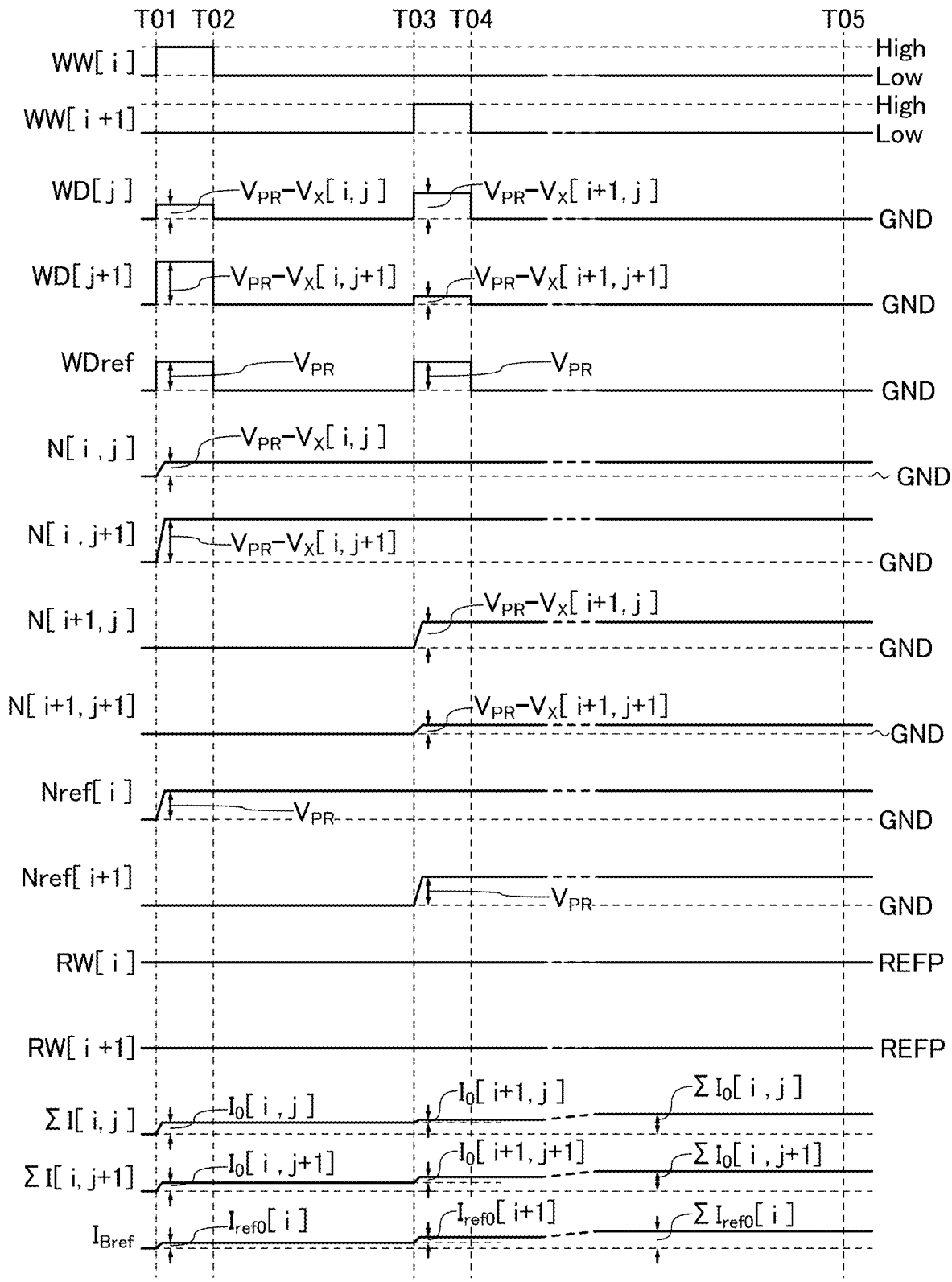
FIG. 35 A timing chart showing an operation example of a product-sum operation circuit.
Figure 36:
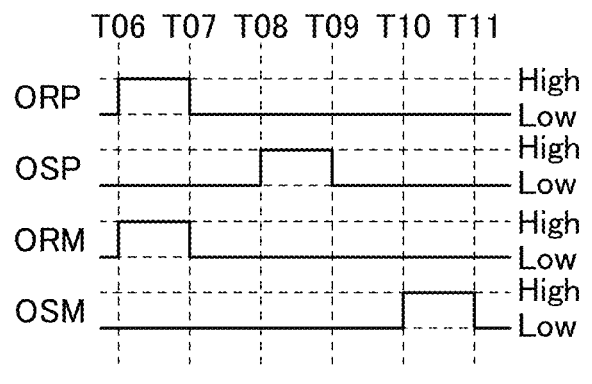
Figure 37:
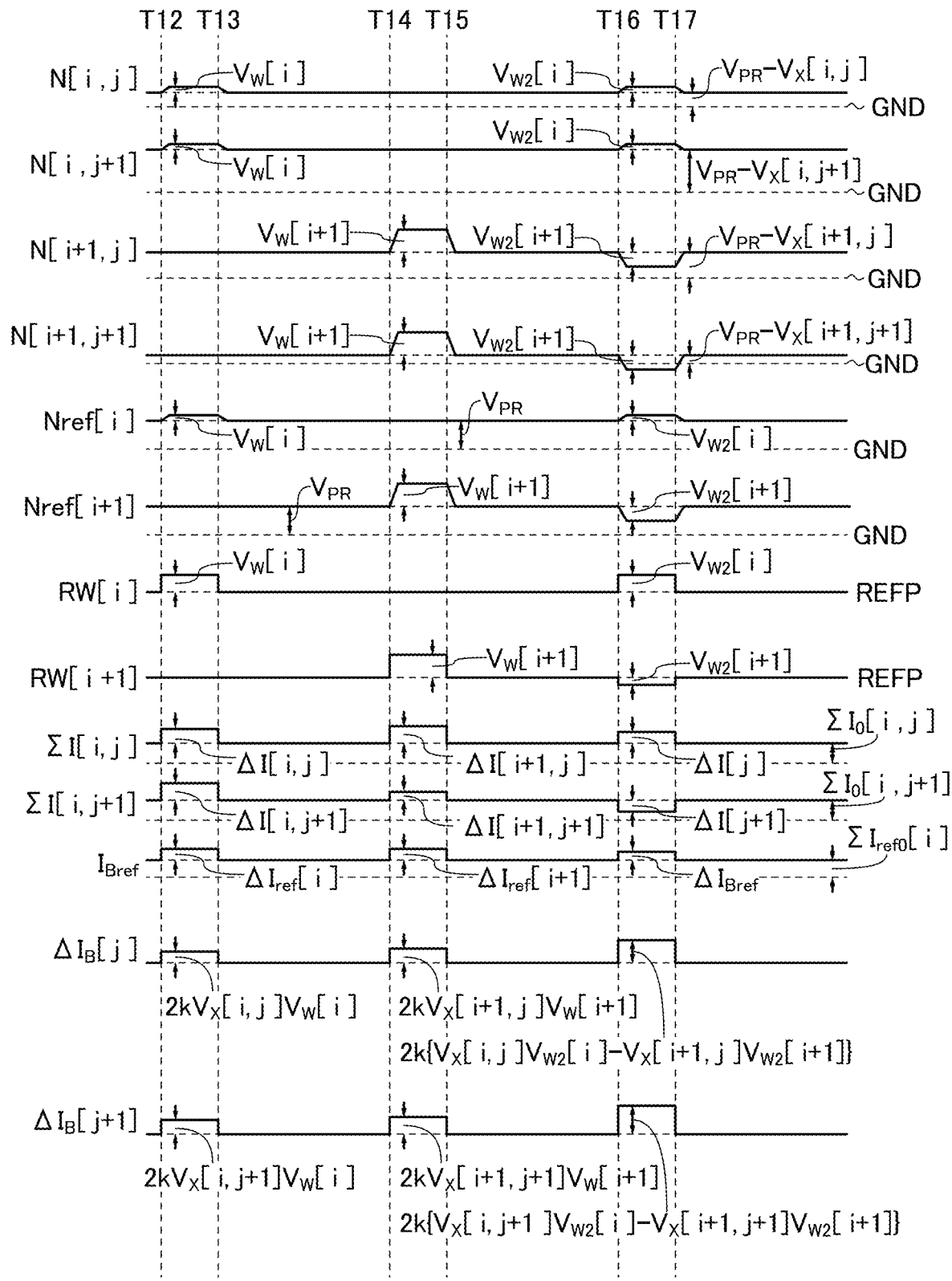
FIG. 37 A timing chart showing an operation example of a product-sum operation circuit.

FIG. 35 to FIG. 37 show timing charts of the operation example of the product-sum operation circuit 700. The timing chart in FIG. 35 shows changes in potentials of the wiring WW[i], a wiring WW[i+1], the wiring WD[j], a wiring WD[j+1], the wiring WDref, the node N[i, j], a node N[i, j+1], a node N[i+1, j], a node N[i+1, j+1], the node Nref[i], a node Nref[i+1], the wiring RW[i], and a wiring RW[i+1] and the amount of changes in a current $\Sigma I[i, j]$, a current $\Sigma I[i, j+1]$, and a current $I_{Bref}$ from Time T01 to Time T05. Note that the current $\Sigma I[i, j]$ is a value obtained by summing a current flowing through the transistor Tr12 in the memory cell AM[i, j] over i from 1 to m, and the current $\Sigma I[i, j+1]$ is a value obtained by summing a current flowing through the transistor Tr12 in the memory cell AM[i, j+1] over i from 1 to m. Moreover, in the timing chart of FIG. 35, the potentials of the wiring ORP, the wiring OSP, the wiring ORM, and the wiring OSM are constantly low-level potentials (not shown).

The timing chart in FIG. 36 shows the operation after Time T05 in the timing chart in FIG. 35, and shows the changes in potentials of the wiring ORP, the wiring OSP, the wiring ORM, and the wiring OSM from Time T06 to Time T11. Note that from Time T06 to Time T11, the potentials of the wiring WW[i], the wiring WW[i+1], the wiring WD[j], the wiring WD[j+], the wiring WDref, the node N[i, j], the node N[i, j+1], the node N[i+1, j], the node N[i+1, j+1], the node Nref[i], the node Nref[i+1], the wiring RW[i], and the wiring RW[i+1] are not changed and the amounts of the current ΣI[i, j], the current ΣI[i, j+1], and the current $I_{Bref}$ are not changed; thus, the changes are omitted in FIG. 36.

The timing chart in FIG. 37 shows the operation after Time T12 in the timing chart in FIG. 36, and shows the changes in potentials of the node N[i, j], the node N[i, j+1], the node N[i+1, j], the node N[i+1, j+1], the node Nref[i], the node Nref[i+1], the wiring RW[i], and the wiring RW[i+1] and the amounts of the current ΣI[i, j], the current ΣI[i, j+1], and the current $I_{Bref}$ from Time T12 to Time T17. Note that the potential of each of the wiring WW[i], the wiring WW[i+1], the wiring ORP, the wiring OSP, the wiring ORM, and the wiring OSM remains at the low-level potential and does not change, and the potential of each of the wiring WD[j], the wiring WD[j+1], and the wiring WDref remains at a ground potential and does not change; thus, the description of the potential changes through the wiring WW[i], the wiring WW[i+1], the wiring WD[j], the wiring WD[j+1], the wiring WDref, the wiring ORP, the wiring OSP, the wiring ORM, and the wiring OSM is omitted in the timing chart in FIG. 37. The timing chart in FIG. 37 also shows the changes in the amount of the current $\Delta I_B[j]$ and the current $\Delta I_B[j+]$, which will be described later.

<<From Time T01 to Time T02>>

During a period from Time T01 to Time T02, the high-level potential (denoted by High in FIG. 35) is applied to the wiring WW[i], and the low-level potential (denoted by Low in FIG. 35) is applied to the wiring WW[i+1]. Furthermore, a potential higher than the ground potential (denoted by GND in FIG. 35) by $V_{PR}-V_X[i, j]$ is applied to the wiring WD[j], a potential higher than the ground potential by $V_{PR}-V_X[i, j+1]$ is applied to the wiring WD[j+1], and a potential higher than the ground potential by $V_{PR}$ is applied to the wiring WDref. Moreover, a reference potential (denoted by REFP in FIG. 35) is applied to the wiring RW[i] and the wiring RW[i+1].

Note that the potential $V_X[i, j]$ and the potential $V_X[i, j+1]$ are each a potential corresponding to the first analog data. In addition, the potential $V_{PR}$ is a potential corresponding to the reference analog data.

In this period, the high-level potential is applied to the gates of the transistors Tr11 in the memory cell AM[i, j], the memory cell AM[i, j+1], and the memory cell AMref[i]; accordingly, the transistors Tr11 in the memory cell AM[i, j], the memory cell AM[i, j+1], and the memory cell AMref[i] are brought into a conduction state. Thus, in the memory cell AM[i, j], the wiring WD[j] and the node N[i, j] are electrically connected to each other, and the potential of the node N[i, j] becomes $V_{PR}-V_X[i, j]$. Similarly, in the memory cell AM[i, j+1], the wiring WD[j+1] and the node N[i, j+1] are electrically connected to each other, and the potential of the node N[i, j+1] becomes $V_{PR}-V_X[i, j+1]$, and in the memory cell AMref[i], the wiring WDref and the node Nref[i] are electrically connected to each other, and the potential of the node Nref[i] becomes $V_{PR}$.

Here, the current flowing from the first terminal of the transistor Tr12 to the second terminal thereof in each of the memory cell AM[i, j], the memory cell AM[i, j+1], and the memory cell AMref[i] will be considered. A current $I_0[i, j]$ flowing from the wiring B[j] to the second terminal of the transistor Tr12 in the memory cell AM[i, j] through the first terminal thereof can be expressed by the following formula.

[Formula 9]

$$I_0[i,j]=k(V_{PR}-V_X[i,j]-V_{th})^2 \quad (E1)$$

k is a constant determined by the channel length, the channel width, the mobility, the capacitance of a gate insulating film, and the like of the transistor Tr12. Furthermore, $V_{th}$ is the threshold voltage of the transistor Tr12.

In this case, the current flowing from the output terminal OT[j] of the column output circuit OUT[j] to the wiring B[j] is $I_0[i, j]$.

Similarly, a current $I_0[i, j+1]$ flowing from the wiring B[j+1] to the second terminal of the transistor Tr12 in the memory cell AM[i, j+1] through the first terminal thereof can be expressed by the following formula.

[Formula 10]

$$I_0[i,j+1]=k(V_{PR}-V_X[i,j+1]-V_{th})^2 \quad (E2)$$

In this case, the current flowing from the output terminal OT[j+1] of the column output circuit OUT[j+1] to the wiring B[j+1] is $I_0[i, j+1]$.

Furthermore, a current $I_{ref0}[i]$ flowing from the wiring Bref to the second terminal of the transistor Tr12 in the memory cell AMref[i] through the first terminal thereof can be expressed by the following formula.

[Formula 11]

$$I_{ref0}[i]=k(V_{PR}-V_{th})^2 \quad (E3)$$

In this case, the current flowing from the output terminal OTref of the reference column output circuit Cref to the wiring Bref is $I_{ref0}[i]$.

Note that since the low-level potential is applied to the gates of the transistors Tr11 in the memory cell AM[i+1, j], the memory cell AM[i+1, j+1], and the memory cell AMref[i+1], the transistors Tr11 in the memory cell AM[i+1, j], the memory cell AM[i+1, j+1], and the memory cell AMref[i+1] are brought into a non-conduction state. Thus, the potentials are not retained at the node N[i+1, j], the node N[i+1, j+1], and the node Nref[i+1].

<<From Time T02 to Time T03>>

During a period from Time T02 to Time T03, the low-level potential is applied to the wiring WW[i]. In this case, since the low-level potential is applied to the gates of the transistors Tr11 in the memory cell AM[i, j], the memory cell AM[i, j+1], and the memory cell AMref[i], the transistors Tr11 in the memory cell AM[i, j], the memory cell AM[i, j+1], and the memory cell AMref[i] are brought into a non-conduction state.

In addition, the low-level potential remains applied to the wiring WW[i+1] from before Time T02. Thus, the transistors Tr11 in the memory cell AM[i+1, j], the memory cell AM[i+1, j+1], and the memory cell AMref[i+1] remain in a non-conduction state since before Time T02.

Since the transistors Tr11 in the memory cell AM[i, j], the memory cell AM[i, j+1], the memory cell AM[i+1, j], the memory cell AM[i+1, j+1], the memory cell AMref[i], and the memory cell AMref[i+1] are each in a non-conduction state as described above, the potentials of the node N[i, j], the node N[i, j+1], the node N[i+1, j], the node N[i+1, j+1], the node Nref[i], and the node Nref[i+1] are retained during the period from Time T02 to Time T03.

In particular, when an OS transistor is used as each of the transistors Tr11 in the memory cell AM[i, j], the memory cell AM[i, j+1], the memory cell AM[i+1, j], the memory cell AM[i+1, j+1], the memory cell AMref[i], and the memory cell AMref[i+1] as mentioned in the description of the circuit configuration of the product-sum operation circuit 700, the amount of leakage current flowing between the source and the drain of the transistor Tr1 can be made small, which makes it possible to retain the potentials of the nodes for a long time.

During the period from Time T02 to Time T03, the ground potential is applied to the wiring WD[j], the wiring WD[j+1], and the wiring WDref. Since the transistors Tr11 in the memory cell AM[i, j], the memory cell AM[i, j+1], the memory cell AM[i+1, j], the memory cell AM[i+1, j+1], the memory cell AMref[i], and the memory cell AMref[i+1] are each in a non-conduction state, the potentials retained at the nodes in the memory cell AM[i, j], the memory cell AM[i, j+1], the memory cell AM[i+1, j], the memory cell AM[i+1, j+1], the memory cell AMref[i], and the memory cell AMref[i+1] are not rewritten by application of potentials from the wiring WD[j], the wiring WD[j+1], and the wiring WDref.

<<From Time T03 to Time T04>>

During a period from Time T03 to Time T04, the low-level potential is applied to the wiring WW[i], and the high-level potential is applied to the wiring WW[i+1]. Furthermore, a potential higher than the ground potential by $V_{PR}-V_X[i+1, j]$ is applied to the wiring WD[j], a potential higher than the ground potential by $V_{PR}-V_X[i+1, j+1]$ is applied to the wiring WD[j+1], and the potential higher than the ground potential by $V_{PR}$ is applied to the wiring WDref. Moreover, the reference potential remains applied to the wiring RW[i] and the wiring RW[i+1]since Time T02.

Note that the potential $V_X[i+1, j]$ and the potential $V_X[i+1, j+1]$ are each a potential corresponding to the first analog data.

In this period, the high-level potential is applied to the gates of the transistors Tr11 in the memory cell AM[i+1, j], the memory cell AM[i+1, j+1], and the memory cell AMref[i+1]; accordingly, the transistors Tr11 in the memory cell AM[i+1, j], the memory cell AM[i+1, j+1], and the memory cell AMref[i+1] are brought into a conduction state. Thus, in the memory cell AM[i+1, j], the wiring WD[j] and the node N[i+1, j] are electrically connected to each other, and the potential of the node N[i+1, j] becomes $V_{PR}-V_X[i+1, j]$. Similarly, in the memory cell AM[i+1, j+1], the wiring WD[j+1] and the node N[i+1, j+1] are electrically connected to each other, and the potential of the node N[i+1, j+1] becomes $V_{PR}-V_X[i+1, j+1]$, and in the memory cell AMref[i+1], the wiring WDref and the node Nref[i+1] are electrically connected to each other, and the potential of the node Nref[i+1] becomes $V_{PR}$.

Here, the current flowing from the first terminal of the transistor Tr12 to the second terminal thereof in each of the memory cell AM[i+1, j], the memory cell AM[i+1, j+1], and the memory cell AMref[i+1] will be considered. The current $I_0[i+1, j]$ flowing from the wiring B[j] to the second terminal of the transistor Tr12 in the memory cell AM[i+, j] through the first terminal thereof can be expressed by the following formula.

[Formula 12]

$$I_0[i+1,j]=k(V_{PR}-V_X[i+1,j]-V_{th})^2 \quad (E4)$$

In this case, the current flowing from the output terminal OT[j] of the column output circuit OUT[j] to the wiring B[j] is $I_0[i, j]+I_0[i+1, j]$.

Similarly, the current $I_0[i+1, j+1]$ flowing from the wiring B[j+1] to the second terminal of the transistor Tr12 in the memory cell AM[i+1, j+1] through the first terminal thereof can be expressed by the following formula.

[Formula 13]

$$I_0[i+1,j+1]=k(V_{PR}-V_X[i+1,j+1]-V_{th})^2 \quad (E5)$$

In this case, the current flowing from the output terminal OT[j+1] of the column output circuit OUT[j+1] to the wiring B[j+1] is $I_0[i, j+1]+I_0[i+1, j+1]$.

Furthermore, the current $I_{ref0}[i+1]$ flowing from the wiring Bref to the second terminal of the transistor Tr12 in the memory cell AMref[i+1] through the first terminal thereof can be expressed by the following formula.

[Formula 14]

$$I_{ref0}[i+1]=k(V_{PR}-V_{th})^2 \quad (E6)$$

In this case, the current flowing from the output terminal OTref of the reference column output circuit Cref to the wiring Bref is $I_{ref0}[i]+I_{ref0}[i+1]$.

<<From Time T04 to Time T05>>

During a period from Time T04 to Time T05, the potential corresponding to the first analog data is written to the rest of the memory cells AM, and the potential $V_{PR}$ is written to the rest of memory cells AMref, as in the operation during the period from Time T01 to Time T02 or the operation during the period from Time T03 to Time T04. Thus, the total of currents flowing to the transistors Tr12 in all of the memory cells AM is the amount of current flowing from the output terminal OT[j] of the column output circuit OUT[j] to the wiring B[j], that is, $\Sigma I_0[i, j]$ (this $\Sigma I_0[i, j]$ is the summation of the current $I_0[i, j]$ over i from 1 to m).

Here, the reference column output circuit Cref will be focused on. The wiring OLref of the reference column output circuit Cref is electrically connected to the wiring Bref through the output terminal OTref; thus, a current flowing through the wiring Bref is a current flowing through the wiring OLref. The total of currents flowing through the transistors Tr12 in the memory cell AMref[1] to the memory cell AMref[m] flows to the wiring Bref. That is, the current $I_{Bref}=\Sigma I_{ref0}[i]$ (this $\Sigma I_{ref0}[i]$ is the summation of $I_{ref0}[i]$ over i from 1 to m) flows to the wiring Bref; thus, the current also flows through the wiring OLref. In the current mirror circuit CM, the current is output from the first terminal of the transistor Tr9 in the direction toward the node NCMref in accordance with the potential of the node NCMref.

Although the current flowing through the wiring ILref is denoted by $I_{CMref}$ in FIG. 33, the current flowing through the wiring ILref before Time T09 is denoted by $I_{CMref0}$ in this specification.

Thus, the current $I_{CMref0}$ flowing through the wiring ILref can be expressed by the following formula.

[Formula 15]

$$I_{CMref0} = I_{Bref} = \sum_i I_{ref0}[i] \quad (E7)$$

Note that since the potential of the gate of the transistor Tr9 (the potential of the node NCMref) is used as a reference in the current mirror circuit CM, the current $I_{CMref0}$ also flows through the wiring IL[1] to the wiring IL[n] of the column output circuit OUT[1] to the column output circuit OUT[n].

<<From Time T06 to Time T07>>

A period from Time T06 to Time T11 will be described with reference to FIG. 36. During a period from Time T06 to Time T07, the wiring ORP is set at the high-level potential, and the wiring ORM is set at the high-level potential. In this case, the high-level potential is applied to the gates of the transistors Tr3 in the column output circuit OUT[1] to the column output circuit OUT[n], so that the transistors Tr3 are brought into a conduction state. Thus, the low-level potential is applied to the first terminals of the capacitors C1 in the column output circuit OUT[1] to the column output circuit OUT[n], and thus the potentials of the capacitors C1 are initialized. Moreover, the high-level potential is applied to the gates of the transistors Tr23 in the column output circuit OUT[1] to the column output circuit OUT[n], so that the transistors Tr23 are brought into a conduction state. Thus, the high-level potential is applied to the first terminals of the capacitors C3 in the column output circuit OUT[1] to the column output circuit OUT[n], and thus the potentials of the capacitors C3 are initialized. Note that at Time T06, the low-level potential is applied to the wiring OSP, so that the transistors Tr2 in the column output circuit OUT[1] to the column output circuit OUT[n] are brought into a non-conduction state, and the low-level potential is applied to the wiring OSM, so that the transistors Tr22 in the column output circuit OUT[1] to the column output circuit OUT[n] are brought into a non-conduction state.

<<From Time T07 to Time T08>>

During a period from Time T07 to Time T08, the wiring ORP and the wiring ORM are each set at the low-level potential. In this case, the low-level potential is applied to the gates of the transistors Tr3 in the column output circuit OUT[1] to the column output circuit OUT[n], so that the transistors Tr3 are brought into a non-conduction state. Furthermore, the low-level potential is applied to the gates of the transistors Tr23 in the column output circuit OUT[1] to the column output circuit OUT[n], so that the transistors Tr23 are brought into a non-conduction state.

<<From Time T08 to Time T09>>

During a period from Time T08 to Time T09, the wiring OSP is set at the high-level potential. In this case, the high-level potential is applied to the gates of the transistors Tr2 in the column output circuit OUT[1] to the column output circuit OUT[n], so that the transistors Tr2 are brought into a conduction state. Meanwhile, the current Is[j] output from the column output circuit OUT[j] is $\Sigma I_0[i, j]$ (this $I_0[i, j]$ is the summation of $I_0[i, j]$ over i from 1 to m). Here, when the current $I_{CMref0}$ is larger than the current $I_B[j]$, a current flows to the first terminals of the capacitors C1 from the first terminals of the transistors Tr2 through the second terminals of the transistors Tr2, and positive potentials are retained by the capacitors C1. Thus, the potentials of the gates of the transistors Tr1 are retained, so that the current depending on the potential of the gate of each of the transistors Tr1 flows between the source and the drain of the transistor Tr1.

Note that at Time T09, the low-level potential is applied to the wiring OSP, so that the transistors Tr2 in the column output circuit OUT[1] to the column output circuit OUT[n] are brought into a non-conduction state. In this case, the potentials of the gates of the transistors Tr1 are retained by the capacitors C1, so that even after Time T09, the same amount of current keeps flowing between the source and the drain of the transistor Tr1.

<<From Time T10 to Time T11>>

During a period from Time T10 to Time T11, the wiring OSM is set at the high-level potential. In this case, the high-level potential is applied to the gates of the transistors Tr22 in the column output circuit OUT[1] to the column output circuit OUT[n], so that the transistors Tr22 are brought into a conduction state. Meanwhile, the current $I_B[j]$ output from the column output circuit OUT[j] is $\Sigma I_0[i, j]$ (this $\Sigma I_0[i, j]$ is the summation of $I_0[i, j]$ over i from 1 to m). Here, when the current $I_{CMref0}$ is smaller than the current $I_B[j]$, a current flows to the first terminals of the transistors Tr22 from the first terminals of the capacitors C3 through the second terminals of the transistors Tr22, and potentials are retained by the capacitors C3. Thus, the potentials of the gates of the transistors Tr21 are retained, so that the current depending on the potential of the gate of each of the transistors Tr21 flows between the source and the drain of the transistor Tr21.

Note that at Time T11, the low-level potential is applied to the wiring OSM, so that the transistors Tr22 in the column output circuit OUT[1] to the column output circuit OUT[n] are brought into a non-conduction state. In this case, the potentials of the gates of the transistors Tr21 are retained by the capacitors C3, so that even after Time T11, the same amount of current keeps flowing between the source and the drain of the transistor Tr21.

Note that in the timing chart in FIG. 36, the operation for switching between the conduction state and the non-conduction state of the transistor Tr2 (the operation during the period from Time T08 to Time T09) is performed before the operation for switching between the conduction state and the non-conduction state of the transistor Tr22 (the operation during the period from Time T10 to Time T11); however, the order of the operations of the offset circuit 751 is not limited thereto. For example, the operation for switching between the conduction state and the non-conduction state of the transistor Tr22 (the operation during the period from Time T10 to Time T11) may be performed first, and then the operation for switching between the conduction state and the non-conduction state of the transistor Tr2 (the operation during the period from Time T08 to Time T09) may be performed.

Here, the column output circuit OUT[j] during a period from Time T06 to Time T12 (shown in FIG. 37) will be focused on. In the column output circuit OUT[j], the current flowing between the source and the drain of the transistor Tr11 is denoted by $I_{CP}[j]$, and the current flowing between the source and the drain of the transistor Tr21 of the constant current circuit CI (a current flowing from the terminal CT2 to the terminal CT5[j]) is denoted by $I_C[j]$. In addition, the current flowing between the source and the drain of the transistor Tr8 through the current mirror circuit CM is $I_{CMref0}$. On the assumption that the current is not output from the output terminal SPT[j] during the period from Time T1 to Time T12, the total of currents flowing through the transistors Tr12 in the memory cell AM[1, j] to the memory cell AM[m, j] flows through the wiring B[j] electrically connected to the column output circuit OUT[j]. In other words, during the period from Time T06 to Time T12, in the column output circuit OUT[j], when the current $I_{CMref0}$ that is input is different from $\Sigma I_0[i, j]$ that is output, an operation in which the current $I_C[j]$ flowing from the second terminal of the transistor Tr21 is supplied to the wiring OL[j], or the current $I_{CP}[j]$ flowing from the wiring OL[j] flows to the first terminal of the transistor Tr1 is performed. Thus, the above satisfies the following formula.

[Formula 16]

$$I_{CMref0} = I_C[j] - I_{CP}[j] = \sum_i I_0[i, j] \qquad (E8)$$

<<From Time T12 to Time T13>>

The operation after Time T12 will be described with reference to FIG. 37. During a period from Time T12 to Time T13, a potential higher than the reference potential (denoted by REFP in FIG. 37) by $V_W[i]$ is applied to the wiring RW[i]. In this case, the potential $V_W[i]$ is applied to the second terminals of the capacitors C2 in the memory cell AM[i, 1] to the memory cell AM[i, n] and the memory cell AMref[i], so that the potentials of the gates of the transistors Tr12 increase.

Note that the potential $V_W[i]$ is a potential corresponding to the second analog data.

Note that an increase in the potential of the gate of the transistor Tr12 corresponds to the potential obtained by multiplying a change in potential of the wiring RW[i] by a capacitive coupling coefficient determined by the memory cell structure. The capacitive coupling coefficient is calculated on the basis of the capacitance of the capacitor C2, the gate capacitance of the transistor Tr12, and the parasitic capacitance. In this operation example, to avoid complexity of description, description is made on the assumption that an increase in potential of the wiring RW[i] is equal to an increase in potential of the gate of the transistor Tr12. This corresponds to a case where the capacitive coupling coefficients of the memory cells AM and the memory cells AMref are set to each 1.

Since the capacitive coupling coefficients are set to each 1, when the potential $V_W[i]$ is applied to the second terminals of the capacitors C2 in the memory cell AM[i, j], the memory cell AM[i, j+1], and the memory cell AMref[i], the potentials of the node N[i, j], the node N[i, j+1], and the node Nref[i] each increase by $V_W[i]$.

Here, the current flowing from the first terminal of the transistor Tr12 to the second terminal thereof in each of the memory cell AM[i, j], the memory cell AM[i, j+1], and the memory cell AMref[i] will be considered. A current I[i, j] flowing from the wiring B[j] to the second terminal of the transistor Tr12 in the memory cell AM[i, j] through the first terminal thereof can be expressed by the following formula.

[Formula 17]

$$I[i,j] = k(V_{PR} - V_X[i,j] + V_W[i] - V_{th})^2 \qquad (E9)$$

In other words, by application of the potential $V_W[i]$ to the wiring RW[i], the current flowing from the wiring B[j] to the second terminal of the transistor Tr12 in the memory cell AM[i, j] through the first terminal thereof is increased by I[i, j]–I$_0$[i, j] (denoted by ΔI[i, j] in FIG. 37).

Similarly, the current I[i, j+1] flowing from the wiring B[j+1] to the second terminal of the transistor Tr12 in the memory cell AM[i, j+1] through the first terminal thereof can be expressed by the following formula.

[Formula 18]

$$I[i,j+1] = k(V_{PR} - V_X[i,j+1] + V_W[i] - V_{th})^2 \qquad (E10)$$

In other words, by application of the potential $V_W[i]$ to the wiring RW[i], the current flowing from the wiring B[j+1] to the second terminal of the transistor Tr12 in the memory cell AM[i, j+1] through the first terminal thereof is increased by I[i, j+1]–I$_0$[i, j+1] (denoted by ΔI[i, j+1] in FIG. 37).

Furthermore, the current $I_{ref}[i]$ flowing from the wiring Bref to the second terminal of the transistor Tr12 in the memory cell AMref[i] through the first terminal thereof can be expressed by the following formula.

[Formula 19]

$$I_{ref}[i] = k(V_{PR} + V_W[i] - V_{th})^2 \qquad (E1)$$

In other words, by application of the potential $V_W[i]$ to the wiring RW[i], the current flowing from the wiring Bref to the second terminal of the transistor Tr12 in the memory cell AMref[i] through the first terminal thereof is increased by $I_{ref}[i] - I_{ref0}[i]$ (denoted by $\Delta I_{ref}[i]$ in FIG. 37).

Here, the reference column output circuit Cref will be focused on. The total of currents flowing through the transistors Tr12 in the memory cell AMref[1] to the memory cell AMref[m] flows to the wiring Bref. The wiring OLref is electrically connected to the wiring Bref through the output terminal OTref, and thus the current $I_{Bref} = \Sigma I_{ref}[i]$ flows through the wiring OLref. In the current mirror circuit CM, the current is output from the first terminal of the transistor Tr9 in the direction toward the node NCMref in accordance with the potential of the node NCMref.

Thus, the current $I_{CMref}$ flowing from the wiring ILref through the terminal CT8 in the current mirror circuit CM can be expressed by the following formula.

[Formula 20]

$$I_{CMref} = \sum_i I_{ref}[i] \qquad (E12)$$

Here, a current ΔIB[j] output from the output terminal SPT[j] electrically connected to the wiring B[j] will be considered. During a period from Time T11 to Time T12, Formula (E8) is satisfied, and the current $\Delta I_B[j]$ is not output from the output terminal SPT[j] electrically connected to the wiring B[j].

During the period from Time T12 to Time T113, a potential higher than the reference potential by $V_W[i]$ is applied to the wiring RW[i], and the current flowing between the source and the drain of the transistor Tr12 in the memory cell AM[i, j] changes; thus, the current $\Delta I_B[j]$ is output from the output terminal SPT[j] electrically connected to the wiring B[j]. Specifically, in the column output circuit OUT[j], the current $I_C[j]$ is output from the terminal CT2 of the constant current circuit CI, the current $I_{CMref}$ flows between the source and the drain of the transistor Tr8, and the current $I_C[j]$ flows between the source and the drain of the transistor Tr1; thus, the current $\Delta I_B[j]$ can be expressed by the following formula using $\Sigma I[i, j]$, which is the summation of a source-drain current flowing through the transistor Tr12 in the memory cell AM[i, j] over i from 1 to m.

[Formula 21]

$$\Delta I_B[j] = (I_C[j] + I_{CMref} - I_{CP}[j]) - \sum_i I[i, j] \qquad (E13)$$

Formula (E1), Formula (E3), Formula (E7) to Formula (E9), Formula (E11), and Formula (E12) are used in Formula (E13), so that the following formula can be obtained.

[Formula 22]

$$\Delta I_B[j] = 2k \sum_i (V_X[i,j]V_W[i]) \qquad (E14)$$

That is, according to Formula (E14), the current $\Delta I_B[j]$ is a value corresponding to the sum of products of the potential $V_X[i, j]$, which is the plurality of first analog data, and the potential $V_W[i]$, which is the plurality of second analog data. That is, when the current $\Delta I_B[j]$ is calculated, the value of the sum of products of the first analog data and the second analog data can be obtained.

In the case where all of the wiring RW[1] to the wiring RW[m] except the wiring RW[i] are set at a reference potential during the period from Time T12 to Time T13, $V_W[g]=0$ (here, g is an integer that is greater than or equal to 1 and less than or equal to m and not i); thus, according to Formula (E14), $\Delta I_B[j]=2$ $kV_X[i, j]V_W[i]$ is output. In other words, the data corresponding to the product of the first analog data stored in the memory cell AM[i, j] and the second analog data corresponding to a selection signal applied to the wiring RW[i] is output from the output terminal SPT[j] electrically connected to the wiring B[j].

Furthermore, similarly, a differential current output from the output terminal SPT[j+1] electrically connected to the wiring B[j+1] is $\Delta I_B[j+1]=2$ $kV_X[i, j+1]V_W[i]$, and the data corresponding to the product of the first analog data stored in the memory cell AM[i, j+1] and the second analog data corresponding to a selection signal applied to the wiring RW[i] is output from the output terminal SPT[j+1] electrically connected to the wiring B[j+1].

<<From Time T13 to Time T14>>

During a period from Time T13 to Time T14, the ground potential is applied to the wiring RW[i]. In this period, the ground potential is applied to the second terminals of the capacitors C2 in the memory cell AM[i, 1] to the memory cell AM[i, n] and the memory cell AMref[i]; thus, the potentials of the node N[i, 1] to the node N[i, n] and the node Nref[i] return to the potentials during the period from Time T11 to Time T12.

<<From Time T14 to Time T15>>

During a period from Time T14 to Time T15, the wiring RW[1] to the wiring RW[m] except the wiring RW[i+1] are set at the reference potential, and a potential higher than the reference potential by $V_W[i+1]$ is applied to the wiring RW[i+1]. In this case, as in the operation during the period from Time T12 to Time T13, the potential $V_W[i+1]$ is applied to the second terminals of the capacitors C2 in the memory cell AM[i+1, i] to the memory cell AM[i+1, n] and the memory cell AMref[i+1], so that the potentials of the gates of the transistors Tr12 increase.

Note that the potential $V_W[i+1]$ is a potential corresponding to the second analog data.

Note that as described above, since the capacitive coupling coefficients of the memory cells AM and the memory cells AMref are set to each 1, when the potential $V_W[i+1]$ is applied to the second terminals of the capacitors C2 in the memory cell AM[i+1, j], the memory cell AM[i+1, j+1], and the memory cell AMref[i+1], the potentials of the node N[i+1, j], the node N[i+1, j+1], and the node Nref[i+1] each increase by $V_W[i+1]$.

When the potentials of the node N[i+1, j], the node N[i+1, j+1], and the node Nref[i+1] increase by $V_W[i+1]$, the amount of current flowing through each of the transistors Tr12 in the memory cell AM[i+1, j], the memory cell AM[i+1, j+1], and the memory cell AMref[i+1] increases. When the current flowing through the transistor Tr12 in the memory cell AM[i+1, j] is denoted by I[i+1, j], the current flowing from the output terminal OT[j] of the column output circuit OUT[j] to the wiring B[j] increases by $I[i+1, j]-I_0[i+1, j]$ (denoted by $\Delta I[i+1, j]$ in FIG. 37). Similarly, when the current flowing through the transistor Tr12 in the memory cell AM[i+1, j+1] is denoted by I[i+1, j+1], the current flowing from the output terminal OT[j+1] of the column output circuit OUT[j+1] to the wiring B[j+1] increases by $I[i+1, j+1]-I_0[i+1, j+1]$ (denoted by $\Delta I[i+1, j+1]$ in FIG. 37). Moreover, when the current flowing through the transistor Tr12 in the memory cell AMref[i+1] is denoted by $I_{ref}[i+1]$, the current flowing from the output terminal OTref of the reference column output circuit Cref to the wiring Bref increases by $I_{ref}[i+1]-I_{ref0}[i+1]$ (denoted by $\Delta I_{ref}[i+1]$ in FIG. 37).

The operation during the period from Time T14 to Time T15 can be considered in a manner similar to that of the operation during the period from Time T12 to Time T13; thus, when Formula (E14) is applied to the operation during the period from Time T14 to Time T15, the differential current output from the wiring B[j] is $\Delta I_B[j]=2$ $kV_X[i+1, j]V_W[i+1]$. In other words, the data corresponding to the product of the first analog data stored in the memory cell AM[i+l, j] and the second analog data corresponding to a selection signal applied to the wiring RW[i+1] is output from the output terminal SPT[j] electrically connected to the wiring B[j].

Furthermore, similarly, a differential current output from the wiring B[j+1] is $\Delta IB[j+1]2$ $kV_X[i+1, j+1]V_W[i+1]$, and the data corresponding to the product of the first analog data stored in the memory cell AM[i+1, j+1] and the second analog data corresponding to a selection signal applied to the wiring RW[i+1] is output from the output terminal SPT[j+1] electrically connected to the wiring B[j+1].

<<From Time T15 to Time T16>>

During a period from Time T15 to Time T16, the ground potential is applied to the wiring RW[i+1]. In this period, the ground potential is applied to the second terminals of the capacitors C2 in the memory cell AM[i+1, 1] to the memory cell AM[i+1, n] and the memory cell AMref[i+1]; thus, the potentials of the node N[i+1, 1] to the node N[i+1, n] and the node Nref[i+1] return to the potentials during the period from Time T13 to Time T14.

<<From Time T116 to Time T17>>

During a period from Time T16 to Time T17, the wiring RW[1] to the wiring RW[m] except the wiring RW[i] and the wiring RW[i+1] are set at the reference potential, a potential higher than the reference potential by $V_{W2}[i]$ is applied to the wiring RW[i], and a potential lower than the reference potential by $V_{W2}[i+1]$ is applied to the wiring RW[i+1]. In this case, as in the operation during the period from Time T12 to Time T13, the potential $V_{W2}[i]$ is applied to the second terminals of the capacitors C2 in the memory cell AM[i, 1] to the memory cell AM[i, n] and the memory cell AMref[i], so that the potentials of the gates of the transistors Tr12 in the memory cell AM[i, 1] to the memory cell AM[i, n] and the memory cell AMref[i] increase. Concurrently, the potential $-V_{W2}[i+1]$ is applied to the second terminals of the capacitors C2 in the memory cell AM[i+1, 1] to the memory cell AM[i+1, n] and the memory cell AMref[i+1], so that the potentials of the gates of the transistors Tr12 in the memory cell AM[i+1, 1] to the memory cell AM[i+1, n] and the memory cell AMref[i+1] decrease.

Note that the potential $V_{W2}[i]$ and the potential $V_{W2}[i+1]$ are potentials each corresponding to the second analog data.

Note that since the capacitive coupling coefficients of the memory cells AM and the memory cells AMrefs are set to each 1, when the potential $V_{W2}[i]$ is applied to the second terminals of the capacitors C2 in the memory cell AM[i, j], the memory cell AM[i, j+1], and the memory cell AMref[i], the potentials of the node N[i, j], the node N[i, j+1], and the node Nref[i] each increase by $V_{W2}[i]$. Furthermore, when the potential $-V_{W2}[i+1]$ is applied to the second terminals of the capacitors C2 in the memory cell AM[i+1, j], the memory cell AM[i+1, j+1], and the memory cell AMref[i+1], the potentials of the node N[i+1, j], the node N[i+1, j+1], and the node Nref[i+1] each decrease by $V_{W2}[i+1]$.

When each of the potentials of the node N[i, j], the node N[i, j+1], and the node Nref[i] increases by $V_{W2}[i]$, the amount of current flowing through each of the transistors Tr12 in the memory cell AM[i, j], the memory cell AM[i, j+1], and the memory cell AMref[i] increases. Here, the current flowing through the transistor Tr12 in the memory cell AM[i, j] is denoted through I[i, j], the current flowing through the transistor Tr12 in the memory cell AM[i, j+1] is denoted by I[i, j+1], and the current flowing through the transistor Tr12 in the memory cell AMref[i] is denoted by $I_{ref}[i]$.

In addition, when each of the potentials of the node N[i+1, j], the node N[i+1, j+1], and the node Nref[i+1] decreases by $V_{W2}[i+1]$, the amount of current flowing through each of the transistors Tr12 in the memory cell AM[i+1, j], the memory cell AM[i+1, j+1], and the memory cell AMref[i+1] decreases. Here, the current flowing through the transistor Tr12 in the memory cell AM[i+1, j] is denoted by $I_2[i, j]$, the current flowing through the transistor Tr12 in the memory cell AM[i+1, j+1] is denoted by $I_2[i, j+1]$, and the current flowing through the transistor Tr12 in the memory cell AMref[i+1] is denoted by $I_{ref}[i+1]$.

In this case, the current flowing from the output terminal OT[j] of the column output circuit OUT[j] to the wiring B[j] increases by $I_2[i, j]-I_0[i, j])+(I_2[i+1, j]-I_0[i+1, j])$ (denoted by $\Delta I[j]$ in FIG. 37). Moreover, the current flowing from the output terminal OT[j+1] of the column output circuit OUT [j+] to the wiring B[j+1] increases by $(I_2[i, j+1]-I_0[i, j+1])+(I_2[i+1, j+1]-I_0[i+1, j+1])$ (denoted by $\Delta I[j+1]$ in FIG. 37, and $\Delta I[j+1]$ is a negative current). Furthermore, the current flowing from the output terminal OTref of the reference column output circuit Cref to the wiring Bref increases by $(I_{2ref}[i, j]-I_{ref0}[i, j])+(I_{2ref}[i+1, j]-I_{ref0}[i+1, j])$ (denoted by $\Delta I_{Bref}$ in FIG. 37).

The operation during the period from Time T16 to Time T17 can be considered in a manner similar to that of the operation during the period from Time T12 to Time T13; thus, when Formula (E14) is applied to the operation during the period from Time T16 to Time T17, the differential current output from the wiring B[j] is $\Delta I_B[j]=2\ k\{V_X[i, j]V_{W2}[i]-V_X[i+1, j]V_{W2}[i+1]\}$. That is, the data corresponding to the sum of products of respective first analog data stored in the memory cell AM[i, j] and the memory cell AM[i+1, j] and respective second analog data corresponding to selection signals applied to the wiring RW[i] and the wiring RW[i+1] is output from the output terminal SPT[j] electrically connected to the wiring B[j].

Furthermore, similarly, the differential current output from the wiring B[j+1] is $\Delta I_B[j+1]=2\ k\{V_X[i, j+1]V_{W2}[i]-V_X[i+1, j+1]V_{W2}[i+1]\}$, and the data corresponding to the product of the first analog data stored in each of the memory cell AM[i, j] and the memory cell AM[i+1, j+1] and the second analog data corresponding to a selection signal applied to each of the wiring RW[i] and the wiring RW[i+1] is output from the output terminal SPT[j+1] electrically connected to the wiring B[j+].

<<After Time T17>>

After Time T17, the ground potential is applied to the wiring RW[i] and the wiring RW[i+1]. In this period, the ground potential is applied to the second terminals of the capacitors C2 in the memory cell AM[i, 1] to the memory cell AM[i, n], the memory cell AM[i+1, 1] to the memory cell AM[i+1, n], the memory cell AMref[i], and the memory cell AMref[i+1]; thus, the potentials of the node N[i, 1] to the node N[i, n], the node N[i+1, 1] to the node N[i+1, n], the node Nref[i], and the node Nref[i+1] return to the potentials during the period from Time T15 to Time T16.

As described above, when the circuit illustrated in FIG. 27 is used for the product-sum operation circuit included in the programmable logic element PLE[1] to the programmable logic element PLE[m] of the NN circuit 100, high-speed product-sum operation processing can be achieved.

Here, the plurality of first analog data serve as weight coefficients and the plurality of second analog data correspond to neuron outputs, whereby calculation of the weighted sums of the neuron outputs can be conducted concurrently, and data corresponding to results of the calculation of the weighted sums, that is, synapse inputs can be obtained as the output signals. Specifically, weight coefficients $w_{s[k]\cdot 1}^{(k)}$ to $w_{s[k]\cdot Q[k-1]}^{(k)}$ of the s[k]-th neuron in the k-th layer are stored as the first analog data in the memory cell AM[1, j] to the memory cell AM[m, j] and output signals $z_{1\cdot s[k]}^{(k-1)}$ to $z_{Q[k-1]\cdot s[k]}^{(k-1)}$ of the neurons in the (k-1)-th layer are supplied as the second analog data to the wiring RW[1] to the wiring RW[m], whereby the summation $u_{s[k]}^{(k)}$ of signals input to the s[k]-th neuron in the k-th layer can be calculated. That is, the product-sum operation expressed by Formula (D1) can be performed with the product-sum operation circuit 700.

In addition, in the case where weight coefficients are updated in supervised learning, weight coefficients $w_{1\cdot s[k]}^{(k+1)}$ to $w_{Q[k+1]s[k]}^{(k+1)}$ multiplied when a signal is transmitted from the s[k]-th neuron in the k-th layer to neurons in the (k+1)-th layer are stored as the first analog data in the memory cell AM[1, j] to the memory cell AM[m, j] and errors $\delta_1^{(k+1)}$ to $\delta_{Q[k+1]}^{(k+1)}$ of the neurons in the (k+1)-th layer are supplied as the second analog data to the wiring RW[1] to the wiring RW[m], whereby a value of $\Sigma w_{s[k+1]\cdot s[k]}^{(k+1)}\cdot \delta_{s[k+1]}^{(k+1)}$ in Formula (D3) can be obtained from the differential current $\Delta I_B[j]$ flowing through the wiring B[j]. That is, part of the operation expressed by Formula (D3) can be performed with the product-sum operation circuit 700.

When the product-sum operation circuit described above is used for the hidden layer of the hierarchical neural network, the weight coefficient $w_{s[k]s[k-1]}^{(k)}$ is the first analog data stored in the memory cell AM[i, j], the output signal $z_{s[k-1]}^{(k-1)}$ from the s[k-1]-th neuron in the (k-1)-th layer is a potential (second analog data) applied from the wiring RW[i], and a signal to which modification corresponding to an activation function is added in accordance to a current output to the wiring B[j] of the product-sum operation circuit is the output signal $z_{s[k]}^{(k)}$ of the s[k]-th neuron in the k-th layer.

In addition, when the product-sum operation circuit described above is used for the output layer of the hierarchical neural network, the weight coefficient $w_{s[L]s[L-1]}^{(L)}$ is the first analog data stored in the memory cell AM[i, j], the output signal $z_{s[L-1]}^{(L-1)}$ from the s[L-1]-th neuron in the (L-1)-th layer is a potential (second analog data) applied from the wiring RW[i], and a signal to which modification corresponding to an activation function is added in accordance to a current output to the wiring B[j] of the product-sum operation circuit is the output signal $z_{s[L]}^{(L)}$ of the s[L]-th neuron in the L-th layer.

Note that the input layer of the hierarchical network may function as a buffer circuit that outputs an input signal to the second layer.

Note that this embodiment can be combined with the other embodiment in this specification as appropriate.

Embodiment 4

In this embodiment, a specific structure example of a display device using the semiconductor device described in the above embodiment will be described. In particular, a display device in which a liquid crystal element is used as a display element will be described here.

<Structure Example 1 of Display Device>

Figure 38:
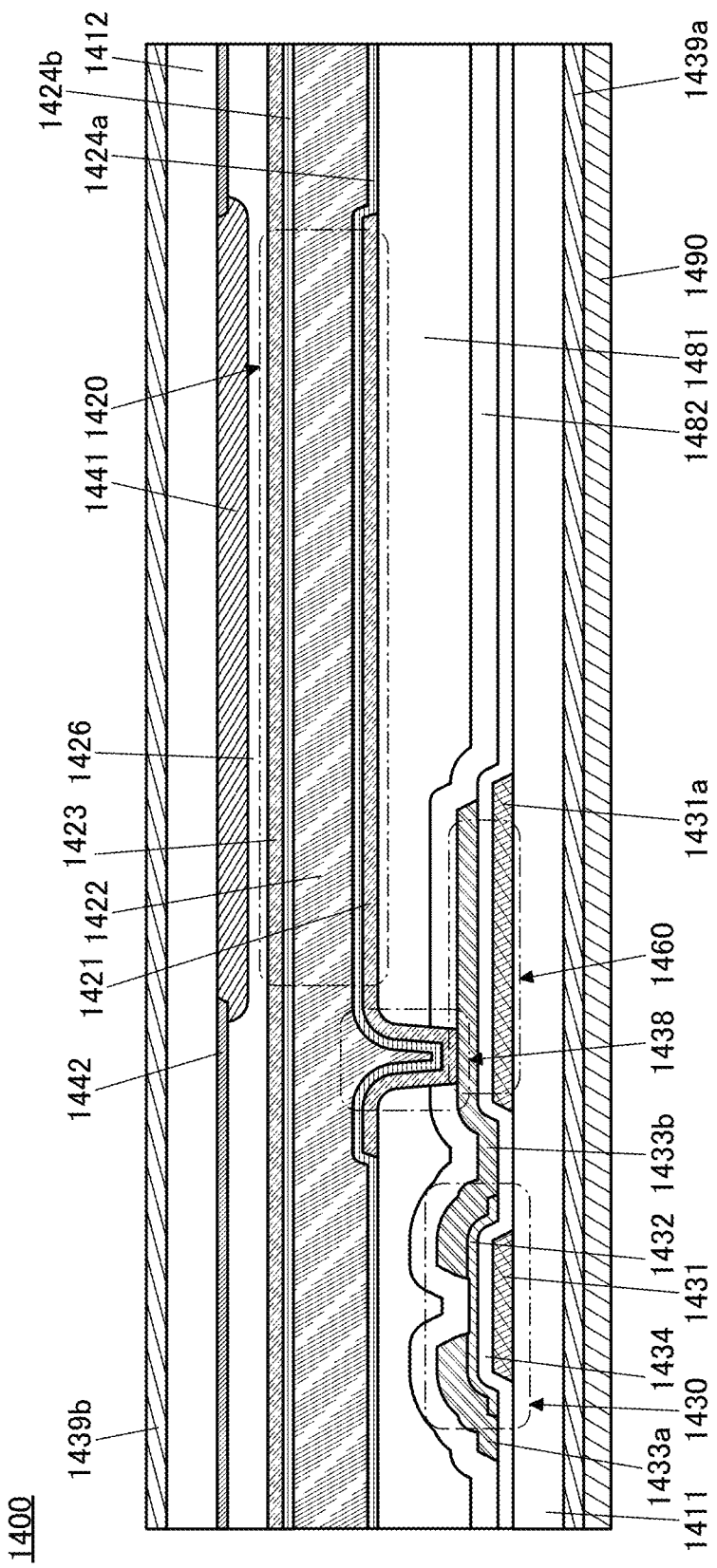
FIG. 38 A diagram illustrating a structure example of a display device.

FIG. 38 illustrates an example of a cross-sectional structure of a display device 1400. An example in which a transmissive liquid crystal element 1420 is used as a display element is described here. In FIG. 38, the substrate 1412 side is the display surface side.

The display device 1400 has a structure in which a liquid crystal 1422 is provided between a substrate 1411 and the substrate 1412. The liquid crystal element 1420 includes a conductive layer 1421 provided on the substrate 1411 side, a conductive layer 1423 provided on the substrate 1412 side, and the liquid crystal 1422 provided therebetween. Furthermore, an alignment film 1424a is provided between the liquid crystal 1422 and the conductive layer 1421 and an alignment film 1424b is provided between the liquid crystal 1422 and the conductive layer 1423.

The conductive layer 1421 functions as a pixel electrode. The conductive layer 1423 functions as a common electrode or the like. In addition, the conductive layer 1421 and the conductive layer 1423 each have a function of transmitting visible light. Thus, the liquid crystal element 1420 is a transmissive liquid crystal element.

A coloring layer 1441 and a light-blocking layer 1442 are provided on a surface of the substrate 1412 on the substrate 1411 side. An insulating layer 1426 is provided to cover the coloring layer 1441 and the light-blocking layer 1442, and the conductive layer 1423 is provided to cover the insulating layer 1426. Moreover, the coloring layer 1441 is provided in a region overlapping with the conductive layer 1421. The light-blocking layer 1442 is provided to cover a transistor 1430 and a connection portion 1438.

A polarizing plate 1439a is located on the outside of the substrate 1411 while a side of the substrate 1411 that faces the substrate 1412 is the inside, and a polarizing plate 1439b is located on the outside of the substrate 1412 while a side of the substrate 1412 that faces the substrate 1411 is the inside. Furthermore, a backlight unit 1490 is located on the outside of the polarizing plate 1439a while a side of the polarizing plate 1439a that is in contact with the substrate 1411 is the inside. The substrate 1412 side is the display surface side of the display device 1400 illustrated in FIG. 38.

The transistor 1430, a capacitor 1460, and the like are provided over the substrate 1411. The transistor 1430 functions as a selection transistor of a pixel. The transistor 1430 is connected to the liquid crystal element 1420 through the connection portion 1438.

The transistor 1430 illustrated in FIG. 38 is what is called a channel-etched bottom-gate transistor. The transistor 1430 includes a conductive layer 1431 functioning as a gate electrode, an insulating layer 1434 functioning as a gate insulating layer, a semiconductor layer 1432, and a pair of conductive layers 1433a and 1433b functioning as a source electrode and a drain electrode. A region of the semiconductor layer 1432 overlapping with the conductive layer 1431 functions as a channel formation region. The semiconductor layer 1432 is connected to the conductive layer 1433a and the conductive layer 1433b.

The capacitor 1460 is composed of a conductive layer 1431a, the insulating layer 1434, and the conductive layer 1433b.

A stack of an insulating layer 1482 and an insulating layer 1481 is provided to cover the transistor 1430 and the like. The conductive layer 1421 functioning as a pixel electrode is provided over the insulating layer 1481. In the connection portion 1438, the conductive layer 1421 is electrically connected to the conductive layer 1433b through an opening provided in the insulating layer 1481 and the insulating layer 1482. The insulating layer 1481 preferably functions as a planarization layer. The insulating layer 1482 preferably functions as a protective film that inhibits diffusion of impurities or the like to the transistor 1430 and the like.

An inorganic insulating material can be used for the insulating layer 1482, and an organic insulating material can be used for the insulating layer 1481, for example.

<Structure Example 2 of Display Device>

Figure 39:
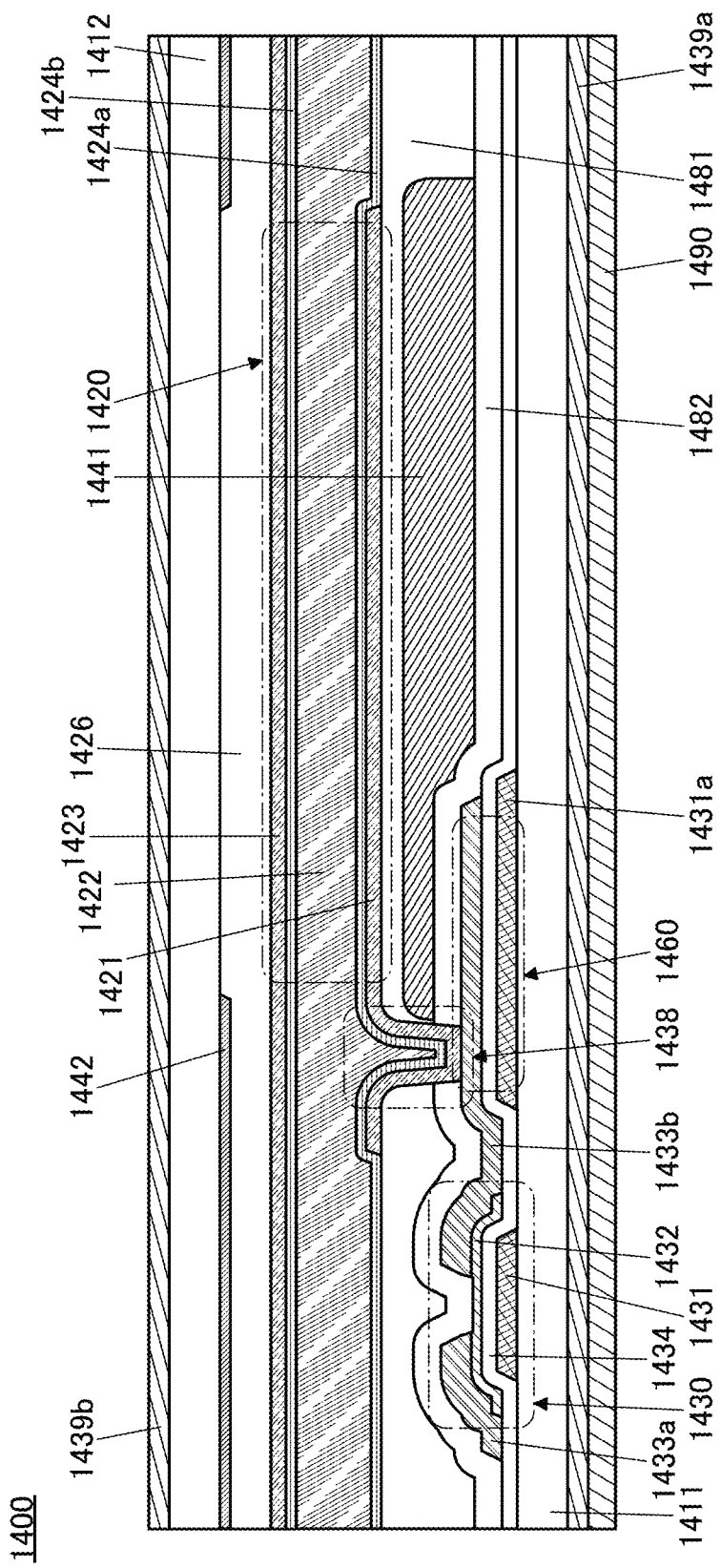
FIG. 39 A diagram illustrating a structure example of a display device.

FIG. 39 illustrates an example in which the coloring layer 1441 is provided not on the substrate 1412 side but on the substrate 1411 side. Thus, the structure on the substrate 1412 side can be simplified.

Note that in the case where the coloring layer 1441 is used as a planarization film, a structure in which the insulating layer 1481 is not provided may be used.

<Structure Example 3 of Display Device>

The examples of a vertical electric field mode liquid crystal element in which a pair of electrodes are located over and under a liquid crystal such that the liquid crystal is sandwiched therebetween are shown above as liquid crystal elements; however, the structure of the liquid crystal element is not limited thereto and liquid crystal elements of a variety of types can be used.

Figure 40:
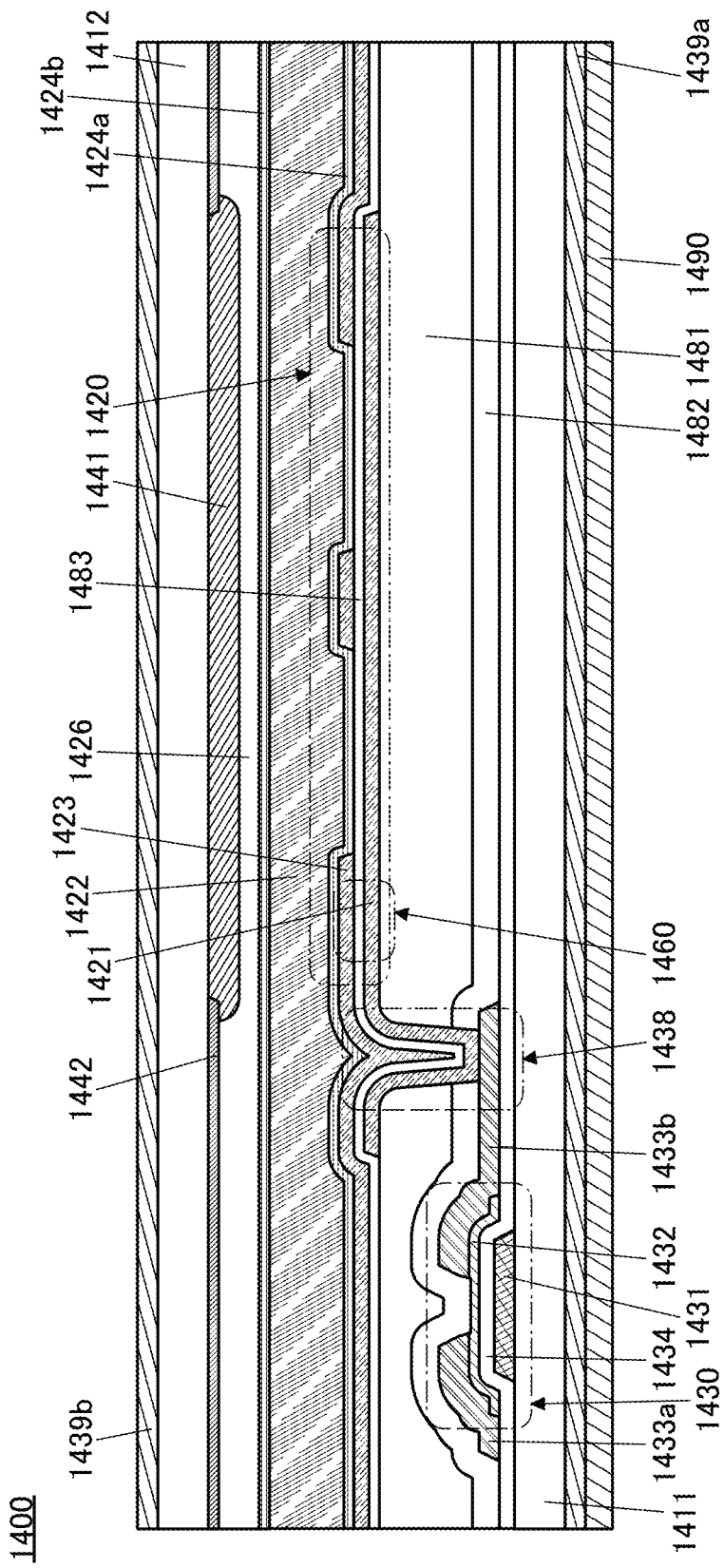
FIG. 40 A diagram illustrating a structure example of a display device.

FIG. 40 illustrates a schematic cross-sectional view of a display device including a liquid crystal element using an FFS (Fringe Field Switching) mode.

The liquid crystal element 1420 includes the conductive layer 1421 functioning as a pixel electrode and the conductive layer 1423 overlapping with the conductive layer 1421 with an insulating layer 1483 provided therebetween. The conductive layer 1423 has a slit-like or comb-like top surface shape.

Moreover, in such a structure, a capacitance is formed in a region where the conductive layer 1421 and the conductive layer 1423 overlap with each other, and can be used as the capacitor 1460. Thus, the area occupied by a pixel can be reduced, so that a high-resolution display device can be provided. Furthermore, the aperture ratio can be improved.

Figure 41:
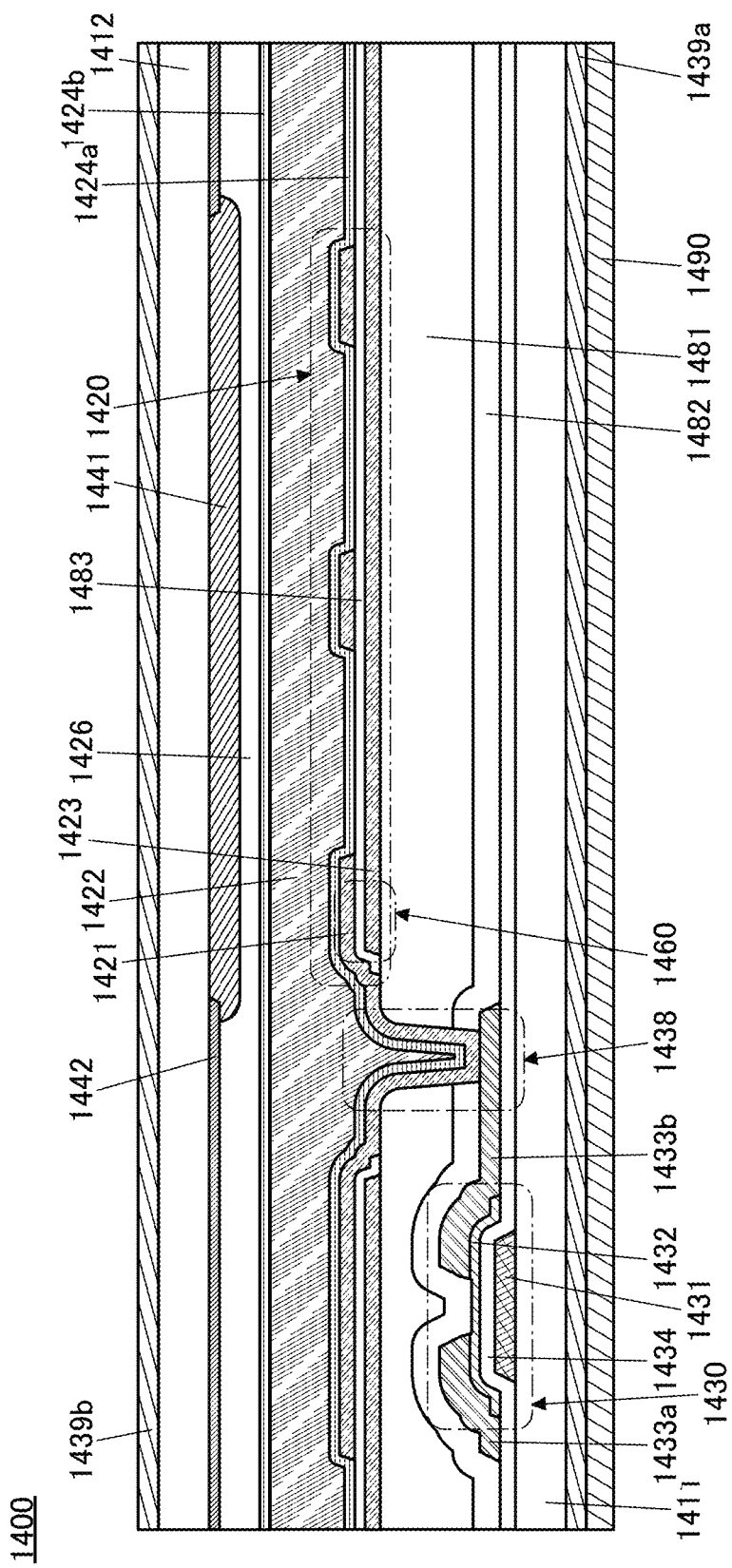
FIG. 41 A diagram illustrating a structure example of a display device.

Although in the structure in FIG. 40, the conductive layer 1423 functioning as a common electrode is positioned on the liquid crystal 1422 side, a structure in which the conductive layer 1421 functioning as a pixel electrode is positioned on the liquid crystal 1422 side as illustrated in FIG. 41 may be used. In such a structure, the conductive layer 1421 has a slit-like or comb-like top surface shape.

Here, the smaller the number of photolithography steps in a manufacturing process of a display device is, that is, the smaller the number of photomasks is, the lower the manufacturing cost can be.

For example, the structure illustrated in FIG. 38 can be manufactured through five photolithography steps in total among steps on the substrate 1411 side: a formation step of the conductive layer 1431 and the like, a formation step of the semiconductor layer 1432, a formation step of the conductive layer 1433a and the like, a formation step of the opening to be the connection portion 1438, and a formation step of the conductive layer 1421. That is, a back plane substrate can be manufactured with five photomasks. On the other hand, on the substrate 1412 (counter substrate) side, an ink-jet method, a screen printing method, or the like is preferably used as the formation methods of the coloring layer 1441 and the light-blocking layer 1442, in which case a photomask becomes unnecessary. For example, in the case where three-color coloring layers 1441 and the light-blocking layer 1442 are provided, four photomasks can be reduced in total compared with the case where these layers are formed by a photolithography method.

<Structure Example of Transistor>

Next, a specific structure example of the transistor 1430 will be described. A semiconductor containing silicon can be used for the semiconductor layer 1432 of the transistor described below. For example, hydrogenated amorphous silicon, microcrystalline silicon, or polycrystalline silicon can be used as the semiconductor containing silicon. The use of hydrogenated amorphous silicon is particularly preferable because it can be formed over a large substrate with a high yield. The display device of one embodiment of the present invention can perform favorable display even with a transistor containing amorphous silicon that has relatively low field-effect mobility.

Figure 42A:
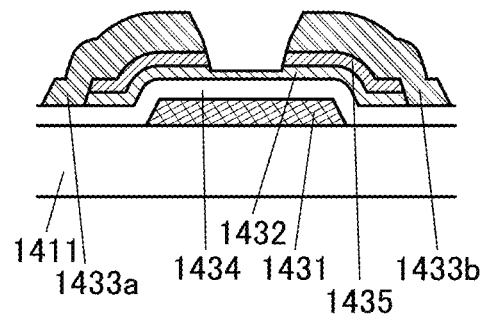
FIG. 42 Diagrams illustrating structure examples of a transistor.

A transistor illustrated in FIG. 42(A) includes a pair of impurity semiconductor layers 1435 functioning as a source region and a drain region. The impurity semiconductor layers 1435 are provided between the semiconductor layer 1432 and the conductive layer 1433a and between the semiconductor layer 1432 and the conductive layer 1433b. The semiconductor layer 1432 and the impurity semiconductor layers 1435 are provided in contact with each other, and each of the impurity semiconductor layers 1435 is provided in contact with the conductive layer 1433a or the conductive layer 1433b.

The impurity semiconductor film to form the impurity semiconductor layer 1435 is formed using a semiconductor to which an impurity element imparting one conductivity type is added. In the case where the transistor is of an n-type, for example, silicon to which P or As is added is given as a semiconductor to which an impurity element imparting one conductivity type is added. In the case where the transistor is of a p-type, for example, it is possible to add B as the impurity element imparting one conductivity type; however, it is preferable that the transistor be of an n-type. Note that the impurity semiconductor layer may be formed using an amorphous semiconductor or formed using a crystalline semiconductor such as a microcrystalline semiconductor.

Figure 42B:
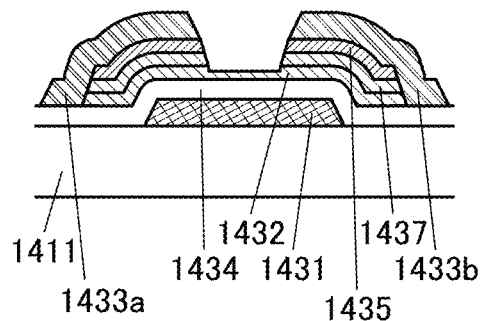

A transistor illustrated in FIG. 42(B) includes a semiconductor layer 1437 between the semiconductor layer 1432 and the impurity semiconductor layer 1435.

The semiconductor layer 1437 may be formed using a semiconductor film similar to the semiconductor layer 1432. The semiconductor layer 1437 can function as an etching stopper for preventing the semiconductor layer 1432 from being removed at the time of etching the impurity semiconductor layer 1435. Note that although an example in which the semiconductor layer 1437 is divided into a right portion and a left portion is illustrated in FIG. 42(A), part of the semiconductor layer 1437 may cover a channel formation region of the semiconductor layer 1432.

Furthermore, the semiconductor layer 1437 may contain an impurity at a concentration lower than that in the impurity semiconductor layer 1435. Thus, the semiconductor layer 1437 can function as an LDD (Lightly Doped Drain) region and can inhibit hot-carrier degradation caused when the transistor is driven.

Figure 42C:
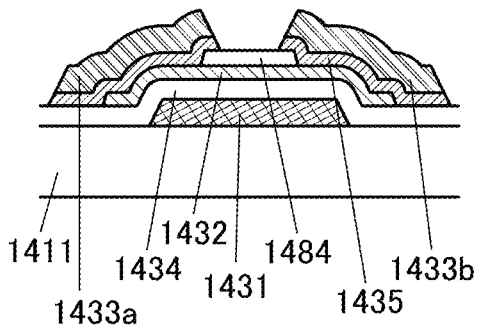

In a transistor illustrated in FIG. 42(C), an insulating layer 1484 is provided over a channel formation region of the semiconductor layer 1432. The insulating layer 1484 functions as an etching stopper at the time of etching a conductor 1433a and a conductor 1433b.

Figure 42D:
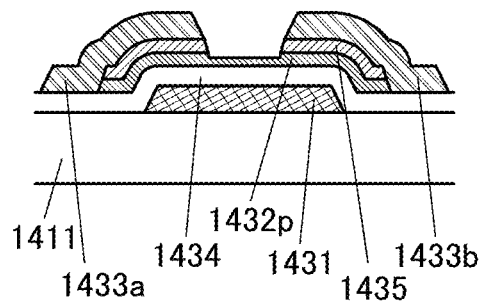

A transistor illustrated in FIG. 42(D) includes a semiconductor layer 1432p instead of the semiconductor layer 1432. The semiconductor layer 1432p includes a semiconductor film having high crystallinity. For example, the semiconductor layer 1432p includes a polycrystalline semiconductor or a single crystal semiconductor. Thus, the transistor can have high field-effect mobility.

Figure 42E:
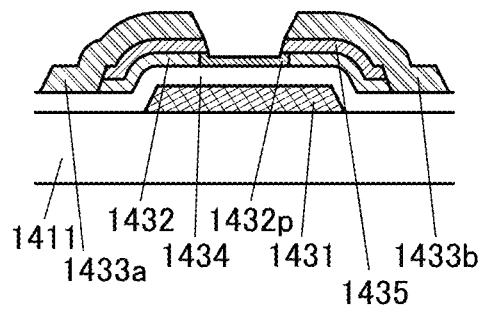

A transistor illustrated in FIG. 42(E) includes the semiconductor layer 1432p in a channel formation region of the semiconductor layer 1432. For example, the transistor illustrated in FIG. 42(E) can be formed by irradiating a semiconductor film to be the semiconductor layer 1432 with laser light or the like so that crystallization is caused locally. Thus, the transistor can have high field-effect mobility.

Figure 42F:
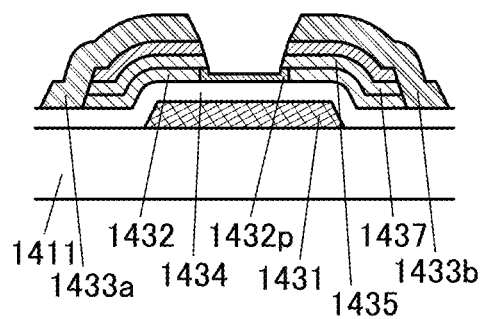

A transistor illustrated in FIG. 42(F) includes the semiconductor layer 1432p with crystallinity in a channel formation region of the semiconductor layer 1432 of the transistor illustrated in FIG. 42(B).

Figure 42G:
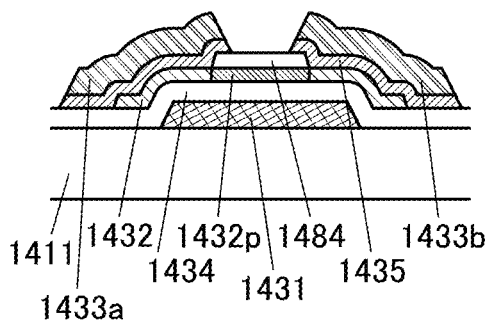

A transistor illustrated in FIG. 42(G) includes the semiconductor layer 1432p with crystallinity in a channel formation region of the semiconductor layer 1432 of the transistor illustrated in FIG. 42(C).

<Components>

The above-described components will be described below.

[Substrate]

A material having a flat surface can be used for the substrate included in the display device. For the substrate on the side from which light from the display element is extracted, a material transmitting the light is used. For example, a material such as glass, quartz, ceramics, sapphire, or an organic resin can be used.

The display panel can be lightweight and thin by using a thin substrate. Furthermore, a display panel having flexibility can be obtained by using a substrate that is thin enough to have flexibility. Alternatively, glass or the like that is thin enough to have flexibility can be used as the substrate. Alternatively, a composite material in which glass and a resin material are attached to each other with an adhesive layer may be used.

[Transistor]

The transistor includes a conductive layer functioning as a gate electrode, a semiconductor layer, a conductive layer functioning as a source electrode, a conductive layer functioning as a drain electrode, and an insulating layer functioning as a gate insulating layer.

Note that there is no particular limitation on the structure of the transistor included in the display device of one embodiment of the present invention. For example, a planar transistor, a staggered transistor, or an inverted staggered transistor may be employed. Alternatively, a top-gate or bottom-gate transistor structure may be employed. Alternatively, gate electrodes may be provided above and below a channel.

There is also no particular limitation on the crystallinity of a semiconductor material used for the transistor, and an amorphous semiconductor or a semiconductor with crystallinity (a microcrystalline semiconductor, a polycrystalline semiconductor, a single crystal semiconductor, or a semiconductor partly including crystal regions) may be used. It is preferred that a semiconductor with crystallinity be used, in which case deterioration of the transistor characteristics can be inhibited.

For example, silicon can be used as a semiconductor in which a channel of the transistor is formed. It is particularly preferable to use amorphous silicon as silicon. By using amorphous silicon, a transistor can be formed over a large substrate with a high yield, resulting in excellent mass productivity.

Furthermore, silicon with crystallinity, such as microcrystalline silicon, polycrystalline silicon, or single crystal silicon can be used. In particular, polycrystalline silicon can be formed at a lower temperature than single crystal silicon and has higher field-effect mobility and higher reliability than amorphous silicon.

The bottom-gate transistor described in this embodiment as an example is preferable because the number of manufacturing steps can be reduced. When amorphous silicon, which can be formed at a lower temperature than polycrystalline silicon, is used in this case, materials with low heat resistance can be used as materials for a wiring or an electrode in a layer under the semiconductor layer or as materials for a substrate, resulting in wider choice of materials. For example, an extremely large glass substrate can be favorably used. Meanwhile, a top-gate transistor is preferable because an impurity region can easily be formed in a self-aligned manner and variation in characteristics or the like can be reduced. In some cases, the top-gate transistor is particularly preferable when polycrystalline silicon, single crystal silicon, or the like is used.

[Conductive Layer]

Examples of materials that can be used for the conductive layers for a variety of wirings and electrodes included in the display device as well as the gate, the source, and the drain of a transistor include metals such as aluminum, titanium, chromium, nickel, copper, yttrium, zirconium, molybdenum, silver, tantalum, and tungsten, or an alloy or the like containing any of these metals as its main component. A film containing these materials can also be used as a single layer or a stacked-layer structure. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film is formed, an aluminum film or a copper film is stacked thereover, and a titanium film or a titanium nitride film is further formed thereover, and a three-layer structure in which a molybdenum film or a molybdenum nitride film is formed, an aluminum film or a copper film is stacked thereover, and a molybdenum film or a molybdenum nitride film is further formed thereover. Note that an oxide such as indium oxide, tin oxide, or zinc oxide may be used. Moreover, copper containing manganese is preferably used because it increases controllability of a shape by etching.

Other examples of a light-transmitting conductive material that can be used for the conductive layers for a variety of wirings and electrodes included in the display device as well as the gate, source, and drain of the transistor include a conductive oxide such as indium oxide, indium tin oxide, indium zinc oxide, zinc oxide, zinc oxide to which gallium is added, or graphene. Alternatively, a metal material such as gold, silver, platinum, magnesium, nickel, tungsten, chromium, molybdenum, iron, cobalt, copper, palladium, or titanium, or an alloy material containing the metal material can be used. Alternatively, a nitride of the metal material (for example, titanium nitride) or the like may be used. Note that in the case of using the metal material or the alloy material (or the nitride thereof), the thickness is set small enough for light transmission. Alternatively, a stacked film of the above materials can be used for the conductive layers. For example, a stacked film of an alloy of silver and magnesium and indium tin oxide is preferably used because it can increase the conductivity. They can also be used for conductive layers for variety of wirings and electrodes included in the display device, and conductive layers (a conductive layer functioning as a pixel electrode or a common electrode) included in a display element.

[Insulating Layer]

As well as a resin such as acrylic or epoxy resin and a resin having a siloxane bond, such as silicone, an inorganic insulating material, such as silicon oxide, silicon oxynitride, silicon nitride oxide, silicon nitride, or aluminum oxide can be used as an insulating material that can be used for the insulating layers, for example.

Examples of the insulating film with low water permeability include a film containing nitrogen and silicon such as a silicon nitride film or a silicon nitride oxide film, and a film containing nitrogen and aluminum such as an aluminum nitride film. Alternatively, a silicon oxide film, a silicon oxynitride film, an aluminum oxide film, or the like may be used.

[Liquid Crystal Element]

As the liquid crystal element, for example, a liquid crystal element using a vertical alignment (VA) mode can be used. Examples of the vertical alignment mode that can be used include an MVA (Multi-Domain Vertical Alignment) mode, a PVA (Patterned Vertical Alignment) mode, and an ASV (Advanced Super View) mode.

Furthermore, liquid crystal elements using a variety of modes can be used as the liquid crystal element. For example, liquid crystal elements using, as well as the VA mode, a TN (Twisted Nematic) mode, an IPS (In-Plane-Switching) mode, an FFS (Fringe Field Switching) mode, an ASM (Axially Symmetric aligned Micro-cell) mode, an OCB (Optically Compensated Birefringence) mode, an FLC (Ferroelectric Liquid Crystal) mode, an AFLC (AntiFerroelectric Liquid Crystal) mode, an ECB (Electrically Controlled Birefringence) mode, and a guest-host mode can be used.

Note that the liquid crystal element is an element that controls the transmission or non-transmission of light by an optical modulation action of a liquid crystal. Note that the optical modulation action of the liquid crystal is controlled by an electric field applied to the liquid crystal (including a horizontal electric field, a vertical electric field, or an oblique electric field). Note that as the liquid crystal used for the liquid crystal element, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

Moreover, as the liquid crystal material, either a positive liquid crystal or a negative liquid crystal may be used, and an optimal liquid crystal material is used depending on the mode or design to be used.

Furthermore, an alignment film can be provided to control the alignment of a liquid crystal. Note that in the case where a horizontal electric field mode is employed, a liquid crystal exhibiting a blue phase for which no alignment film is used may be used. The blue phase is one of liquid crystal phases, which is a phase generated just before a cholesteric phase changes into an isotropic phase when the temperature of a cholesteric liquid crystal is increased. Since the blue phase appears only in a narrow temperature range, a liquid crystal composition in which a chiral material is mixed to account for several weight percent or more is used for the liquid crystal layer in order to improve the temperature range. The liquid crystal composition containing a liquid crystal exhibiting a blue phase and a chiral material has a short response time and is optically isotropic. Additionally, the liquid crystal composition containing a liquid crystal exhibiting a blue phase and a chiral material needs no alignment treatment and has small viewing angle dependence. Furthermore, since the alignment film does not need to be provided, rubbing treatment is not necessary; accordingly, electrostatic breakdown caused by the rubbing treatment can be prevented and defects and damage of a liquid crystal display device in the manufacturing process can be reduced.

Moreover, examples of the liquid crystal element include a transmissive liquid crystal element, a reflective liquid crystal element, and a transflective liquid crystal element.

In one embodiment of the present invention, a transmissive liquid crystal element can be particularly suitably used.

In the case where a transmissive or transflective liquid crystal element is used, two polarizing plates are provided such that a pair of substrates are sandwiched therebetween. Furthermore, a backlight is provided more outward than the polarizing plate. The backlight may be a direct-below backlight or an edge-light backlight. The direct-below backlight including an LED (Light Emitting Diode) is preferably used because local dimming is easily performed and contrast can be improved. The edge-light backlight is also preferably used because the thickness of a module including the backlight can be reduced.

Note that when the edge-light backlight is brought into an off state, see-through display can be performed.

[Coloring Layer]

Examples of a material that can be used for the coloring layers include a metal material, a resin material, and a resin material containing a pigment or dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. A stacked film of films containing the material of the coloring layer can also be used for the light-blocking layer. For example, a stacked-layer structure of a film containing a material used for a coloring layer which transmits light of a certain color and a film containing a material used for a coloring layer which transmits light of another color can be employed. It is preferable that the same material be used for the coloring layer and the light-blocking layer because the same manufacturing apparatus can be used and the process can be simplified.

Note that although the display device using the liquid crystal element as the display element is described in this embodiment, a light-emitting element can also be used as the display element.

This embodiment can be combined with the description of the other embodiment as appropriate.

Embodiment 5

In this embodiment, examples of a method of crystallization for polycrystalline silicon which can be used for a semiconductor layer of a transistor and a laser crystallization apparatus will be described.

To form polycrystalline silicon layers having favorable crystallinity, it is preferable that an amorphous silicon layer be provided over a substrate and the amorphous silicon layer be irradiated with laser light to be crystallized. For example, laser light is a linear beam and the substrate is moved while the amorphous silicon layer is irradiated with the linear beam, so that the polycrystalline silicon layers can be formed in desired regions over the substrate.

The throughput of the method using a linear beam is relatively favorable. On the other hand, variations in crystallinity owing to a change in the output of laser light and a change in beam profile caused by the output change tend to be caused because in the method, the laser light is moved relative to a region and is emitted to the region a plurality of times. For example, when a semiconductor layer crystallized by the method is used for a transistor included in a pixel of a display device, a random stripe pattern due to the variations in the crystallinity is seen in display in some cases.

The length of the linear beam is ideally greater than or equal to the length of a side of the substrate; however, the length of the linear beam is limited by an output of a laser oscillator and the structure of an optical system. Thus, it is practical to irradiate a large substrate with the laser light by turning back the laser light in a substrate plane. Consequently, there is a region irradiated with the laser light a plurality of times. Since the crystallinity of the region is likely to be different from the crystallinity of the other region, display unevenness is sometimes caused in the region.

To avoid such a problem, an amorphous silicon layer formed over a substrate may be crystallized by local laser irradiation. Local laser irradiation easily forms polycrystalline silicon layers with small variations in crystallinity.

Figure 43A:
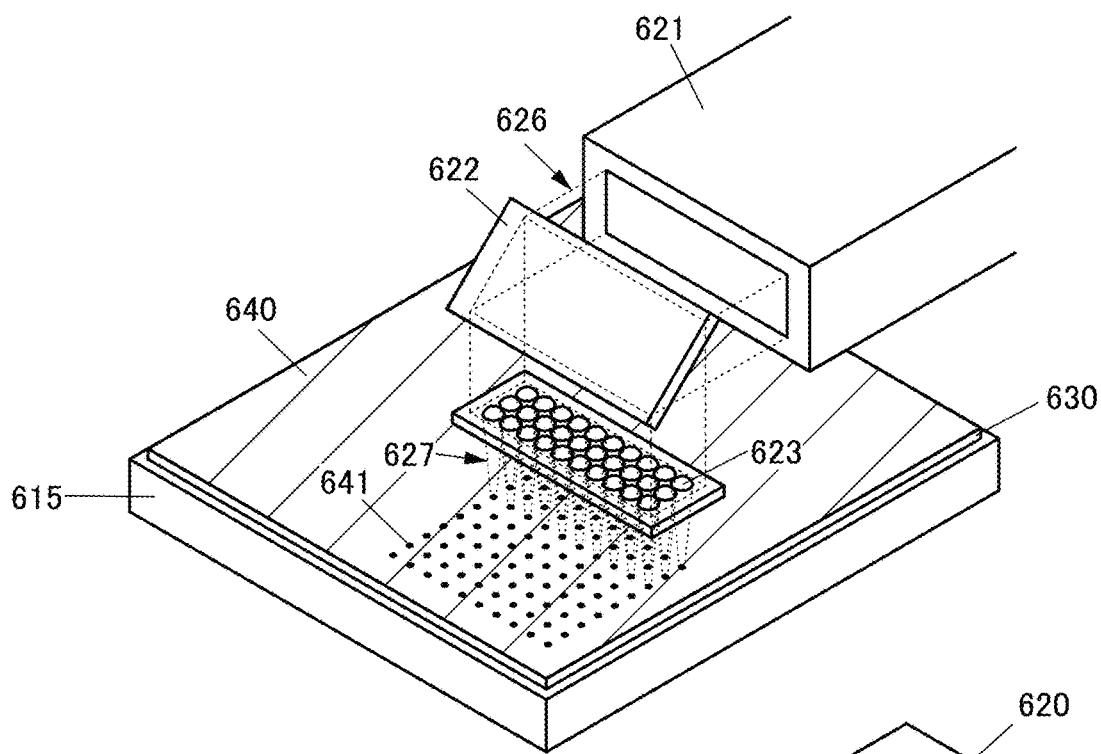
FIG. 43 Diagrams illustrating a laser irradiation method and a laser crystallization apparatus.

FIG. 43(A) is a diagram illustrating a method of locally irradiating an amorphous silicon layer formed over a substrate with laser light.

Laser light 626 emitted from an optical system unit 621 is reflected by a mirror 622 and enters a microlens array 623. The microlens array 623 condenses the laser light 626 to form a plurality of laser beams 627.

A substrate 630 over which an amorphous silicon layer 640 is formed is fixed to a stage 615. The amorphous silicon layer 640 is irradiated with the plurality of laser beams 627, so that a plurality of polycrystalline silicon layers 641 can be formed at the same time.

Microlenses of the microlens array 623 are preferably provided with a pixel pitch of a display device. Alternatively, they may be provided at intervals of an integral multiple of the pixel pitch. In either of the cases, polycrystalline silicon layers can be formed in regions corresponding to the pixels by repeating laser irradiation and movement of the stage 615 in the X direction or the Y direction.

For example, when the microlens array 623 includes I rows and J columns (I and J are natural numbers) of microlenses arranged with a pixel pitch, laser light irradiation is performed at a predetermined start position first, so that I rows and J columns of polycrystalline silicon layers can be formed. Then, the stage 615 is moved by J columns in the row direction and laser light irradiation is performed to further form I rows and J columns of polycrystalline silicon layers 641, so that I rows and 2J columns of polycrystalline silicon layers 641 can be formed. By repeating the steps, a plurality of polycrystalline silicon layers 641 can be formed in desired regions. In addition, in the case where the laser irradiation step is performed by turning back the laser light, moving the stage 615 by J columns in the row direction, performing laser light irradiation, further moving the stage 615 by I rows in the column direction, and performing laser irradiation are repeated.

Note that even when a method of performing laser irradiation while the stage 615 is moved in one direction is employed, polycrystalline silicon layers can be formed with a pixel pitch by properly adjusting the oscillation frequency of the laser light and the moving speed of the stage 615.

The size of the laser beam 627 can be an area enough for an entire semiconductor layer of a transistor, for example. Alternatively, the size can be an area enough for an entire channel region of a transistor. Alternatively, the size can be an area in which part of a channel region of a transistor is included. They are used properly in accordance with required electrical characteristics of a transistor.

Note that in the case where a display device including a plurality of transistors in a pixel is an object, the laser beam 627 can have an area enough for an entire semiconductor layer of each transistor in a pixel. Alternatively, the laser beam 627 may be an area enough for entire semiconductor layers of transistors included in a plurality of pixels.

Figure 44A:
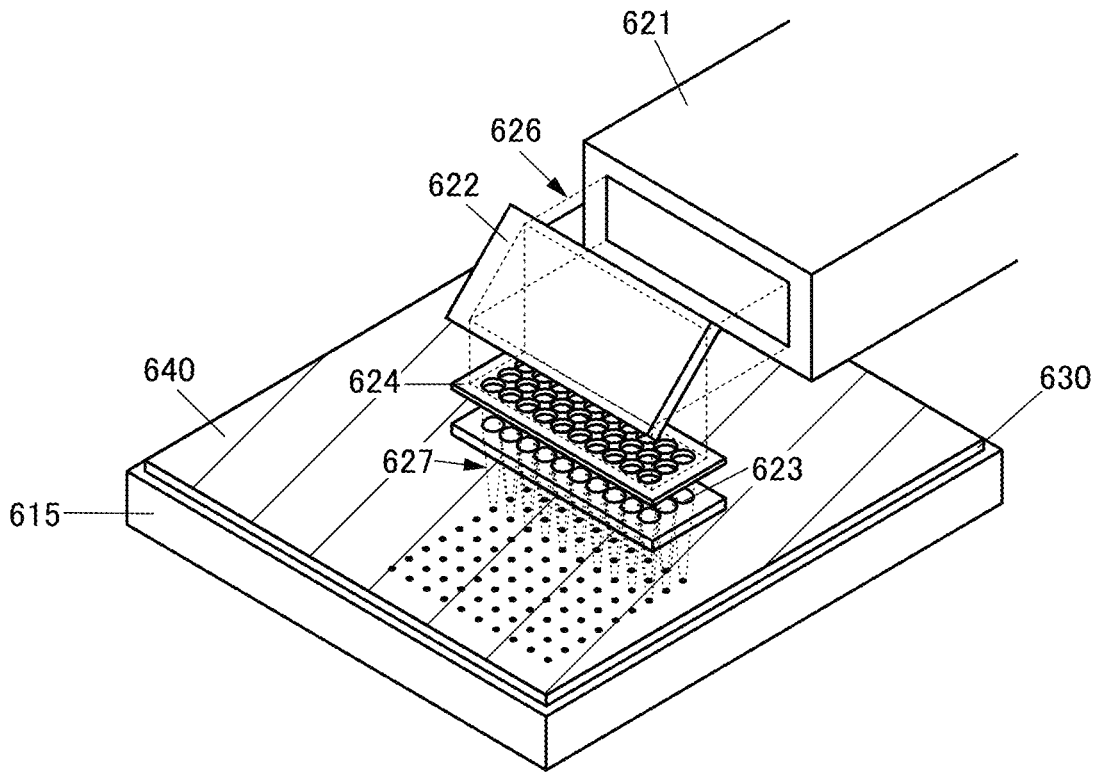
FIG. 44 Diagrams illustrating a laser irradiation method.
Figure 44B:
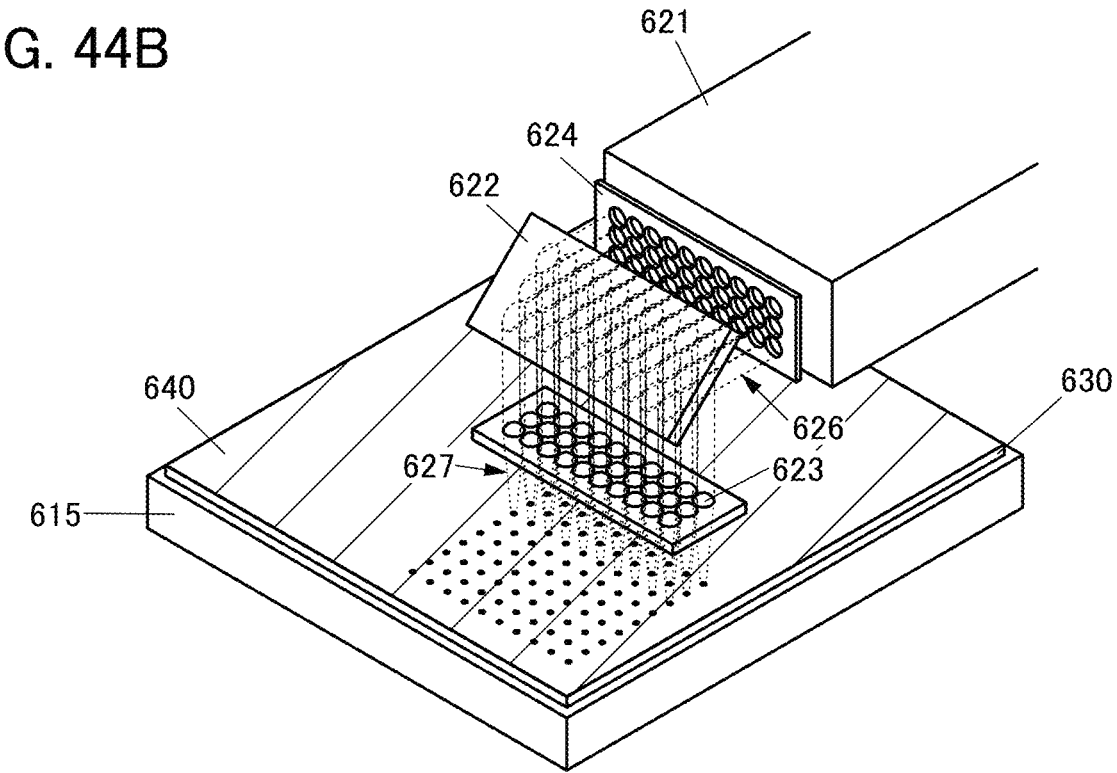

Alternatively, as illustrated in FIG. 44(A), a mask 624 may be provided between the mirror 622 and the microlens array 623. The mask 624 includes a plurality of openings corresponding to respective microlenses. The shape of the opening can be reflected by the shape of the laser beam 627; as illustrated in FIG. 44(A), the laser beam 627 having a circular shape can be obtained in the case where the mask 624 has circular openings. Moreover, the laser beam 627 having a rectangular shape can be obtained in the case where the mask 624 includes rectangular openings. The mask 624 is effective in the case where only a channel region of a transistor needs to be crystallized, for example. Note that the mask 624 may be provided between the optical system unit 621 and the mirror 622 as illustrated in FIG. 44(B).

Figure 43B:
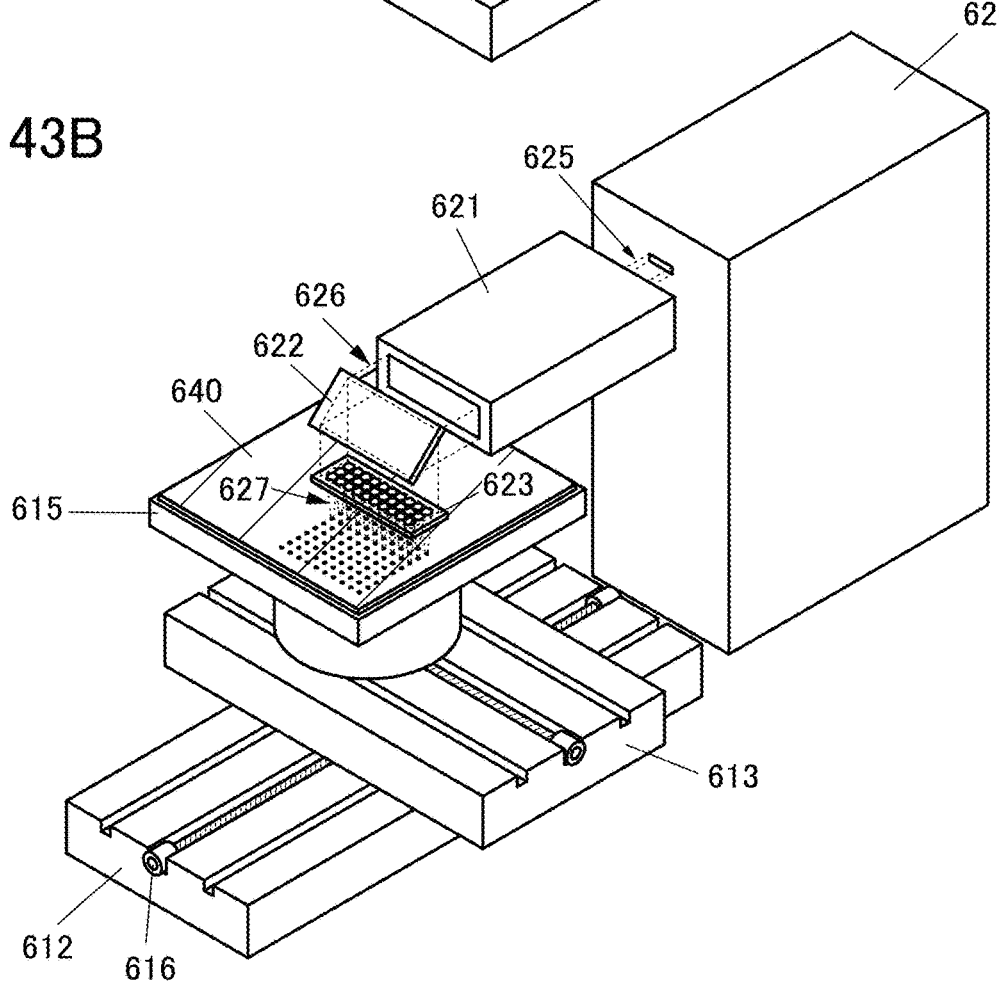

FIG. 43(B) is a perspective view illustrating a main structure of a laser crystallization apparatus which can be used in the above-described local laser irradiation step. The laser crystallization apparatus includes a moving mechanism 612, a moving mechanism 613, and the stage 615 which are components of an X-Y stage. A laser oscillator 620, the optical system unit 621, the mirror 622, and the microlens array 623 to shape the laser beam 627 are further included.

The moving mechanism 612 and the moving mechanism 613 each have a function of performing reciprocating linear motion in the horizontal direction. As a mechanism for powering the moving mechanism 612 and the moving mechanism 613, a ball screw mechanism 616 driven by a motor can be used, for example. The moving directions of the moving mechanism 612 and the moving mechanism 613 cross orthogonally; thus, the stage 615 fixed to the moving mechanism 613 can be moved in the X direction and in the Y direction freely.

The stage 615 includes a fixing mechanism such as a vacuum suction mechanism and can fix the substrate 630 or the like to itself. Furthermore, the stage 615 may include a heating mechanism as needed. Note that although not illustrated, the stage 615 includes a pusher pin and a vertical moving mechanism thereof, and the substrate 630 or the like can be moved up and down when the substrate 630 or the like is transferred.

The laser oscillator 620 outputs at least light with a wavelength and intensity suitable for the purpose of processing, and the light is preferably a pulsed laser, but may be a CW laser. Typically, an excimer laser that can emit ultraviolet light with a wavelength of 351-353 nm (XeF), 308 nm (XeCl), or the like can be used. Alternatively, a second harmonic wavelength (515 nm, 532 nm, or the like) or a third harmonic wavelength (343 nm, 355 nm, or the like) of a solid-state laser (a YAG laser, a fiber laser, or the like) may be used. In addition, a plurality of laser oscillators 620 may be provided.

The optical system unit 621 includes a mirror, a beam expander, a beam homogenizer, or the like, for example, and can homogenize and expand the energy in-plane distribution of the laser light 625 output from the laser oscillator 620.

As the mirror 622, a dielectric multilayer mirror can be used, for example, and is provided so that the incident angle of the laser light is substantially 45°. The microlens array 623 can have a shape where a plurality of convex lenses are provided on the top surface or on the top and bottom surfaces of a quartz board, for example.

With the above-described laser crystallization apparatus, polycrystalline silicon layers with small variations in crystallinity can be formed.

This embodiment can be combined with the description of the other embodiment as appropriate.

Embodiment 6

In this embodiment, a display element included in the display portion PA described in Embodiment 1 will be described.

Figure 45A:
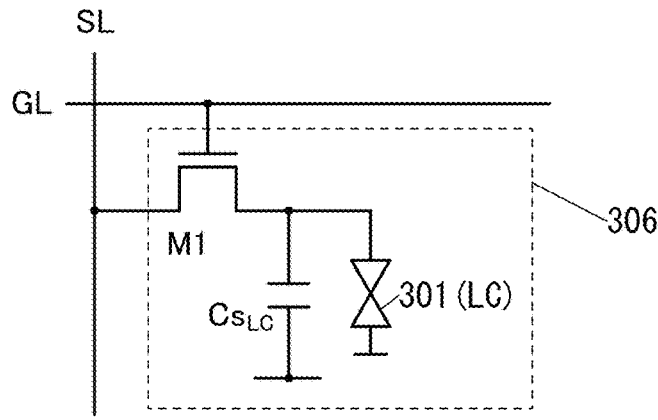
FIG. 45 Circuit diagrams and timing charts illustrating configuration examples of pixel circuits.

FIG. 45(A) illustrates a pixel circuit in which a liquid crystal element is used as a display element. A pixel circuit 306 includes a display element 301, a transistor M1, and a capacitor $Cs_{LC}$. Note that a first terminal of the display element 301 corresponds to a pixel electrode and a second terminal of the display element 301 corresponds to a common electrode. FIG. 45(A) also illustrates a signal line SL and a gate line GL that are electrically connected to the pixel circuit 306.

A first terminal of the transistor M1 is electrically connected to the first terminal of the display element 301, a second terminal of the transistor M1 is electrically connected to the signal line SL, and a gate of the transistor M1 is electrically connected to the gate line GL. In addition, a first terminal of the capacitor $Cs_{LC}$ is electrically connected to the first terminal of the transistor M1.

The second terminal of the display element 301 is electrically connected to a wiring that supplies a common potential for driving the display element 301. In addition, a second terminal of the capacitor $Cs_{LC}$ is electrically connected to a wiring that supplies a reference potential.

An OS transistor is preferably used as the transistor M1. As a typical example of the transistor, a transistor including an oxide semiconductor which is a type of metal oxide (OS transistor) will be described below. The OS transistor has an extremely low leakage current in a non-conduction state (off-state current); therefore, by bringing the OS transistor into a non-conduction state, electric charge can be retained by a pixel electrode of the liquid crystal element.

Note that by utilizing the characteristic of an extremely low off-state current of the OS transistor, a display device including the pixel circuit 306 can be driven at a frame frequency lower than a normal frame frequency (typified by higher than or equal to 60 Hz and lower than or equal to 240 Hz). A normal driving mode (Normal mode) with a normal frame frequency and an idling stop (IDS) driving mode with a low frame frequency will be described below as examples.

Note that the idling stop (IDS) driving mode refers to a driving method in which rewriting of image data is stopped after writing processing of image data is performed. By increasing the interval between writing of image data and subsequent writing of image data, the power that would be consumed by writing of image data in that interval can be reduced. The frame frequency for the idling stop (IDS) driving mode can be about 1/100 to 1/10 of that for the normal driving mode, for example.

Figure 45B:
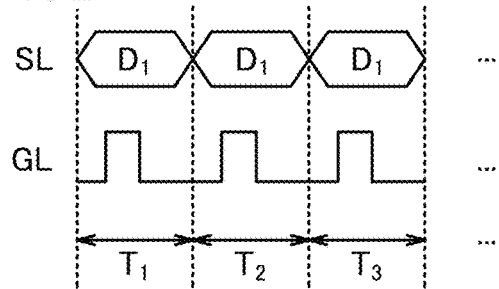

FIGS. 45(B) and (C) are timing charts respectively showing the normal driving mode and the idling stop (IDS) driving mode.

FIG. 45(B) is a timing chart showing signals supplied to the signal line SL and the gate line GL in the normal driving mode. In the normal driving mode, a normal frame frequency (for example, 60 Hz) is used for operation. Each of a period $T_1$ to a period T3 is one frame period, and in each frame period, an operation in which a scanning signal is supplied to the gate line GL and data $D_1$ is written from the signal line SL is performed. This operation is also performed in the case where the same data $D_1$ is written during the period $T_1$ to the period T3 and the case where different data is written during the period $T_1$ to the period T3.

Figure 45C:
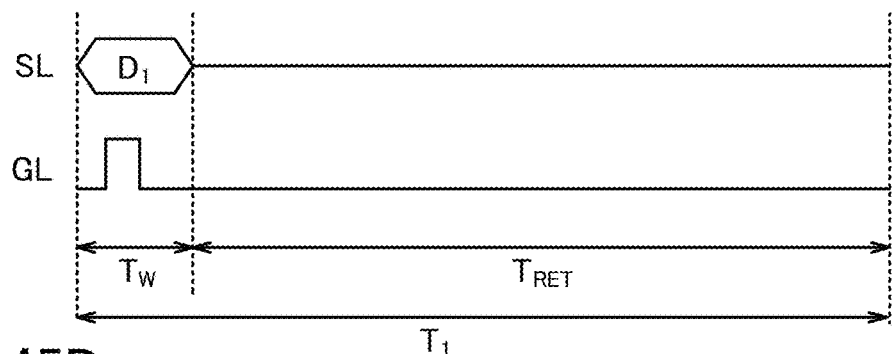

In contrast, FIG. 45(C) is a timing chart showing signals supplied to the signal line SL and the gate line GL in the idling stop (IDS) driving mode. In the idling stop (IDS) driving, a low frame frequency (for example, 1 Hz) is used for operation. One frame period is denoted by the period $T_1$, which includes a data writing period denoted by a period $T_W$ and a data retention period denoted by a period $T_{RET}$. In the idling stop (IDS) driving mode, a scanning signal is supplied to the gate line GL and the data $D_1$ of the signal line SL is written during the period $T_W$, and the gate line GL is fixed to a low-level voltage in the period $T_{RET}$ so that the transistor M1 is brought into a non-conduction state and the written data $D_1$ is retained.

The idling stop (IDS) driving mode requires a small number of times of image data writing to the pixel circuit 306 as compared with the normal driving mode, whereby low power consumption can be achieved.

Figure 45D:
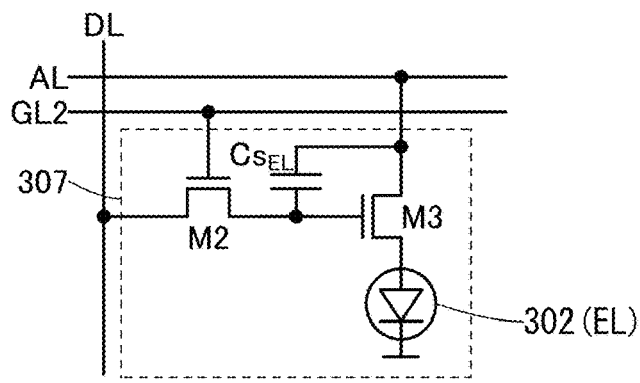

FIG. 45(D) illustrates a pixel circuit in which an organic EL element is used as a display element. A pixel circuit 307 includes a display element 302, a transistor M2, a transistor M3, and a capacitor $Cs_{EL}$. FIG. 45(D) also illustrates a signal line DL, a gate line GL2, and a current supply line AL that are electrically connected to the pixel circuit 307.

As the transistor M2, an OS transistor is preferably used like the transistor M1. The OS transistor has an extremely low leakage current in a non-conduction state (off-state current); therefore, electric charge accumulated in the capacitor $Cs_{EL}$ can be retained by bringing the OS transistor into a non-conduction state. In other words, the gate-drain voltage of the transistor M3 can be kept constant, whereby the emission intensity of the display element 302 can be constant.

Therefore, as in the idling stop (IDS) driving of the display element 301, the idling stop (IDS) driving of the display element 302 is performed by supplying a scanning signal to the gate line GL2, writing data from the signal line DL, and then, fixing the gate line GL2 to a low-level voltage to bring the transistor M2 into a non-conduction state and retain the data once written.

The use of the OS transistor as the transistor M2 enables the pixel circuit 307 as well as the pixel circuit 306 to operate in the idling stop (IDS) driving mode. Thus, the number of times of image data writing to the pixel circuit 307 can be small as compared with the case of the normal driving mode, whereby low power consumption can be achieved.

Note that the transistor M3 is preferably formed using a material similar to that of the transistor M2. The use of the same material for the transistor M3 and the transistor M2 can shorten the fabrication process of the pixel circuit 307.

A material that can be used for semiconductor layers of the transistor M1, the transistor M2, and the transistor M3 preferably contains an amorphous semiconductor, particularly hydrogenated amorphous silicon (a-Si:H), other than a metal oxide. Because a transistor including an amorphous semiconductor can be easily formed over a large substrate, the manufacturing process of a large-screen display device which is compatible with 2K, 4K, or 8K broadcasting or the like can be simplified, for example.

Note that this embodiment can be combined with the other embodiment in this specification as appropriate.

Embodiment 7

In this embodiment, examples of a product using the electronic device described in the above embodiments will be described.

Figure 46A:
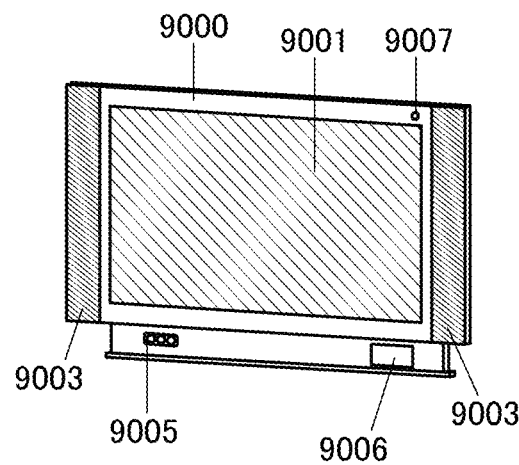
FIG. 46 Diagrams illustrating examples of electronic devices.

FIG. 46(A) is a perspective view illustrating a television device. The television device includes a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and the like. The television device can include the display portion 9001 having a large screen size of, for example, larger than or equal to 50 inches or larger than or equal to 100 inches.

Figure 46B:
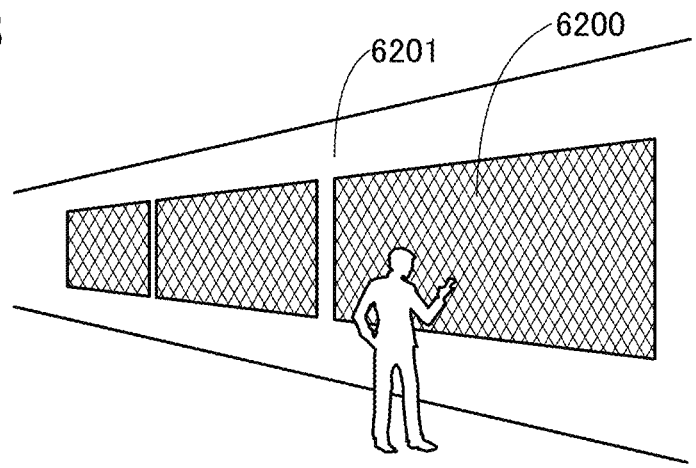

FIG. 46(B) illustrates an example of a digital signage that can be attached to a wall. FIG. 46(B) illustrates a state where a digital signage 6200 is attached to a wall 6201.

Figure 46C:
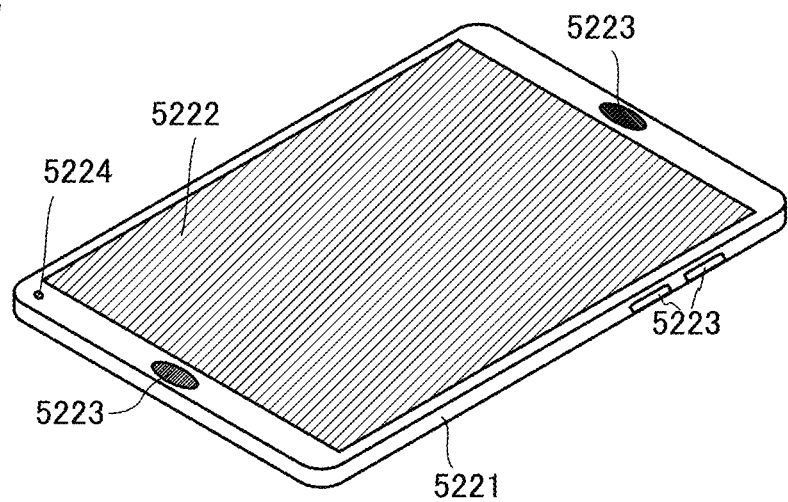

FIG. 46(C) is a tablet information terminal, which includes a housing 5221, a display portion 5222, operation buttons 5223, and a speaker 5224. Moreover, a display device to which a function of a position input device is added may be used for the display portion 5222. The function of a position input device can be added by provision of a touch panel in a display device. Alternatively, the function of a position input device can be added by providing a photoelectric conversion element also called a photosensor in a pixel area of a display device. In addition, as the operation buttons 5223, any one of a power switch for starting the information terminal, a button for operating an application of the information terminal, a volume control button, a switch for turning on or off the display portion 5222, and the like can be provided. Although the number of the operation buttons 5223 is four in the information terminal illustrated in FIG. 46(C), the number and position of operation buttons included in the information terminal is not limited thereto. Although not illustrated, the information terminal illustrated in FIG. 46(C) may have a structure including a camera. Although not illustrated, the information terminal illustrated in FIG. 46(C) may have a structure including a light-emitting device for use as a flashlight or a lighting device. Although not illustrated, the information terminal illustrated in FIG. 46(C) may have a structure including a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, infrared rays, or the like) inside the housing 5221. In particular, when a sensing device including a sensor for sensing inclination such as a gyroscope or an acceleration sensor is provided, display on the screen of the display portion 5222 can be automatically changed in accordance with the orientation of the information terminal illustrated in FIG. 46(C) by determining the orientation of the information terminal (the orientation of the information terminal with respect to the vertical direction).

In this specification and the like, for example, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of an EL (electroluminescence) element (an EL element including an organic material and an inorganic material, an organic EL element, or an inorganic EL element), an LED chip (a white LED chip, a red LED chip, a green LED chip, a blue LED chip, or the like), a transistor (a transistor that emits light depending on current), a plasma display panel (PDP), an electron emitter, a display element using a carbon nanotube, a liquid crystal element, electronic ink, an electrowetting element, an electrophoretic element, a display element using MEMS (micro electro mechanical system) (for example, a grating light valve (GLV), a digital micromirror device (DMD), a DMS (digital micro shutter), MIRASOL (registered trademark), an IMOD (interferometric modulation) element, a MEMS shutter display element, an optical-interference-type MEMS display element, a piezoelectric ceramic display, or the like), and quantum dots. Other than the above, a display medium whose contrast, luminance, reflectance, transmittance, or the like is changed by electric or magnetic action may be included in the display element, the display device, the light-emitting element, or the light-emitting device. Examples of display devices using EL elements include an EL display. Examples of a display device including an electron emitter include a field emission display (FED) and an SED-type flat panel display (SED: Surface-conduction Electron-emitter Display). Examples of display devices including liquid crystal elements include a liquid crystal display (a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or an electrophoretic element include electronic paper. Examples of display devices using quantum dots in each pixel include a quantum dot display. Note that quantum dots may be provided not as display elements but as part of a backlight. The use of quantum dots enables display with high color purity. Note that in the case where a transflective liquid crystal display or a reflective liquid crystal display is achieved, some of or all of pixel electrodes have a function of reflective electrodes. For example, some of or all of pixel electrodes contain aluminum, silver, or the like. Moreover, in such a case, a memory circuit such as an SRAM can be provided under the reflective electrodes. Thus, the power consumption can be further reduced. Note that in the case of using an LED chip, graphene or graphite may be provided under an electrode or a nitride semiconductor of the LED chip. Graphene or graphite may be a multilayer film in which a plurality of layers are stacked. The provision of graphene or graphite enables easy deposition of a nitride semiconductor thereover, such as an n-type GaN semiconductor layer including crystals. Furthermore, a p-type GaN semiconductor layer including crystals or the like can be provided thereover, and thus the LED chip can be formed. Note that an AlN layer may be provided between graphene or graphite and the n-type GaN semiconductor layer including crystals. Note that the GaN semiconductor layers included in the LED chip may be deposited by MOCVD. Note that when the graphene is provided, the GaN semiconductor layers included in the LED chip can also be deposited by a sputtering method. In a display element using MEMS (micro electro mechanical system), a dry agent may be provided in a space where the display element is sealed (for example, between an element substrate over which the display element is placed and a counter substrate provided to be opposed to the element substrate). Providing a dry agent can prevent MEMS and the like from becoming difficult to move or deteriorating easily because of moisture.

Note that this embodiment can be combined with the other embodiment in this specification as appropriate.

Embodiment 8

In this embodiment, the details of a transistor 200 and a transistor 201 that are applicable to the transistors described in this specification and the like will be described with reference to FIG. 47 to FIG. 51.

<Transistor 200>

First, the details of the transistor 200 will be described.

Figures 47A, 47B, 47C:
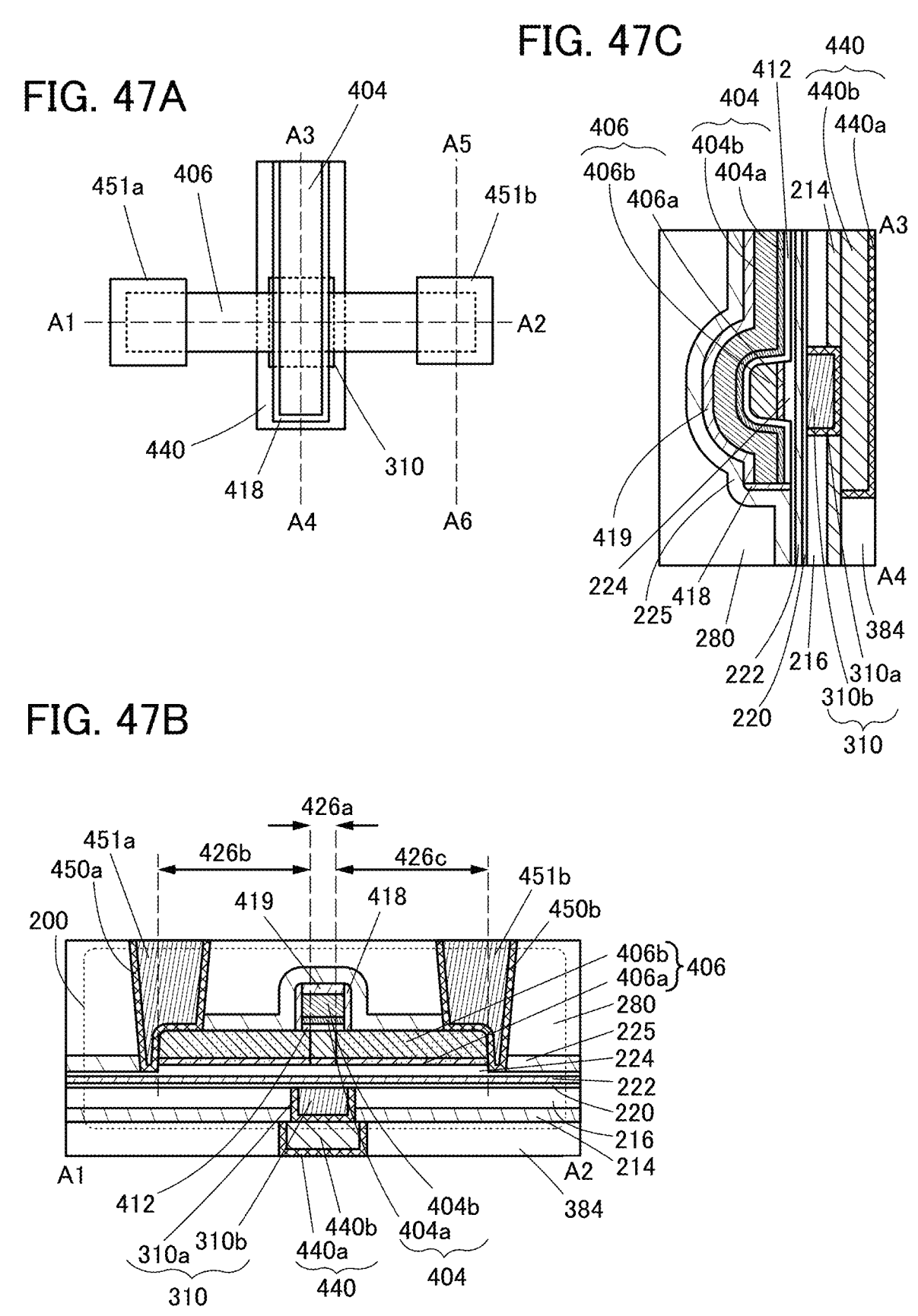

FIG. 47(A) is a top view of a semiconductor device including the transistor 200. Moreover, FIG. 47(B) is a cross-sectional view of a portion indicated by a dashed-dotted line A1-A2 in FIG. 47(A), and is also a cross-sectional view of the transistor 200 in a channel length direction. Furthermore, FIG. 47(C) is a cross-sectional view of a portion indicated by a dashed-dotted line A3-A4 in FIG. 47(A), and is also a cross-sectional view of the transistor 200 in a channel width direction. In the top view of FIG. 47(A), some components are not illustrated for simplification of the drawing.

As illustrated in FIGS. 47(A) to (C), the transistor 200 includes an insulator 224 located over a substrate (not illustrated), a metal oxide 406a located over the insulator 224, a metal oxide 406b located in contact with at least part of a top surface of the metal oxide 406a, an insulator 412 located over the metal oxide 406b, a conductor 404a located over the insulator 412, a conductor 404b located over the conductor 404a, an insulator 419 located over the conductor 404b, an insulator 418 located in contact with side surfaces of the insulator 412, the conductor 404a, the conductor 404b, and the insulator 419, and an insulator 225 located in contact with a top surface of the metal oxide 406b and a side surface of the insulator 418. Here, as illustrated in FIG. 47(B), a top surface of the insulator 418 is preferably substantially aligned with a top surface of the insulator 419. Furthermore, the insulator 225 is preferably provided to cover the insulator 419, the conductor 404, the insulator 418, and the metal oxide 406.

In the following description, the metal oxide 406a and the metal oxide 406b are collectively referred to as the metal oxide 406. Note that although the structure in which the metal oxide 406a and the metal oxide 406b are stacked in the transistor 200 is illustrated, the present invention is not limited thereto. For example, a structure in which only the metal oxide 406b is provided may be used. Furthermore, the conductor 404a and the conductor 404b are collectively denoted by the conductor 404 below. Note that although the structure in which the conductor 404a and the conductor 404b are stacked in the transistor 200 is illustrated, the present invention is not limited thereto. For example, a structure in which only the conductor 404b is provided may be used.

A conductor 440 includes a conductor 440a and a conductor 440b, and the conductor 440a is formed in contact with an inner wall of an opening of an insulator 384 and the conductor 440b is formed on the inner side. Here, the top surfaces of the conductor 440a and the conductor 440b and the top surface of the insulator 384 can be substantially level with each other. Note that although the structure in which the conductor 440a and the conductor 440b are stacked in the transistor 200 is illustrated, the present invention is not limited thereto. For example, a structure in which only the conductor 440b is provided may be used.

A conductor 310 includes a conductor 310a and a conductor 310b, and the conductor 310a is formed in contact with an inner wall of an opening of the insulator 214 and the insulator 216, and the conductor 310b is formed on the inner side. Thus, a structure in which the conductor 310a is in contact with the conductor 440b is preferable. Here, the top surfaces of the conductor 310a and the conductor 310b and the top surface of the insulator 216 can be substantially level with each other. Note that although the structure in which the conductor 310a and the conductor 310b are stacked in the transistor 200 is illustrated, the present invention is not limited thereto. For example, a structure in which only the conductor 310b is provided may be used.

The conductor 404 can function as a top gate, and the conductor 310 can function as a back gate. The potential of the back gate may be the same as the potential of the top gate, or may be the ground potential or a given potential. Moreover, by changing the potential of the back gate not in synchronization with but independently of the potential of the top gate, the threshold voltage of the transistor can be changed.

The conductor 440 extends in the channel width direction in a manner similar to that of the conductor 404, and functions as the conductor 310, that is, a wiring that applies potential to the back gate. Here, when the conductor 310 embedded in the insulator 214 and the insulator 216 is stacked over the conductor 440 functioning as the wiring for the back gate, the insulator 214 and the insulator 216 and the like are provided between the conductor 440 and the conductor 404, reducing the parasitic capacitance between the conductor 440 and the conductor 404 and thereby increasing the withstand voltage. The reduction in the parasitic capacitance between the conductor 440 and the conductor 404 can improve the switching speed of the transistor, so that the transistor can have high frequency characteristics. Furthermore, the increase in the withstand voltage between the conductor 440 and the conductor 404 can improve the reliability of the transistor 200. Therefore, the thicknesses of the insulator 214 and the insulator 216 are preferably large. Note that the extending direction of the conductor 440 is not limited thereto; for example, the conductor 440 may extend in the channel length direction of the transistor 200.

Here, it is preferable to use conductive materials that have a function of inhibiting the passage of (that are relatively impermeable to) impurities such as water or hydrogen for the conductor 310a and the conductor 440a. For example, tantalum, tantalum nitride, ruthenium, ruthenium oxide, or the like is preferably used, and a single layer or a stacked layer is used. Owing to this, diffusion of impurities such as hydrogen or water from a lower layer into an upper layer through the conductor 440 and the conductor 310 can be inhibited. Note that it is preferable that the conductor 310a and the conductor 440a have a function of inhibiting the passage of at least one of impurities such as a hydrogen atom, a hydrogen molecule, a water molecule, an oxygen atom, an oxygen molecule, a nitrogen atom, a nitrogen molecule, a nitrogen oxide molecule ($N_2O$, NO, $NO_2$, and the like), and a copper atom and oxygen (for example, an oxygen atom and an oxygen molecule). Furthermore, the same applies to the case where a conductive material having a function of inhibiting the passage of impurities is described below. When the conductor 310a and the conductor 440a have a function of inhibiting the passage of oxygen, the conductivity of the conductor 310b and the conductor 440b can be prevented from being lowered because of oxidation.

Moreover, the conductor 310b preferably uses a conductive material containing tungsten, copper, or aluminum as its main component. In addition, although not illustrated, the conductor 310b may have a stacked-layer structure and be, for example, a stack of titanium, titanium nitride, and the above-described conductive material.

Furthermore, since the conductor 440b serves as a wiring, a conductor having a higher conductivity than the conductor 310b is preferably used, and a conductive material containing copper or aluminum as its main component can be used, for example. In addition, although not illustrated, the conductor 440b may have a stacked-layer structure and for example, may be a stack of titanium, titanium nitride, and the above-described conductive material.

The insulator 214 can function as a barrier insulating film for preventing impurities such as water or hydrogen from entering the transistor from a lower layer. The insulator 214 preferably uses an insulating material having a function of inhibiting the passage of impurities such as water or hydrogen. For example, for the insulator 214, silicon nitride or the like is preferably used. Accordingly, diffusion of impurities such as hydrogen or water to a layer over the insulator 214 can be inhibited. Note that it is preferable that the insulator 214 have a function of inhibiting the passage of at least one of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Furthermore, the same applies to the case where an insulating material having a function of inhibiting the passage of impurities is described below.

Furthermore, the insulator 214 preferably uses an insulating material having a function of inhibiting the passage of oxygen (for example, an oxygen atom or an oxygen molecule). This can inhibit downward diffusion of oxygen contained in the insulator 224 or the like.

Furthermore, with the structure in which the conductor 310 is stacked over the conductor 440, the insulator 214 can be provided between the conductor 440 and the conductor 310. Here, even when a metal that is easily diffused, such as copper, is used as the conductor 440b, silicon nitride or the like provided as the insulator 214 can prevent diffusion of the metal to a layer over the insulator 214.

Moreover, for an insulator 222, an insulating material having a function of inhibiting the passage of oxygen and impurities such as water or hydrogen is preferably used, and for example, aluminum oxide or hafnium oxide is preferably used. Accordingly, diffusion of impurities such as water or hydrogen from a layer under the insulator 222 to a layer over the insulator 222 can be inhibited. Furthermore, downward diffusion of oxygen contained in the insulator 224 or the like can be inhibited.

Furthermore, the concentration of impurities such as water, hydrogen, or nitrogen oxide in the insulator 224 is preferably reduced. The released amount of hydrogen from the insulator 224 that is converted into the released amount of hydrogen molecules per unit area of the insulator 224 is lower than or equal to $2 \times 10^{15}$ molecules/cm$^2$, preferably lower than or equal to $1 \times 10^{15}$ molecules/cm$^2$, further preferably lower than or equal to $5 \times 10^{14}$ moleclees/cm$^2$ in a thermal desorption spectroscopy analysis method (TDS) in the range from 50° C. to 500° C., for example. Moreover, the insulator 224 is preferably formed using an insulator from which oxygen is released by heating.

The insulator 412 can function as a first gate insulating film, and an insulator 220, the insulator 222, and the insulator 224 can function as a second gate insulating film. Note that although the structure in which the insulator 220, the insulator 222, and the insulator 224 are stacked in the transistor 200 is illustrated, the present invention is not limited thereto. For example, a structure in which any two layers of the insulator 220, the insulator 222, and the insulator 224 are stacked may be used, or a structure in which any one layer of them is used may be used.

As the metal oxide 406, a metal oxide functioning as an oxide semiconductor is preferably used. As the metal oxide, a metal oxide having an energy gap of greater than or equal to 2 eV, preferably greater than or equal to 2.5 eV is preferably used. With the use of a metal oxide having such a wide energy gap, the off-state current of the transistor can be reduced.

A transistor using a metal oxide has an extremely low leakage current in a non-conduction state; thus, a semiconductor device with low power consumption can be provided. Moreover, a metal oxide can be deposited by a sputtering method or the like and thus can be used in a transistor included in a highly integrated semiconductor device.

The metal oxide 406 preferably contains at least indium or zinc. In particular, indium and zinc are preferably contained. In addition, aluminum, gallium, yttrium, tin, or the like is preferably contained. Furthermore, one kind or a plurality of kinds selected from boron, silicon, titanium, iron, nickel, germanium, zirconium, molybdenum, lanthanum, cerium, neodymium, hafnium, tantalum, tungsten, magnesium, or the like may be contained.

Here, the case where the metal oxide 406 is an In-M-Zn oxide containing indium, an element M, and zinc is considered. Note that the element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that a plurality of the above elements may be used in combination as the element M in some cases.

Note that in this specification and the like, a metal oxide containing nitrogen is also called a metal oxide in some cases. Moreover, a metal oxide containing nitrogen may be called a metal oxynitride.

Here, the atomic ratio of the element M to constituent elements in the metal oxide used as the metal oxide 406a is preferably greater than the atomic ratio of the element M to constituent elements in the metal oxide used as the metal oxide 406b. Moreover, the atomic ratio of the element M to In in the metal oxide used as the metal oxide 406a is preferably greater than the atomic ratio of the element M to In in the metal oxide used as the oxide 406b. Furthermore, the atomic ratio of In to the element M in the metal oxide used as the metal oxide 406b is preferably greater than the atomic ratio of In to the element M in the metal oxide used as the metal oxide 406a.

It is preferable that by using the above metal oxide as the metal oxide 406a, the energy of the conduction band minimum of the metal oxide 406a be higher than the energy of the conduction band minimum of a region of the metal oxide 406b where the energy of the conduction band minimum is low. In other words, the electron affinity of the metal oxide 406a is preferably smaller than the electron affinity of the region of the metal oxide 406b where the energy of conduction band minimum is low.

Here, the energy level of the conduction band minimum gradually changes in the metal oxide 406a and the metal oxide 406b. In other words, it continuously changes or is continuously connected. To obtain such an energy level, the density of defect states in a mixed layer formed at an interface between the metal oxide 406a and the metal oxide 406b is preferably made low.

Specifically, when the metal oxide 406a and the metal oxide 406b contain the same element (as a main component) in addition to oxygen, a mixed layer with a low density of defect states can be formed. For example, in the case where the metal oxide 406b is an In—Ga—Zn oxide, it is preferable to use an In—Ga—Zn oxide, a Ga—Zn oxide, gallium oxide, or the like as the metal oxide 406a.

In this case, a narrow-gap portion formed in the metal oxide 406b serves as a main carrier path. Since the density of defect states at the interface between the metal oxide 406a and the metal oxide 406b can be made low, the influence of interface scattering on carrier conduction is small, and high on-state current can be obtained.

Furthermore, the metal oxide 406 includes a region 426a, a region 426b, and a region 426c. The region 426a is sandwiched between the region 426b and the region 426c as illustrated in FIG. 47(B). The region 426b and the region 426c are regions having reduced resistance owing to the deposition of the insulator 225 and are regions having higher conductivity than the region 426a. An impurity element such as hydrogen or nitrogen included in the atmosphere for depositing the insulator 225 is added to the region 426b and the region 426c. Thus, owing to the added impurity element, oxygen vacancies are generated mainly in the regions of the metal oxide 406b that overlap with the insulator 225, and furthermore the impurity element enters the oxygen vacancies, which increases the carrier density and decreases the resistance.

Therefore, the region 426b and the region 426c preferably have a higher concentration of at least one of hydrogen and nitrogen than the region 426a. The concentration of hydrogen or nitrogen is measured by a secondary ion mass spectrometry method (SIMS) or the like. Here, the concentration of hydrogen or nitrogen in the middle of the region of the metal oxide 406b that overlaps with the insulator 412 (for example, a portion in the metal oxide 406b which is located equidistant from both side surfaces in the channel length direction of the insulator 412) is measured as the concentration of hydrogen or nitrogen in the region 426a.

Note that the resistance of the region 426b and the region 426c is reduced by addition of an element that generates oxygen vacancies or an element that is bonded to oxygen vacancies. Typical examples of the element include hydrogen, boron, carbon, nitrogen, fluorine, phosphorus, sulfur, chlorine, titanium, and rare gas. In addition, typical examples of the rare gas element include helium, neon, argon, krypton, and xenon. Thus, the region 426b and the region 426c have a structure in which one or a plurality of the above-described elements are included.

Furthermore, it is preferable in the metal oxide 406a that the atomic ratio of In to the element M in the region 426b and the region 426c be substantially the same as the atomic ratio of In to the element M in the metal oxide 406b. In other words, in the metal oxide 406a, the atomic ratio of In to the element M in the region 426b and the region 426c is preferably larger than the atomic ratio of In to the element M in the region 426a. Here, when the indium content in the metal oxide 406 is increased, the carrier density is increased and the resistance can be decreased. With this structure, even when the thickness of the metal oxide 406b is small and electric resistance of the metal oxide 406b is high in the manufacturing process of the transistor 200, the region 426b and the region 426c in the metal oxide 406 can function as a source region and a drain region owing to the sufficiently reduced resistance of the metal oxide 406a in the region 426b and the region 426c.

Figure 48A:
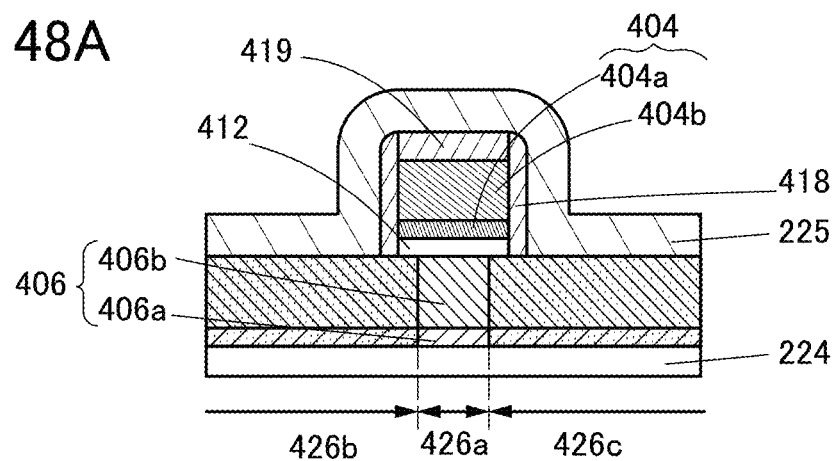
FIG. 48 Cross-sectional views illustrating structure examples of a transistor.

An enlarged view of the vicinity of the region 426a illustrated in FIG. 47(B) is illustrated in FIG. 48(A). As illustrated in FIG. 48(A), the region 426b and the region 426c are formed in at least the regions overlapping with the insulator 225 in the metal oxide 406. Here, one of the region 426b and the region 426c in the metal oxide 406b can function as a source region, and the other can function as a drain region. Moreover, the region 426a in the metal oxide 406b can function as a channel formation region.

Note that although the region 426a, the region 426b, and the region 426c are formed in the metal oxide 406b and the metal oxide 406a in FIG. 47(B) and FIG. 48(A), it is acceptable as long as these regions are formed in the metal oxide 406b. Furthermore, although a boundary between the region 426a and the region 426b and a boundary between the region 426a and the region 426c are illustrated as being substantially perpendicular to the top surface of the metal oxide 406 in FIG. 47(B) and the like, this embodiment is not limited thereto. For example, in some cases, the region 426b and the region 426c project to the conductor 404 side in the vicinity of the surface of the metal oxide 406b and are recessed to the insulator 225 side in the vicinity of a bottom surface of the metal oxide 406a.

In the transistor 200, as illustrated in FIG. 48(A), the region 426b and the region 426c are formed in the regions where the metal oxide 406 is in contact with the insulator 225 and the regions overlapping with the vicinity of the both end portions of the insulator 418 and the insulator 412. In this case, portions of the region 426b and the region 426c which overlap with the conductor 404 function as what is called overlap regions (also referred to as L OVregions). Because a high-resistance region is not formed between the channel formation region and the source region or the drain region of the metal oxide 406 in the structure including the LOV region, the on-state current and the mobility of the transistor can be increased.

Figure 48B:
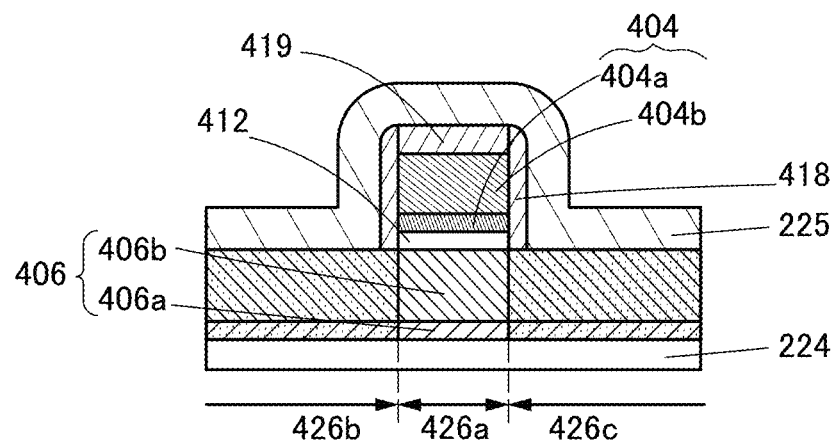

Note that the semiconductor device described in this embodiment is not limited thereto. For example, as illustrated in FIG. 48(B), a structure in which the region 426b and the region 426c are formed in regions where the metal oxide 406 overlaps with the insulator 225 and the insulator 418 may be used. Note that the structure illustrated in FIG. 48(B) can be rephrased as the structure in which the width of the conductor 404 in the channel length direction is substantially the same as the width of the region 426a. With the structure illustrated in FIG. 48(B), a high-resistance region is not formed between the channel formation region and the source region and the drain region, so that the on-state current of the transistor can be increased. Moreover, with the structure illustrated in FIG. 48(B), the gate does not overlap with the source region and the drain region in the channel length direction, so that formation of unnecessary capacitance can be inhibited.

Thus, by appropriately selecting the areas of the region 426b and the region 426c, a transistor having electric characteristics necessary for the circuit design can be easily provided.

The insulator 412 is preferably located in contact with the top surface of the metal oxide 406b. The insulator 412 is preferably formed using an insulator from which oxygen is released by heating. When the insulator 412 is formed in contact with the top surface of the metal oxide 406b, oxygen can be supplied to the metal oxide 406b effectively. Furthermore, as in the insulator 224, the concentration of impurities such as water or hydrogen in the insulator 412 is preferably reduced. The thickness of the insulator 412 is preferably greater than or equal to 1 nm and less than or equal to 20 nm, and may be approximately 1 nm, for example.

The insulator 412 preferably contains oxygen. For example, the released amount of oxygen molecules that is converted into the released amount of oxygen molecules per unit area of the insulator 412 is higher than or equal to $1\times10^{14}$ molecules/cm$^2$, preferably higher than or equal to $2\times10^{14}$ molecules/cm$^2$, further preferably higher than or equal to $4\times10^{14}$ molecules/cm$^2$ in a thermal desorption spectroscopy analysis method (TDS analysis) in the range of a surface temperature of higher than or equal to 100° C. and lower than or equal to 700° C. or higher than or equal to 100° C. and lower than or equal to 500° C.

The insulator 412, the conductor 404, and the insulator 419 each include a region overlapping with the metal oxide 406b. In addition, side surfaces of the insulator 412, the conductor 404a, the conductor 404b, and the insulator 419 are preferably substantially aligned with each other.

As the conductor 404a, a conductive oxide is preferably used. For example, the metal oxide that can be used as the metal oxide 406a or the metal oxide 406b can be used. In particular, an In—Ga—Zn-based oxide with a metal atomic ratio of [In]:[Ga]:[Zn]=4:2:3 to 4.1 and a value in the vicinity thereof, which has high conductivity, is preferably used. When the above conductor 404a is provided, the passage of oxygen into the conductor 404b can be inhibited, and an increase in the electric resistance value of the conductor 404b due to oxidation can be prevented.

Moreover, when such a conductive oxide is deposited by a sputtering method, oxygen can be added to the insulator 412, so that oxygen can be supplied to the metal oxide 406b. Thus, oxygen vacancies in the region 426a of the metal oxide 406 can be reduced.

For the conductor 404b, a metal such as tungsten can be used, for example. Alternatively, as the conductor 404b, a conductor that can add impurities such as nitrogen to the conductor 404a to improve the conductivity of the conductor 404a may be used. For example, titanium nitride or the like is preferably used for the conductor 404b. Furthermore, the conductor 404b may have a structure in which a metal such as tungsten is stacked over a metal nitride such as titanium nitride.

Here, the conductor 404 having a function of a gate electrode is provided to cover the top surface in the vicinity of the region 426a and the side surface, which is in the channel width direction, of the metal oxide 406b with the insulator 412 interposed therebetween. Thus, the electric field of the conductor 404 having a function of a gate electrode can electrically surround the top surface in the vicinity of the region 426a and the side surface, which is in the channel width direction, of the metal oxide 406b. The structure of the transistor in which the channel formation region is electrically surrounded by the electric field of the conductor 404 is referred to as a surrounded channel (s-channel) structure. Thus, a channel can be formed in the top surface in the vicinity of the region 426a and the side surface, which is in the channel width direction, of the metal oxide 406b; therefore, a large amount of current can flow between the source and the drain, and a current in a conduction state (on-state current) can be large. Moreover, since the top surface in the vicinity of the region 426a and the side surface, which is in the channel width direction, of the metal oxide 406b are surrounded by the electric field of the conductor 404, a leakage current in a non-conduction state (off-state current) can be small.

The insulator 419 is preferably located over the conductor 404b. In addition, side surfaces of the insulator 419, the conductor 404a, the conductor 404b, and the insulator 412 are preferably substantially aligned with each other. The insulator 419 is preferably deposited by an atomic layer deposition (ALD) method. In that case, the insulator 419 can be deposited to have a thickness of approximately greater than or equal to 1 nm and less than or equal to 20 nm, preferably approximately greater than or equal to 5 nm and less than or equal to 10 nm. Here, for the insulator 419 as well as the insulator 418, an insulating material having a function of inhibiting the passage of oxygen and impurities such as water or hydrogen is preferably used; aluminum oxide, hafnium oxide, or the like is preferably used, for example.

When the insulator 419 is provided, the insulator 419 and the insulator 418 which have a function of inhibiting the passage of oxygen and impurities such as water or hydrogen can cover a top surface and side surfaces of the conductor 404. This can prevent entry of impurities such as water or hydrogen into the metal oxide 406 through the conductor 404. Thus, the insulator 418 and the insulator 419 have a function of a gate cap that protects the gate.

The insulator 418 is provided in contact with the side surfaces of the insulator 412, the conductor 404, and the insulator 419. Furthermore, the top surface of the insulator 418 is preferably substantially aligned with the top surface of the insulator 419. The insulator 418 is preferably deposited by an ALD method. In that case, the insulator 418 can be deposited to have a thickness of approximately greater than or equal to 1 nm and less than or equal to 20 nm, preferably approximately greater than or equal to 1 nm and less than or equal to 3 nm, and for example, 1 nm.

As described above, the region 426b and the region 426c of the metal oxide 406 are formed by the impurity element added in the deposition of the insulator 225. In the case where the transistor is miniaturized and formed to have a channel length of approximately 10 nm to 30 nm, the impurity element contained in the source region or the drain region might be diffused to bring electrical connection between the source region and the drain region. In view of this, the insulator 418 is formed as described in this embodiment, so that the distance between regions of the metal oxide 406 that are in contact with the insulator 225 is increased; accordingly, electrical connection between the source region and the drain region can be prevented. Furthermore, when the insulator 418 is formed using an ALD method, the thickness thereof is as small as or smaller than the length of the miniaturized channel, an excessive increase of the distance between the source region and the drain region is not caused, and thereby an increase in the resistance can be prevented.

Here, for the insulator 418, an insulating material having a function of inhibiting the passage of oxygen and impurities such as water or hydrogen is preferably used, and for example, aluminum oxide or hafnium oxide is preferably used. Accordingly, oxygen in the insulator 412 can be prevented from diffusing to the outside. Furthermore, entry of impurities such as hydrogen or water to the metal oxide 406 from an end portion or the like of the insulator 412 can be inhibited.

The insulator 418 is preferably formed by depositing an insulating film by an ALD method and then performing anisotropic etching so as to leave a portion of the insulating film that is in contact with the side surfaces of the insulator 412, the conductor 404, and the insulator 419. Thus, an insulator having a small thickness as described above can be easily formed. Furthermore, since the insulator 419 is provided over the conductor 404, the portions of the insulator 418 in contact with the insulator 412 and the conductor 404 can to be left sufficiently even when the insulator 419 is partly removed by the anisotropic etching.

Here, the insulator 225 is provided in contact with the top surfaces of the insulator 419 and the insulator 418 and in contact with the side surface of the insulator 418. As described above, the insulator 225 adds impurities such as hydrogen or nitrogen to the metal oxide 406, so that the region 426b and the region 426c are formed. Thus, the insulator 225 preferably contains at least one of hydrogen and nitrogen.

Furthermore, the insulator 225 is preferably provided in contact with a side surface of the metal oxide 406b and a side surface of the metal oxide 406a as well as the top surface of the metal oxide 406b. This enables a resistance reduction to the side surface of the metal oxide 406b and the side surface of the metal oxide 406a in the region 426b and the region 426c.

Moreover, for the insulator 225, an insulating material having a function of inhibiting the passage of oxygen and impurities such as water or hydrogen is preferably used. For example, as the insulator 225, silicon nitride, silicon nitride oxide, silicon oxynitride, aluminum nitride, aluminum nitride oxide, or the like is preferably used. Formation of such an insulator 225 can prevent a reduction in carrier density due to oxygen passing through the insulator 225 and oxygen being supplied to oxygen vacancies in the region 426b and the region 426c. Furthermore, impurities such as water or hydrogen can be prevented from passing through the insulator 225 and excessively enlarging the region 426b and the region 426c to the region 426a side.

An insulator 280 is preferably provided over the insulator 225. Furthermore, as in the insulator 224 or the like, the concentration of impurities such as water or hydrogen in the insulator 280 is preferably reduced.

In openings formed in the insulator 280 and the insulator 225, a conductor 450a and a conductor 451a, and a conductor 450b and a conductor 451b are located. The conductor 450a and the conductor 451a, and the conductor 450b and the conductor 451b are preferably provided to face each other with the conductor 404 sandwiched therebetween.

Here, the conductor 450a is formed in contact with an inner wall of the opening of the insulator 280 and the insulator 225, and the conductor 451a is formed on the inner side. The region 426b of the metal oxide 406 is positioned in at least part of a bottom portion of the opening, and the conductor 450a is in contact with the region 426b. Similarly, the conductor 450b is formed in contact with an inner wall of the opening of the insulator 280 and the insulator 225, and the conductor 451b is formed on the inner side. The region 426c of the metal oxide 406 is positioned in at least part of a bottom portion of the opening, and the conductor 450b is in contact with the region 426c.

Figure 49A:
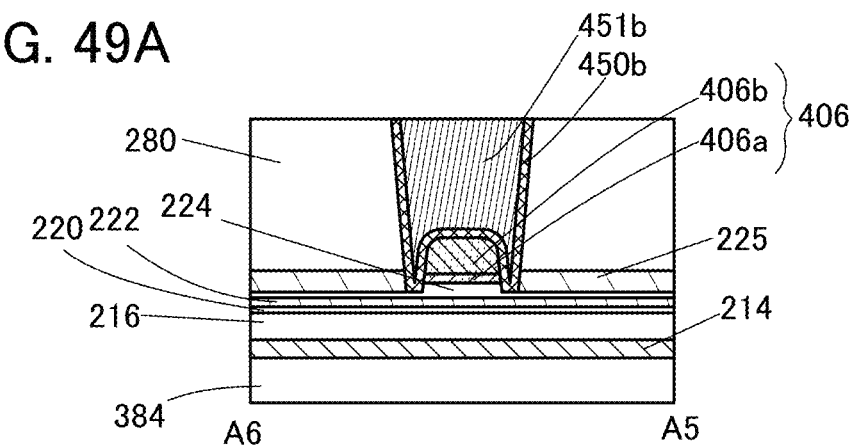
FIG. 49 Cross-sectional views illustrating structure examples of a transistor.

Here, a cross-sectional view of a portion indicated by a dashed-dotted line A5-A6 in FIG. 47(A) is illustrated in FIG. 49(A). Note that although the cross-sectional view of the conductor 450b and the conductor 451b is illustrated in FIG. 49(A), the conductor 450a and the conductor 451a have a similar structure.

As illustrated in FIG. 47(B) and FIG. 49(A), the conductor 450b is in contact with at least the top surface of the metal oxide 406 and is preferably also in contact with the side surface of the metal oxide 406. In particular, as illustrated in FIG. 49(A), the conductor 450b is preferably in contact with one or both of the side surface on the A5 side and the side surface on the A6 side of the metal oxide 406 in the channel width direction. Alternatively, as illustrated in FIG. 47(B), a structure in which the conductor 450b is in contact with the side surface on the A2 side in the channel length direction of the metal oxide 406 may be used. As described above, when the structure in which the conductor 450b is in contact with the side surface of the metal oxide 406 in addition to the top surface of the metal oxide 406 is used, the contact area between the conductor 450b and the metal oxide 406 can be increased without an increase in the area of the top surface of the contact portion, so that the contact resistance between the conductor 450b and the metal oxide 406 can be reduced. Accordingly, miniaturization of the source electrode and the drain electrode of the transistor can be achieved and, in addition, the on-state current can be increased. Note that the same applies to the conductor 450a and the conductor 451a.

Here, the conductor 450a is in contact with the region 426b functioning as one of a source region and a drain region of the transistor 200, and the conductor 450b is in contact with the region 426c functioning as the other of the source region and the drain region of the transistor 200. Therefore, the conductor 450a and the conductor 451a can function as one of a source electrode and a drain electrode, and the conductor 450b and the conductor 451b can function as the other of the source electrode and the drain electrode. Because the region 426b and the region 426c are reduced in resistance, the contact resistance between the conductor 450a and the region 426b and the contact resistance between the conductor 450b and the region 426c are reduced, whereby the on-state current of the transistor 200 can be increased.

Here, for the conductor 450a and the conductor 450b as well as the conductor 310a or the like, a conductive material having a function of inhibiting the passage of impurities such as water or hydrogen is preferably used. For example, as the conductor 450a and the conductor 450b, tantalum, tantalum nitride, titanium, titanium nitride, ruthenium, or ruthenium oxide is preferably used, and a single layer or a stacked layer may be used. This can inhibit entry of impurities such as hydrogen or water from a layer over the insulator 280 to the metal oxide 406 through the conductor 451a and the conductor 451b.

Moreover, for the conductor 451a and the conductor 451b, a conductive material containing tungsten, copper, or aluminum as its main component is preferably used. Furthermore, although not illustrated, the conductor 451a and the conductor 451b may have a stacked-layer structure, and for example, may be a stack of titanium, titanium nitride, and the above-described conductive material.

Note that although the conductor 450b (the conductor 450a) is in contact with both the metal oxide 406a and the metal oxide 406b in FIG. 47(B) and FIG. 49(A), the structure is not limited thereto, and for example, the structure in which the conductor 450b (the conductor 450a) is in contact with only the metal oxide 406b may be used. Furthermore, the top surfaces of the conductor 450a, the conductor 451a, the conductor 450b, and the conductor 451b can be substantially level with each other. Furthermore, although the structure in which the conductor 450a and the conductor 451a are stacked and the conductor 450b and the conductor 451b are stacked is illustrated in FIG. 47(B), the structure of the transistor 200 is not limited thereto. For example, the transistor 200 may have a structure in which only the conductor 451a and the conductor 451b are provided.

Figure 49B:
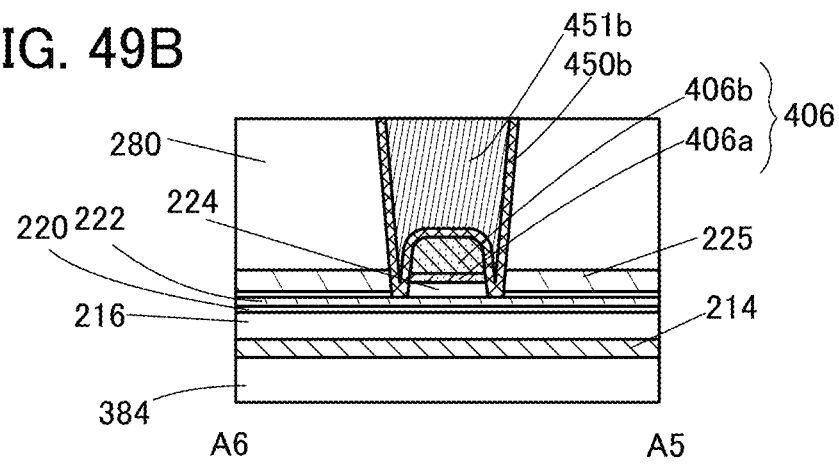

Moreover, although the insulator 224 serves as the bottom portion of the opening in which the conductor 450b (the conductor 450a) is provided in FIG. 47(B) and FIG. 49(A), this embodiment is not limited thereto. As illustrated in FIG. 49(B), the insulator 222 may serve as the bottom portion of the opening in which the conductor 450a and the conductor 450b are provided. In the case illustrated in FIG. 49(A), the conductor 450b (the conductor 450a) is in contact with the insulator 224, the metal oxide 406a, the metal oxide 406b, the insulator 225, and the insulator 280. In the case illustrated in FIG. 49(B), the conductor 450b (the conductor 450a) is in contact with the insulator 222, the insulator 224, the metal oxide 406a, the metal oxide 406b, the insulator 225, and the insulator 280.

Next, materials for components of the transistor 200 will be described.

<<Substrate>>

As a substrate over which the transistor 200 is formed, for example, an insulator substrate, a semiconductor substrate, or a conductor substrate may be used. As the insulator substrate, a glass substrate, a quartz substrate, a sapphire substrate, a stabilized zirconia substrate (an yttria-stabilized zirconia substrate or the like), or a resin substrate is given, for example. Moreover, as the semiconductor substrate, a semiconductor substrate of silicon, germanium, or the like, or a compound semiconductor substrate of silicon carbide, silicon germanium, gallium arsenide, indium phosphide, zinc oxide, or gallium oxide is given, for example. Furthermore, as the substrate over which the transistor 200 is formed, a semiconductor substrate in which an insulator region is provided in the above semiconductor substrate, for example, an SOI (Silicon On Insulator) substrate or the like is given. As the conductor substrate, a graphite substrate, a metal substrate, an alloy substrate, a conductive resin substrate, or the like is given. Alternatively, as the substrate over which the transistor 200 is formed, a substrate including a metal nitride, a substrate including a metal oxide, or the like is given, and a substrate which is an insulator substrate provided with a conductor or a semiconductor, a substrate which is a semiconductor substrate provided with a conductor or an insulator, a substrate which is a conductor substrate provided with a semiconductor or an insulator, or the like is also given. Alternatively, any of these substrates over which an element is provided may be used. As the element provided over the substrate, a capacitor, a resistor, a switching element, a light-emitting element, a memory element, or the like is given.

Alternatively, a flexible substrate may be used as the substrate over which the transistor 200 is formed. Note that as a method for providing a transistor over a flexible substrate, there is a method in which the transistor is formed over a non-flexible substrate and then the transistor is separated and transferred to the substrate which is a flexible substrate. In that case, a separation layer is preferably provided between the non-flexible substrate and the transistor. Note that as the flexible substrate, a sheet, a film, or a foil containing a fiber may be used. In addition, the substrate may have elasticity. Moreover, the flexible substrate may have a property of returning to its original shape or a property of not returning to its original shape when bending or pulling is stopped. The substrate having flexibility or inflexibility includes a region having a thickness of, for example, greater than or equal to 5 μm and less than or equal to 700 μm, preferably greater than or equal to 10 μm and less than or equal to 500 μm, and further preferably greater than or equal to 15 μm and less than or equal to 300 μm. When the substrate has a small thickness, the semiconductor device including the transistor can be lightweight. Furthermore, when the substrate has a small thickness, even in the case of using glass or the like, the substrate may have elasticity or a property of returning to its original shape when bending or pulling is stopped. Therefore, an impact or the like applied to the semiconductor device over the substrate, which is caused by dropping or the like, can be reduced. That is, a durable semiconductor device can be provided.

For the substrate having flexibility, metal, an alloy, resin, glass, or fiber thereof can be used, for example. The substrate having flexibility preferably has a lower coefficient of linear expansion because deformation due to an environment is inhibited. For the substrate having flexibility, for example, a material whose coefficient of linear expansion is lower than or equal to $1\times10^{-3}$/K, lower than or equal to $5\times10^{-5}$/K, or lower than or equal to $1\times10^{-5}$/K may be used. Examples of the resin include polyester, polyolefin, polyamide (nylon, aramid, or the like), polyimide, polycarbonate, and acrylic. In particular, aramid is preferably used for the flexible substrate because of its low coefficient of linear expansion.

<<Insulator>>

As the insulator, oxide, nitride, oxynitride, nitride oxide, metal oxide, metal oxynitride, metal nitride oxide, or the like having an insulating property is given.

When the transistor is surrounded by an insulator that has a function of inhibiting the passage of oxygen and impurities such as hydrogen, the electrical characteristics of the transistor can be stabilized. For example, an insulator that has a function of inhibiting the passage of oxygen and impurities such as hydrogen may be used as the insulator 222 and the insulator 214.

As the insulator that has a function of inhibiting the passage of oxygen and impurities such as hydrogen, for example, a single layer or a stacked layer of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used.

Furthermore, for example, as the insulator 222 and the insulator 214, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride may be used. Note that the insulator 222 and the insulator 214 preferably include aluminum oxide, hafnium oxide, or the like.

As the insulator 384, the insulator 216, the insulator 220, the insulator 224, and the insulator 412, for example, an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used as a single layer or a stacked layer. For example, the insulator 384, the insulator 216, the insulator 220, the insulator 224, and the insulator 412 each preferably include silicon oxide, silicon oxynitride, or silicon nitride.

The insulator 220, the insulator 222, the insulator 224, and/or the insulator 412 preferably include an insulator with a high dielectric constant. For example, the insulator 220, the insulator 222, the insulator 224, and/or the insulator 412 each preferably include gallium oxide, hafnium oxide, zirconium oxide, oxide containing aluminum and hafnium, oxynitride containing aluminum and hafnium, oxide containing silicon and hafnium, oxynitride containing silicon and hafnium, or nitride containing silicon and hafnium. Alternatively, the insulator 220, the insulator 222, the insulator 224, and/or the insulator 412 each preferably have a stacked-layer structure of silicon oxide or silicon oxynitride and an insulator with a high dielectric constant. Because silicon oxide and silicon oxynitride have thermal stability, a combination of silicon oxide or silicon oxynitride with an insulator with a high dielectric constant allows the stacked-layer structure to be thermally stable and have a high dielectric constant. For example, when a structure in which aluminum oxide, gallium oxide, or hafnium oxide is in contact with the metal oxide 406 in each of the insulator 224 and the insulator 412 is used, silicon contained in silicon oxide or silicon oxynitride can be prevented from entering the metal oxide 406. Furthermore, for example, when a structure in which silicon oxide or silicon oxynitride is in contact with the metal oxide 406 in each of the insulator 224 and the insulator 412 is used, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

The insulator 384, the insulator 216, and the insulator 280 preferably include an insulator with a low dielectric constant. For example, the insulator 384, the insulator 216, and the insulator 280 preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin. Alternatively, the insulator 384, the insulator 216, and the insulator 280 preferably have a stacked-layer structure of silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide, and a resin. Because silicon oxide and silicon oxynitride have thermal stability, a combination of silicon oxide or silicon oxynitride with a resin allows the stacked-layer structure to have thermal stability and a low dielectric constant. Examples of the resin include polyester, polyolefin, polyamide (nylon, aramid, or the like), polyimide, polycarbonate, and acrylic.

As the insulator 418 and the insulator 419, an insulator having a function of inhibiting the passage of oxygen and impurities such as hydrogen may be used. As the insulator 418 and the insulator 419, a metal oxide such as aluminum oxide, hafnium oxide, magnesium oxide, gallium oxide, germanium oxide, yttrium oxide, zirconium oxide, lanthanum oxide, neodymium oxide, or tantalum oxide; silicon nitride oxide; or silicon nitride may be used, for example.

<<Conductor>>

For the conductor 404a, the conductor 404b, the conductor 310a, the conductor 310b, the conductor 450a, the conductor 450b, the conductor 451a, and the conductor 451b, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Alternatively, for the conductor 404a, the conductor 404b, the conductor 310a, the conductor 310b, the conductor 450a, the conductor 450b, the conductor 451a, and the conductor 451b, a semiconductor having a high electric conductivity typified by polycrystalline silicon including an impurity element such as phosphorus, or silicide such as nickel silicide may be used.

Moreover, for the above-described conductors, especially for the conductor 404a, the conductor 310a, the conductor 450a, and the conductor 450b, a conductive material containing oxygen and a metal element contained in a metal oxide that can be used for the metal oxide 406 may be used, or a conductive material containing the above-described metal element and nitrogen may be used. As the conductive material, for example, a conductive material containing nitrogen such as titanium nitride or tantalum nitride can be used. Alternatively, as the conductor 404a, the conductor 310a, the conductor 450a, and the conductor 450b, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used, or indium gallium zinc oxide containing nitrogen may be used. By using such a material, hydrogen contained in the metal oxide 406 can be captured in some cases. Alternatively, hydrogen entering from an external insulator or the like can be captured in some cases.

Alternatively, as the conductor 404a, the conductor 310a, the conductor 450a, and the conductor 450b, a stack of a plurality of conductive layers formed using the above materials may be used, and for example, a stacked-layer structure in which a material containing any of the above metal elements and a conductive material containing oxygen are combined may be used. Alternatively, as the conductor 404a, the conductor 310a, the conductor 450a, and the conductor 450b, a stacked-layer structure in which a material containing any of the above metal elements and a conductive material containing nitrogen are combined may be used, or a stacked-layer structure in which a material containing any of the above metal elements, a conductive material containing oxygen, and a conductive material containing nitrogen are combined may be used.

Note that when oxide is used for the channel formation region in the transistor, a stacked-layer structure in which a material containing the above-described metal element and a conductive material containing oxygen are combined is preferably employed for the gate electrode. In this case, the conductive material containing oxygen is preferably formed on the channel formation region side. When the conductive material containing oxygen is formed on the channel formation region side, oxygen released from the conductive material is likely to be supplied to the channel formation region.

<<Metal oxide applicable to metal oxide 406>>

The metal oxide 406 according to the present invention will be described below. As the metal oxide 406, a metal oxide functioning as an oxide semiconductor is preferably used.

The metal oxide 406 preferably contains at least indium or zinc, and in particular, indium and zinc are preferably contained. Moreover, aluminum, gallium, yttrium, tin, or the like is preferably contained in the metal oxide 406 in addition to them. Furthermore, one kind or a plurality of kinds selected from boron, silicon, titanium, iron, nickel, germanium, zirconium, molybdenum, lanthanum, cerium, neodymium, hafnium, tantalum, tungsten, magnesium, or the like may be contained in the metal oxide 406.

Here, the case where the metal oxide 406 contains indium, the element M, and zinc is considered. Note that the terms of the atomic ratio of indium, the element M, and zinc contained in the metal oxide 406 are denoted by [In], [M], and [Zn], respectively.

Preferred ranges of the atomic ratio of indium, the element M, and zinc contained in the metal oxide 406 will be described with reference to FIG. 50(A), FIG. 50(B), and FIG. 50(C). Note that the atomic ratio of oxygen is not shown in FIG. 50(A), FIG. 50(B), and FIG. 50(C). In addition, the terms of the atomic ratio of indium, the element M, and zinc contained in the metal oxide 406 are denoted by [In], [M], and [Zn], respectively.

Figure 50A:
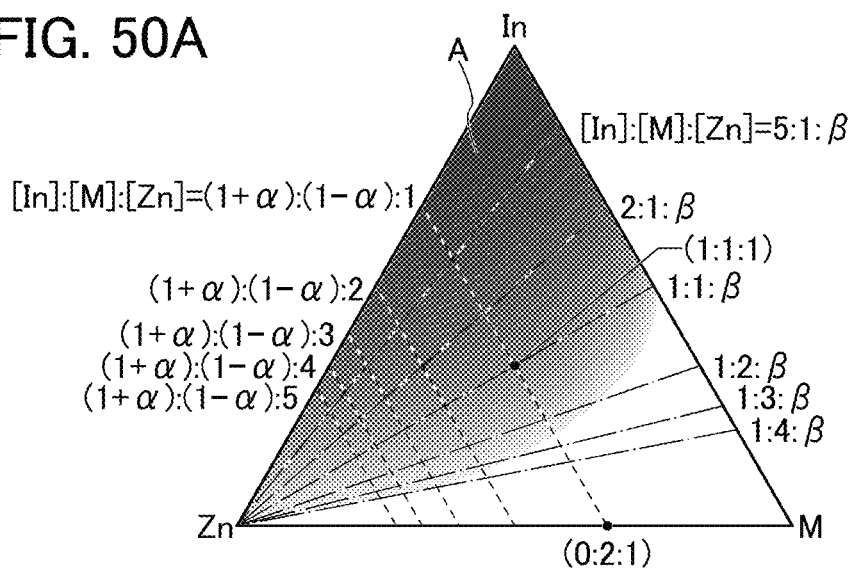
FIG. 50 Diagrams illustrating an atomic ratio range of a metal oxide.
Figure 50B:
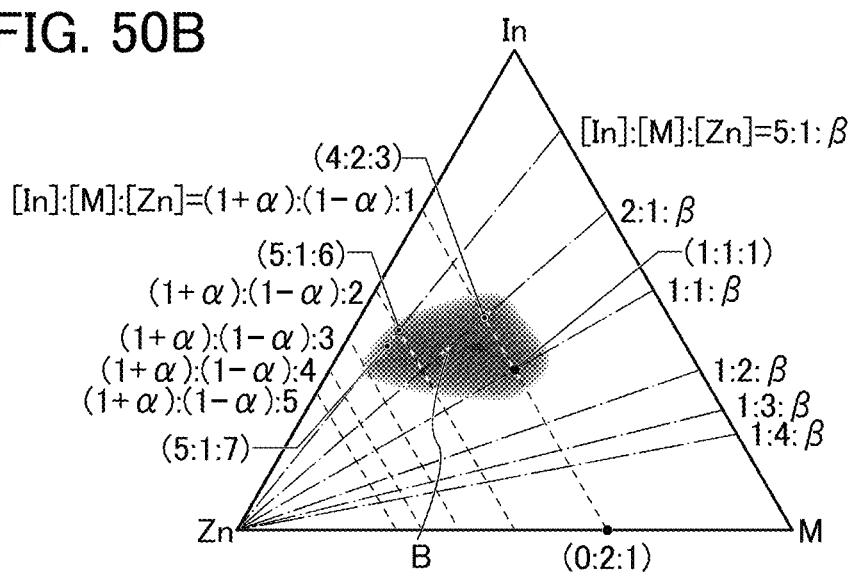
Figure 50C:
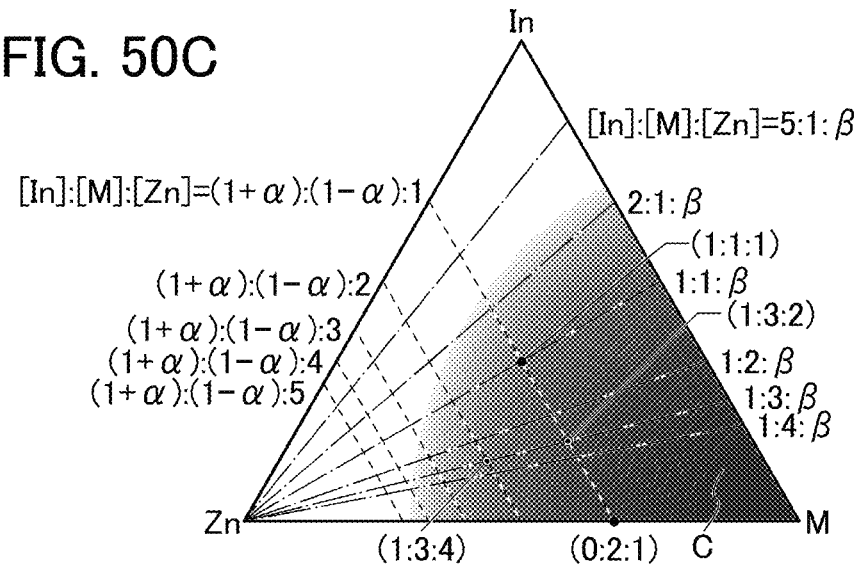

In FIG. 50(A), FIG. 50(B), and FIG. 50(C), broken lines indicate a line representing the atomic ratio of $[In]:[M]:[Zn]=(1+\alpha):(1-\alpha):1$ $(-1\leq\alpha\leq1)$, a line representing the atomic ratio of $[In]:[M]:[Zn]=(1+\alpha):(1-\alpha):2$, a line representing the atomic ratio of $[In]:[M]:[Zn](1+\alpha):(1-\alpha):3$, a line representing the atomic ratio of $[In]:[M]:[Zn]=(1+\alpha):(1-\alpha):4$, and a line representing the atomic ratio of $[In]:[M]:[Zn]=(1+\alpha):(1-\alpha):5$.

Furthermore, dashed-dotted lines indicate a line representing the atomic ratio of $[In]:[M]:[Zn]=5:1:\beta$ $(\beta\geq0)$, a line representing the atomic ratio of $[In]:[M]:[Zn]=2:1:1\beta$, a line representing the atomic ratio of $[In]:[M]:[Zn]=1:1:\beta$, a line representing the atomic ratio of $[In]:[M]:[Zn]=1:2:1\beta$, a line representing the atomic ratio of $[In]:[M]:[Zn]=1:3:1\beta$, and a line representing the atomic ratio of $[In]:[M]:[Zn]=1:4:\beta$.

Furthermore, a metal oxide with an atomic ratio of $[In]:[M]:[Zn]=0:2:1$ and a value in the vicinity thereof illustrated in FIG. 50(A), FIG. 50(B), and FIG. 50(C) tends to have a spinel crystal structure.

In addition, a plurality of phases coexist in the metal oxide in some cases (two-phases coexistence, three-phases coexistence, or the like). For example, with an atomic ratio having a value in the vicinity of $[In]:[M]:[Zn]=0:2:1$, two phases of a spinel crystal structure and a layered crystal structure are likely to coexist. In addition, with an atomic ratio having a value in the vicinity of $[In]:[M]:[Zn]=1:0:0$, two phases of a bixbyite crystal structure and a layered crystal structure are likely to coexist. In the case where a plurality of phases coexist in the metal oxide, a crystal grain boundary might be formed between different crystal structures.

A region A illustrated in FIG. 50(A) represents an example of the preferred range of the atomic ratio of indium, the element M, and zinc contained in the metal oxide 406.

When the metal oxide has a higher content of indium, the carrier mobility (electron mobility) of the metal oxide can be increased. Thus, a metal oxide having a high content of indium has higher carrier mobility than a metal oxide having a low content of indium.

By contrast, when the content of indium and zinc in a metal oxide becomes lower, carrier mobility becomes lower. Thus, with an atomic ratio of [In]:[M]:[Zn]=0:1:0 and a value in the vicinity thereof (for example, a region C illustrated in FIG. 50(C)), high insulating properties are obtained.

For example, the metal oxide used as the metal oxide 406b preferably has an atomic ratio represented by the region A in FIG. 50(A), with which high carrier mobility is obtained. The metal oxide used as the metal oxide 406b may have an atomic ratio of In:Ga:Zn=4:2:3 to 4.1 and approximately a value in the vicinity thereof, for example. By contrast, the metal oxide used as the metal oxide 406a preferably has an atomic ratio represented by the region C in FIG. 50(C), with which relatively high insulating properties are obtained. The metal oxide used as the metal oxide 406a may have an atomic ratio of In:Ga:Zn=approximately 1:3:4.

In the region A, particularly in a region B illustrated in FIG. 50(B), an excellent metal oxide having high carrier mobility and high reliability can be obtained.

Note that the region B includes [In]:[M]:[Zn]=4:2:3 to 4.1 and a value in the vicinity thereof. The value in the vicinity includes [In]:[M]:[Zn]=5:3:4. In addition, the region B includes [In]:[M]:[Zn]=5:1:6 and a value in the vicinity thereof and [In]:[M]:[Zn]=5:1:7 and a value in the vicinity thereof.

Furthermore, in the case where an In-M-Zn oxide is used as the metal oxide 406, it is preferable to use a target including a polycrystalline In-M-Zn oxide as the sputtering target. Note that the atomic ratio of the deposited metal oxide varies from the above atomic ratios of metal elements contained in the sputtering targets in a range of ±40%. For example, when the composition ratio of a sputtering target used for the metal oxide 406 is In:Ga:Zn=4:2:4.1 [atomic ratio], the composition ratio of the deposited metal oxide may be In:Ga:Zn=4:2:3 [atomic ratio] or in the vicinity thereof. Moreover, when the composition ratio of a sputtering target used for the metal oxide 406 is In:Ga:Zn=5:1:7 [atomic ratio], the composition ratio of the deposited metal oxide may be In:Ga:Zn=5:1:6 [atomic ratio] or in the vicinity thereof.

Note that the property of a metal oxide is not uniquely determined by an atomic ratio. Even with the same atomic ratio, the property of a metal oxide might be different depending on a formation condition. For example, in the case where the metal oxide 406 is deposited with a sputtering apparatus, a film having an atomic ratio deviated from the atomic ratio of the target is formed. In addition, [Zn] in the film might be smaller than [Zn] in the target depending on the substrate temperature in deposition. Thus, the illustrated regions are each a region representing an atomic ratio with which a metal oxide tends to have specific characteristics, and boundaries of the region A to the region C are not clear.

<<Composition of Metal Oxide>>

The composition of a CAC (Cloud-Aligned Composite)-OS that can be used in an OS transistor will be described below.

Note that in this specification and the like, CAC refers to an example of a function or a material composition and CAAC (c-axis aligned crystal) to be described later refers to an example of a crystal structure.

A CAC-OS or a CAC-metal oxide has a conducting function in a part of the material and has an insulating function in a part of the material, and has a function of a semiconductor as the whole material. Note that in the case where the CAC-OS or the CAC-metal oxide is used in an active layer of a transistor, the conducting function is a function of allowing electrons (or holes) serving as carriers to flow, and the insulating function is a function of not allowing electrons serving as carriers to flow. By the complementary action of the conducting function and the insulating function, the CAC-OS or the CAC-metal oxide can have a switching function (On/Off function). In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC-metal oxide, the conductive regions and the insulating regions each have a size of greater than or equal to 0.5 nm and less than or equal to 10 nm, preferably greater than or equal to 0.5 nm and less than or equal to 3 nm and are dispersed in the material, in some cases.

The CAC-OS or the CAC-metal oxide are formed of components having different bandgaps. For example, the CAC-OS or the CAC-metal oxide are formed of a component having a wide gap due to the insulating region and a component having a narrow gap due to the conductive region. When carriers flow in such a structure, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or CAC-metal oxide is used in a channel region of a transistor, high current drive capability in the on state of the transistor, that is, high on-state current and high field-effect mobility, can be obtained.

In other words, the CAC-OS or the CAC-metal oxide can also be called a matrix composite or a metal matrix composite.

<<Structure of Metal Oxide>>

An oxide semiconductor is classified into a single crystal oxide semiconductor and a non-single crystal oxide semiconductor. Examples of a non-single crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanorystals are connected in the a-b plane direction, and its crystal structure has distortion. Note that distortion refers to a portion where the direction of a lattice arrangement changes between a region with a uniform lattice arrangement and another region with a uniform lattice arrangement in a region where the plurality of nanocrystals are connected.

The nanocrystal is basically a hexagon but is not always a regular hexagon and is a non-regular hexagon in some cases. Furthermore, a pentagonal lattice arrangement, a heptagonal lattice arrangement, and the like are included in the distortion in some cases. Note that a clear crystal grain boundary (also referred to as a grain boundary) cannot be observed even in the vicinity of distortion in the CAAC-OS. That is, formation of a crystal grain boundary is inhibited by the distortion of a lattice arrangement. This is probably because the CAAC-OS can tolerate distortion owing to a low density of oxygen atom arrangement in an a-b plane direction, a change in interatomic bond distance by replacement of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M, Zn) layer) are stacked. Note that indium and the element M can be replaced with each other, and when the element M of the (M, Zn) layer is replaced by indium, the layer can also be referred to as an (In, M, Zn) layer. Furthermore, when indium of the In layer is replaced by the element M, the layer can also be referred to as an (In, M) layer.

The CAAC-OS is an oxide semiconductor with high crystallinity. By contrast, in the CAAC-OS, it can be said that a reduction in electron mobility due to the crystal grain boundary is less likely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has small amounts of impurities and defects (oxygen vacancies or the like). Thus, an oxide semiconductor including a CAAC-OS is physically stable. Therefore, the oxide semiconductor including a CAAC-OS is resistant to heat and has high reliability.

The nc-OS has a periodic atomic arrangement in a microscopic region (for example, a region with a size greater than or equal to 1 nm and less than or equal to 10 nm, in particular, a region with a size greater than or equal to 1 nm and less than or equal to 3 nm). In addition, no regularity of crystal orientation is observed between different nanocrystals in the nc-OS. Thus, the orientation is not observed in the whole film. Accordingly, in some cases, the nc-OS cannot be distinguished from an a-like OS or an amorphous oxide semiconductor depending on an analysis method.

The a-like OS is an oxide semiconductor that has a structure between those of the nc-OS and the amorphous oxide semiconductor. The a-like OS has a void or a low-density region. That is, the a-like OS has low crystallinity as compared with the nc-OS and the CAAC-OS.

An oxide semiconductor has various structures with different properties. Two or more kinds among the amorphous oxide semiconductor, the polycrystalline oxide semiconductor, the a-like OS, the nc-OS, and the CAAC-OS may be included in an oxide semiconductor of one embodiment of the present invention.

<<Transistor Including Metal Oxide>>

Next, the case where the metal oxide is used for a transistor will be described.

Note that when the metal oxide is used for a transistor, the transistor having high field-effect mobility can be achieved. In addition, the transistor having high reliability can be achieved.

Moreover, the carrier density in the region $426a$ of the metal oxide $406b$ in the transistor is preferably low. In the case of reducing the carrier density of the metal oxide, the concentration of impurities in the metal oxide is reduced so that the density of defect states is reduced. In this specification and the like, a state with a low impurity concentration and a low density of defect states is referred to as highly purified intrinsic or substantially highly purified intrinsic. For example, the carrier density of the region $426a$ of the metal oxide $406b$ is lower than $8\times10^{11}/cm^3$, preferably lower than $1=10^{11}/cm^3$, further preferably lower than $1\times10^{11}/cm^3$, and higher than or equal to $1\times10^{-9}/cm^3$.

The highly purified intrinsic or substantially highly purified intrinsic metal oxide has a low density of defect states and accordingly has a low density of trap states in some cases.

Electric charge trapped by the trap states in the metal oxide takes a long time to be released and may behave like fixed electric charge. Thus, the transistor whose channel region is formed in the oxide semiconductor having a high density of trap states has unstable electrical characteristics in some cases.

In order to stabilize electrical characteristics of the transistor, it is effective to reduce the concentration of impurities in the region $426a$ of the metal oxide $406b$. In addition, in order to reduce the concentration of impurities in the region $426a$ of the metal oxide $406b$, the concentration of impurities in an adjacent film is also preferably reduced. As examples of the impurities, hydrogen, nitrogen, alkali metal, alkaline earth metal, iron, nickel, silicon, and the like are given.

<<Impurities>>

Here, the influence of each impurity in the metal oxide will be described.

When silicon or carbon that is one of Group 14 elements is contained in the metal oxide, defect states are formed in the metal oxide. Thus, the concentration of silicon or carbon (the concentration measured by SIMS) in the region $426a$ of the metal oxide $406b$ is set to be lower than or equal to $2\times10^{18}$ atoms/cm$^3$, preferably lower than or equal to $2\times10^{17}$ atoms/cm$^3$.

When the metal oxide contains an alkali metal or an alkaline earth metal, defect states are formed and carriers are generated, in some cases. Thus, a transistor including a metal oxide that contains an alkali metal or an alkaline earth metal is likely to have normally-on characteristics. Therefore, it is preferable to reduce the concentration of an alkali metal or an alkaline earth metal in the region $426a$ of the metal oxide $406b$. Specifically, the concentration of an alkali metal or an alkaline earth metal in the region $426a$ of the metal oxide $406b$, which is measured by SIMS, is lower than or equal to $1\times10^{18}$ atoms/cm$^3$, preferably lower than or equal to $2\times10^{16}$ atoms/cm$^3$.

Moreover, the metal oxide containing nitrogen easily becomes n-type by generation of electrons serving as carriers and an increase of carrier density. Thus, the transistor containing nitrogen in the region $426a$ of the metal oxide $406b$ tends to have normally-on characteristics. For this reason, nitrogen in the region $426a$ of the metal oxide $406b$ is preferably reduced as much as possible; for example, the concentration of nitrogen in the region $426a$ of the metal oxide $406b$, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{16}$ atoms/cm$^3$.

Hydrogen contained in a metal oxide reacts with oxygen bonded to a metal atom to be water, and thus forms an oxygen vacancy, in some cases. Entry of hydrogen into the oxygen vacancy generates an electron serving as a carrier in some cases. Furthermore, in some cases, bonding of part of hydrogen to oxygen bonded to a metal atom generates an electron serving as a carrier. Thus, the transistor containing much hydrogen in the region 426a of the metal oxide 406b tends to have normally-on characteristics. For this reason, hydrogen in the region 426a of the metal oxide 406b is preferably reduced as much as possible. Specifically, the hydrogen concentration of the metal oxide, which is measured by SIMS, is lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

By reducing impurities in the region 426a of the metal oxide 406b sufficiently, the transistor can have stable electrical characteristics.

<Transistor 201>

Next, the details of the transistor 201 having a different structure from the transistor 200 will be described as an example.

FIG. 51(A) is a top view of a semiconductor device including the transistor 201. Moreover, FIG. 51(B) is a cross-sectional view of a portion indicated by a dashed-dotted line A1-A2 in FIG. 51(A), and is also a cross-sectional view of the transistor 201 in a channel length direction. Furthermore, FIG. 51(C) is a cross-sectional view of a portion indicated by a dashed-dotted line A3-A4 in FIG. 51(A), and is also a cross-sectional view of the transistor 201 in a channel width direction. In the top view of FIG. 51(A), some components are not illustrated for simplification of the drawing. In addition, the components common to the transistor 201 and the transistor 200 are denoted by the same reference numerals.

As illustrated in FIGS. 51(A) to (C), the transistor 201 includes the insulator 224 located over a substrate (not illustrated), the metal oxide 406a located over the insulator 224, the metal oxide 406b located in contact with at least part of the top surface of the metal oxide 406a, a conductor 452a and a conductor 452b located in contact with at least part of the top surface of the metal oxide 406b, a metal oxide 406c located in contact with at least part of the top surface of the metal oxide 406b and over the conductor 452a and the conductor 452b, an insulator 412 located over the metal oxide 406c, a conductor 405a located over the insulator 412, a conductor 405b located over the conductor 405a, and an insulator 420 located over the conductor 405b.

A conductor 405 (the conductor 405a and the conductor 405b) can function as a top gate, and the conductor 310 can function as a back gate. The potential of the back gate may be the same as the potential of the top gate, or may be the ground potential or a given potential. Moreover, by changing the potential of the back gate not in synchronization with but independently of the potential of the top gate, the threshold voltage of the transistor can be changed.

The conductor 405a can be provided using a material similar to that for the conductor 404a in FIG. 47. The conductor 405b can be provided using a material similar to that for the conductor 404b in FIG. 47.

The conductor 452a has a function of one of a source electrode and a drain electrode, and the conductor 452b has a function of the other of the source electrode and the drain electrode.

A metal such as aluminum, titanium, chromium, nickel, copper, yttrium, zirconium, molybdenum, silver, tantalum, or tungsten, or an alloy containing the metal as its main component can be used for each of the conductors 452a and 452b. Although a single-layer structure is illustrated in the drawings, a stacked-layer structure of two or more layers may be used. Furthermore, a transparent conductive material containing indium oxide, tin oxide, or zinc oxide may be used.

In the transistor 201, a channel is preferably formed in the metal oxide 406b. Therefore, for the metal oxide 406c, a material having a higher insulating property than the metal oxide 406b is preferably used. For the metal oxide 406c, a material similar to that for the metal oxide 406a is preferably used.

By providing the metal oxide 406c for the transistor 201, the transistor 201 can be a buried-channel transistor. Moreover, oxidation of end portions of the conductor 452a and the conductor 452b can be prevented. Furthermore, a leakage current between the conductor 405 and the conductor 452a (or the conductor 405 and the conductor 452b) can be prevented. Note that the metal oxide 406c may be omitted depending on the case.

In addition, the metal oxide 406b includes regions 426d. As illustrated in FIG. 51(B), the regions 426d are positioned in regions where the metal oxide 406b is in contact with the conductor 452a and the conductor 452b. The regions 426d are formed because of damage caused when the conductor 452a and the conductor 452b are deposited and the addition of an impurity such as nitrogen contained in the deposition atmosphere in some cases. Therefore, an oxygen vacancy is formed because of the added impurity element and the impurity element enters the oxygen vacancy, thereby increasing the carrier density and reducing resistance in the regions 426d of the metal oxide 406b. Note that in some cases, the regions 426d are formed only at the interface of the metal oxide 406b depending on the deposition conditions of the conductor 452a and the conductor 452b.

For the insulator 420, an insulating material having a function of inhibiting the passage of oxygen and impurities such as water or hydrogen is preferably used. For example, for the insulator 420, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride may be used.

Provision of the insulator 420 in the transistor 201 can prevent oxidation of the conductor 405. Furthermore, impurities such as water or hydrogen can be prevented from entering the metal oxide 406.

The transistor 201 can have a larger contact area between the metal oxide 406b and the electrode (the source electrode or the drain electrode) than the transistor 200. Furthermore, a step for forming the region 426b and the region 426c illustrated in FIG. 47 is not necessary. Thus, the transistor 201 can have a larger on-state current than the transistor 200. In addition, the manufacturing process can be simplified.

For the details of the other components of the transistor 201, the description of the transistor 200 can be referred to.

Note that this embodiment can be combined with the other embodiment in this specification as appropriate.

(Notes on the Description in this Specification and the Like)

The following are notes on the description of the structures in the above embodiments.

<Notes on One Embodiment of the Present Invention Described in Embodiments>

One embodiment of the present invention can be constituted by appropriately combining the structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment, a content described in the embodiment is a content described with reference to a variety of diagrams or a content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

<Notes on Ordinal Numbers>

Ordinal numbers such as "first," "second," and "third" in this specification and the like are used in order to avoid confusion among components. Thus, the ordinal numbers in this specification and the like do not limit the number of components and do not limit the order of components. In this specification and the like, for example, a "first" component in one embodiment can be referred to as a "second" component in other embodiments or claims. Furthermore, in this specification and the like, for example, a "first" component in one embodiment can be omitted in other embodiments or claims.

<Notes on Description for Drawings>

Embodiments are described with reference to drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted.

Moreover, in this specification and the like, terms for describing arrangement, such as "over" and "under," are used for convenience for describing the positional relation between components with reference to drawings. The positional relation between components is changed as appropriate in accordance with a direction in which the components are described. Thus, terms for describing arrangement are not limited to those described in this specification and can be rephrased as appropriate according to circumstances.

Furthermore, the term "over" or "under" does not necessarily mean that a component is placed directly above or directly below and in direct contact with another component. For example, the expression "electrode B over insulating layer A" does not necessarily mean that the electrode B is formed on and in direct contact with the insulating layer A and does not exclude the case where another component is provided between the insulating layer A and the electrode B.

In drawings, the size, the layer thickness, or the region is shown arbitrarily for description convenience. Therefore, they are not limited to the scale. Note that the drawings are schematically shown for clarity, and embodiments of the present invention are not limited to shapes or values shown in the drawings. For example, variation in signal, voltage, or current due to noise or variation in signal, voltage, or current due to difference in timing can be included.

In drawings such as a perspective view, illustration of some components might be omitted for clarity of the drawings.

Moreover, the same components or components having similar functions, components formed using the same material, components formed at the same time, or the like in the drawings are denoted by the same reference numerals in some cases, and the repeated description thereof is omitted in some cases.

<Notes on Expressions that can be Rephrased>

In this specification and the like, one of a source and a drain is denoted by "one of a source and a drain" (or a first electrode or a first terminal) and the other of the source and the drain is denoted by "the other of the source and the drain" (or a second electrode or a second terminal) in the description of the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate according to circumstances. In this specification and the like, the two terminals other than the gate may be referred to as a first terminal and a second terminal or as a third terminal and a fourth terminal. Furthermore, in the case where a transistor described in this specification and the like has two or more gates (such a structure is referred to as a dual-gate structure in some cases), these gates are referred to as a first gate and a second gate or as a front gate and a back gate in some cases. In particular, the term "front gate" can be replaced with a simple term "gate." The term "back gate" can be replaced with a simple term "gate." Note that a bottom gate is a terminal that is formed before a channel formation region in manufacture of a transistor, and a "top gate" is a terminal that is formed after a channel formation region in manufacture of a transistor.

A transistor has three terminals referred to as a gate, a source, and a drain. A gate is a terminal that functions as a control terminal that controls the conduction state of a transistor. Depending on the type of the transistor or levels of potentials supplied to the terminals, one of two input/output terminals functions as a source and the other functions as a drain. Therefore, the terms "source" and "drain" can be interchanged in this specification and the like. In this specification and the like, the two terminals other than the gate may be referred to as a first terminal and a second terminal or as a third terminal and a fourth terminal.

In addition, in this specification and the like, the term "electrode" or "wiring" does not functionally limit a component. For example, an "electrode" is used as part of a "wiring" in some cases, and vice versa. Furthermore, the term "electrode" or "wiring" can also mean the case where a plurality of "electrodes" or "wirings" are formed in an integrated manner.

In this specification and the like, voltage and potential can be replaced with each other as appropriate. Voltage refers to a potential difference from a reference potential, and when the reference potential is a ground potential, for example, voltage can be replaced with potential. The ground potential does not necessarily mean 0 V. Note that potentials are relative, and the potential supplied to a wiring or the like is changed depending on the reference potential, in some cases.

Note that in this specification and the like, the terms "film," "layer," and the like can be interchanged with each other depending on the case or according to circumstances. For example, the term "conductive layer" can be changed into the term "conductive film" in some cases. Moreover, the term "insulating film" can be changed into the term "insulating layer" in some cases. Alternatively, the term "film," "layer," or the like is not used and can be interchanged with another term depending on the case or according to circumstances. For example, the term "conductive layer" or "conductive film" can be changed into the term "conductor" in some cases. Furthermore, for example, the term "insulating layer" or "insulating film" can be changed into the term "insulator" in some cases.

Note that in this specification and the like, the terms "wiring," "signal line," "power source line," and the like can be interchanged with each other depending on the case or according to circumstances. For example, the term "wiring" can be changed into the term "signal line" in some cases. Also, for example, the term "wiring" can be changed into the term "power source line" in some cases. Inversely, the term "signal line," "power source line," or the like can be changed into the term "wiring" in some cases. The term "power source line" or the like can be changed into the term "signal line" or the like in some cases. Inversely, the term "signal line" or the like can be changed into the term "power source line" or the like in some cases. The term "potential" that is applied to a wiring can be changed into the term "signal" or the like depending on the case or according to circumstances. Inversely, the term "signal" or the like can be changed into the term "potential" in some cases.

<Notes on Definitions of Terms>

Definitions of the terms mentioned in the above embodiments will be explained below.

<<Impurity in Semiconductor>>

An impurity in a semiconductor refers to, for example, an element other than the main components of a semiconductor layer. For example, an element with a concentration of lower than 0.1 atomic % is an impurity. If a semiconductor contains an impurity, formation of the DOS (Density of States) in the semiconductor, decrease in the carrier mobility, or decrease in the crystallinity may occur, for example. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components; specifically, there are hydrogen (contained also in water), lithium, sodium, silicon, boron, phosphorus, carbon, and nitrogen, for example. In the case of an oxide semiconductor, oxygen vacancies may be formed by entry of impurities such as hydrogen. Moreover, in the case where the semiconductor is silicon, examples of an impurity which changes characteristics of the semiconductor include oxygen, Group 1 elements except hydrogen, Group 2 elements, Group 13 elements, and Group 15 elements.

<<Transistor>>

In this specification, a transistor is an element having at least three terminals including a gate, a drain, and a source. A channel formation region is included between the drain (a drain terminal, a drain region, or a drain electrode) and the source (a source terminal, a source region, or a source electrode) and current can flow between the source and the drain through the channel formation region. Note that in this specification and the like, the channel formation region refers to a region through which current mainly flows.

Furthermore, functions of a source and a drain are sometimes interchanged with each other when transistors having different polarities are used or when the direction of current is changed in circuit operation, for example. Therefore, the terms "source" and "drain" can be interchanged in this specification and the like.

<<Switch>>

In this specification and the like, a switch is in a conduction state (on state) or in a non-conduction state (off state) to determine whether a current flows or not. Alternatively, a switch has a function of selecting and changing a current path.

Examples of the switch that can be used are an electrical switch, a mechanical switch, and the like. That is, a switch can be any element capable of controlling current, and is not limited to a certain element.

Examples of the electrical switch are a transistor (for example, a bipolar transistor or a MOS transistor), a diode (for example, a PN diode, a PIN diode, a Schottky diode, a MIM (Metal Insulator Metal) diode, a MIS (Metal Insulator Semiconductor) diode, or a diode-connected transistor), and a logic circuit in which such elements are combined.

Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of the mechanical switch is a switch formed using a MEMS (micro electro mechanical system) technology, such as a digital micromirror device (DMD). Such a switch includes an electrode which can be moved mechanically, and operates by controlling conduction and non-conduction with movement of the electrode.

<<Connection>>

In this specification and the like, a description X and Y are connected includes the case where X and Y are electrically connected, the case where X and Y are functionally connected, and the case where X and Y are directly connected. Accordingly, without being limited to a predetermined connection relation, for example, a connection relation shown in drawings or text, a connection relation other than the connection relation shown in drawings or text is also included.

Note that X, Y, and the like used here each denote an object (for example, a device, an element, a circuit, a wiring, an electrode, a terminal, a conductive film, or a layer).

For example, in the case where X and Y are electrically connected, one or more elements that enable electrical connection between X and Y (for example, a switch, a transistor, a capacitor, an inductor, a resistor, a diode, a display element, a light-emitting element, or a load) can be connected between X and Y. Note that the switch has a function of being controlled to be turned on or off. That is, the switch has a function of being in a conduction state (on state) or a non-conduction state (off state) to determine whether a current flows or not.

For example, in the case where X and Y are functionally connected, one or more elements that enable functional connection between X and Y (for example, a logic circuit (an inverter, a NAND circuit, a NOR circuit, or the like); a signal converter circuit (a DA converter circuit, an AD converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. Note that, for example, even when another circuit is interposed between X and Y, X and Y are functionally connected if a signal output from X is transmitted to Y.

Note that an explicit description, X and Y are electrically connected, includes the case where X and Y are electrically connected (that is, the case where X and Y are connected with another element or another circuit provided therebetween), the case where X and Y are functionally connected (that is, the case where X and Y are functionally connected with another circuit provided therebetween), and the case where X and Y are directly connected (that is, the case where X and Y are connected without another element or another circuit provided therebetween). That is, the explicit expression "X and Y are electrically connected" is the same as the explicit simple expression "X and Y are connected."

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y can be expressed as follows.

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order." Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order." Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order." When the connection order in a circuit configuration is defined by using an expression similar to these examples, a source (or a first terminal or the like) and a drain (or a second terminal or the like) of a transistor can be distinguished from each other to specify the technical scope. Note that these expressions are examples and expressions are not limited to these expressions. Here, each of X, Y, Z1, and Z2 denotes an object (for example, a device, an element, a circuit, a wiring, an electrode, a terminal, a conductive film, or a layer).

Note that even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes in its category such a case where one conductive film has functions of a plurality of components.

<<Parallel and Perpendicular>>

In this specification, "parallel" indicates a state where the angle formed between two straight lines is greater than or equal to −10° and less than or equal to 10°. Accordingly, the case where the angle is greater than or equal to −5° and less than or equal to 5° is also included. In addition, "substantially parallel" indicates a state where the angle formed between two straight lines is greater than or equal to −30° and less than or equal to 30°. In addition, "perpendicular" indicates a state where the angle formed between two straight lines is greater than or equal to 80° and less than or equal to 1000. Accordingly, the case where the angle is greater than or equal to 85° and less than or equal to 95° is also included. In addition, "substantially perpendicular" indicates a state where the angle formed between two straight lines is greater than or equal to 600 and less than or equal to 1200.

REFERENCE NUMERALS

PA display portion, SD source driver circuit, GD gate driver circuit, TC timing controller, AFE analog front end, DEC decoder, PP image processing portion, RCV receive portion, I/F interface, CP control portion, ANT antenna, RC remote controller, AIE encoder, AID decoder, IL input layer, ML1 intermediate layer, ML2 intermediate layer, ML3 intermediate layer, ML4 intermediate layer, OL output layer, SR shift register, AB2 analog buffer circuit, Tr transistor, GNDL wiring, Sig signal, SP start pulse signal, CLK clock signal, DMPX demultiplexer, SDM1 driver circuit, SDM2 driver circuit, PX pixel, PxS pixel column, PxB pixel portion, SR[0] latch circuit, SR[1] latch circuit, SR[2] latch circuit, SR[n−1] latch circuit, SR[n] latch circuit, D input terminal, Q output terminal, AD[1] AND circuit, AD[2] AND circuit, AD[n−1] AND circuit, AD[n] AND circuit, NT NOT circuit, SEL[1] output terminal, SEL[2] output terminal, SEL[j] output terminal, SEL[n−1] output terminal, SEL[n] output terminal, TrX transistor, TrY transistor, CX capacitor, AB3 analog buffer circuit, NT2 NOT circuit, SDA source driver circuit, DS image data, SLT signal, LT1 latch circuit, LT2 latch circuit, DA digital-to-analog converter circuit, CL convolution layer, PL pooling layer, IPD image data, $fil_a$ filter, $fil_b$ filter, file filter, FCL fully connected layer, OPD image data, IPT input terminal, P[1, 1] region, $D_a$[1, 1] data, PT[1] output terminal, PT[s] output terminal, PT[s+1] output terminal, PT[s+2] output terminal, PT[2s] output terminal, PT[(t−1)s+1] output terminal, PT[(t−1)s+2] output terminal, PT[ts] output terminal, HC[1] retention circuit, HC[s] retention circuit, HC[m] retention circuit, HC[m+1] retention circuit, HC[m+s] retention circuit, HC[2m] retention circuit, HC[(t−1)m+1] retention circuit, HC[(t−1)m+s] retention circuit, HC[tm] retention circuit, RW[2] wiring, RW[s] wiring, RW[s+1] wiring, RW[s+2] wiring, RW[2s] wiring, RW[(t−1)s+1] wiring, RW[(t−1)s+2] wiring, RW[ts] wiring, PDL[1] input terminal, PDL[1] input terminal, PDR[1] output terminal, PDR[n] output terminal, PLE[1] programmable logic element, PLE[m] programmable logic element, SWC switch circuit, PSW1 programmable switch, PSW2 programmable switch, PSW3 programmable switch, L[1] wiring, L[2] wiring, L[1] wiring, R[1] wiring, R[2] wiring, R[m] wiring, P[1] wiring, P[2] wiring, P[m] wiring, Q[1] wiring, Q[2] wiring, Q[m] wiring, In[1] input terminal, In[2] input terminal, In[s] input terminal, MLT[1] multiplier circuit, MLT1[2] multiplier circuit, MLT[s] multiplier circuit, CMW[1] configuration memory, CMW[2] configuration memory, CMW[s] configuration memory, CMF configuration memory, AD adder circuit, FC activation function circuit, KC retention circuit, TA1 terminal, TA2 terminal, CKT terminal, TrA transistor, TrB transistor, CA capacitor, AMP amplifier, NL NOT circuit, N node, q[1] wiring, q[s] wiring, r[1] wiring, r[t] wiring, O[1] terminal, O[t] terminal, SW switch, X wiring, CMS configuration memory, OUT[1] column output circuit, OUT[j] column output circuit, OUT[j+1] column output circuit, OUT[n] column output circuit, Cref reference column output circuit, SPT[1] output terminal, SPT[j] output terminal, SPT[j+1] output terminal, SPT[n] output terminal, OT[1] output terminal, OT[j] output terminal, OT[j+1] output terminal, OT[n] output terminal, OTref output terminal, OSP wiring, ORP wiring, OSM wiring, ORM wiring, AM[1, 1] memory cell, AM[i, 1] memory cell, AM[m, 1] memory cell, AM[1, j] memory cell, AM[i, j] memory cell, AM[m, j] memory cell, AM[1, n] memory cell, AM[i, n] memory cell, AM[m, n] memory cell, AM[i+1, j] memory cell, AM[i, j+1] memory cell, AM[i+1, j+1] memory cell, AMref memory cell, VR wiring, RW[1] wiring, RW[i] wiring, RW[m] wiring, WW[1] wiring, WW[i] wiring, WW[m] wiring, WD[1] wiring, WD[j] wiring, WD[j+1] wiring, WD[n] wiring, WDref wiring, B[1] wiring, B[j] wiring, B[j+1] wiring, B[n] wiring, Bref wiring, VDDL wiring, VSSL wiring, CI constant current circuit, CIref constant current circuit, CM current mirror circuit, OL[1] wiring, OL[j] wiring, OL[n] wiring, OLref wiring, IL[1] wiring, IL[1] wiring, IL[j+1] wiring, IL[n] wiring, ILref wiring, BG[1] wiring, BG[j] wiring, BG[n] wiring, BGref wiring, NCMref node, N[1, 1] node, N[i, 1] node, N[m, 1] node, N[1, j] node, N[i, j] node, N[m, j] node, N[1, n] node, N[i, n] node, N[m, n] node, N[i+1, j] node, N[i, j+1] node, N[i+1, j+1] node, Nref[1] node, Nref[i] node, Nref[i+1] node, Nref[m] node, C1 capacitor, C2 capacitor, C3 capacitor, CT1 terminal, CT1-1 terminal, CT1-2 terminal, CT1-3 terminal, CT2 terminal, CT3 terminal, CT4 terminal, CT5[1] terminal, CT5[j] terminal, CT5[j+1] terminal, CT5[n] terminal, CT6[1] terminal, CT6[j] terminal, CT6[j+1] terminal, CT6[n] terminal, CT7 terminal, CT8 terminal, Tr1 transistor, Tr2 transistor, Tr3 transistor, Tr5 transistor, Tr7 transistor, Tr8 transistor, Tr9 transistor, Tr11 transistor, Tr12 transistor, Tr21 transistor, Tr22 transistor, Tr23 transistor, M1 transistor, M2 transistor, M3 transistor, $Cs_{LC}$ capacitor, $Cs_{EL}$ capacitor, GL gate line, GL2 gate line, SL signal line, DL signal line, AL current supply line, 10 electronic device, 11 display device, 12 receiver, 13 autoencoder, 100 NN circuit, 100A NN circuit, 100B NN circuit, 150 arithmetic processing circuit, 161 circuit, 163 circuit, 164 circuit, 165 circuit, 200 transistor, 201 transistor, 214 insulator, 216 insulator, 220 insulator, 222 insulator, 224 insulator, 225 insulator, 280 insulator, 301 display element, 302 display element, 306 pixel circuit, 307 pixel circuit, 310 conductor, 310a conductor, 310b conductor, 384 insulator, 404 conductor, 404a conductor, 404b conductor, 405 conductor, 405a conductor, 405b conductor, 406 metal oxide, 406a metal oxide, 406b metal oxide, 406c metal oxide, 412 insulator, 418 insulator, 419 insulator, 420 insulator, 426a region, 426b region, 426c region, 426d region, 440 conductor, 440a conductor, 440b conductor, 450a conductor, 450b conductor, 451a conductor, 451b conductor, 452a conductor, 452b conductor, 612 moving mechanism, 613 moving mechanism, 615 stage, 616 ball screw mechanism, 620 laser oscillator, 621 optical system unit, 622 mirror, 623 microlens array, 624 mask, 625 laser light, 626 laser light, 627 laser beam, 630 substrate, 640 amorphous silicon layer, 641 polycrystalline silicon layer, 700 product-sum operation circuit, 710 offset circuit, 711 offset circuit, 712 offset circuit, 713 offset circuit, 715 offset circuit, 716 offset circuit, 720 memory cell array, 721 memory cell array, 751 offset circuit, 760 memory cell array, 800 semiconductor device, 801 shift register, 1400 display device, 1411 substrate, 1412 substrate, 1420 liquid crystal element, 1421 conductive layer, 1422 liquid crystal, 1423 conductive layer, 1424a alignment film, 1424b alignment film, 1426 insulating layer, 1430 transistor, 1431 conductive layer, 1431a conductive layer, 1432 semiconductor layer, 1432p semiconductor layer, 1433a conductive layer, 1433b conductive layer, 1434 insulating layer, 1435 impurity semiconductor layer, 1437 semiconductor layer, 1438 connection portion, 1439a polarizing plate, 1439b polarizing plate, 1441 coloring layer, 1442 light-blocking layer, 1460 capacitor, 1481 insulating layer, 1482 insulating layer, 1483 insulating layer, 1484 insulating layer, 1490 backlight unit, 5221 housing, 5222 display portion, 5223 operation button, 5224 speaker, 6200 digital signage, 6201 wall, 9000 housing, 9001 display portion, 9003 speaker, 9005 operation key, 9006 connection terminal, 9007 sensor

The invention claimed is:

1. A semiconductor device comprising:
an encoder;
a decoder; and
a source driver circuit,
wherein an output terminal of the encoder is electrically connected to an input terminal of the source driver circuit,
wherein an output terminal of the source driver circuit is electrically connected to an input terminal of the decoder,
wherein the encoder is configured to convert first image data into feature-extracted second image data when a first analog signal corresponding to the first image data is input to the encoder,
wherein the encoder is configured to output the second image data as a second analog signal from the output terminal of the encoder,
wherein the decoder is configured to restore the second image data into the first image data when the second analog signal is input to the input terminal of the decoder,
wherein the decoder is configured to output the restored first image data as a third analog signal from an output terminal of the decoder,
wherein the encoder comprises a neural network configured to perform convolution processing using a weight filter,
wherein the encoder comprises a memory cell array and a shift register,
wherein the memory cell array is configured to store a filter value of the weight filter,
wherein the shift register is configured to sequentially output the first image data for every pixel region to the memory cell array,
wherein the convolution processing comprises product-sum operation using the first image data and the filter value,
wherein the first image data comprises n rows and m columns of pixel data,
wherein the pixel region comprises t rows and s columns,
wherein the shift register comprises t×m stages of retention circuits,
wherein the shift register is configured to output t×s of the pixel data from the first image data to the memory cell array at a time, wherein n and m are each an integer greater than or equal to 1, and wherein t is an integer greater than or equal to 1 and less than or equal to n, and s is an integer greater than or equal to 1 and less than or equal to m.

2. The semiconductor device according to claim 1, wherein the memory cell array comprises a first transistor, and wherein the first transistor comprises a metal oxide in a channel formation region.

3. The semiconductor device according to claim 1, further comprising an autoencoder, wherein the encoder and the decoder are comprised in the autoencoder.

4. The semiconductor device according to claim 1, further comprising an analog buffer circuit, wherein an input terminal of the analog buffer circuit is electrically connected to the output terminal of the decoder.

5. The semiconductor device according to claim 1, wherein the source driver circuit comprises a latch circuit, and wherein the latch circuit is configured to store the second image data output from the encoder, and wherein the latch circuit is configured to output the second image data to the decoder.

6. The semiconductor device according to claim 5, wherein the latch circuit comprises a second transistor, and wherein the second transistor comprises a metal oxide in a channel formation region.

\* \* \* \* \*